United States Patent [19]
Tetaka et al.

[11] Patent Number: 6,159,770
[45] Date of Patent: Dec. 12, 2000

[54] METHOD AND APPARATUS FOR FABRICATING SEMICONDUCTOR DEVICE

[75] Inventors: Masafumi Tetaka; Shinichiro Maki; Nobuo Ohyama, all of Satsuma-gun; Seiichi Orimo, Kawasaki; Hideharu Sakoda, Kawasaki; Yoshiyuki Yoneda, Kawasaki; Akihiro Shigeno, Satsuma-gun; Ryoichi Yokoyama, Satsuma-gun; Fumitoshi Fujisaki, Satsuma-gun; Masao Fukunaga, Satsuma-gun; Kazuto Tsuji, Kawasaki; Terumi Kamifukumoto, Satsuma-gun; Kenji Itasaka, Satsuma-gun; Masanori Onodera, Kawasaki, all of Japan

[73] Assignee: Fujitsu Limited, Kawasaki, Japan

[21] Appl. No.: 09/192,445

[22] Filed: Nov. 16, 1998

Related U.S. Application Data

[63] Continuation-in-part of application No. 08/744,048, Nov. 6, 1996, Pat. No. 6,072,239.

[30] Foreign Application Priority Data

| Nov. 8, 1995 | [JP] | Japan | 7-290135 |
| Nov. 17, 1995 | [JP] | Japan | 9-315324 |
| Dec. 12, 1995 | [JP] | Japan | 7-322803 |
| Jul. 12, 1996 | [JP] | Japan | 8-183838 |
| Sep. 20, 1996 | [JP] | Japan | 8-250707 |
| Oct. 8, 1996 | [JP] | Japan | 8-267607 |
| Dec. 11, 1997 | [JP] | Japan | 9-341674 |
| Dec. 22, 1997 | [JP] | Japan | 9-353596 |

[51] Int. Cl.[7] .......... H01L 21/44; H01L 21/48; H01L 21/50; H01L 21/302; H01L 21/461
[52] U.S. Cl. .......... 438/112; 438/113; 438/115; 438/123; 438/691
[58] Field of Search ............... 438/110, 111, 438/112, 113, 114, 115, 118, 123, 641

[56] References Cited

U.S. PATENT DOCUMENTS

| 3,171,187 | 3/1965 | Ikeda et al. . |
| 3,581,387 | 6/1971 | Buck et al. . |
| 4,724,280 | 2/1988 | Tsuji et al. . |
| 5,114,880 | 5/1992 | Lin . |
| 5,214,308 | 5/1993 | Nishiguchi et al. . |
| 5,410,451 | 4/1995 | Hawthorne et al. . |
| 5,440,169 | 8/1995 | Tomita et al. . |
| 5,502,631 | 3/1996 | Adachi . |
| 5,521,427 | 5/1996 | Chia et al. . |
| 5,523,628 | 6/1996 | Williams et al. . |

(List continued on next page.)

FOREIGN PATENT DOCUMENTS

| 0 638 933 A1 | 2/1995 | European Pat. Off. . |
| 0 751 561 A1 | 1/1997 | European Pat. Off. . |
| 2 691 836 | 12/1993 | France . |

(List continued on next page.)

OTHER PUBLICATIONS

Copy of European Patent Office Communication for European Patent Application No. 96308093.2 with European Search Report dated Dec. 21, 1999.

*Primary Examiner*—David E. Graybill
*Attorney, Agent, or Firm*—Armstrong, Westerman, Hattori, McLeland & Naughton

[57] ABSTRACT

There is provided a method for fabricating semiconductor devices including resin packages sealing semiconductor elements and external connection terminals respectively resin projections formed on the resin packages and metallic film parts provided to the resin projections. The semiconductor elements are mounted to a lead frame having recess portions located in positions corresponding to positions of the resin projections, metallic film parts being provided in the recess portions. The semiconductor elements are electrically connected to the metallic film parts. The resin packages that seal the semiconductor elements and gate portions are integrally formed with the resin packages. The lead frame is etched so that the resin packages are separated from the lead frame together with the metallic layer parts. The resin packages are attached to an adhesive tape provided to a frame and being used as a carrier.

9 Claims, 154 Drawing Sheets

U.S. PATENT DOCUMENTS

| | | |
|---|---|---|
| 5,567,984 | 10/1996 | Zalesinski et al. . |
| 5,625,230 | 4/1997 | Park et al. . |
| 5,629,566 | 5/1997 | Doi et al. . |
| 5,633,535 | 5/1997 | Chao et al. . |
| 5,666,008 | 9/1997 | Tomita et al. . |
| 5,670,826 | 9/1997 | Bessha et al. . |

FOREIGN PATENT DOCUMENTS

| | | |
|---|---|---|
| 59-208756 | 11/1984 | Japan . |
| 61-135131 | 6/1986 | Japan . |
| 1-161724 | 6/1989 | Japan . |
| 1-179334 | 7/1989 | Japan . |
| 2-112264 | 4/1990 | Japan . |
| 3-94438 | 4/1991 | Japan . |
| 3-94459 | 4/1991 | Japan . |
| 3-178152 | 8/1991 | Japan . |
| 5-129473 | 5/1993 | Japan . |
| 5-251455 | 9/1993 | Japan . |
| 6-151520 | 5/1994 | Japan . |
| 6-310563 | 11/1994 | Japan . |
| 7-161746 | 6/1995 | Japan . |
| 7-235618 | 9/1995 | Japan . |
| 7-307409 | 11/1995 | Japan . |
| WO 95/26047 | 9/1995 | WIPO . |
| WO 96/09646 | 3/1996 | WIPO . |

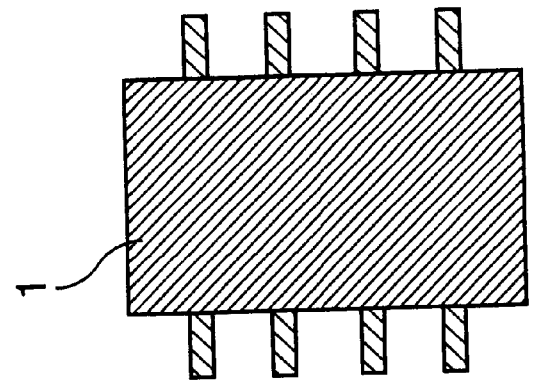
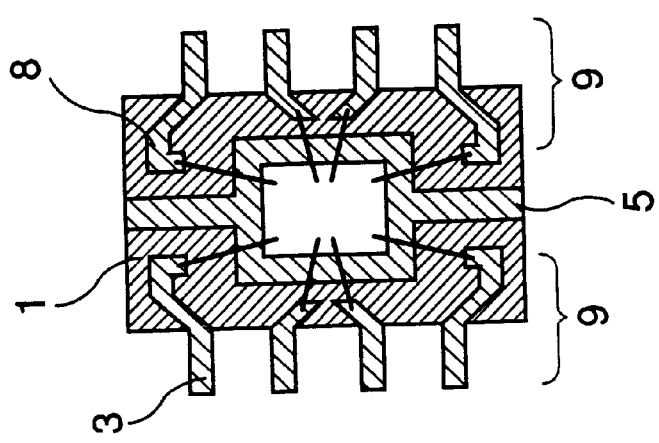
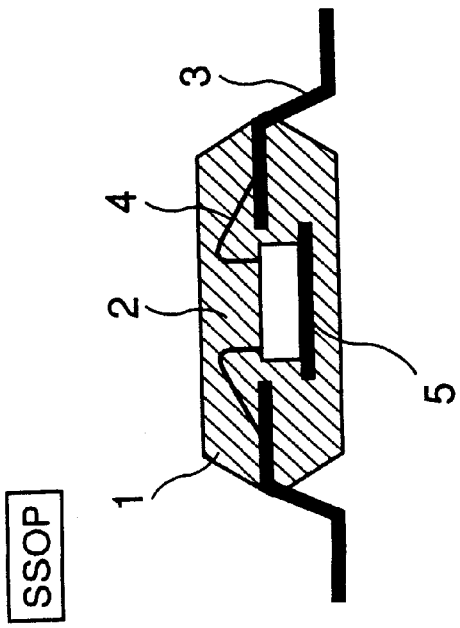

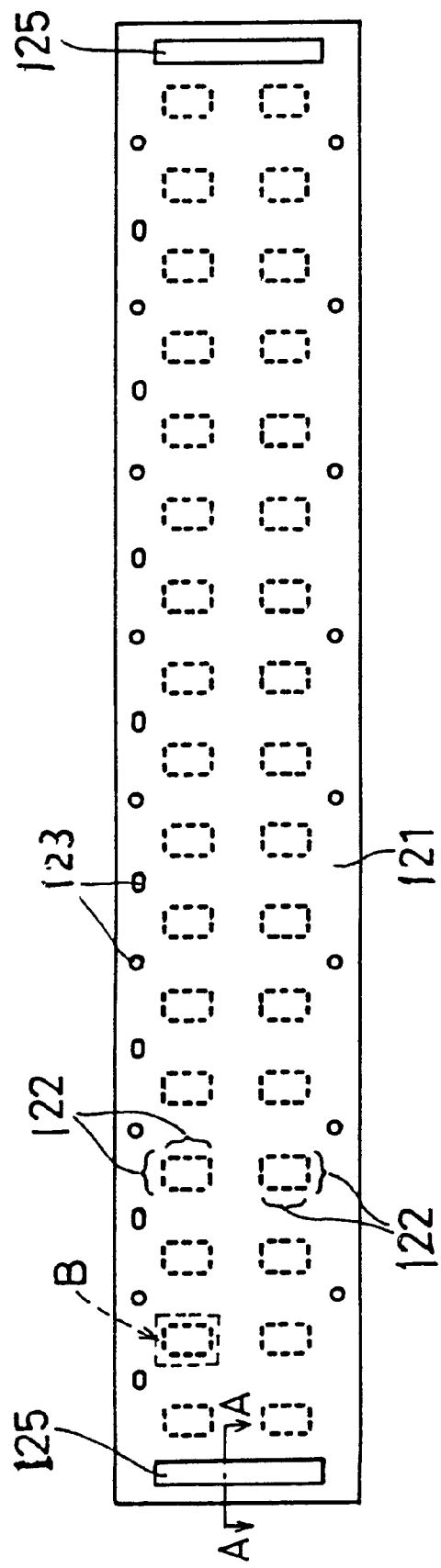
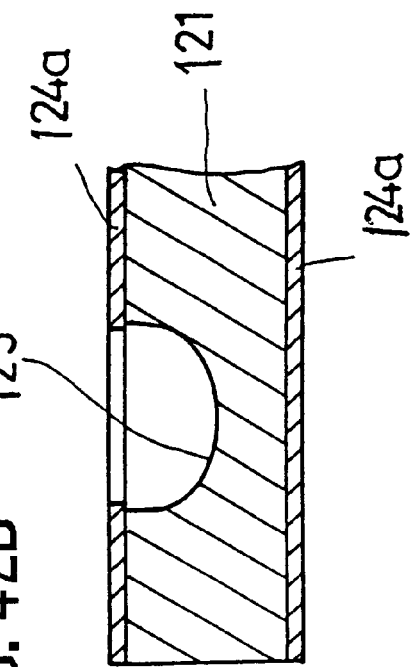
FIG. 42A
FIG. 42B

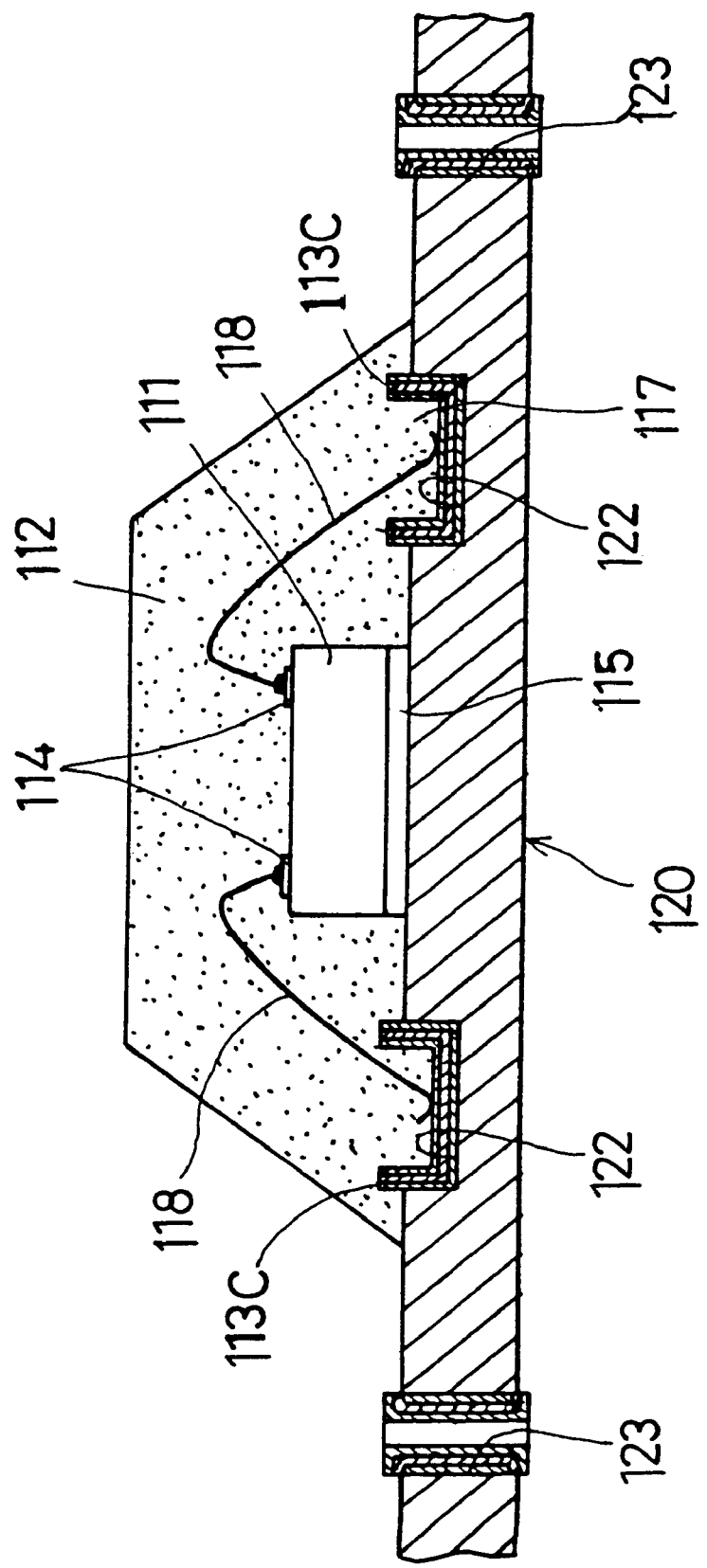

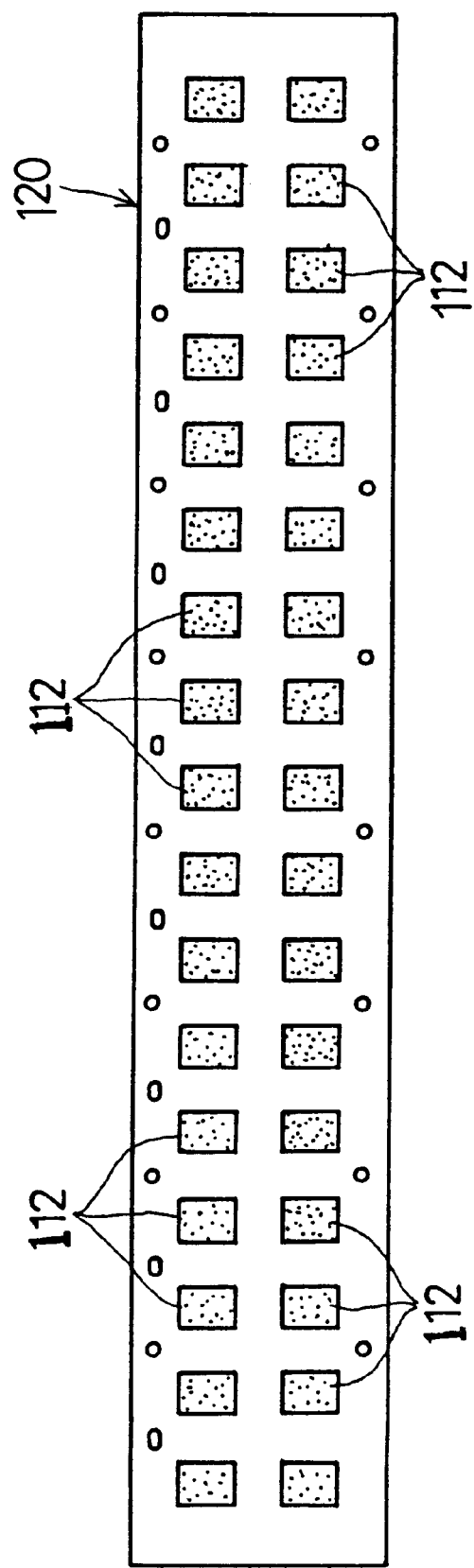
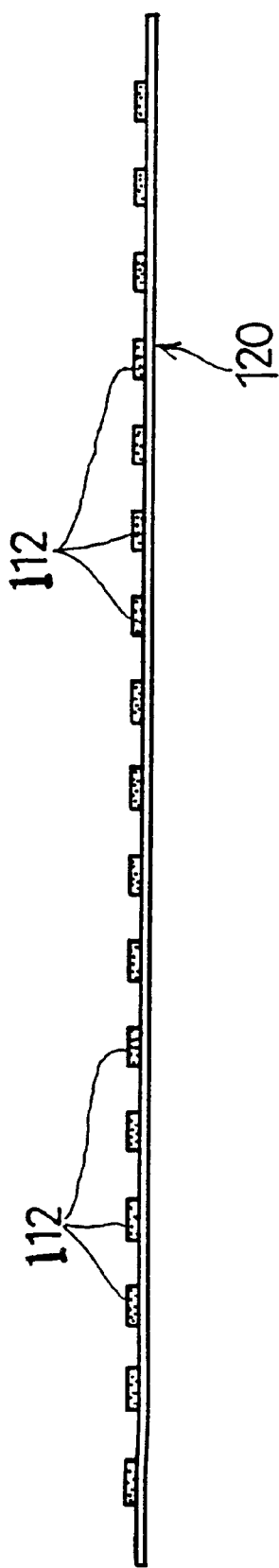
FIG. 51A
FIG. 51B

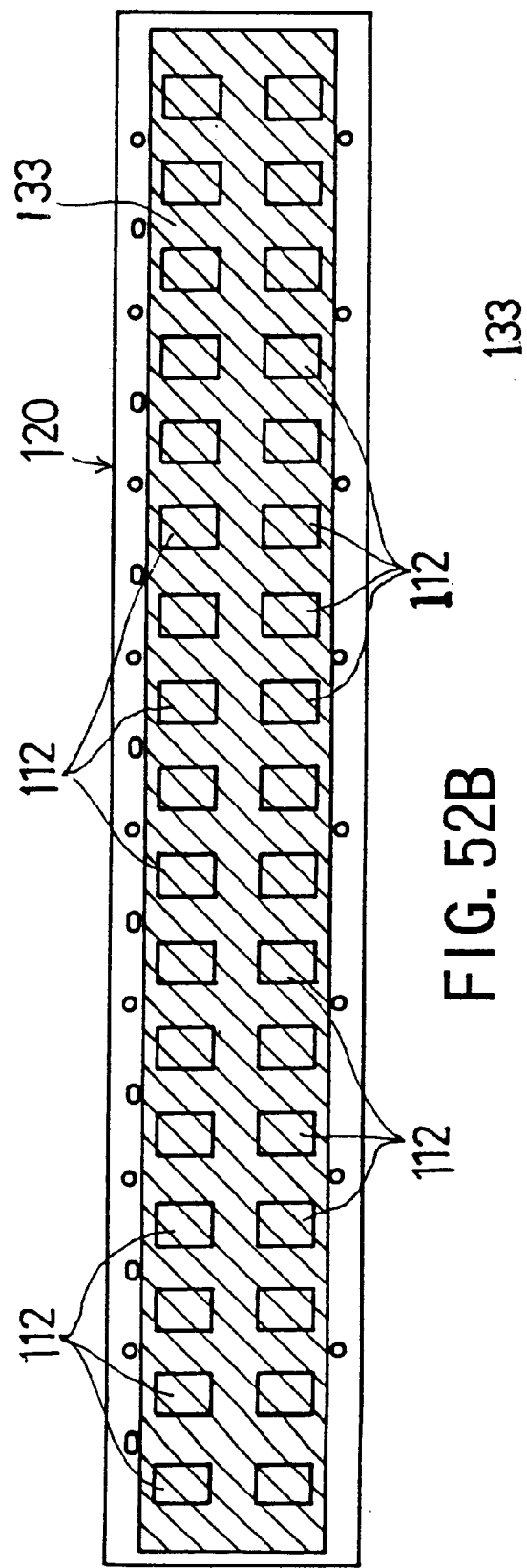
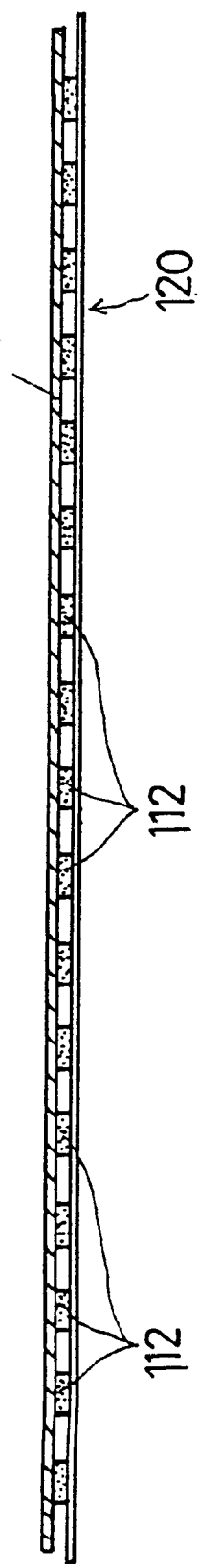
FIG. 52A
FIG. 52B

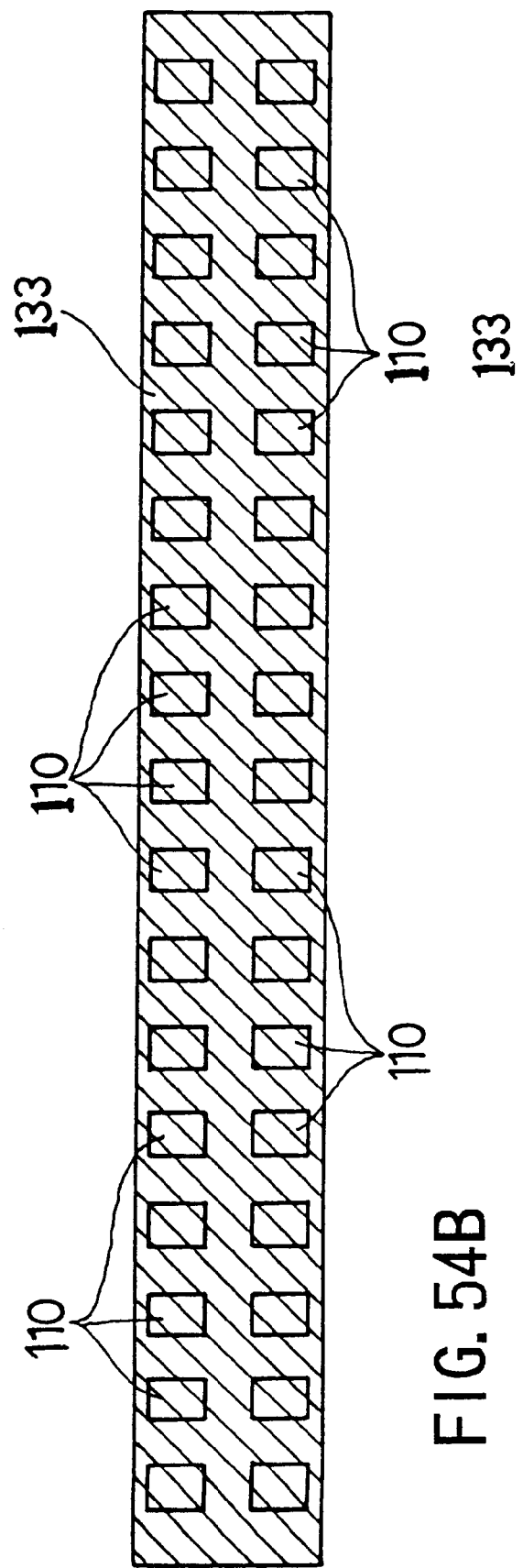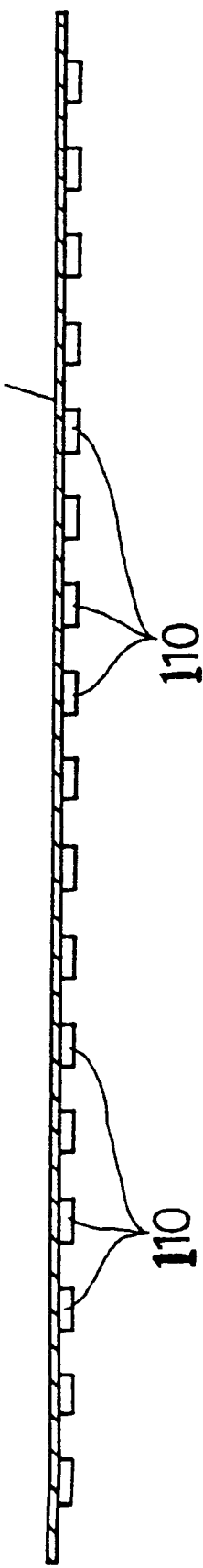
FIG. 54A
FIG. 54B

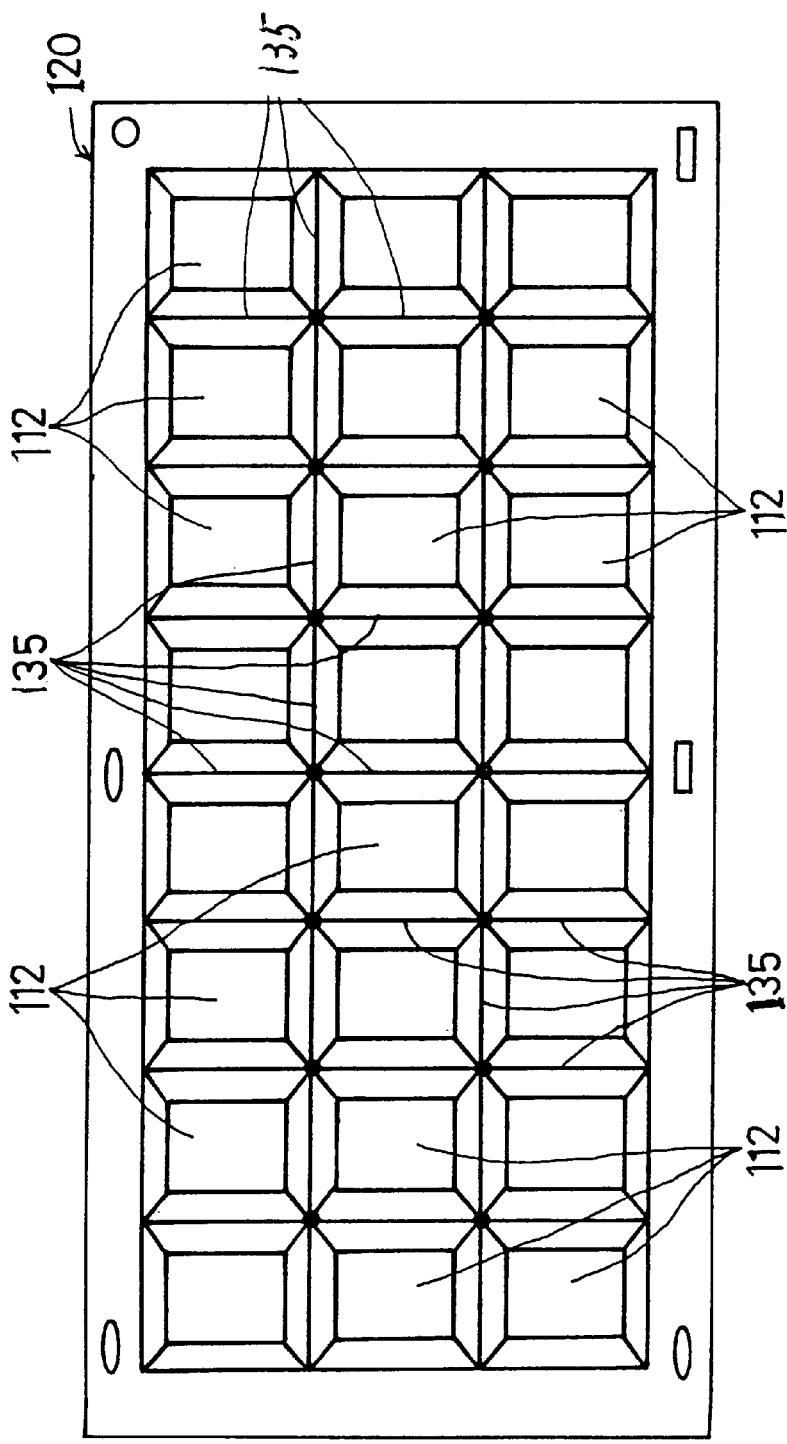
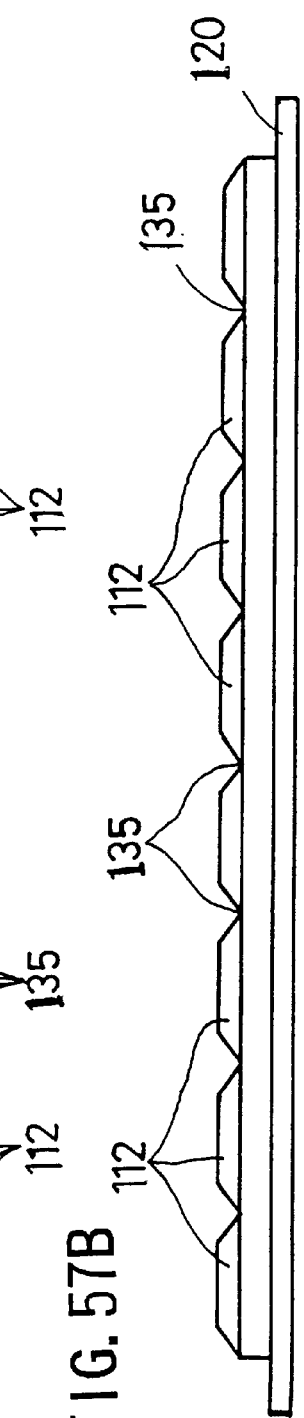
FIG. 57A
FIG. 57B

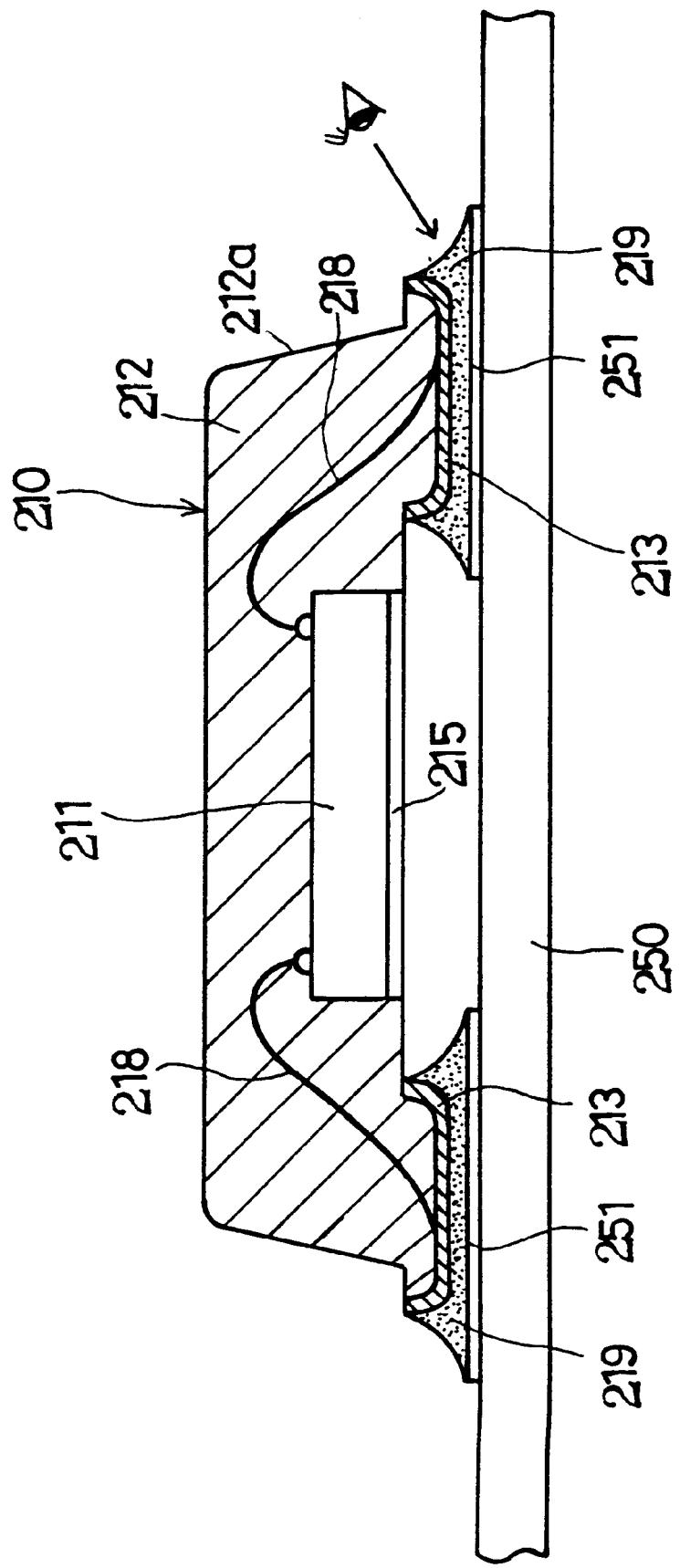

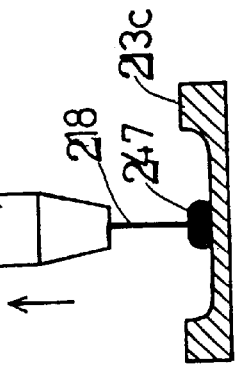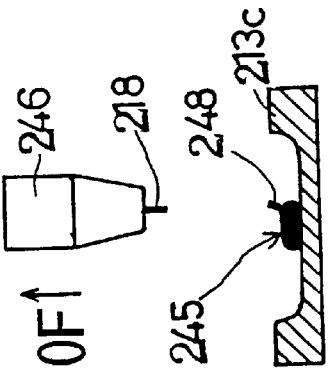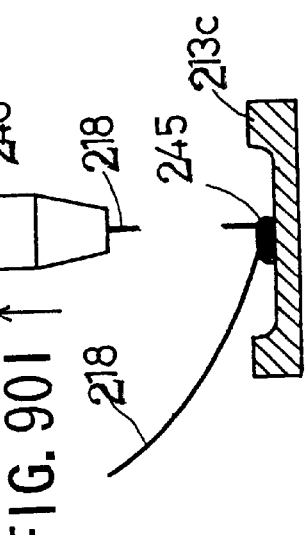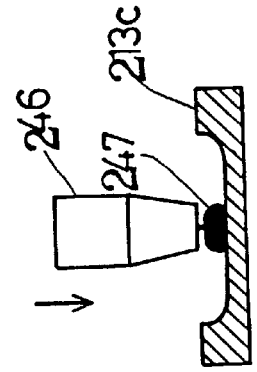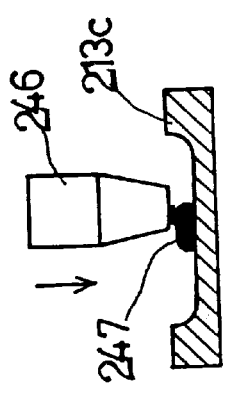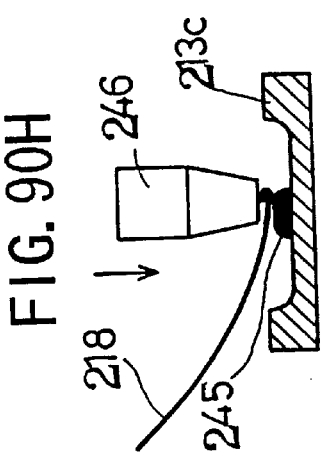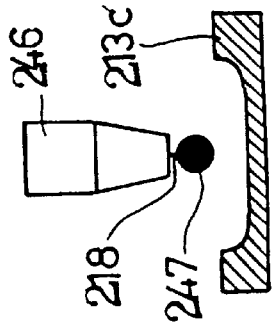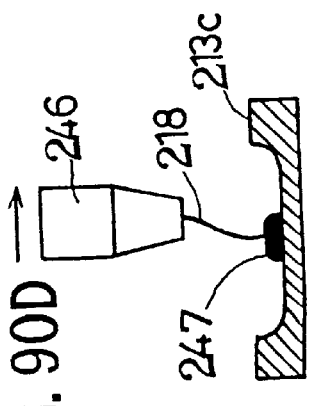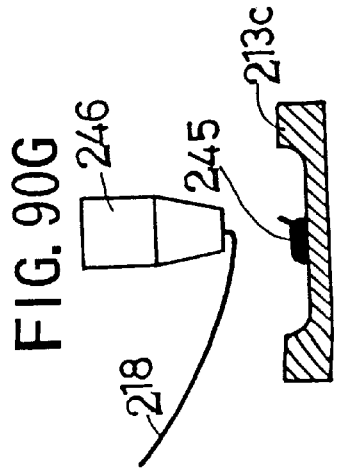

(ETCHING)

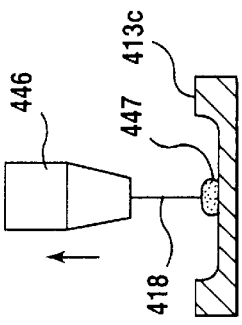
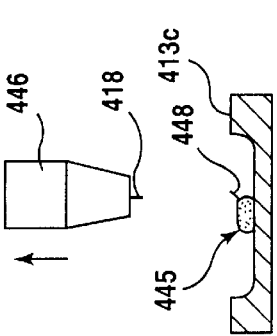
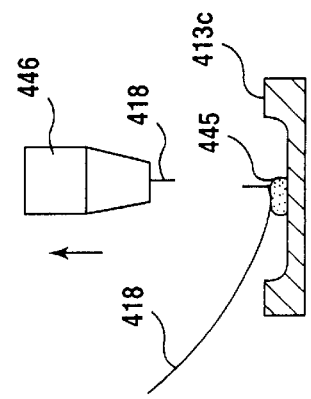
FIG.162A  FIG.162B  FIG.162C
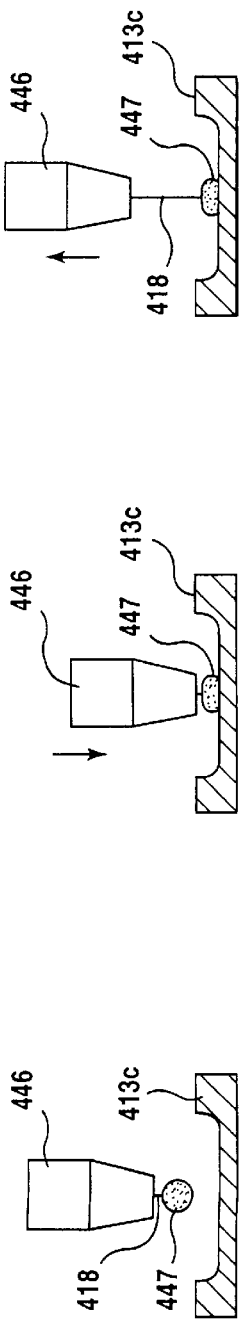
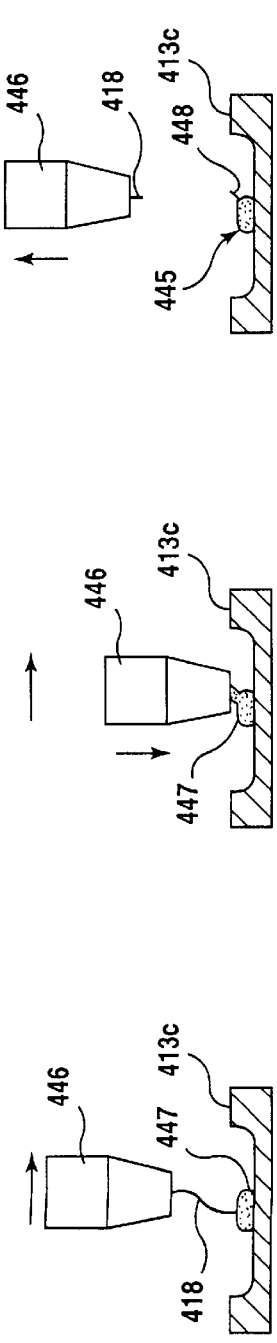
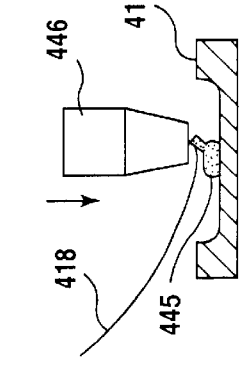
FIG.162D  FIG.162E  FIG.162F

FIG.162I

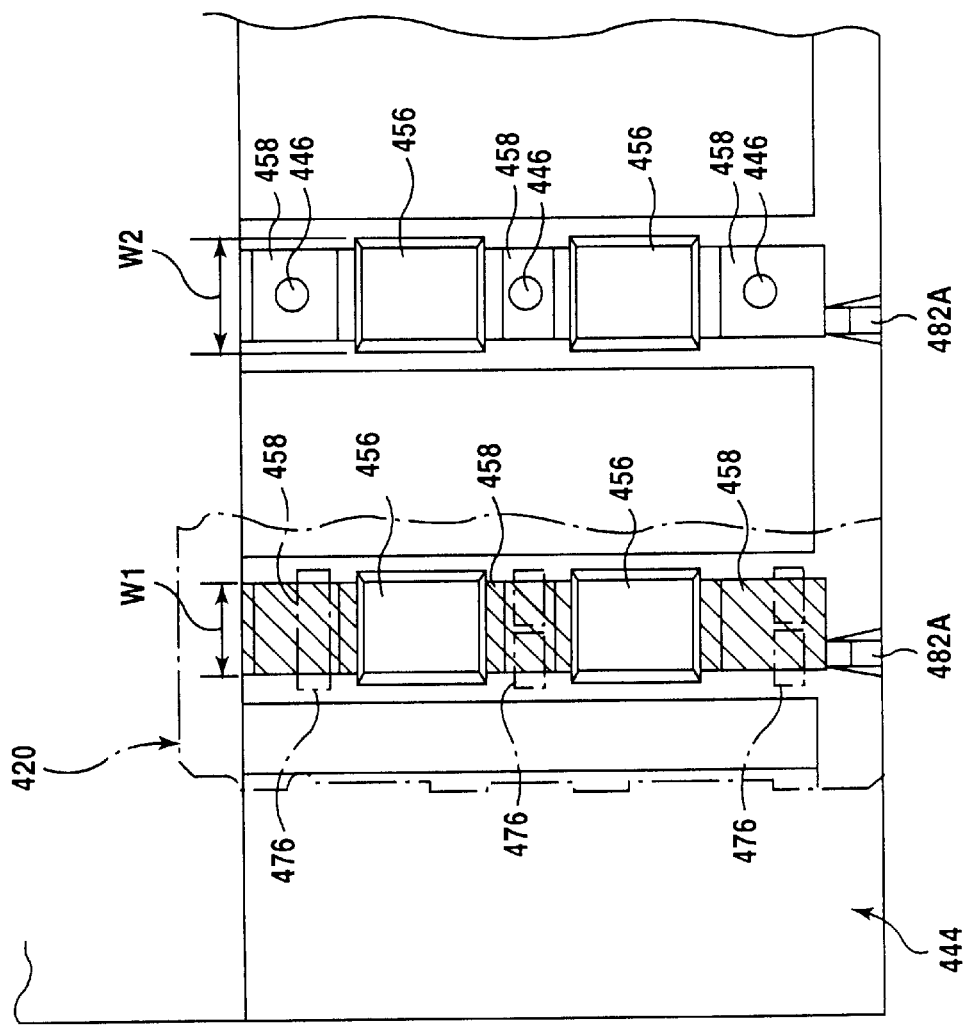

FIG.173A
FIG.173B
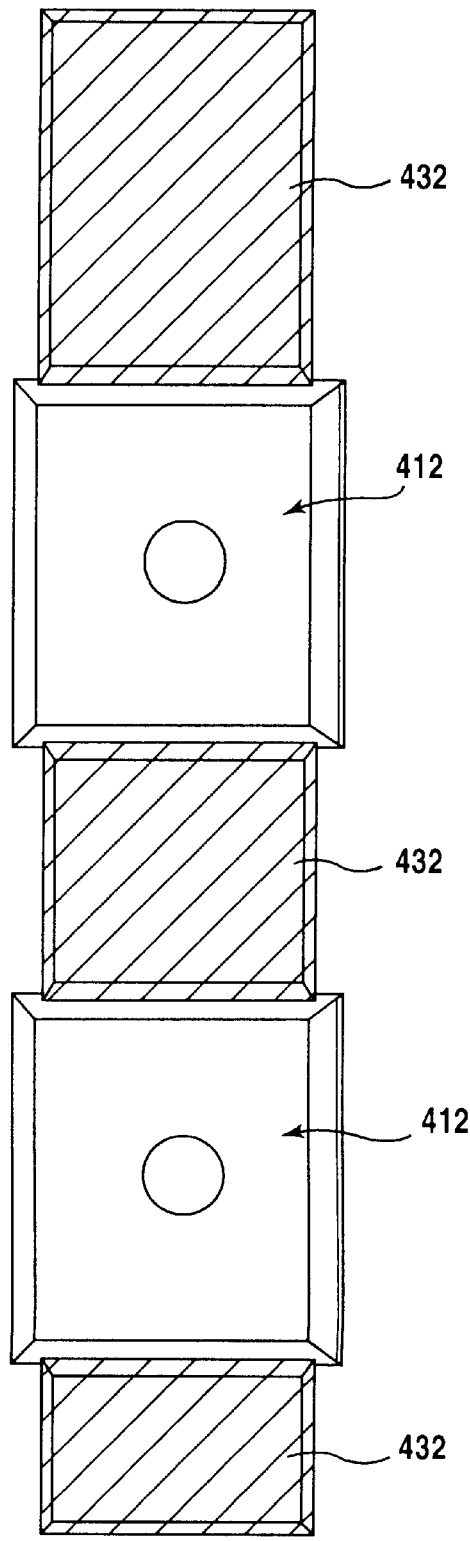
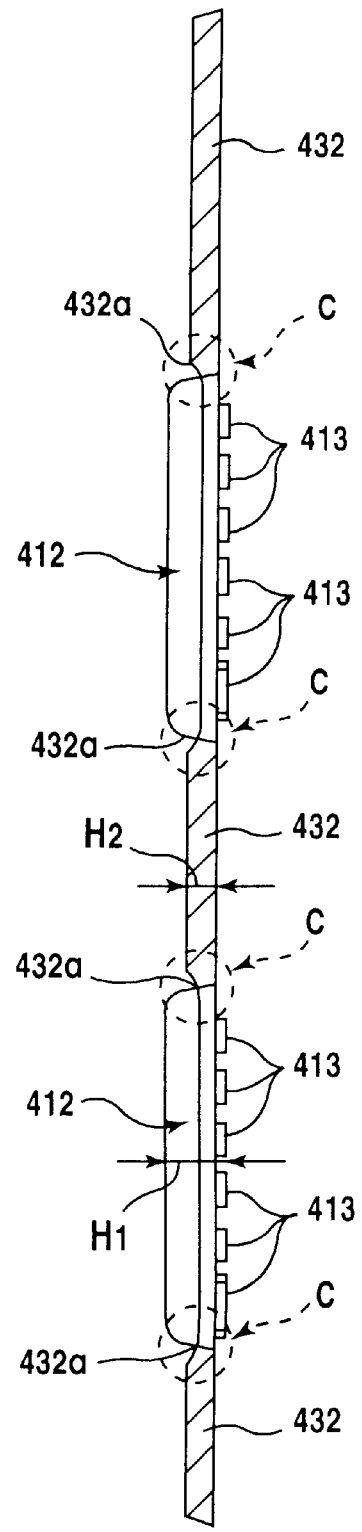

FIG. 190A
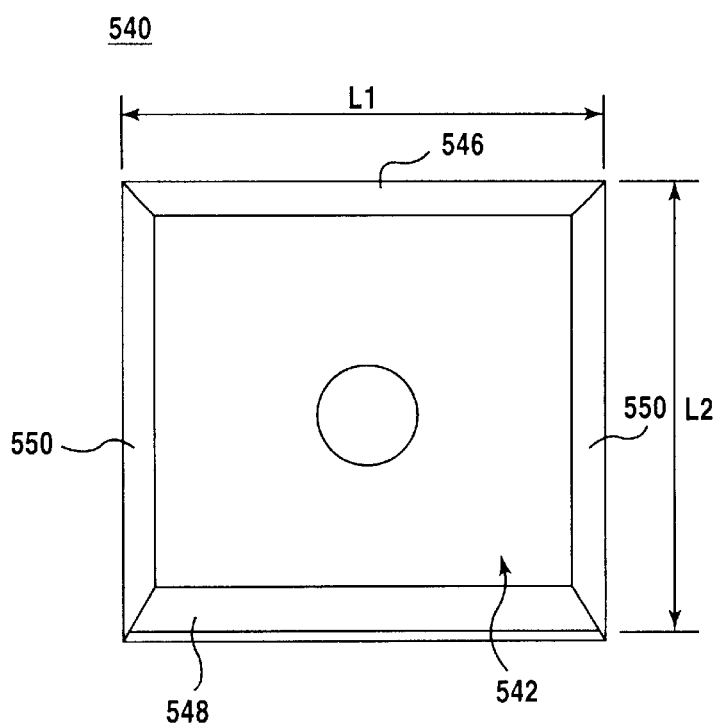
FIG. 190D
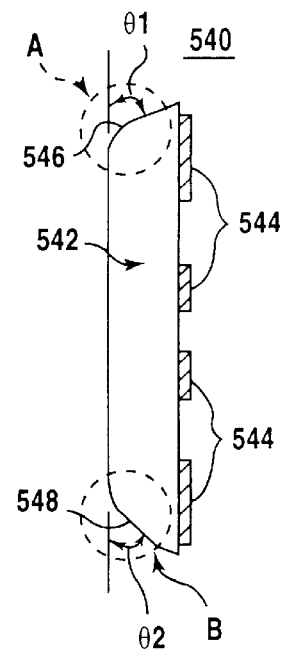
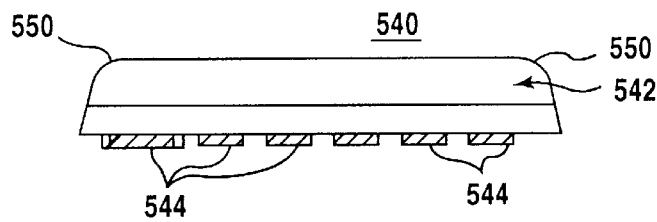
FIG. 190B
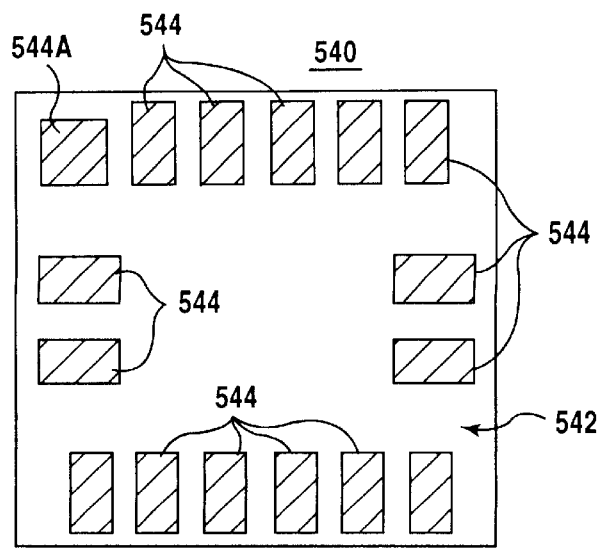
FIG. 190C

METHOD AND APPARATUS FOR FABRICATING SEMICONDUCTOR DEVICE

This application is a continuation-in-part of prior application Ser. No. 08/744,048 filed Nov. 6, 1996, U.S. Pat. No. 6,072,239.

BACKGROUND OF THE INVENTION

1. Field of the Invention

The present invention generally relates to devices having a resin package such as semiconductor devices, and more particularly to a resin-sealed semiconductor device of a leadless surface mounting type directed to high-density mounting. Further, the present invention is concerned with a method of producing such a semiconductor device.

Recently, down-sizing of electronic devices has required a decrease in the pitch of leads extending from a resin-sealed type package. Hence, it is desired that there are provided a new structure of the resin-sealed type package making it possible to further decrease the lead pitch and a method of producing such a structure.

2. Description of the Related Art

FIGS. 1A, 1B and 1C are diagrams of a semiconductor device having a conventional resin-sealed package. The device includes a resin 1, a chip 2, outer leads 3, bonding wires 4 made of an alloy of gold and aluminum (Au—Al), and a die pad 5. The package shown in FIGS. 1A, 1B and 1C is called an SSOP (Shrink Small Outline Package). The outer leads 3 are bent in a gull-wing shape, and are mounted on a circuit board.

FIG. 2 is a cross-sectional view of a semiconductor device of another type. The device shown in FIG. 2 includes solder balls 6 and a mount base 7 on which the chip 2 sealed by the resin 1 and solder balls 6 are provided. The package shown in FIG. 2 is called a BGA (Ball Grid Array) type, and the solder balls 6 serve as terminals provided on the mount base 7.

The SSOP type package shown in FIGS. 1A, 1B and 1C has a disadvantage in which a large area 9 is needed to arrange inner leads 8 integrally formed with the outer leads 3, and a large area is needed to arrange the outer leads 3. Hence, the SSOP type package needs a large mounting area.

The BGA type package shown in FIG. 2 is expensive because it needs the mount base 7.

SUMMARY OF THE INVENTION

It is an object of the present invention to provide an apparatus and method for fabricating a semiconductor device having terminals including resin projections and metallic parts with high reliability.

The above object of the present invention is achieved by method for fabricating semiconductor devices including resin packages sealing semiconductor elements and external connection terminals respectively resin projections formed on the resin packages and metallic film parts provided to the resin projections, said method comprising the steps of: (a) mounting the semiconductor elements to a lead frame having recess portions located in positions corresponding to positions of the resin projections, metallic film parts being provided in the recess portions; (b) electrically connecting the semiconductor elements the metallic film parts; (c) forming the resin packages that seal the semiconductor elements and gate portions being integrally formed with the resin packages; (d) etching the lead frame so that the resin packages are separated from the lead frame together with the metallic layer parts; and (e) removing the gate portions from the resin packages, the resin packages being attached to an adhesive tape provided to a frame and being used as a carrier in the step (d).

The above object of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a resin package attaching part that is supplied with the resin packages integral with a lead frame and that attach the resin packages to a carrier having a frame to which an adhesive tape is provided; and an etching part that is supplied with the carrier from the resin package attaching part and removes the lead frame by etching.

The above object of the present invention is also achieved by a method for fabricating semiconductor devices including resin packages sealing semiconductor elements and external connection terminals respectively having resin projections formed on the resin packages and metallic film parts provided to the resin projections, said method comprising the steps of: (a) mounting the semiconductor elements to a lead frame having recess portions located in positions corresponding to positions of the resin projections, metallic film parts being provided in the recess portions; (b) electrically connecting the semiconductor elements the metallic film parts; (c) forming the resin packages that seal the semiconductor elements and gate portions being integrally formed with the resin packages; (d) etching the lead frame so that the resin packages are separated from the lead frame together with the metallic layer parts; and (e) removing the gate portions from the resin packages by cutting interface portions between the gate portions and the resin packages by a cutting apparatus.

The above object of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: upper and lower rollers arranged so as to sandwich a transportation path of an adhesive tape to which the resin packages connected through gate portions are attached; and the upper and lower rollers bending interface portions between the resin packages and the gate portions so that the resin packages can be separated from the gate portions.

The above object of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a press tool arranged so as to correspond to gate portions that connect the resin packages to which an adhesive tape is attached or interface portions between the resin packages and the gate portions; and the press tool pressing the gate portions or the interface portions so that the resin packages can be separated from the gate portions.

The above object of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a high-pressure water injection nozzle injecting high-pressure water to gate portions that connect the resin packages to which an adhesive tape is attached or interface portions between the resin packages and the gate portions; and the high-pressure water pressing the gate portions or the interface portions so that the resin packages can be separated from the gate portions.

The above object of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a laser generating apparatus applying a laser beam to gate portions that connect the resin packages to which an adhesive tape is attached or interface portions between the resin packages and the gate portions; and the laser beam pressing the gate portions or the interface portions so that the resin packages can be separated from the gate portions.

The above-mentioned object of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a cutter arranged so as to correspond to interface portions between the resin packages and gate portions connecting the resin packages to which an adhesive tape is attached; and the cutter cutting pressing the interface portions so that the resin packages can be separated from the gate portions.

The above-mentioned embodiment of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a member that is provided in a halfway of a transportation path of an adhesive tape to which the resin packages are attached and that has a slit through which the adhesive tape passes; and the slit having a size less than a thickness of the resin packages.

The above-mentioned embodiment of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a push-up member that pushes up the resin packages attached to an adhesive tape to which the resin packages are attached; and the push-up member being provided in a halfway of a transportation path of the adhesive tape.

The above-mentioned object of the present invention is also achieved by an apparatus for fabricating semiconductor devices including resin packages sealing semiconductor elements and external connection terminals respectively having resin projections formed on the resin packages and metallic film parts provided to the resin projections, said apparatus comprising: a high-pressure water generating apparatus which injects high-pressure water to interfaces between the resin packages and an adhesive tape to which the resin packages are attached.

The above-mentioned object of the present invention is achieved by an apparatus for fabricating semiconductor devices including resin packages sealing semiconductor elements and external connection terminals respectively having resin projections formed on the resin packages and metallic film parts provided to the resin projections, said apparatus comprising: a wire that is provided in a halfway of a transportation path of an adhesive tape to which the resin packages are attached and that is located at interfaces between the resin packages and the adhesive resin; and the wire breaking away the resin packages from the adhesive resin while the adhesive tape is traveling.

The above-mentioned object of the present invention is also achieved by an apparatus for fabricating a semiconductor device comprising: a pair of first and second molds used to form resin packages on a lead frame; one of the first and second molds having package cavities for defining the resin packages and anchor cavities for defining gate portions that connect the resin packages; and the rein packages and the anchor cavities being alternately arranged.

The above-mentioned object of the present invention is also achieved by an apparatus for fabricating semiconductor devices including resin packages sealing semiconductor elements and external connection terminals respectively having resin projections formed on the resin packages and metallic film parts provided to the resin projections, the resin packages having an asymmetrical shape, said apparatus comprising: a gate break part that separates the resin packages from the gate portions; an orientation part that orients the semiconductor devices from the gate break part in a predetermined direction; and an outer appearance check part that checks outer appearances of the semiconductor devices from the orientation part, the orientation part having a transportation passage having a slope and a stopper associated with the transportation passage, the slope being inclined at an angle which causes the semiconductor devices incorrectly oriented in a first direction to drop from the transportation passage due to the symmetrical shape of the resin packages, the semiconductor devices incorrectly oriented in a second direction butting against the stopper, which thus causes the semiconductor devices to drop from the transportation passage.

The above-mentioned object of the present invention is also achieved by an apparatus for fabricating semiconductor devices including resin packages sealing semiconductor elements and external connection terminals respectively having resin projections formed on the resin packages and metallic film parts provided to the resin projections, the resin packages having an asymmetrical shape, said apparatus comprising: a transportation passage over which the semiconductor devices are transported due to self-weights thereof; an orientation part that orients the semiconductor devices from the transportation passage in a predetermined direction; and a measurement part that performs a test of the semiconductor devices in a state in which the semiconductor devices are placed on a measurement plate one by one, the measurement part having a movement apparatus that moves the semiconductor devices to the measurement board one by one.

BRIEF DESCRIPTION OF THE DRAWINGS

Other objects, features and advantages of the present invention will become more apparent from the following detailed description when read in conjunction with the accompanying drawings, in which:

FIG. 1A is a cross-sectional view of a semiconductor device of a conventional SSOP type;

FIG. 1B is a bottom view of the semiconductor device shown in FIG. 1A;

FIG. 1C is a top view of the semiconductor device shown in FIG. 1A;

FIG. 42A is a plan view for explaining power supply portions formed in a lead frame;

FIG. 42B is a cross-sectional view taken along a line A—A shown in FIG. 42A;

FIG. 50 is a cross-sectional view of the lead frame observed when the sealing step is completed;

FIG. 51A is a plan view of the lead frame observed when the sealing step is completed;

FIG. 51B is a side view of the lead frame observed when the sealing step is completed;

FIG. 52A is a plan view showing a tape arranging step of the method of the semiconductor device according to the tenth embodiment of the present invention;

FIG. 52B is a side view of the tape arranging step of the method of the semiconductor device according to the tenth embodiment of the present invention;

FIG. 54A is a plan view of semiconductor devices observed when the sealing step is completed;

FIG. 54B is a side view of the semiconductor devices observed when the sealing step is completed;

FIG. 57A is a plan view showing a fourth variation of the sealing step of the method of producing the semiconductor device according to the tenth embodiment of the present invention;

FIG. 57B is a side view showing the fourth variation of the sealing step of the method of producing the semiconductor device according to the tenth embodiment of the present invention;

FIG. 85 is a cross-sectional view of the semiconductor device according to the fourteenth embodiment of the present invention in which the device is mounted to a circuit board;

FIGS. 90A, 90B, 90C, 90D, 90E, 90F, 90G, 90H and 90I are respectively side views showing a method of forming stud bumps;

FIG. 107 is a cross-sectional view of a semiconductor device according to a seventeenth embodiment of the present invention;

FIG. 108 is a bottom view of the semiconductor device shown in FIG. 107;

FIG. 109 is a plan view of the semiconductor device shown in FIG. 107 in which inner parts thereof are seen through the package thereof;

FIG. 110 is a cross-sectional view of a semiconductor device according to an eighteenth embodiment of the present invention;

FIG. 111 is a bottom view of the semiconductor device shown in FIG. 110;

FIG. 112 is a cross-sectional view of semiconductor devices arranged on a circuit board according to the eighteenth embodiment of the present invention;

FIG. 113 is a cross-sectional view of an arrangement different from that shown in FIG. 112;

FIG. 114 is a cross-sectional view of an arrangement different from the arrangements shown in FIGS. 112 and 113, in which semiconductor devices are inclined on the circuit board;

FIG. 115 is a cross-sectional view of the semiconductor device mounted on the circuit board according to the eighteenth embodiment of the present invention;

FIG. 116 is a cross-sectional view of a semiconductor device according to a nineteenth embodiment of the present invention;

FIG. 117 is a top view of the semiconductor device shown in FIG. 116, in which inner parts are seen through a resin package thereof;

FIG. 118 is a cross-sectional view of a metallic film having a single-layer structure;

Figure 119:
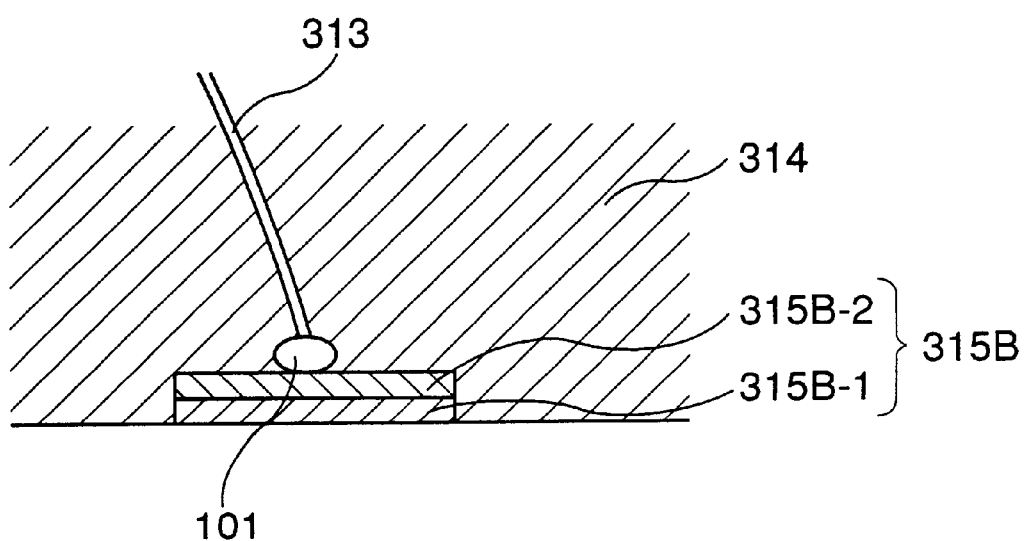
Figure 120:
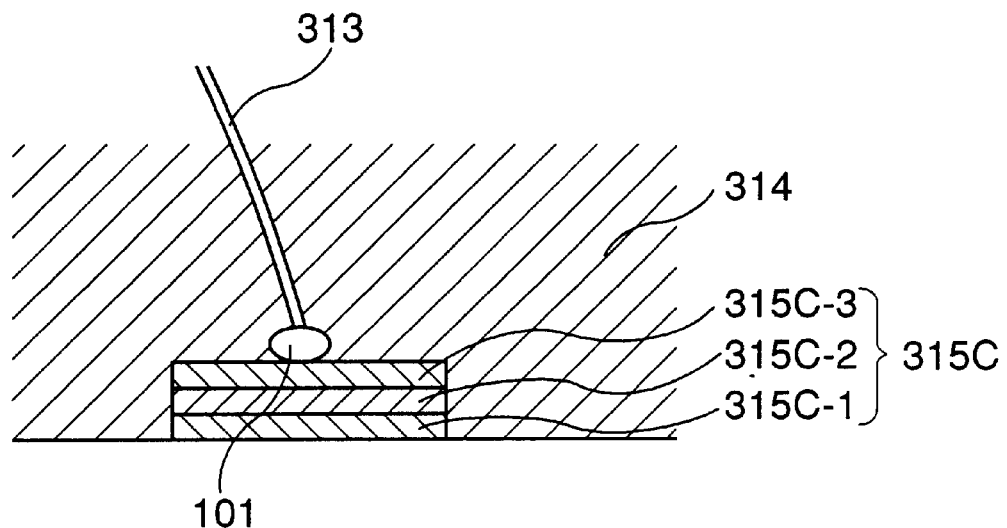
Figure 121:
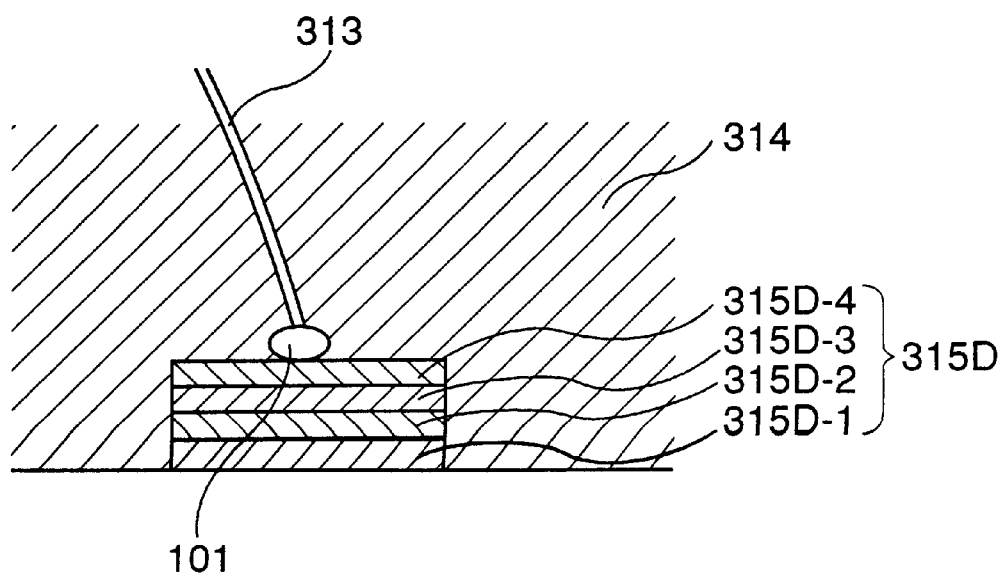
Figure 122:
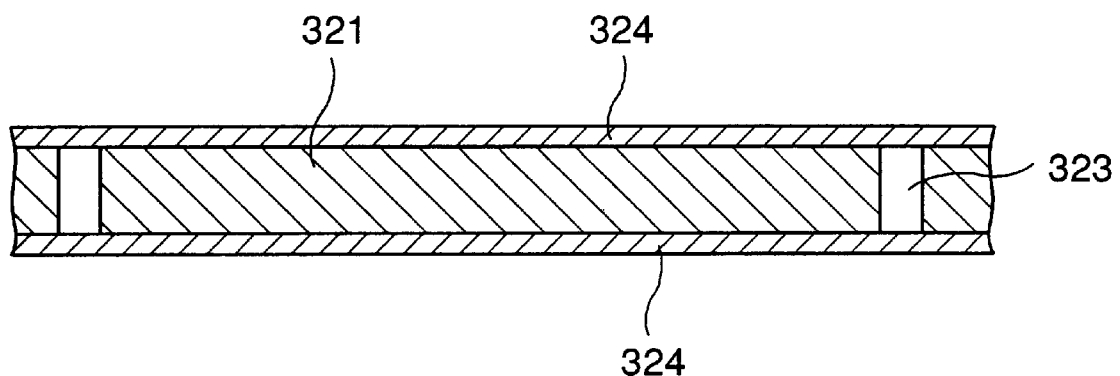
Figure 123:
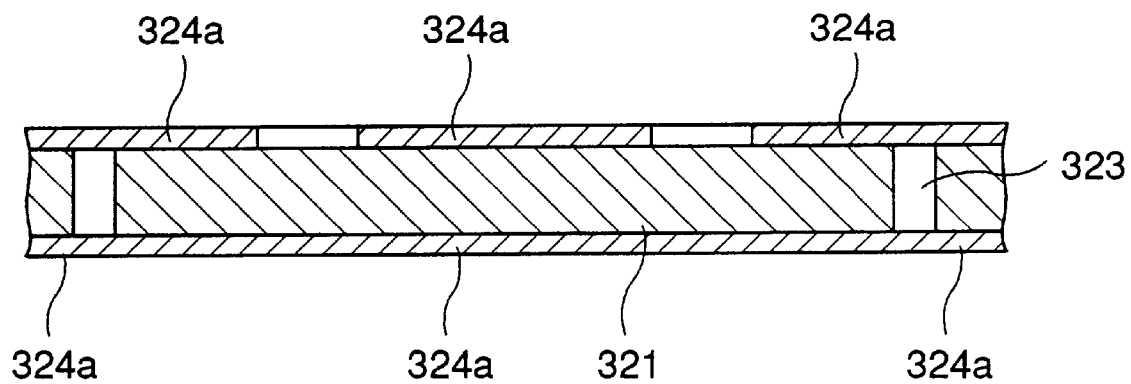
Figure 124:
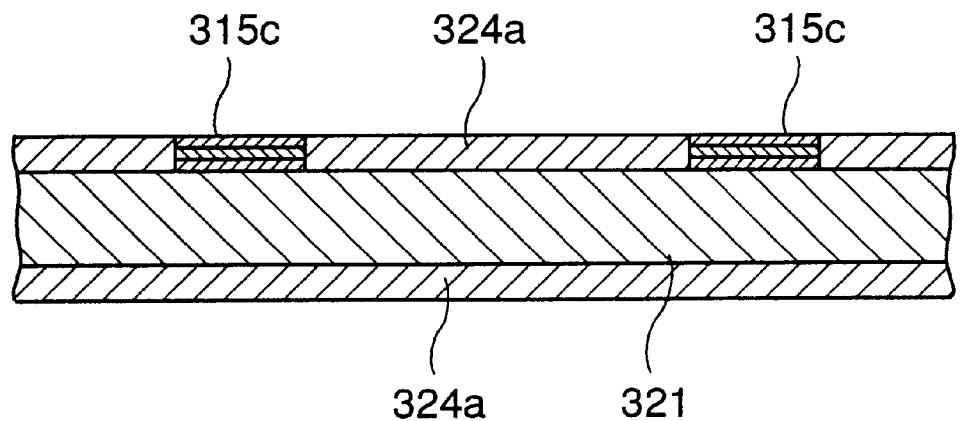
Figure 125:
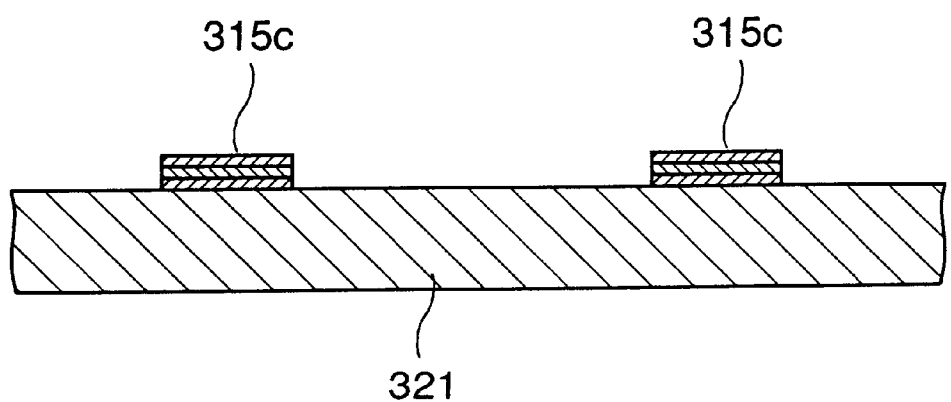
Figure 126:
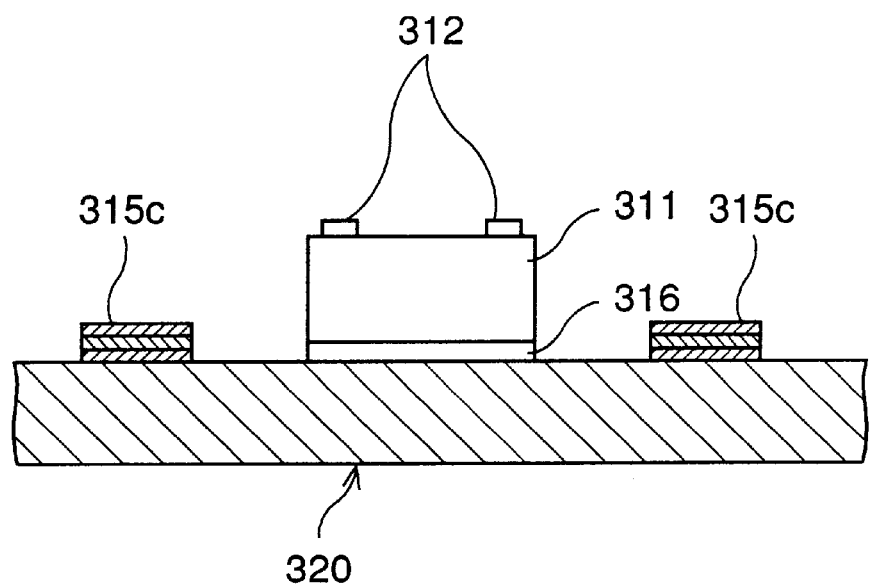
Figure 127:
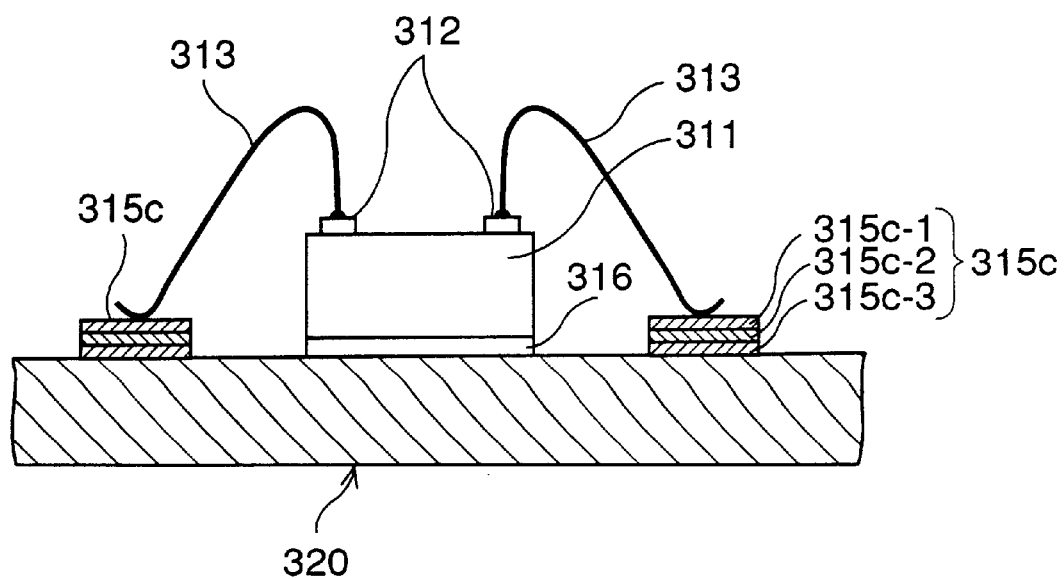
Figure 128:
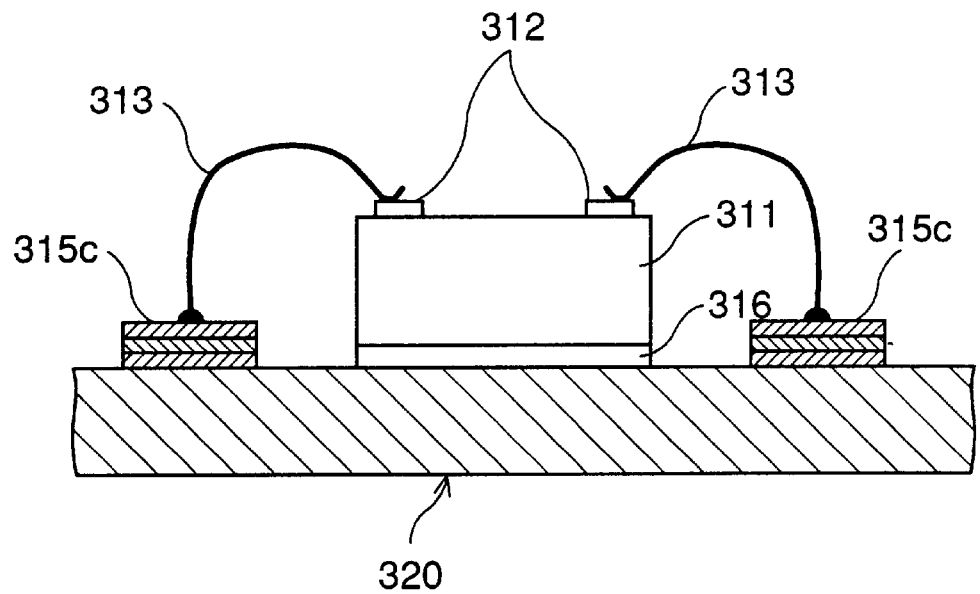
Figure 129:
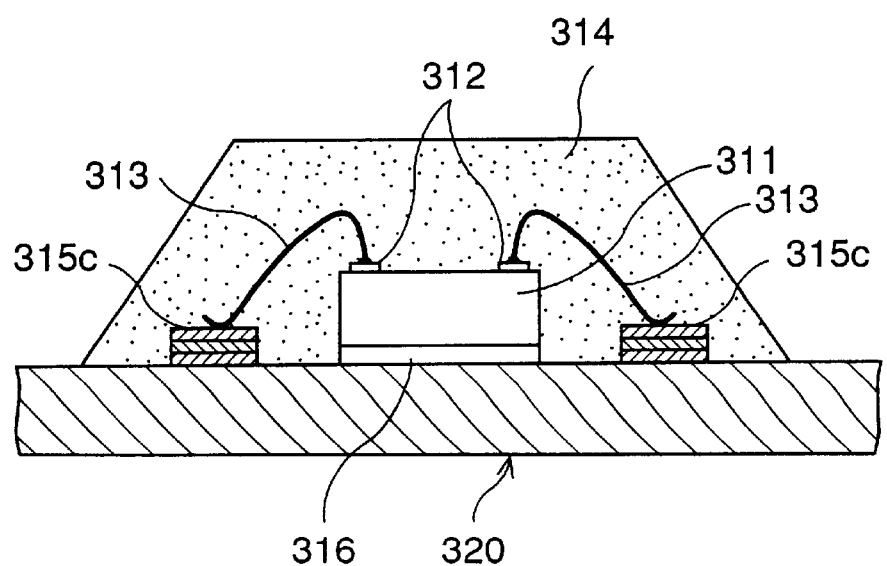
Figure 130:
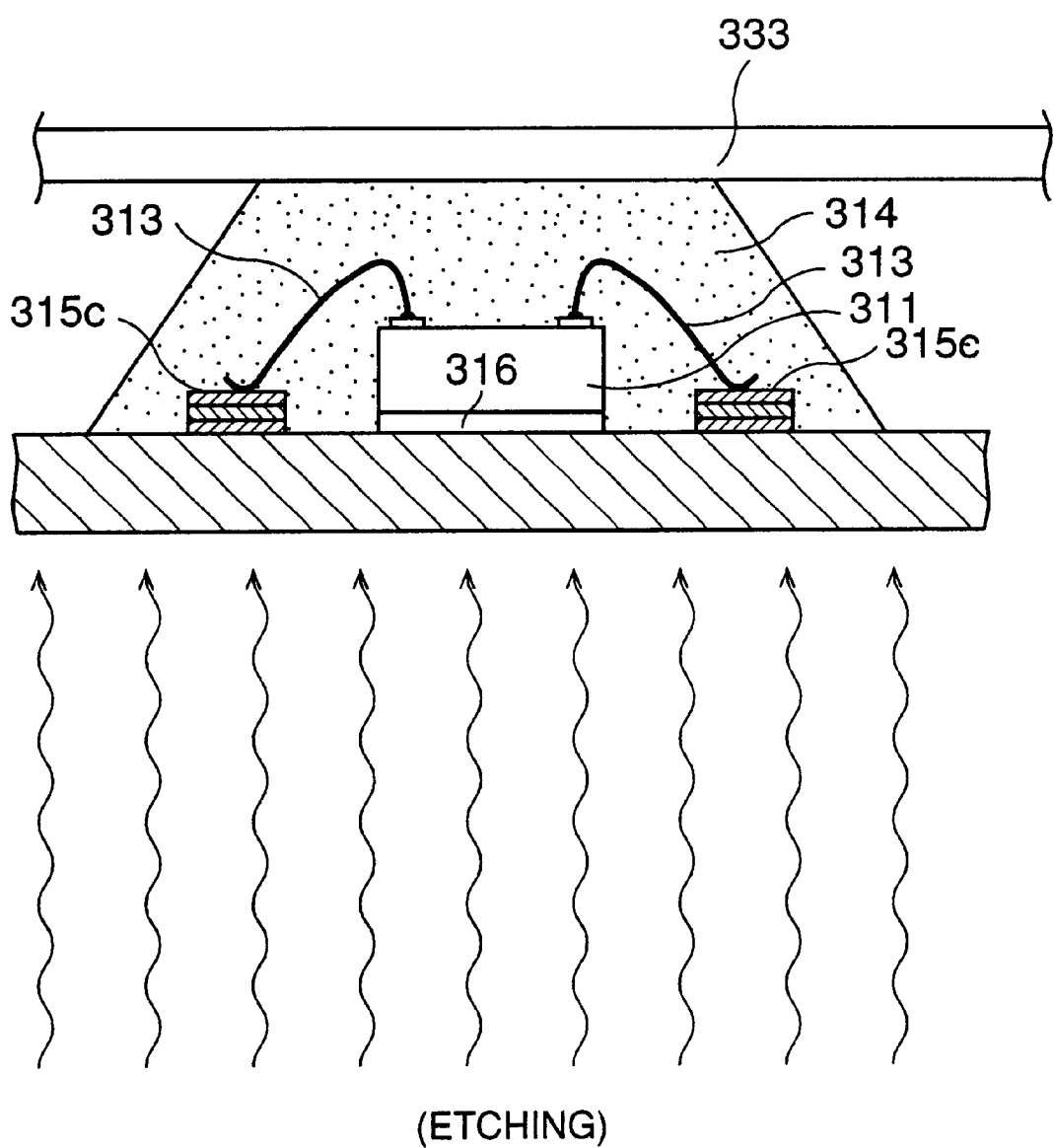
Figure 131:
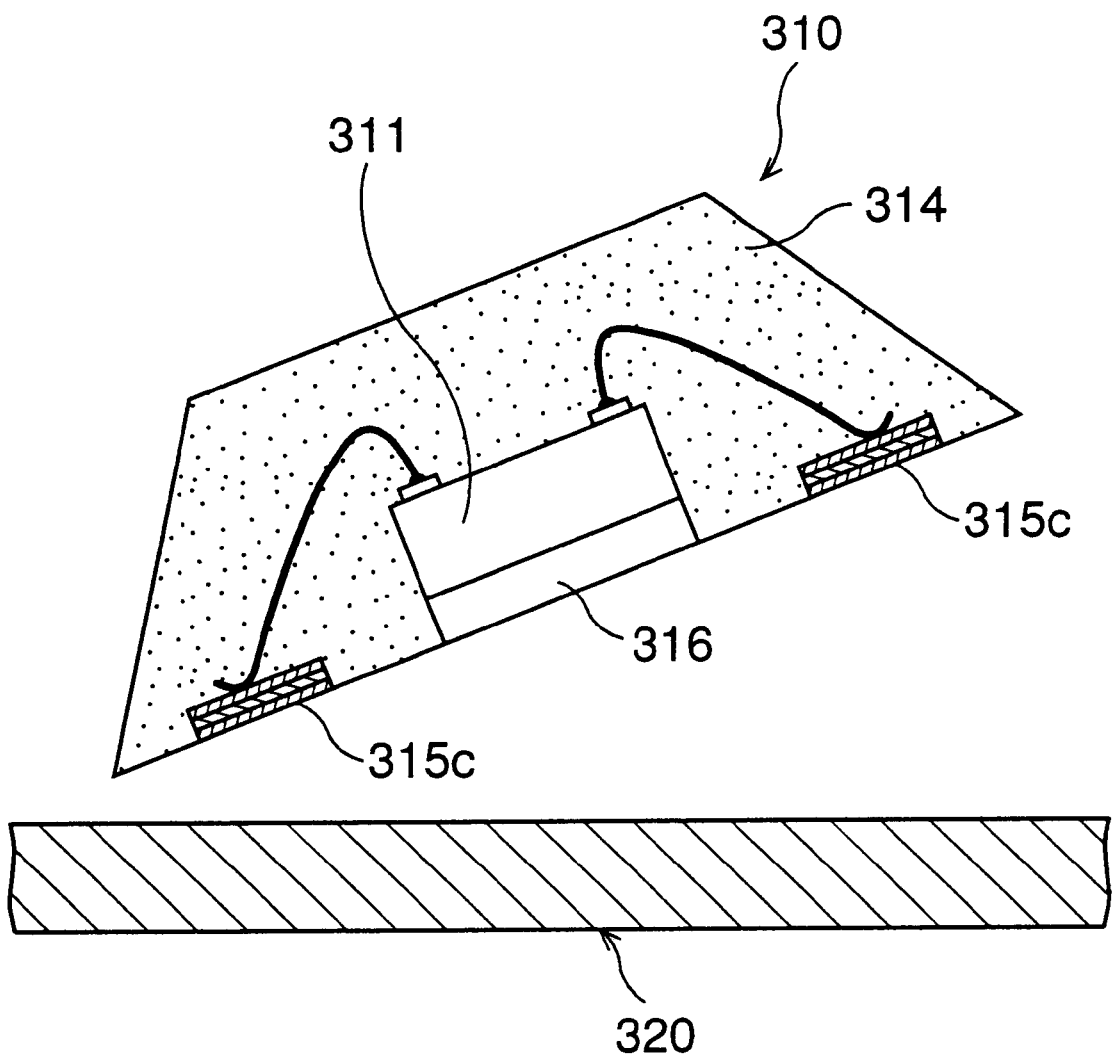
Figure 132A:
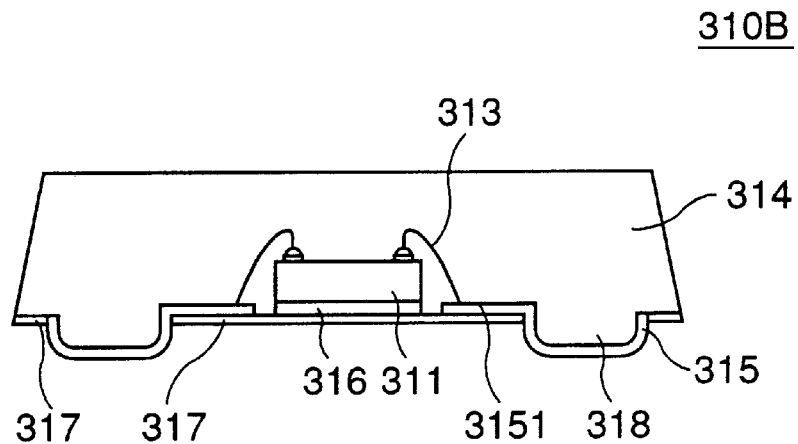
Figure 132B:
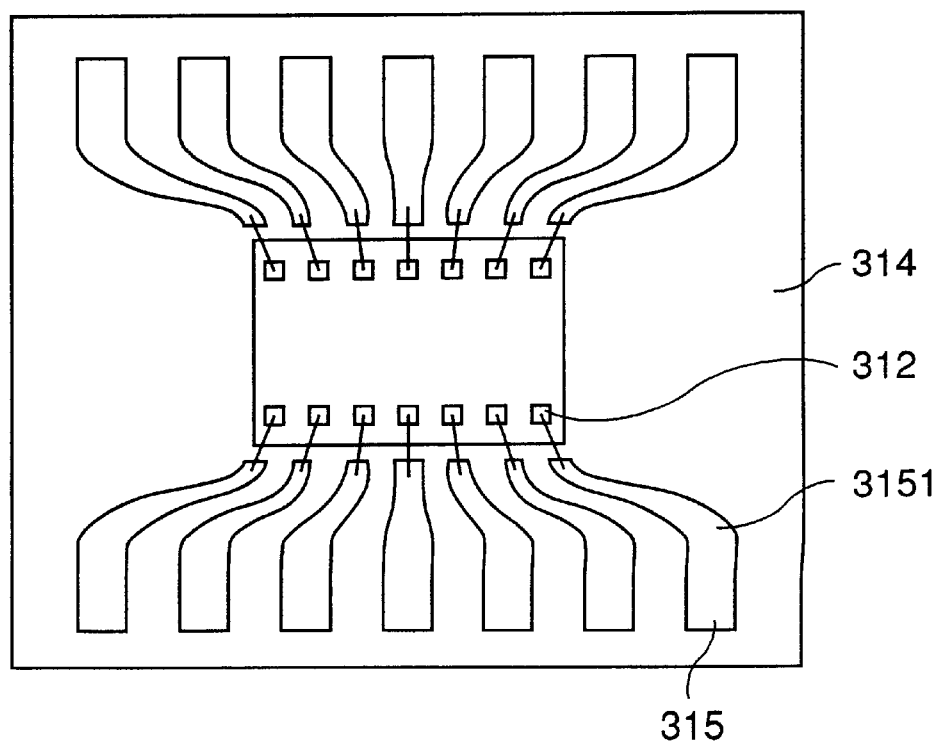
Figure 133:
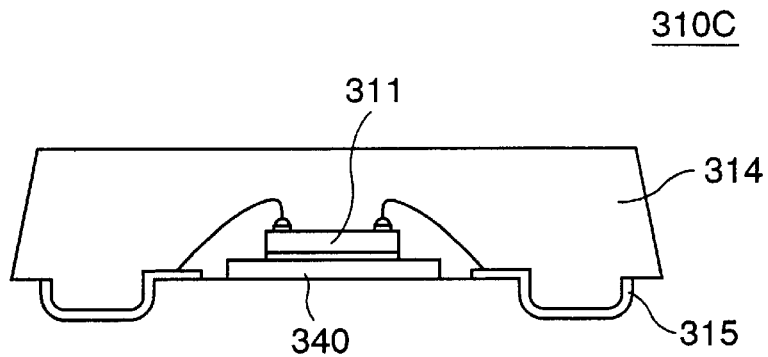
Figure 134:
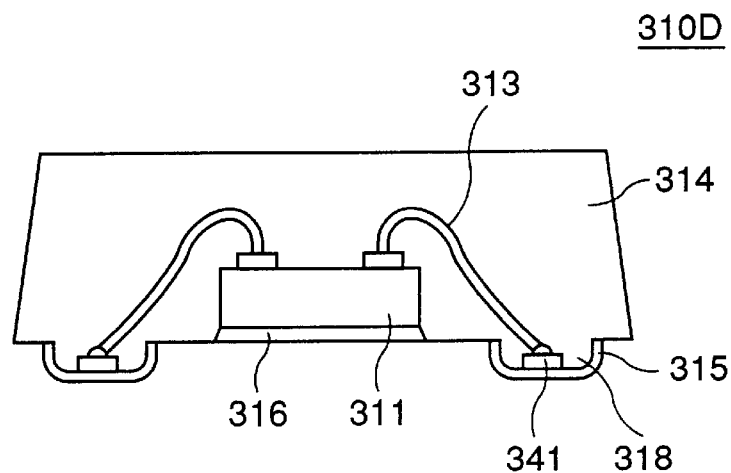
Figure 135:
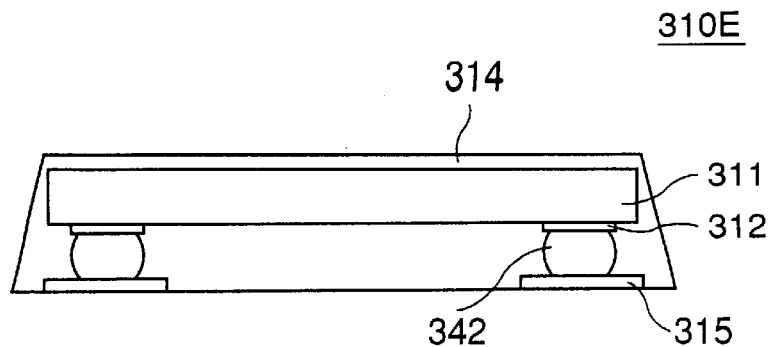
Figure 136A:
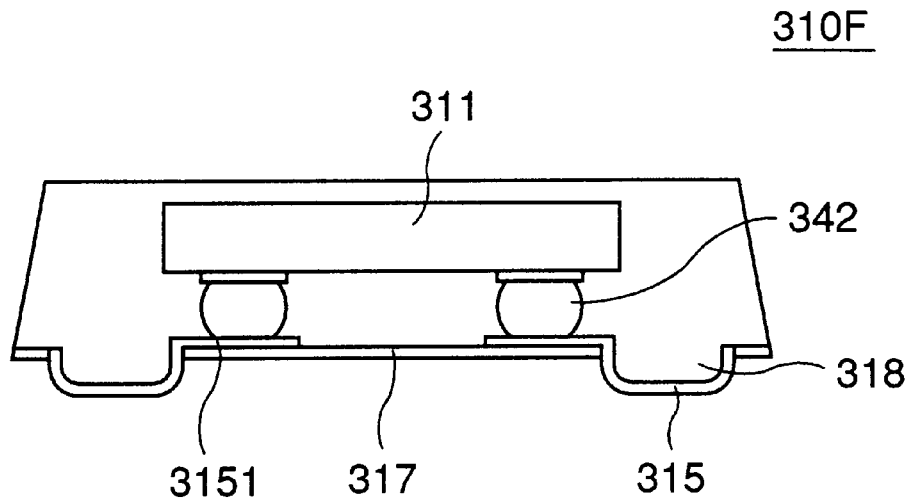
Figure 136B:
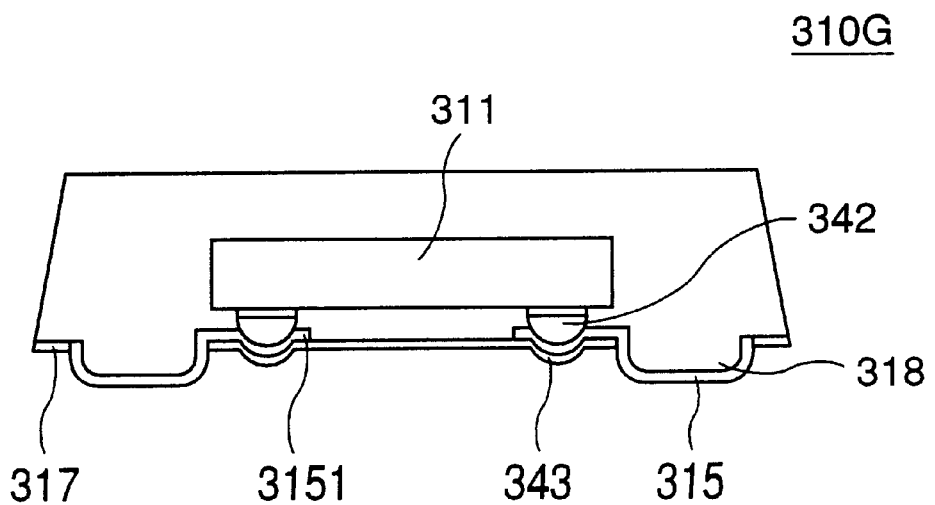
Figure 137:
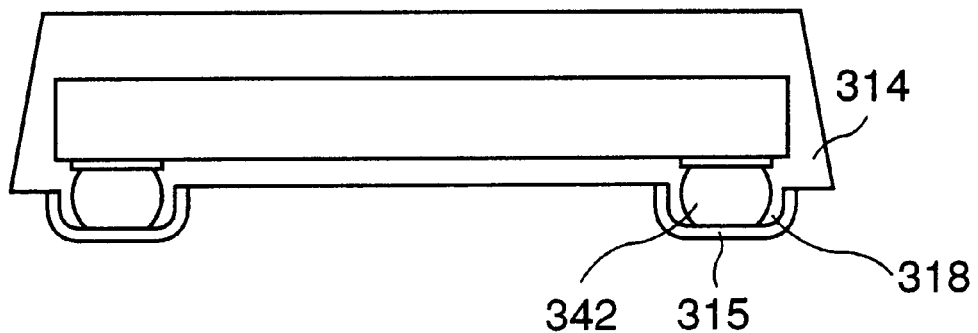
Figure 138:
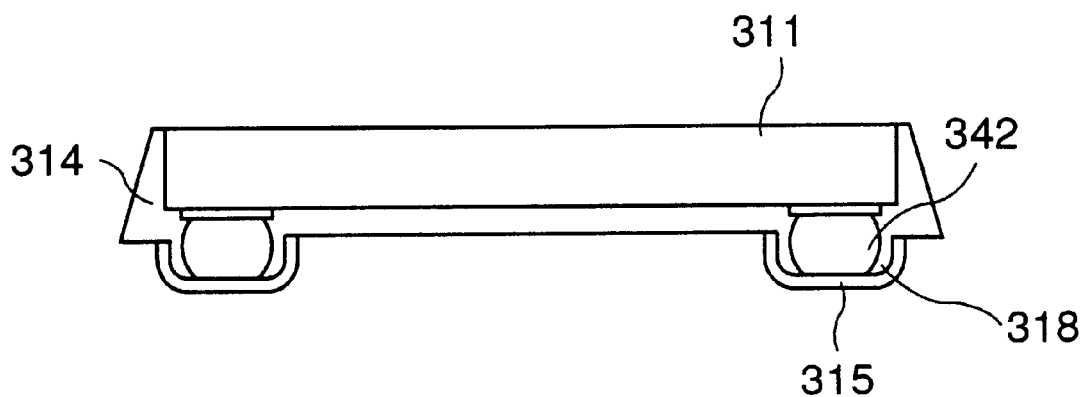
Figure 139A:
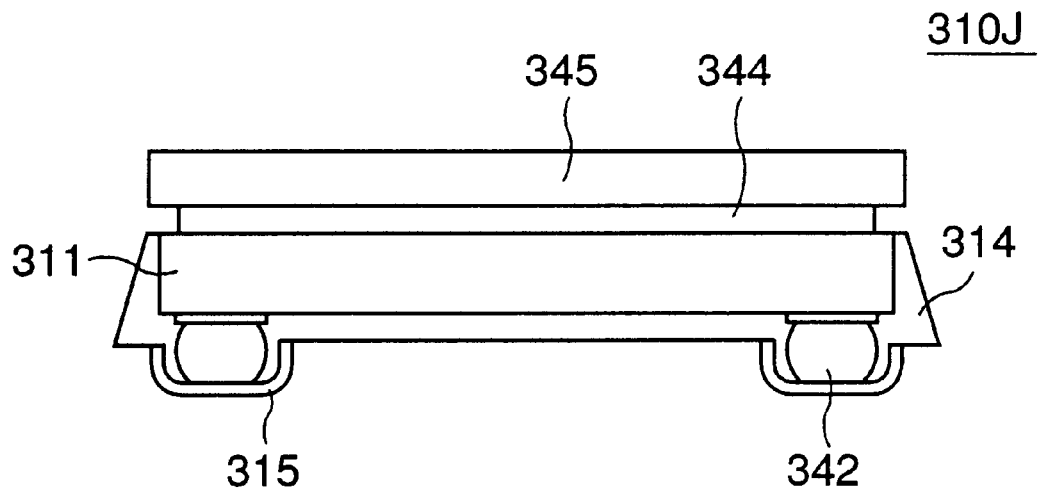
Figure 139B:
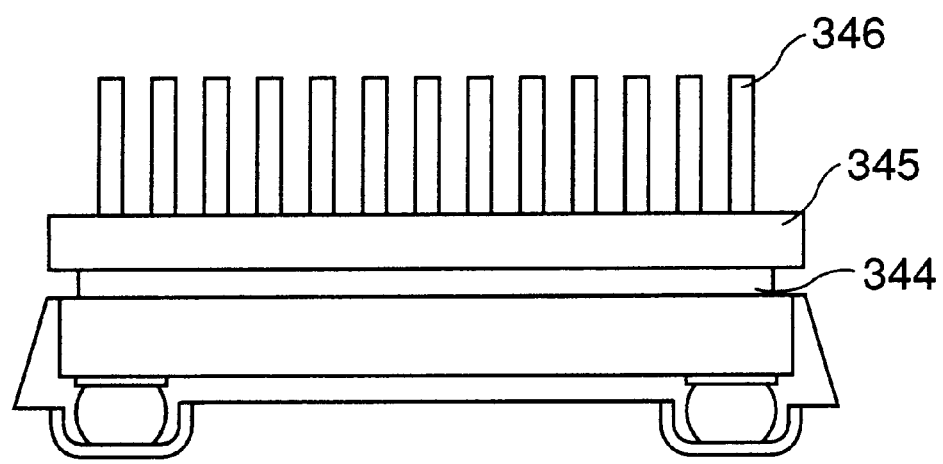
Figure 140:
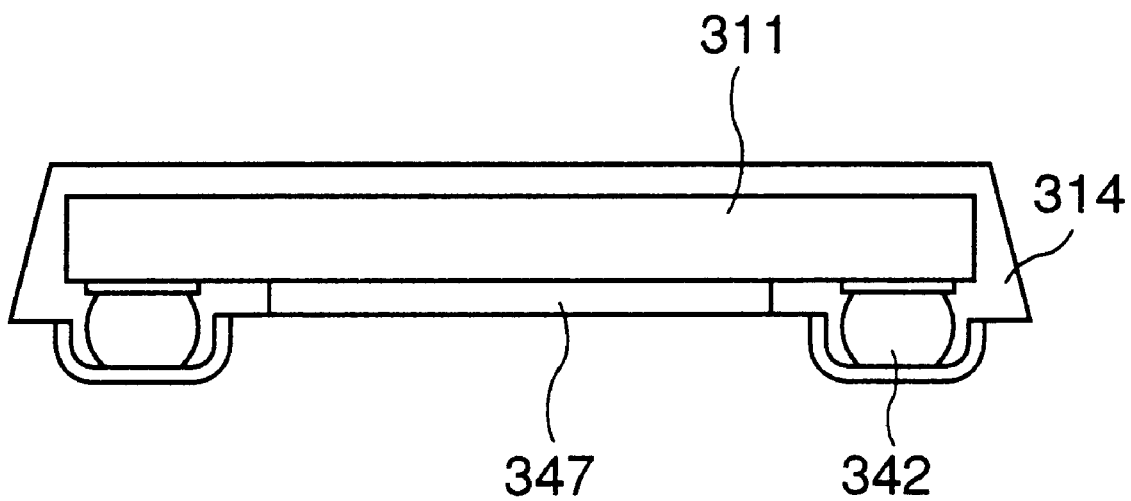
Figure 141A:
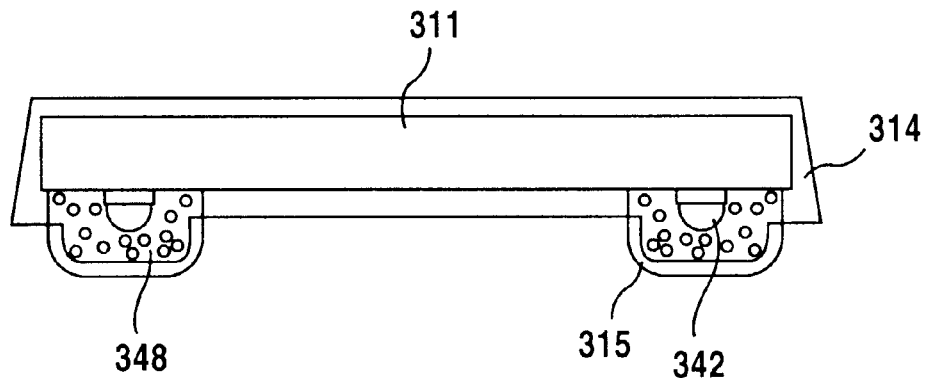
Figure 141B:
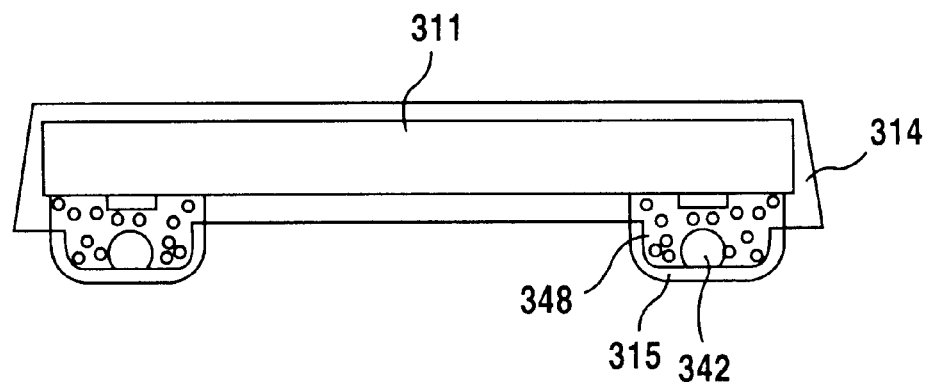
Figure 141C:
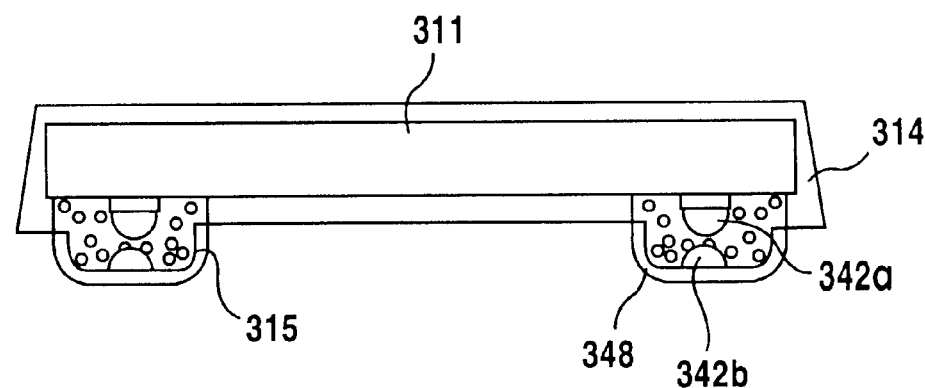
Figure 142:
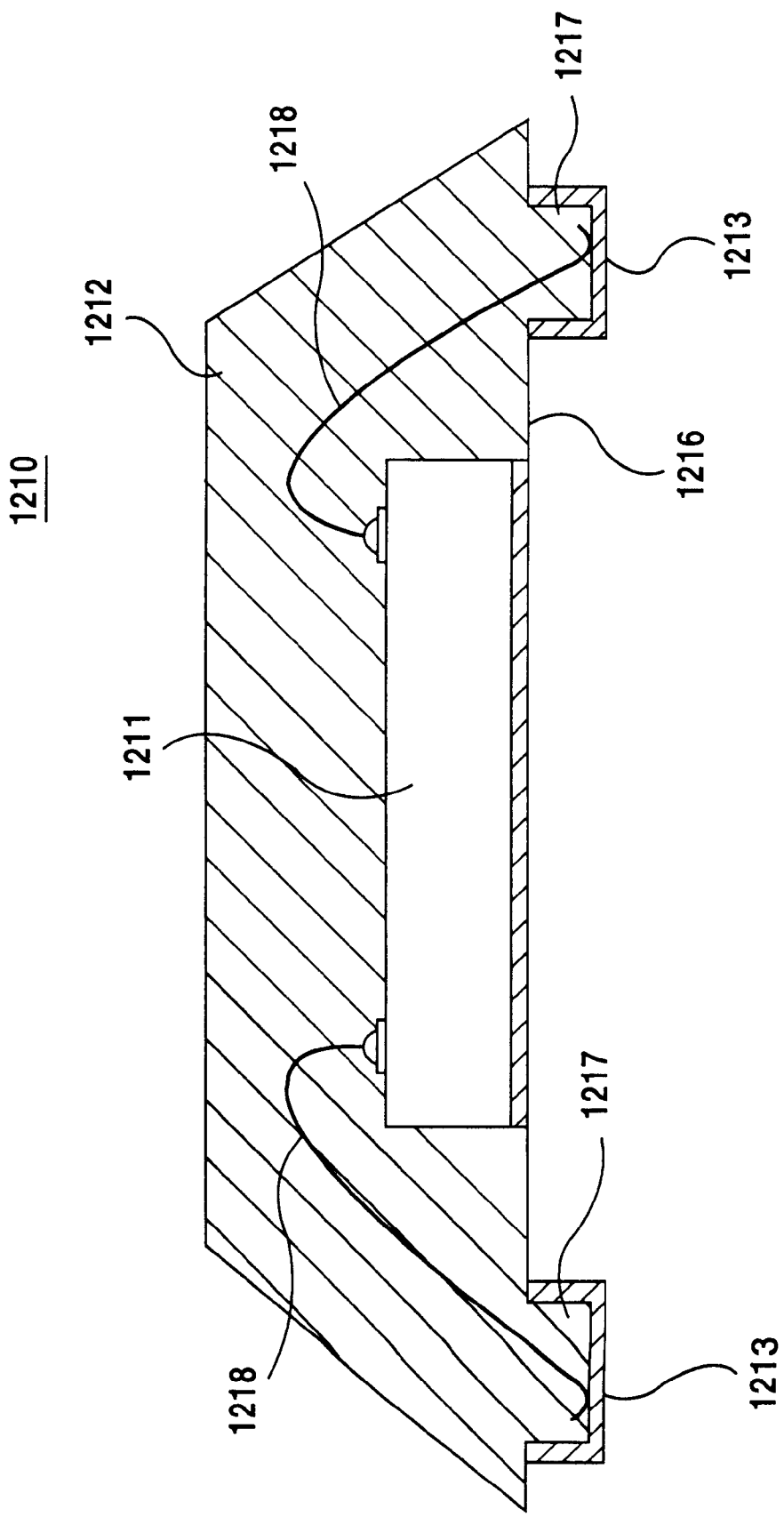
Figure 143A:
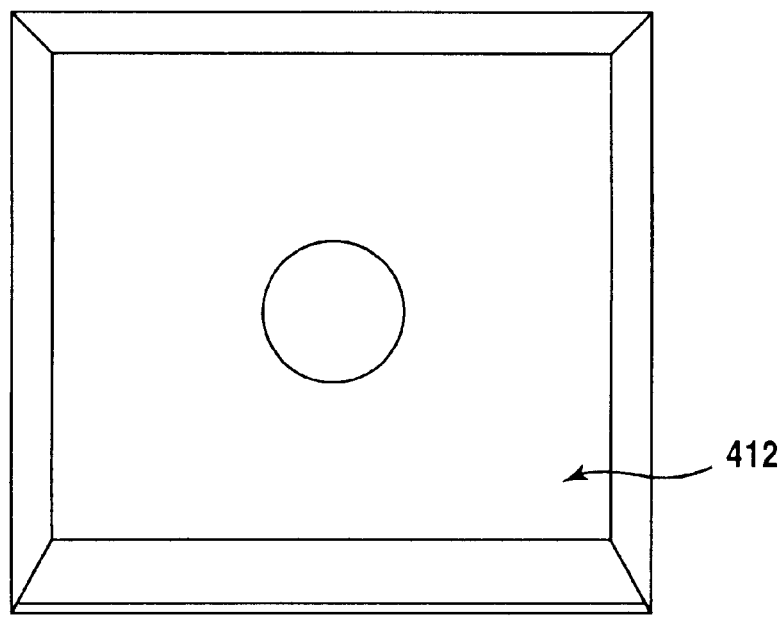
Figure 143B:
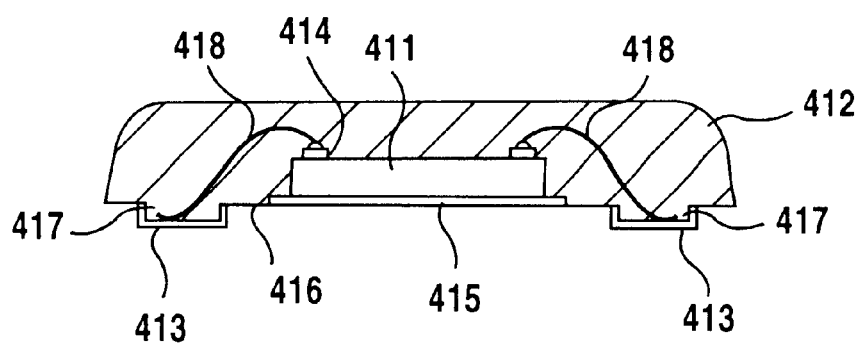
Figure 144:
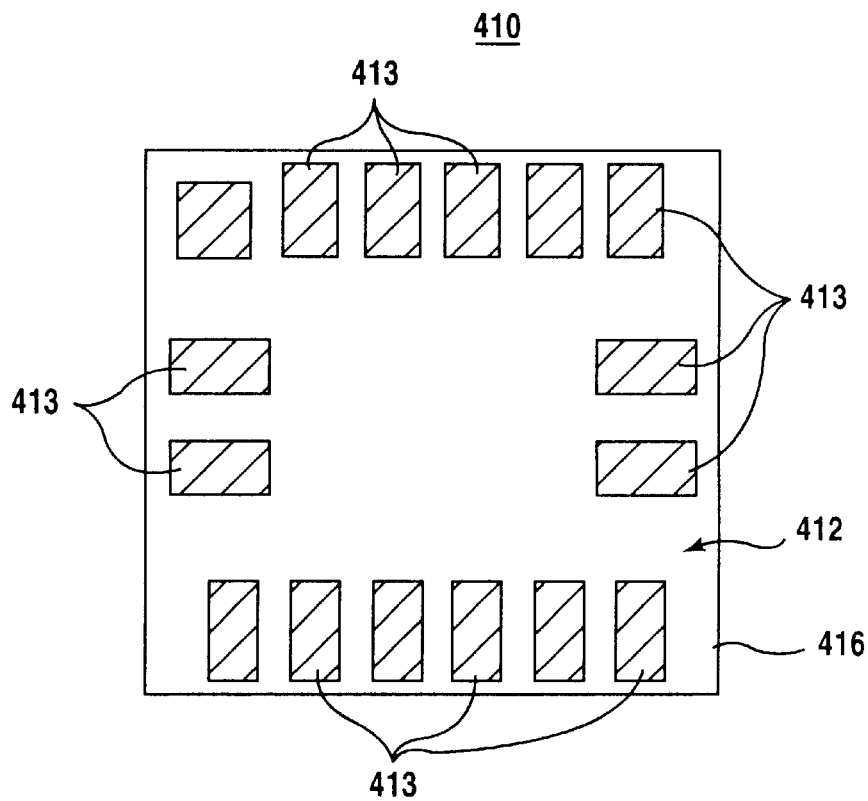
Figure 145:
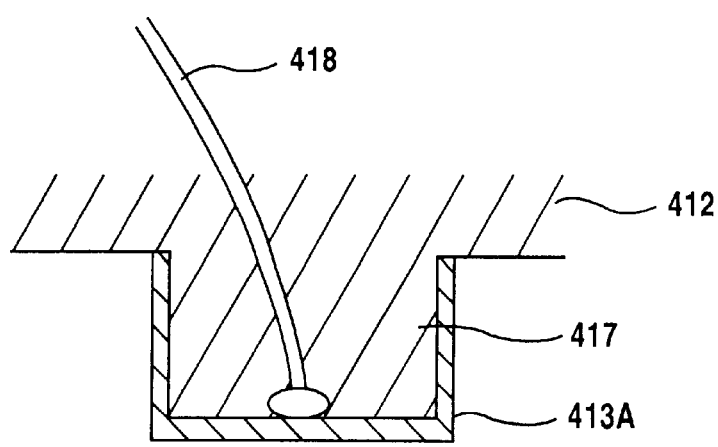
Figure 146:
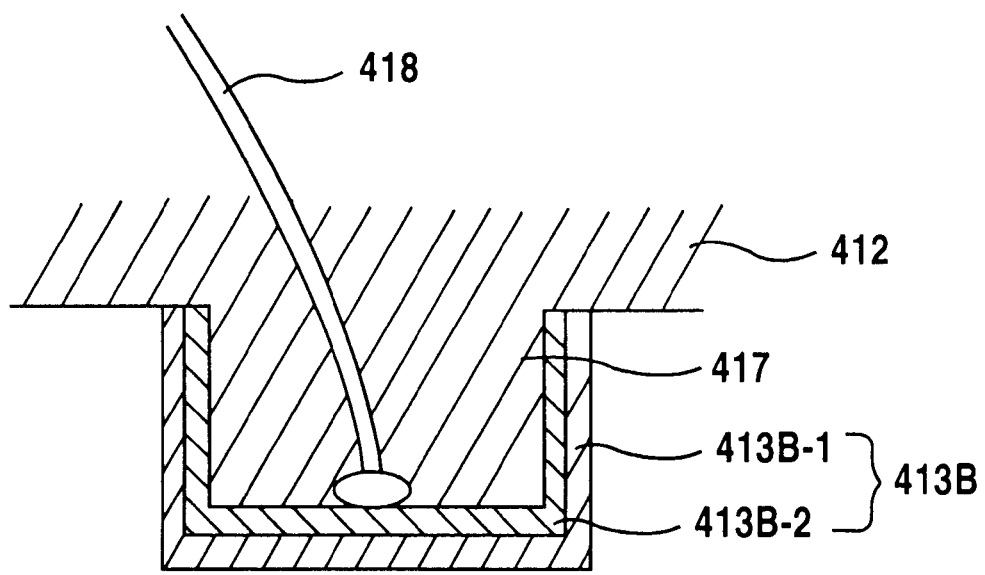
Figure 147:
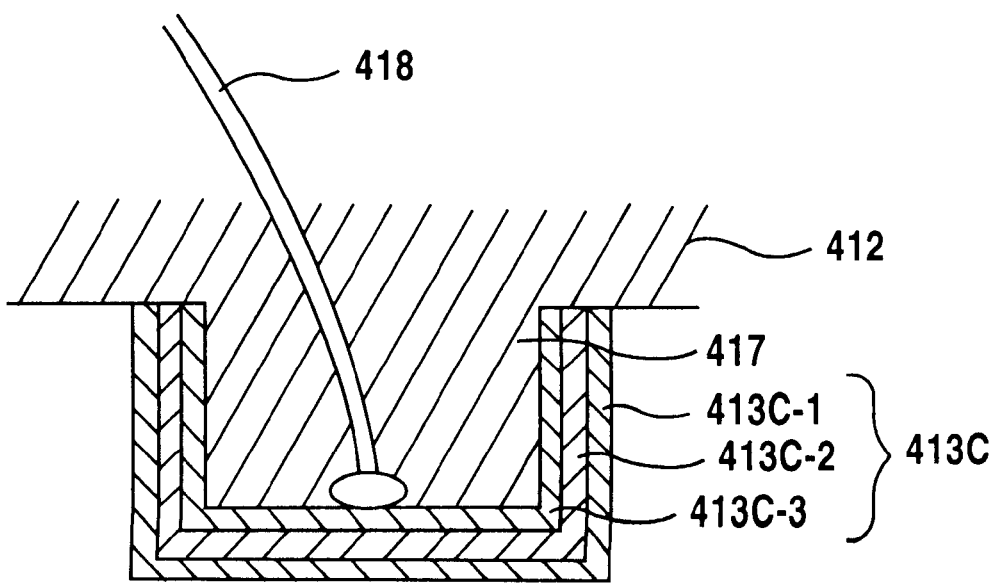
Figure 148:
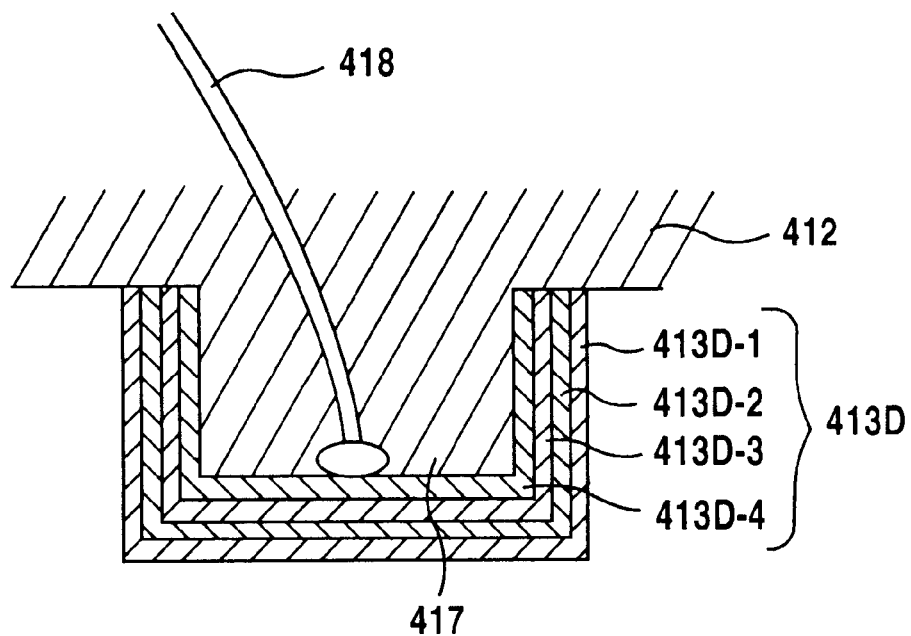
Figure 149:
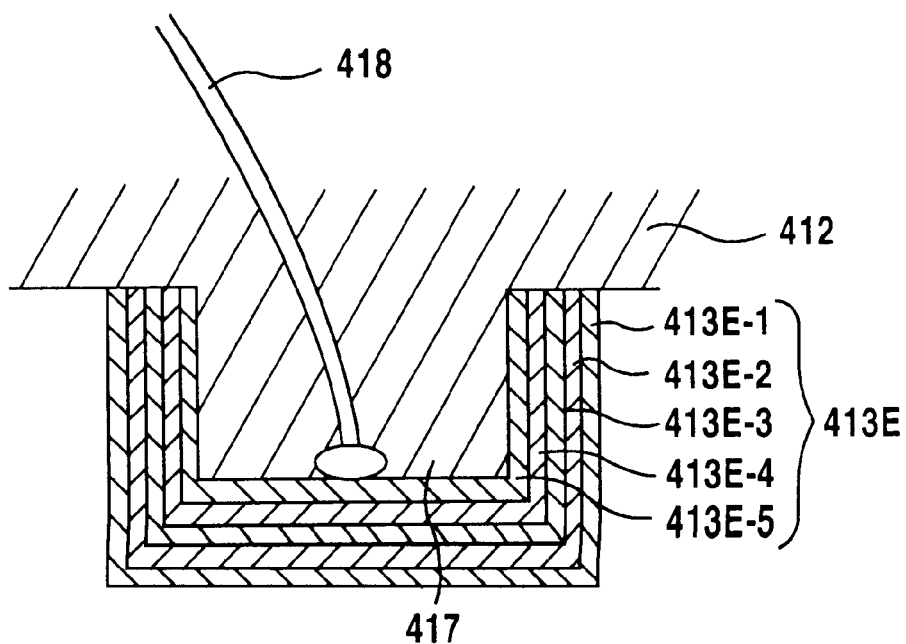
Figure 150A:
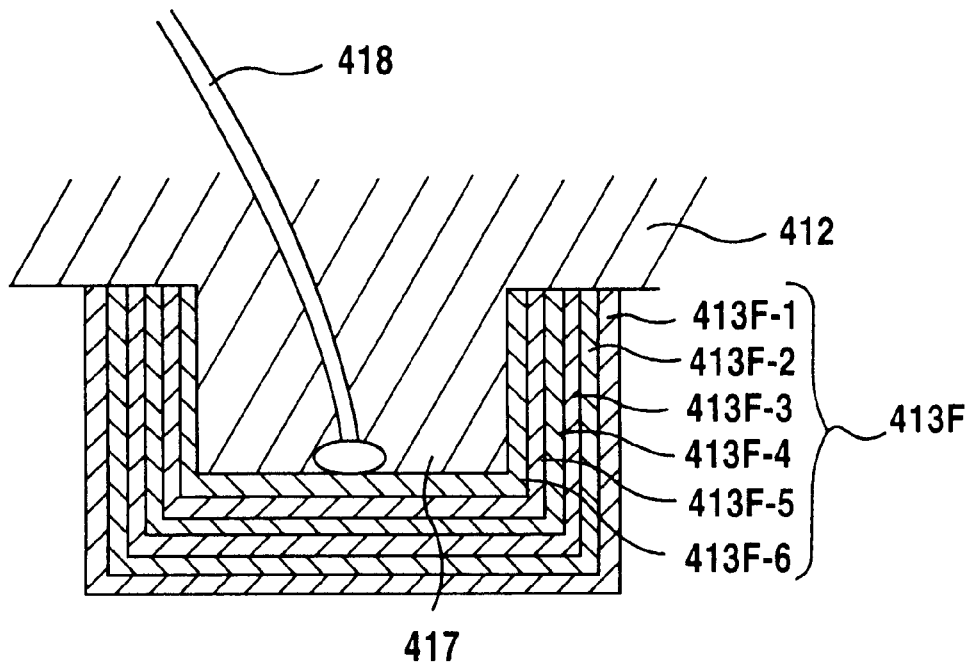
Figure 150B:
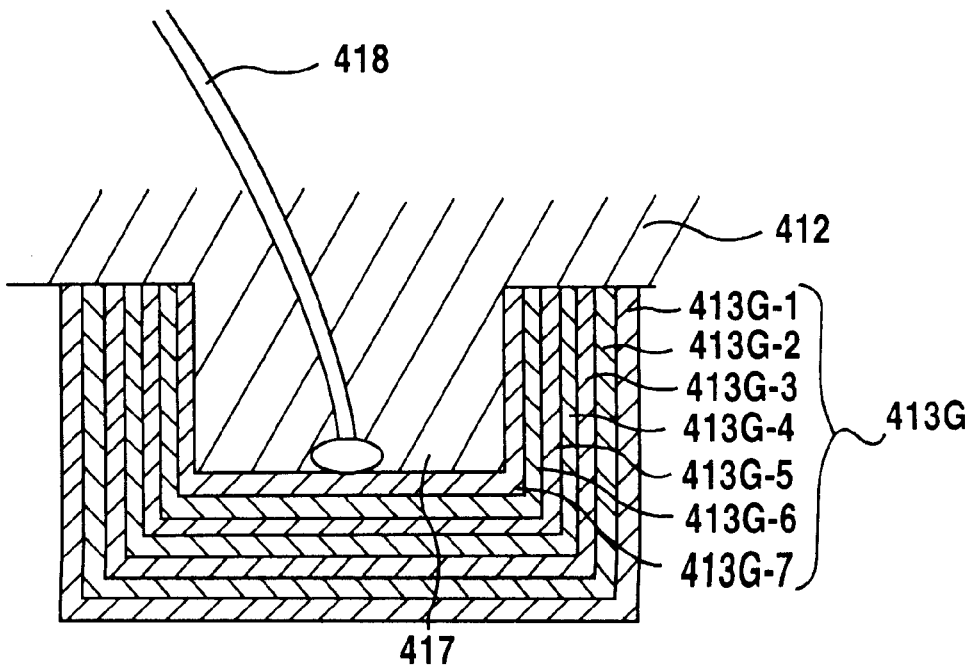
Figure 151:
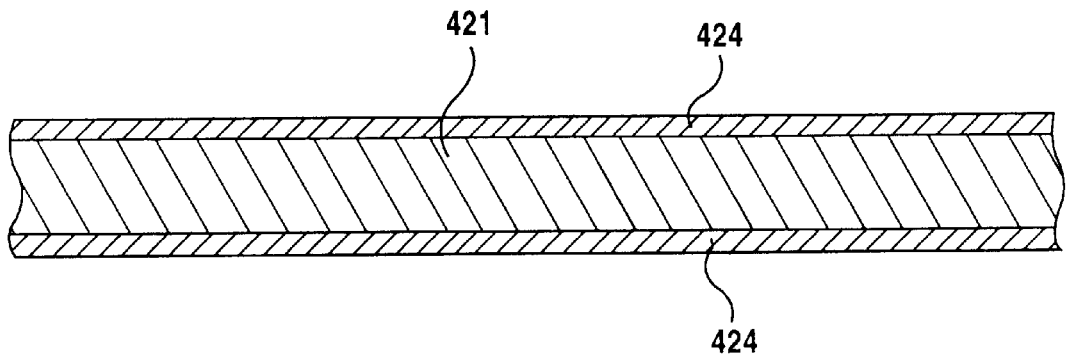
Figure 152:
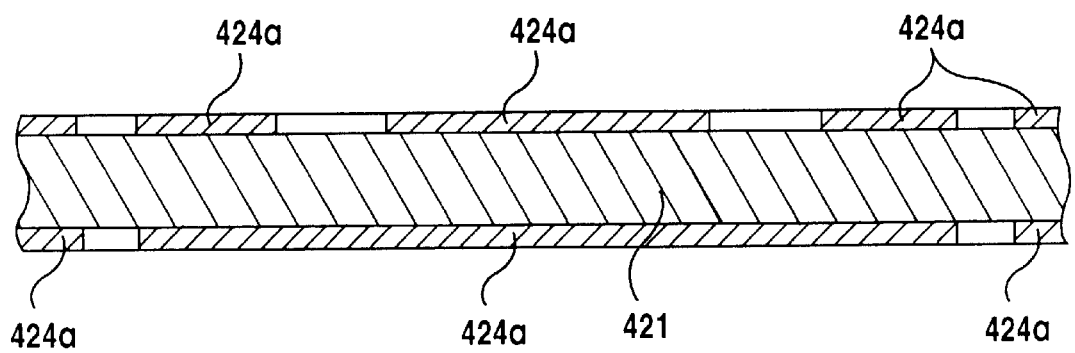
Figure 153:
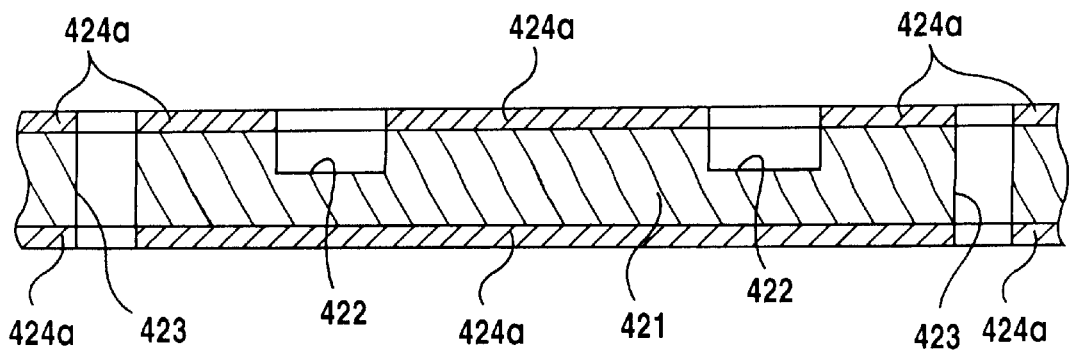
Figure 154:
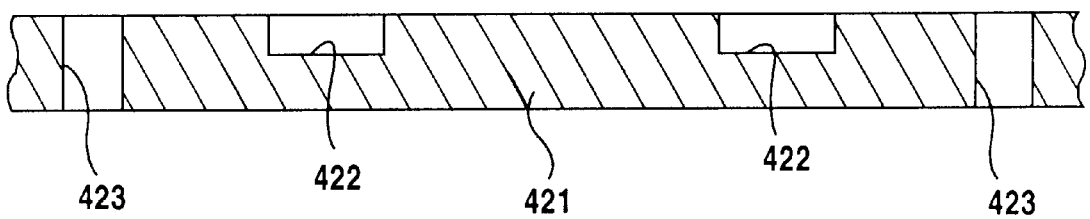
Figure 155:
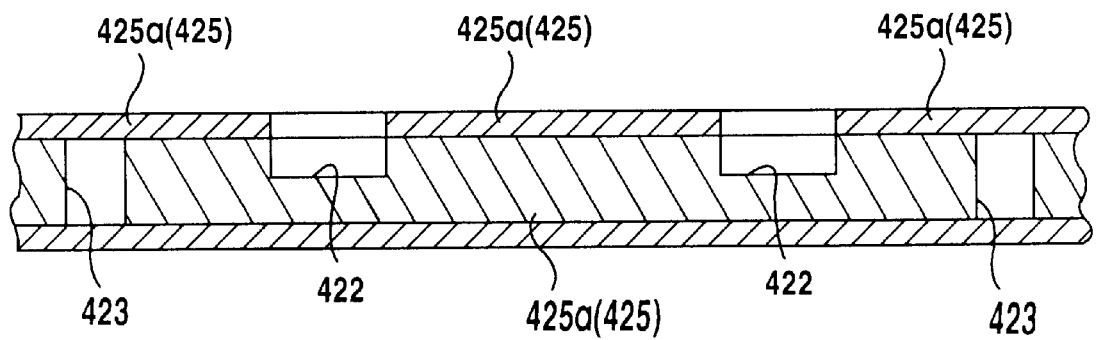
Figure 156:
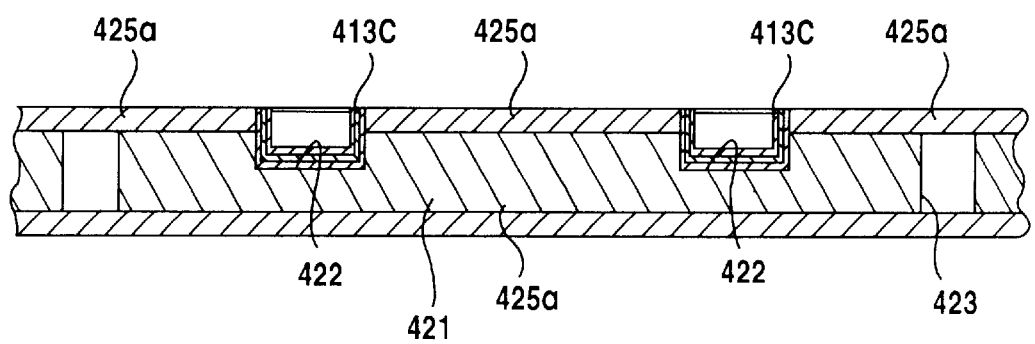
Figure 157:
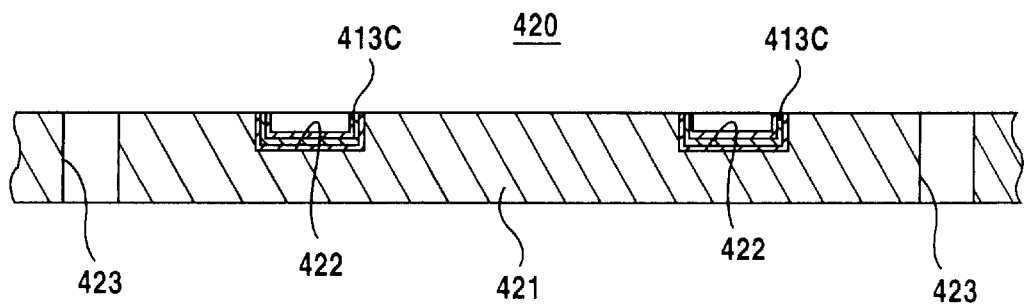
Figure 158:
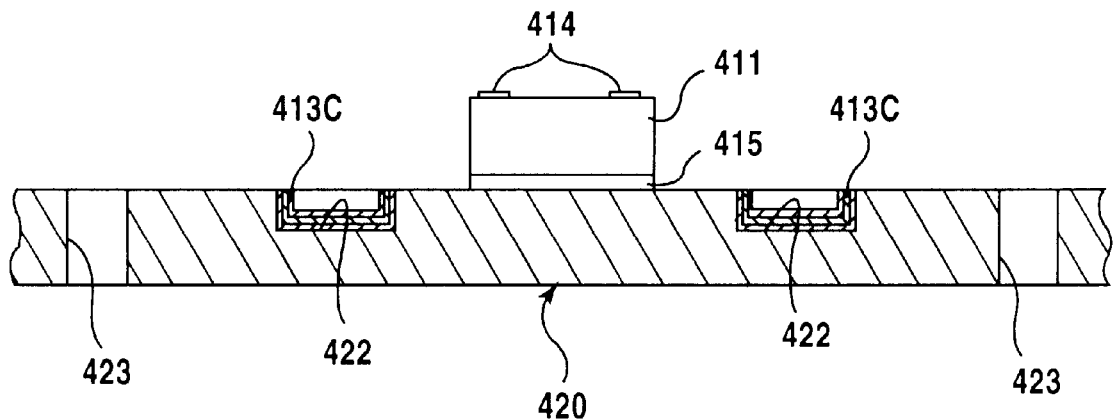
Figure 159:
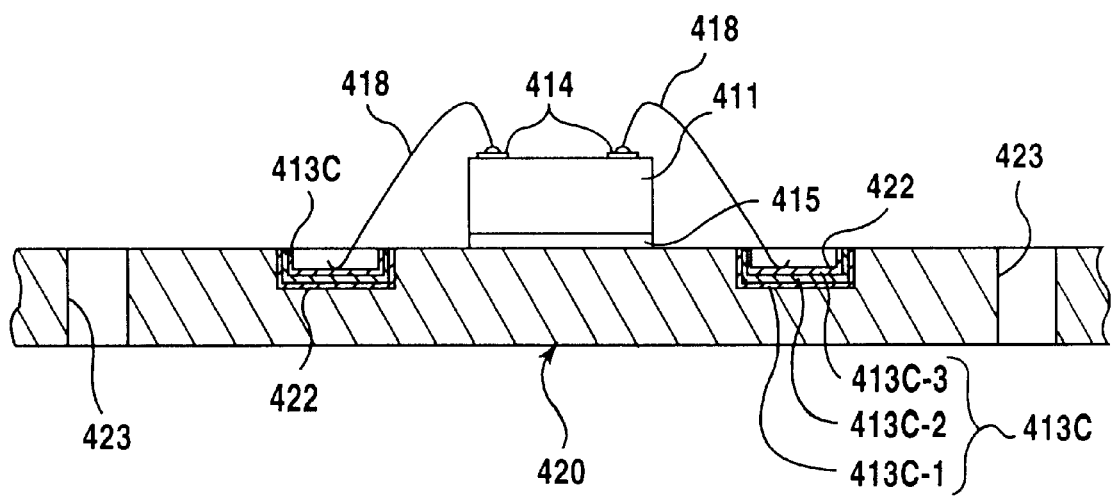
Figure 160:
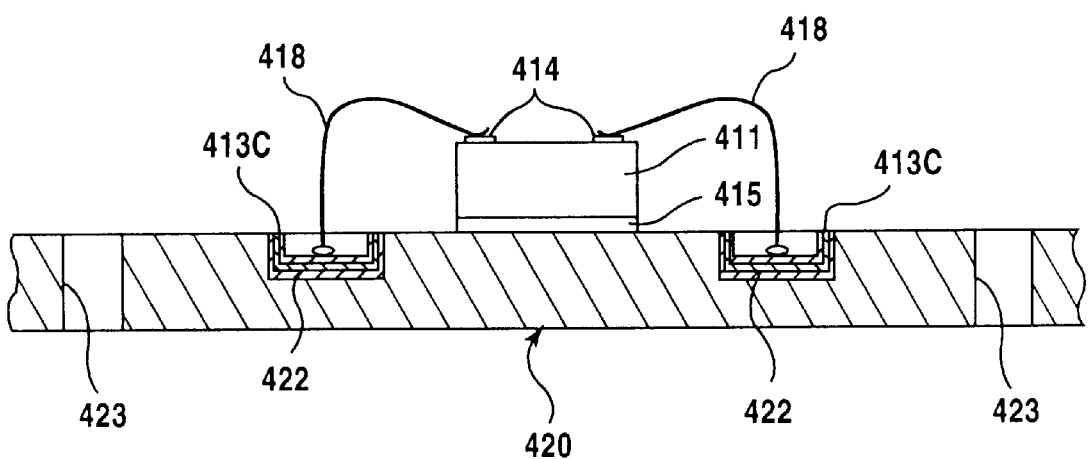
Figure 163:
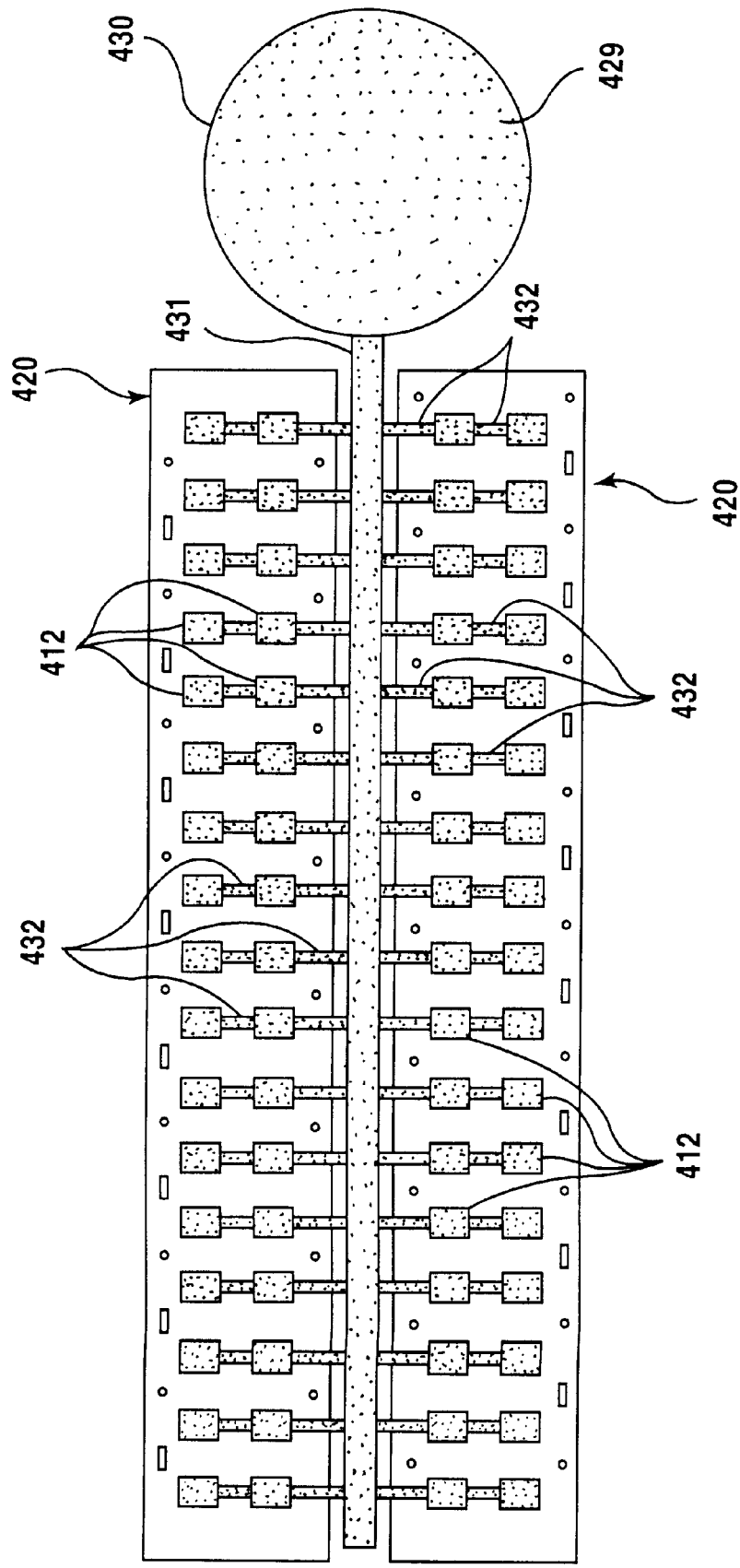
Figure 164:
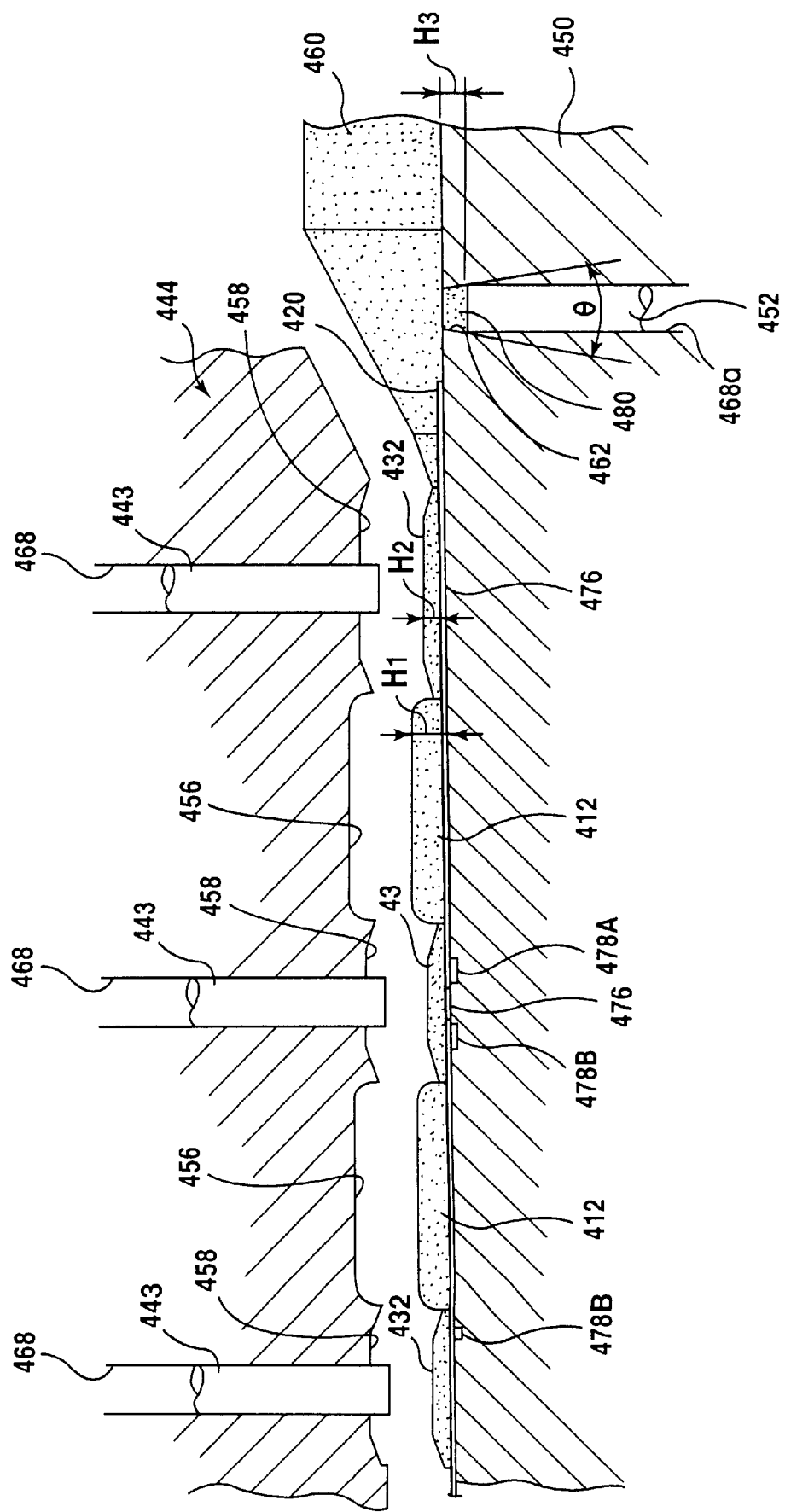
Figure 164B:
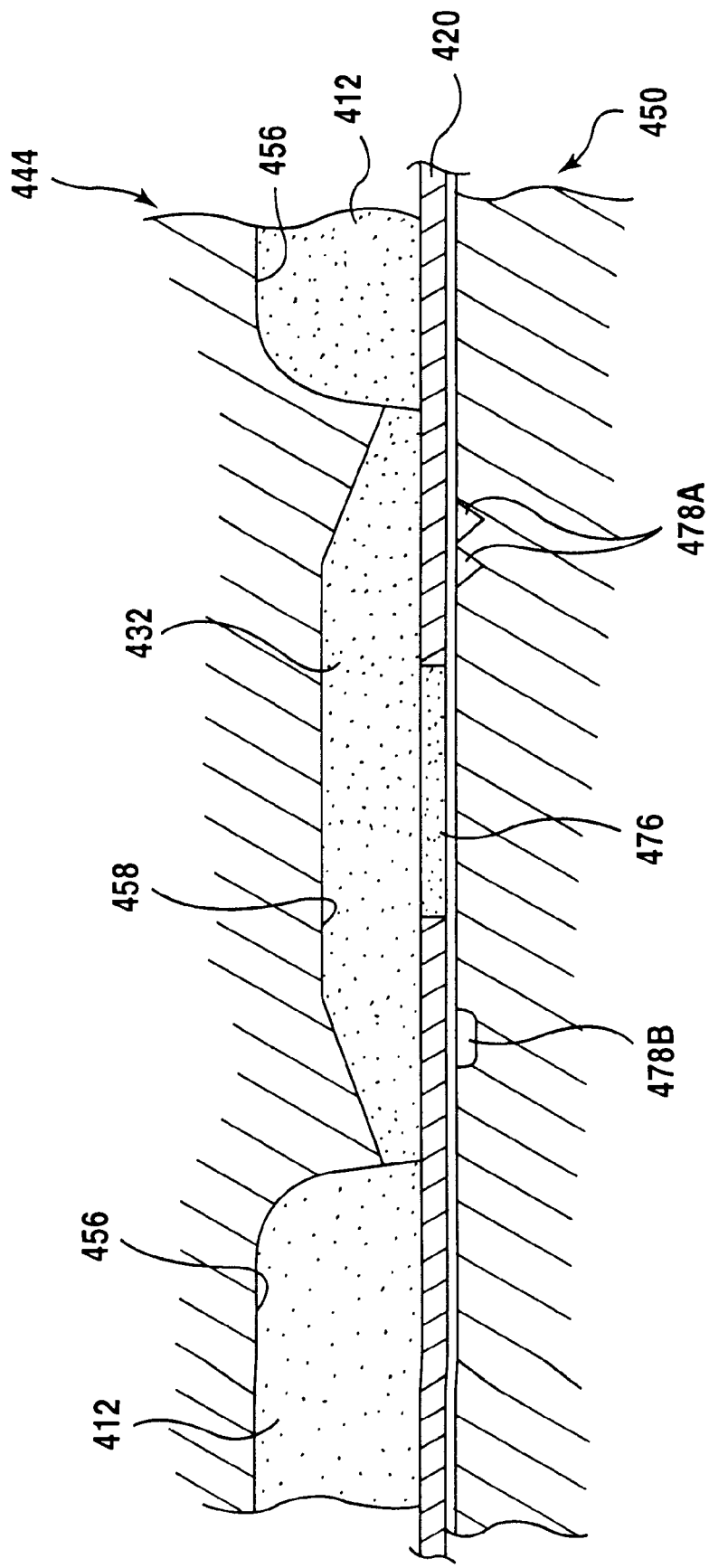
Figure 165:
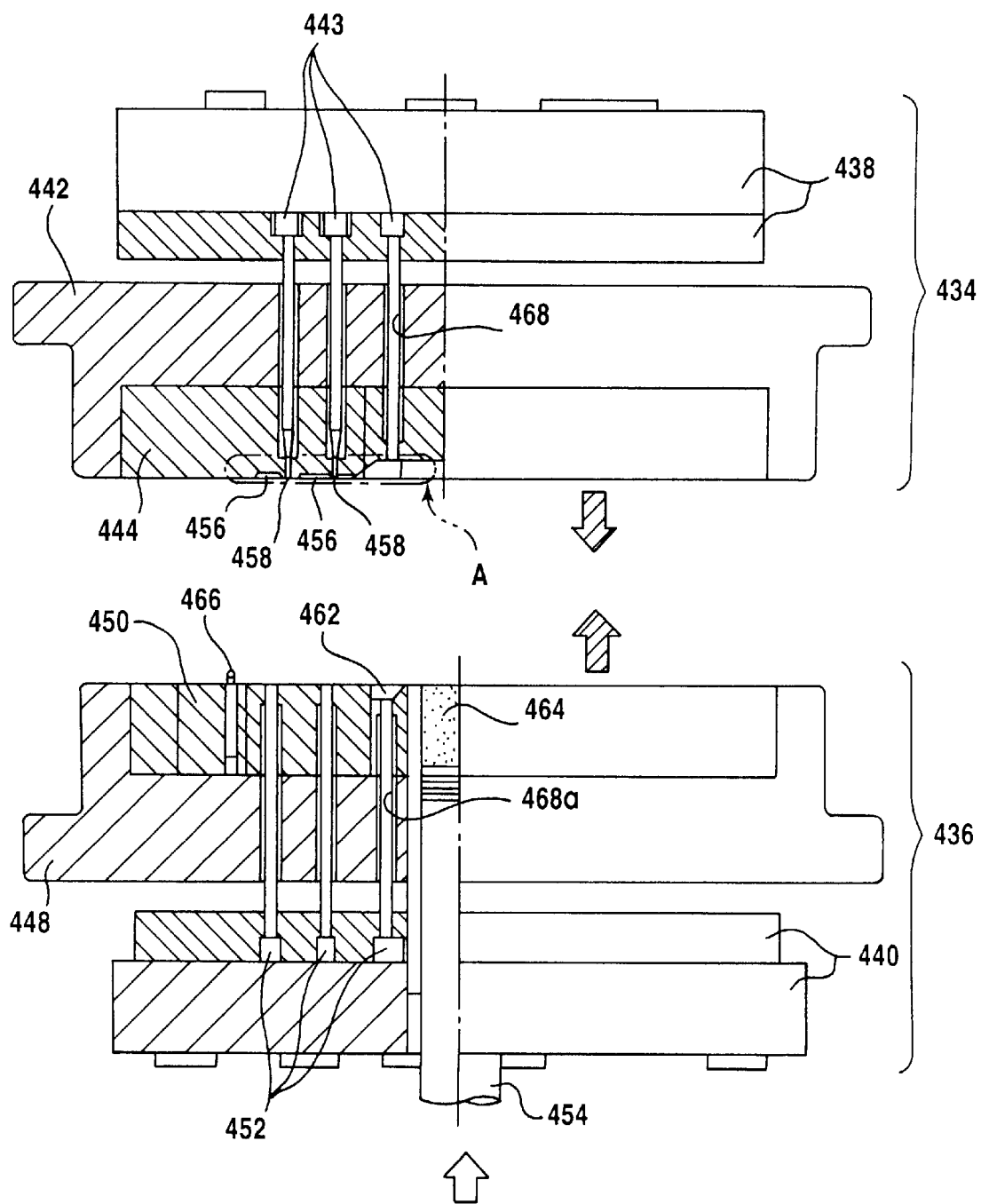
Figures 166A, 166B:
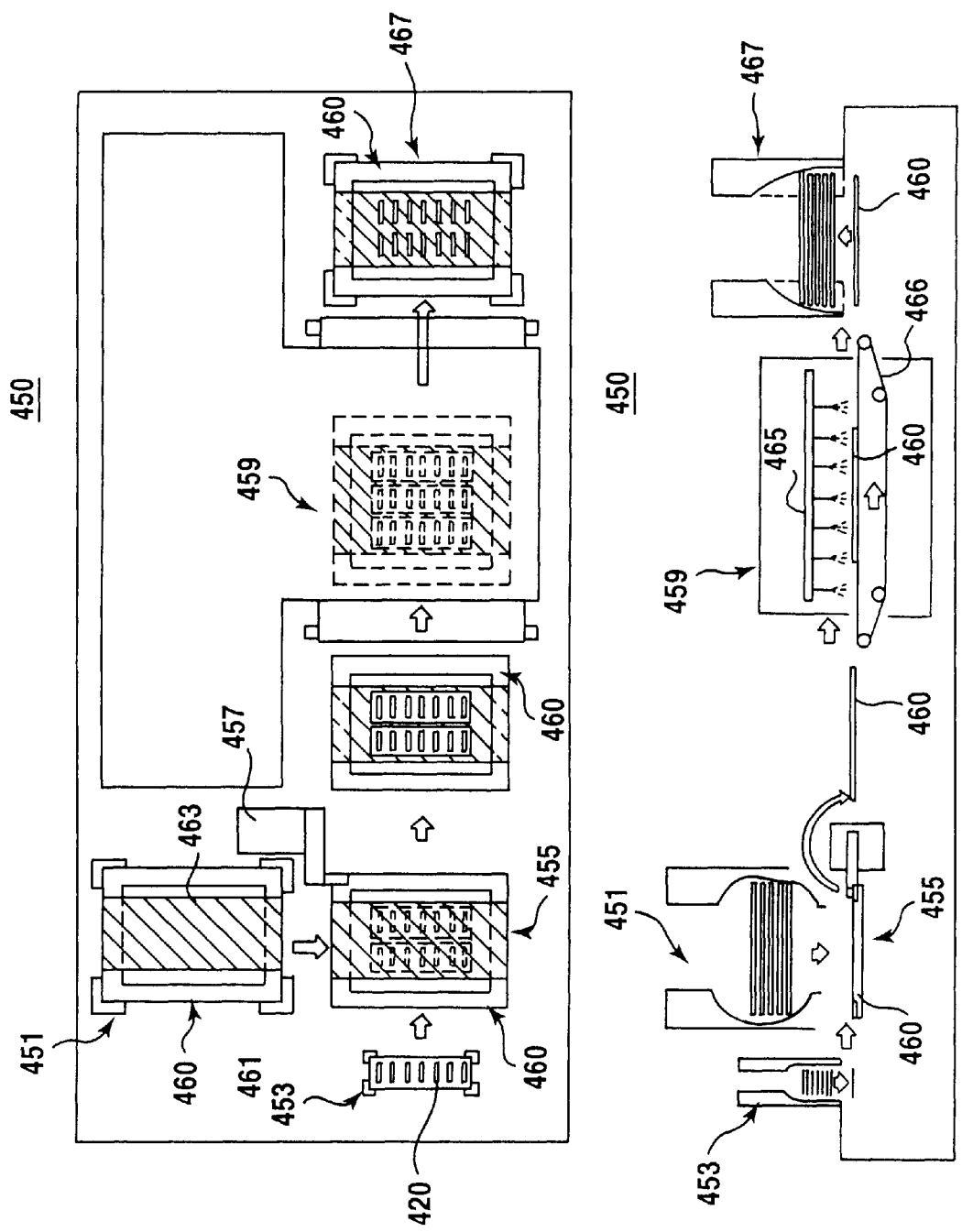
Figure 167:
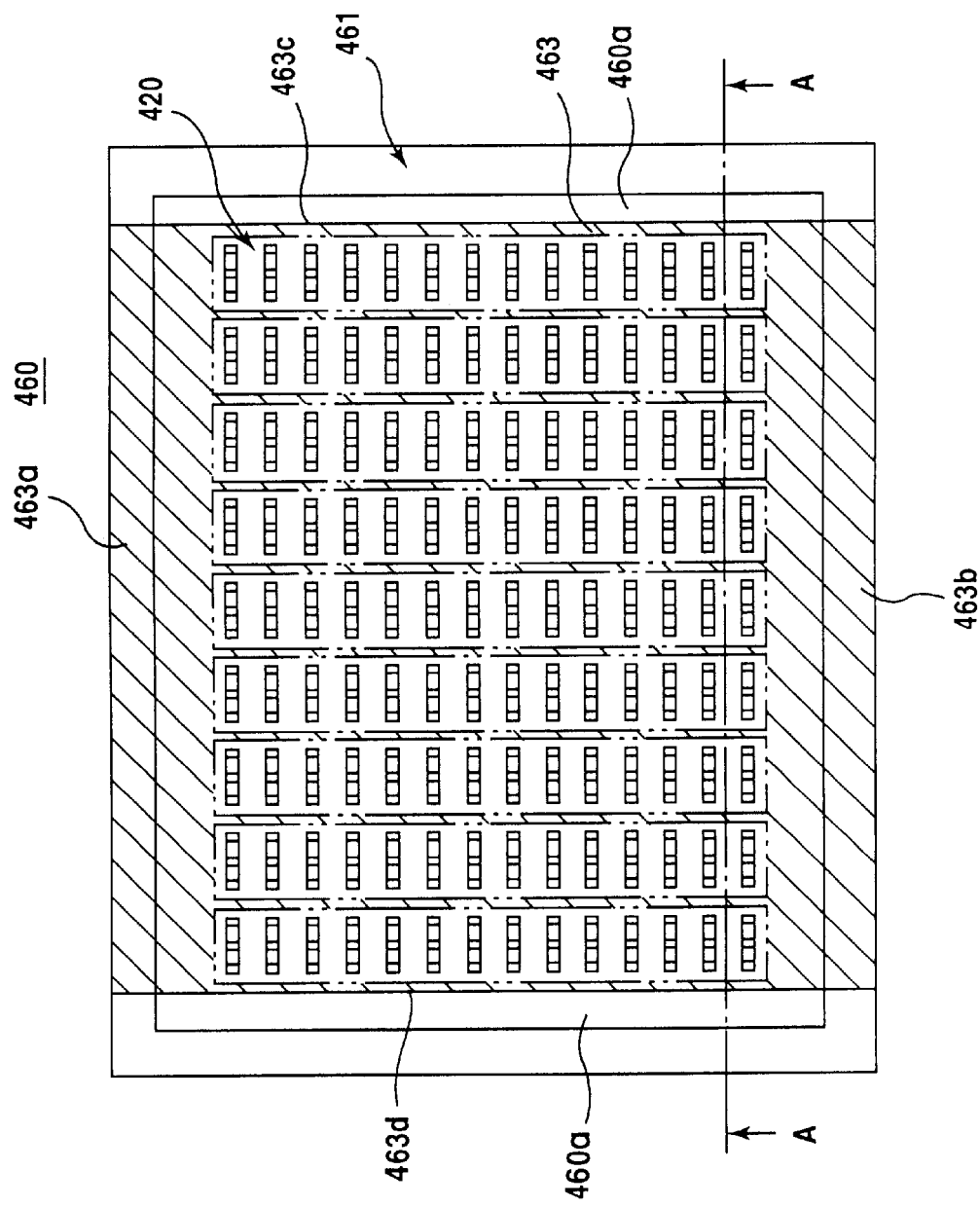
Figure 168:
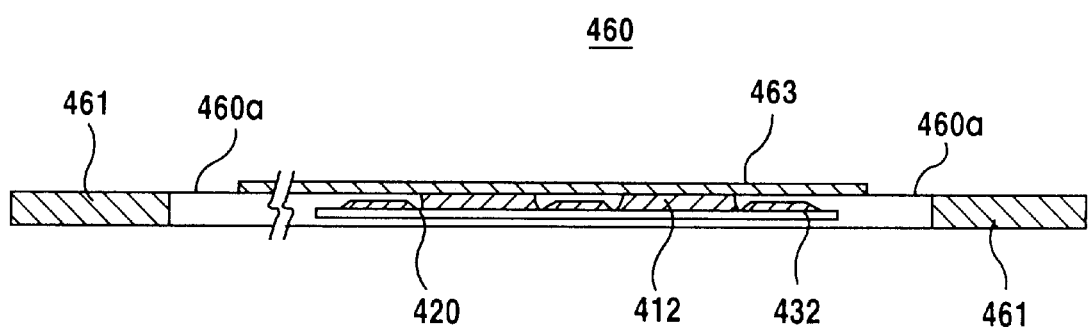
Figure 169:
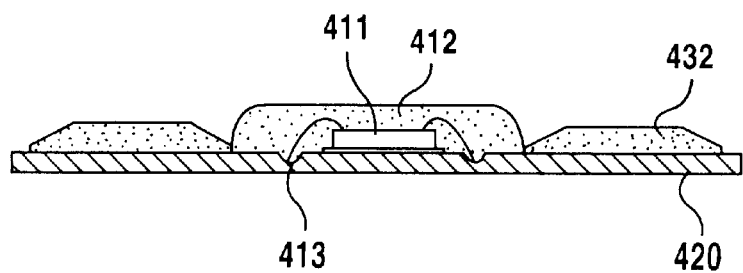
Figure 170:
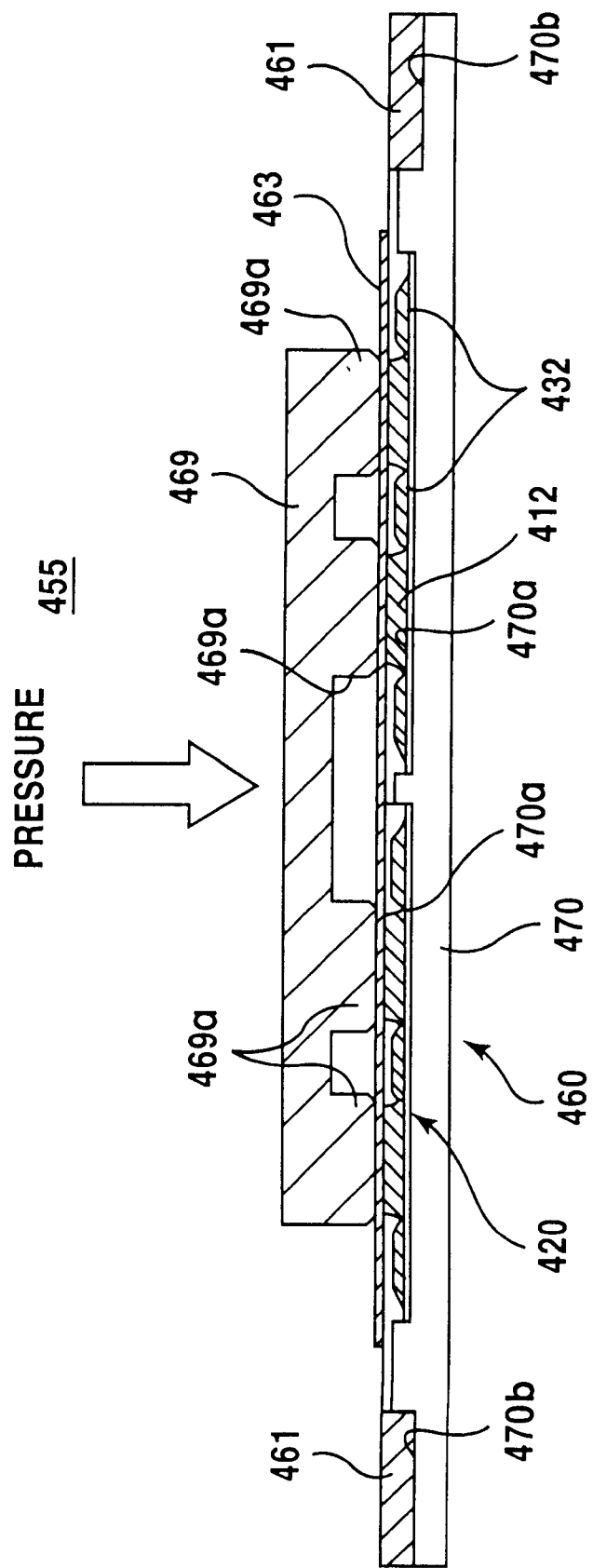
Figure 171:
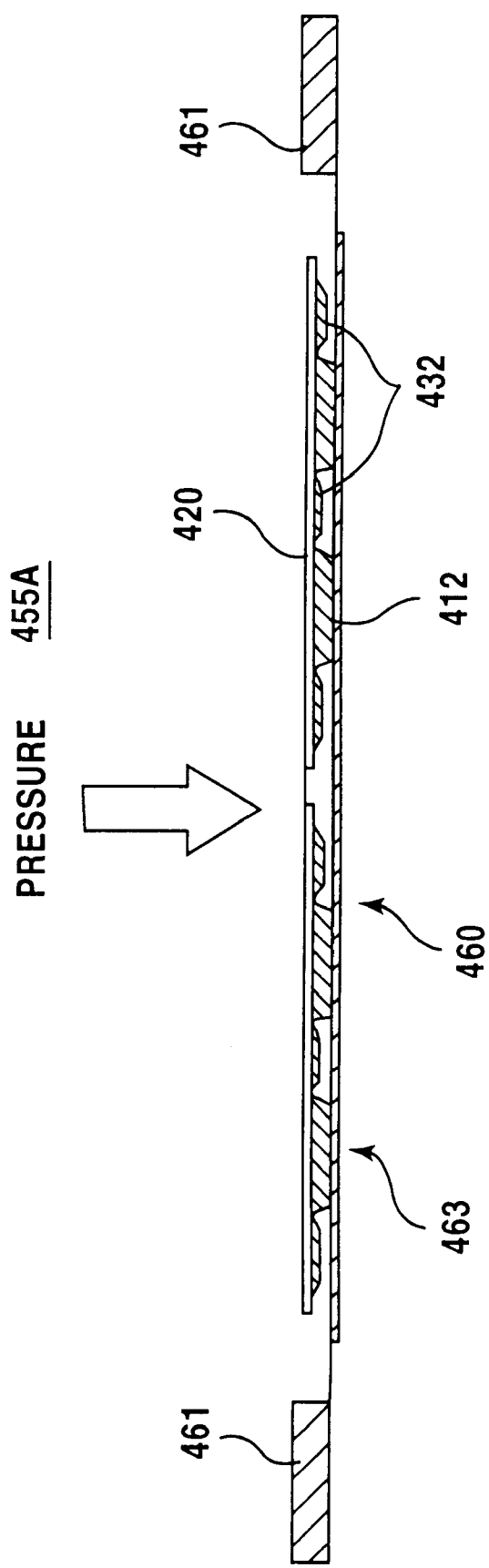
Figure 172:
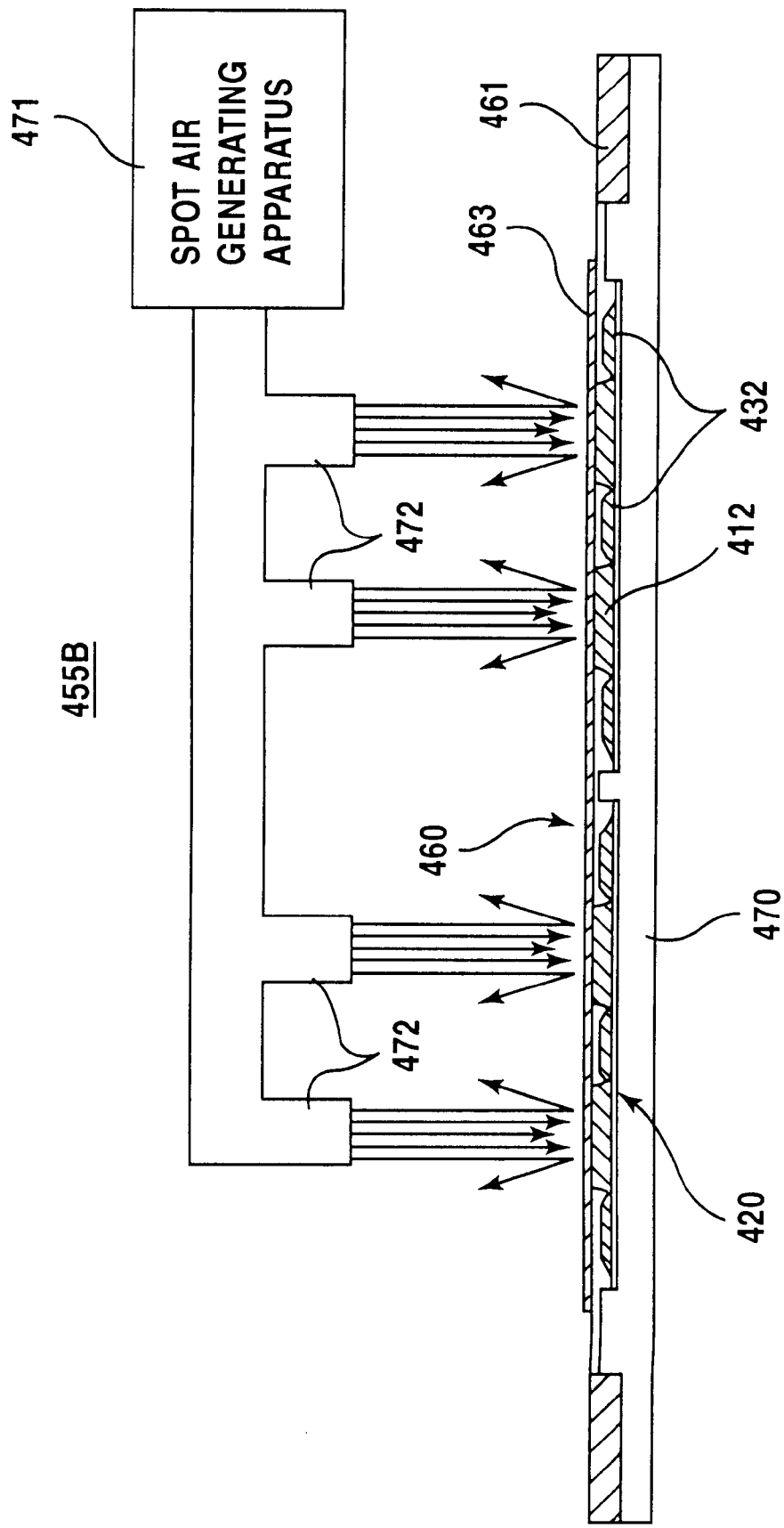
Figure 174:
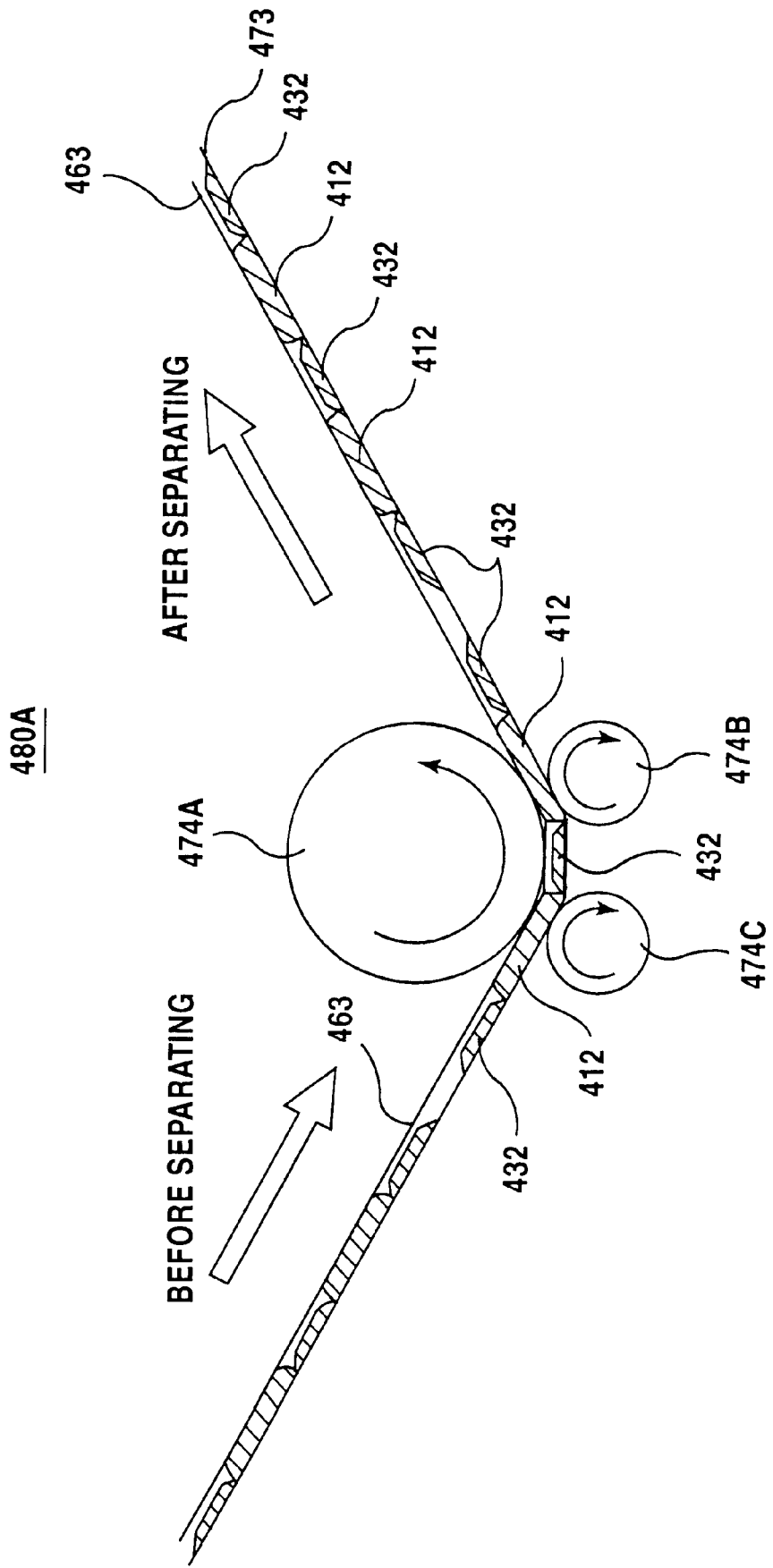
Figure 175:
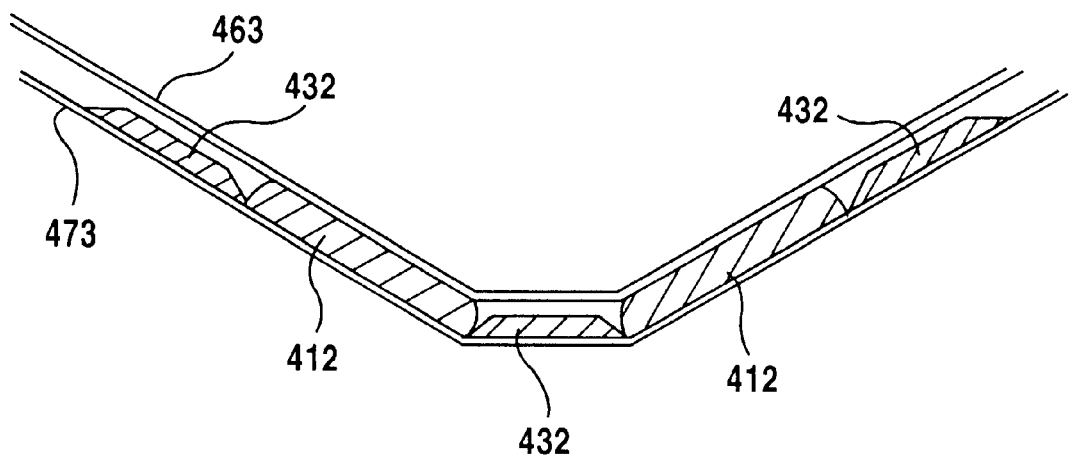
Figure 176:
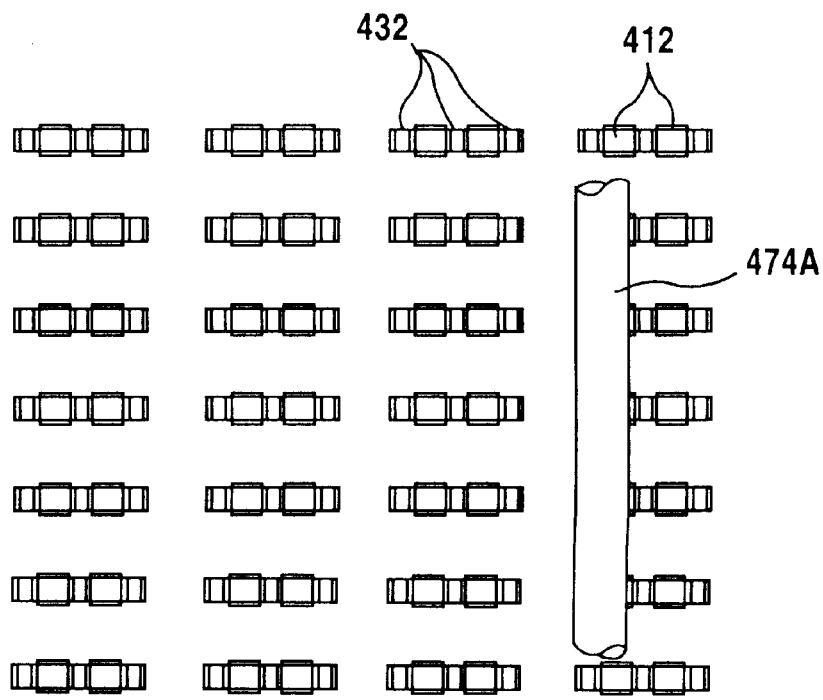
Figure 177:
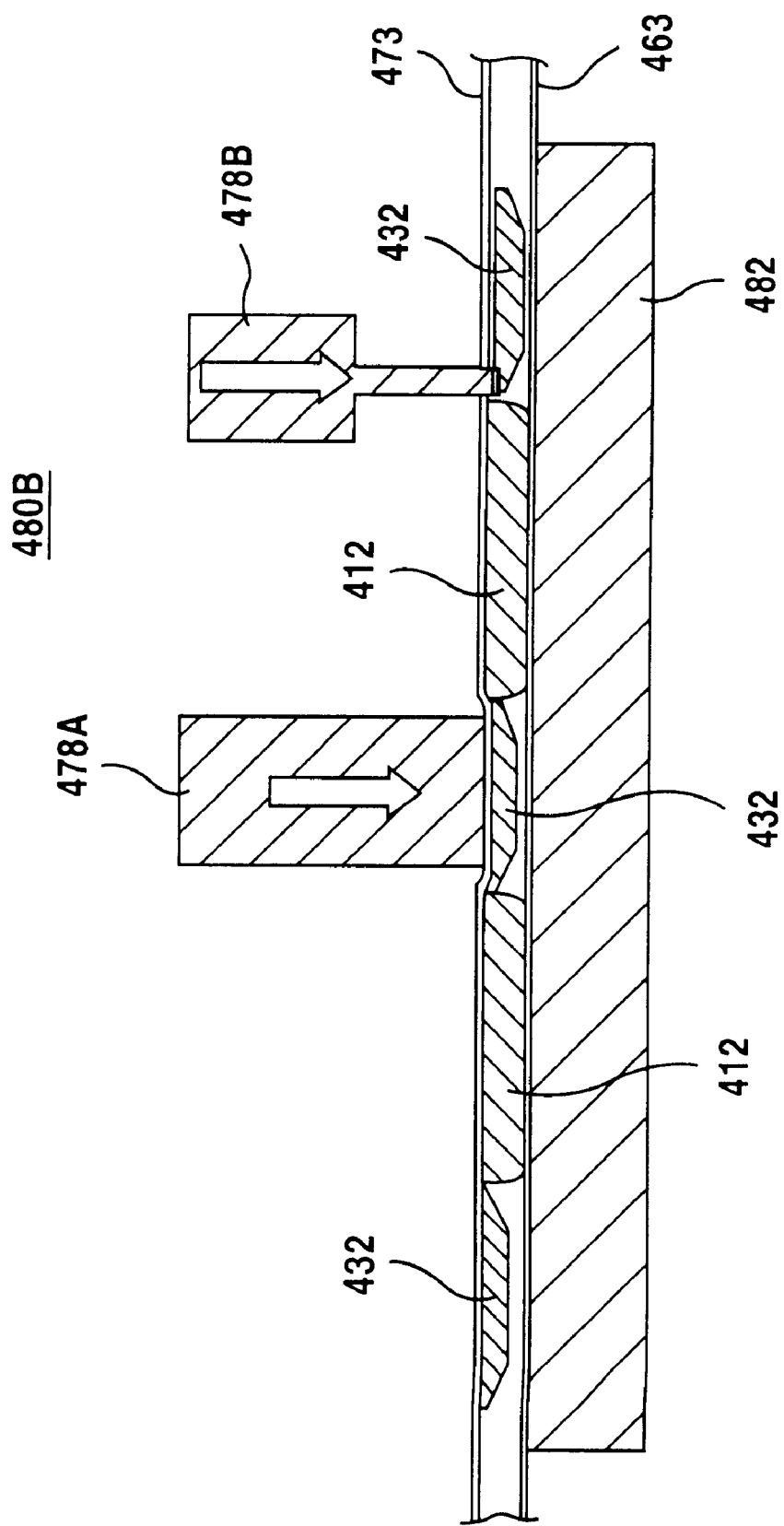
Figure 178:
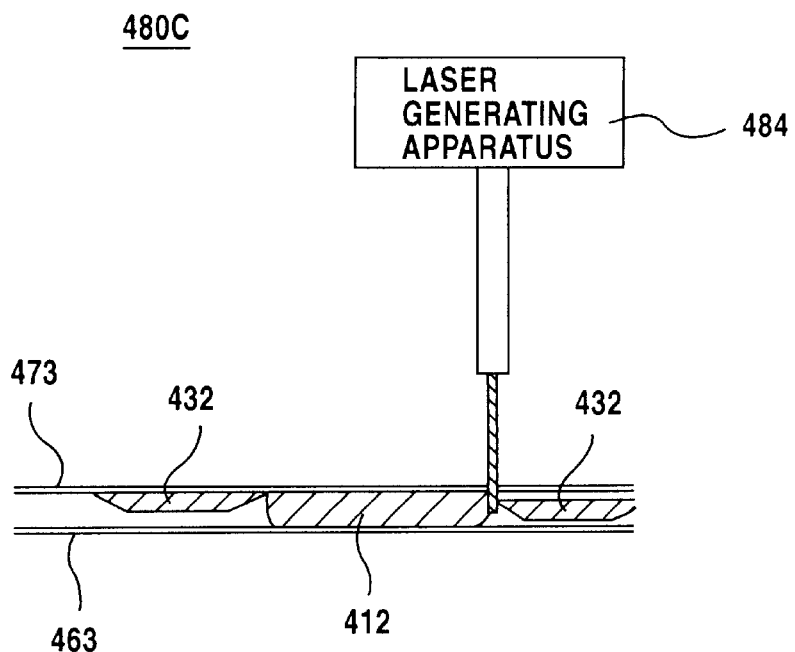
Figure 179A:
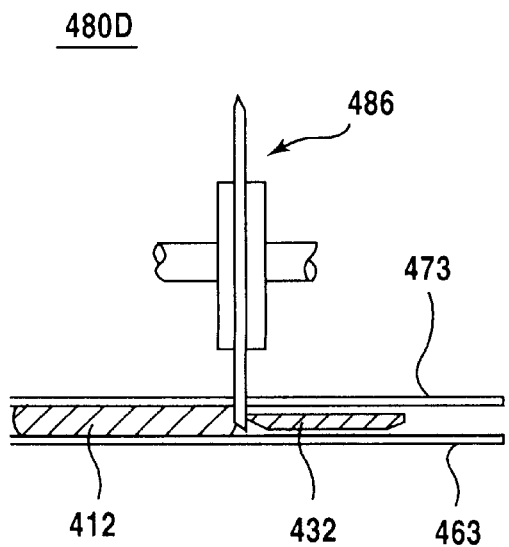
Figure 179B:
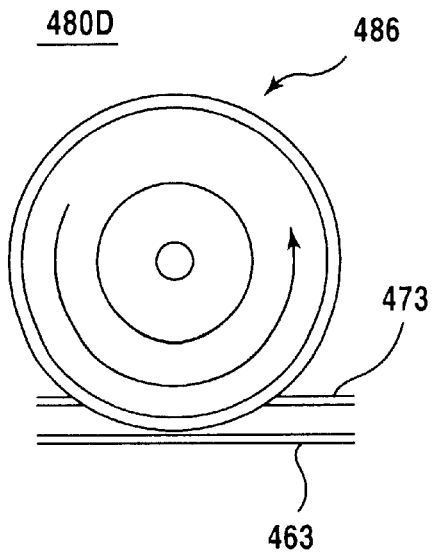
Figure 180:
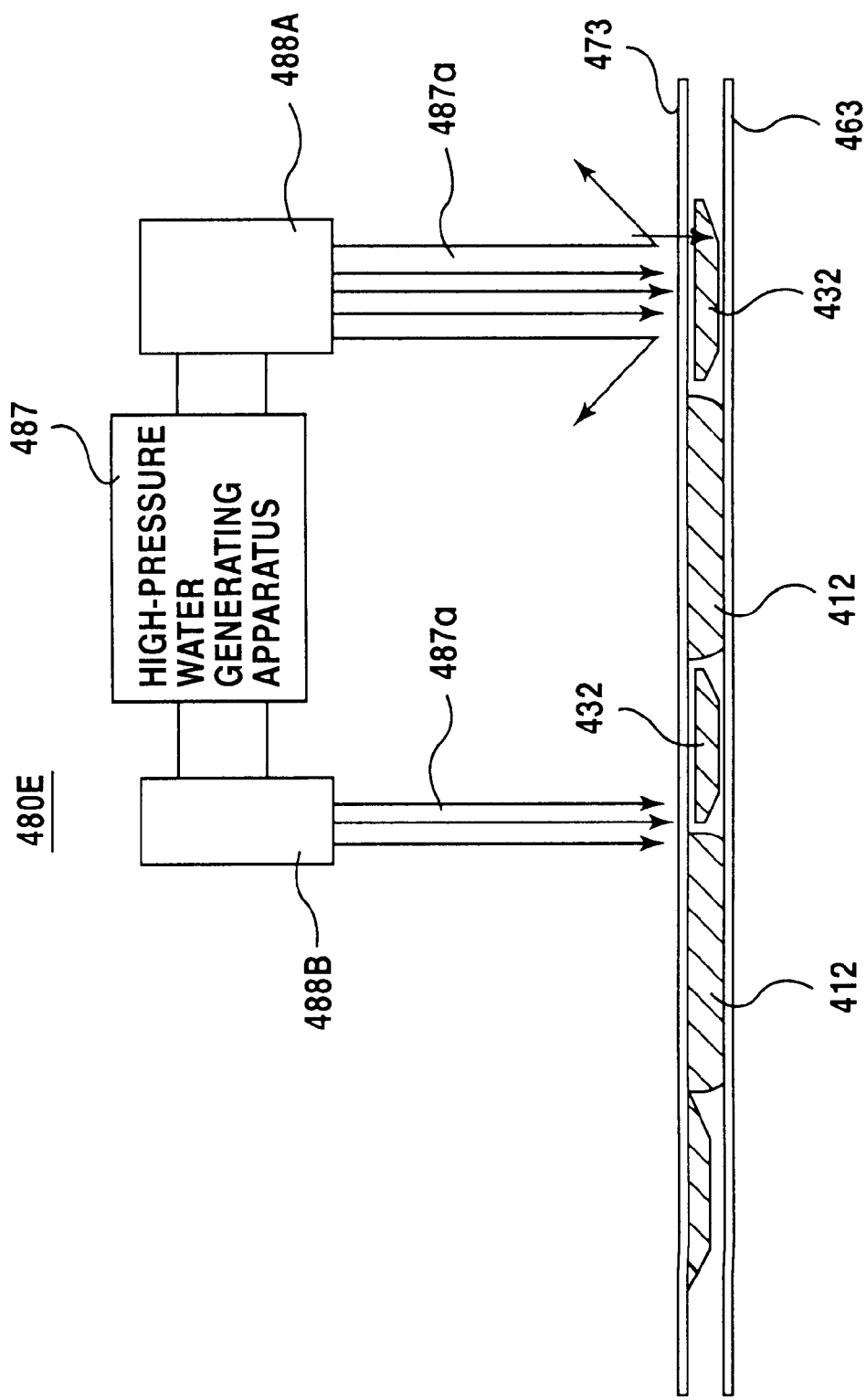
Figure 181:
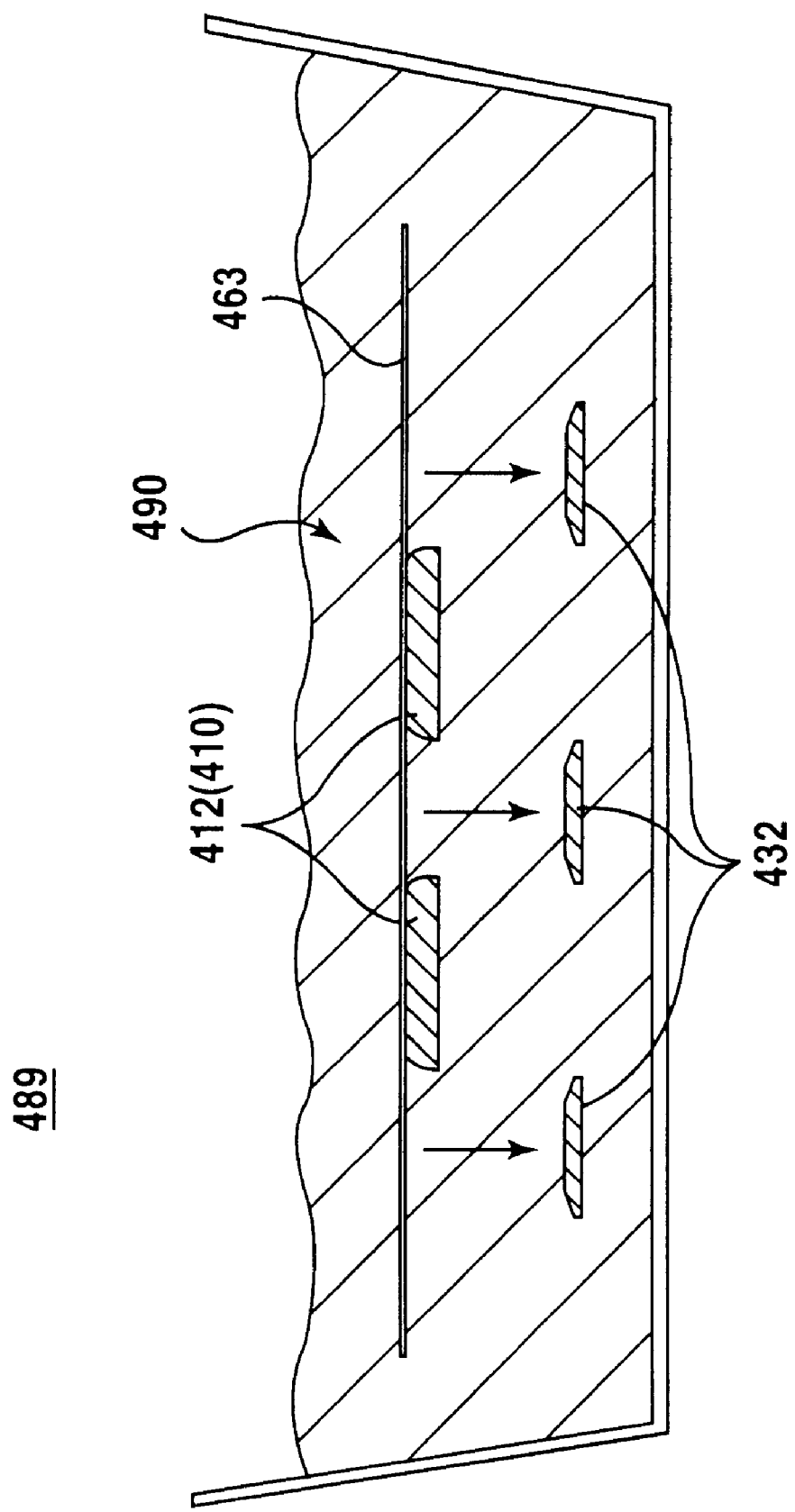
Figure 182:
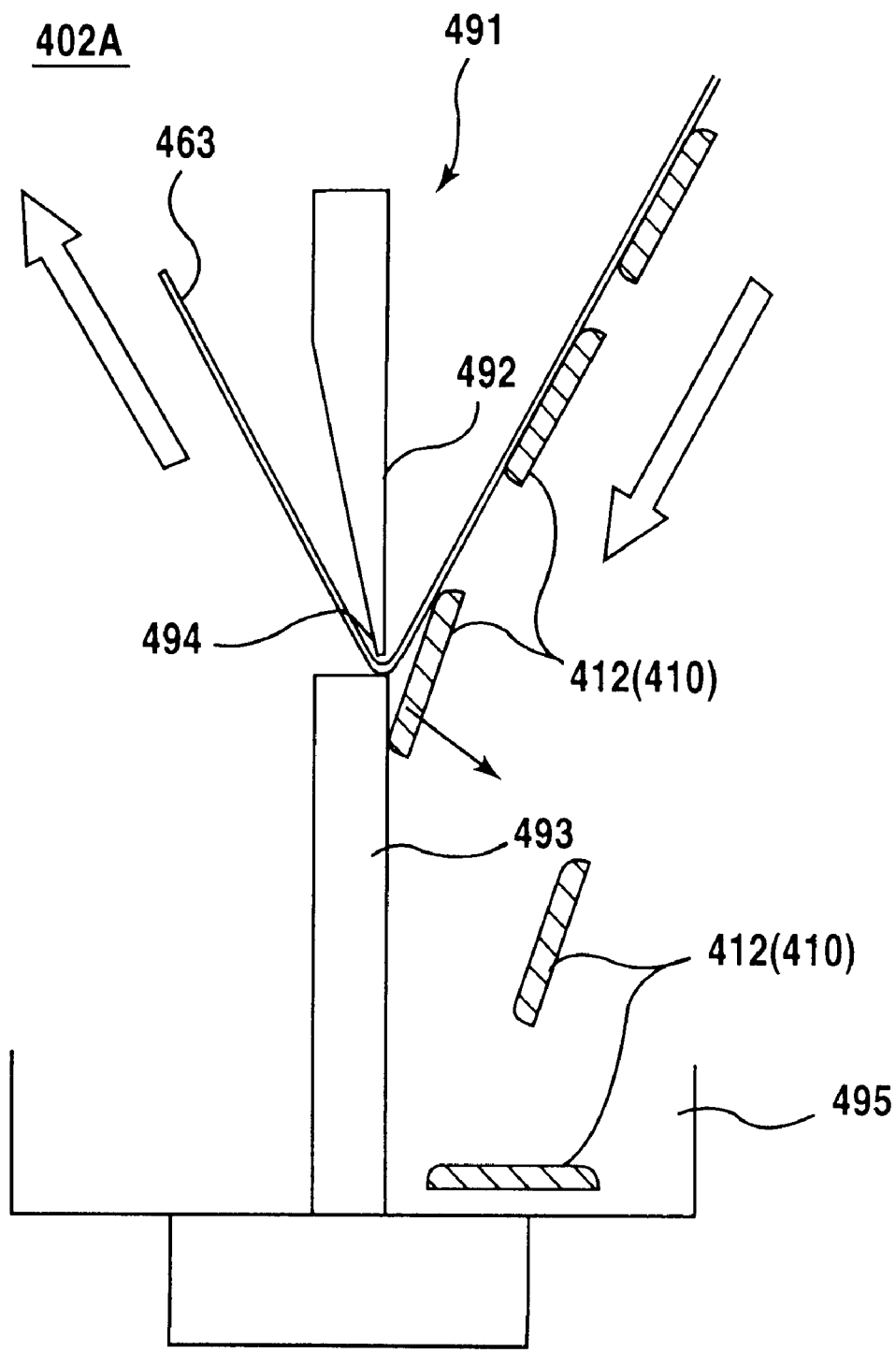
Figure 183:
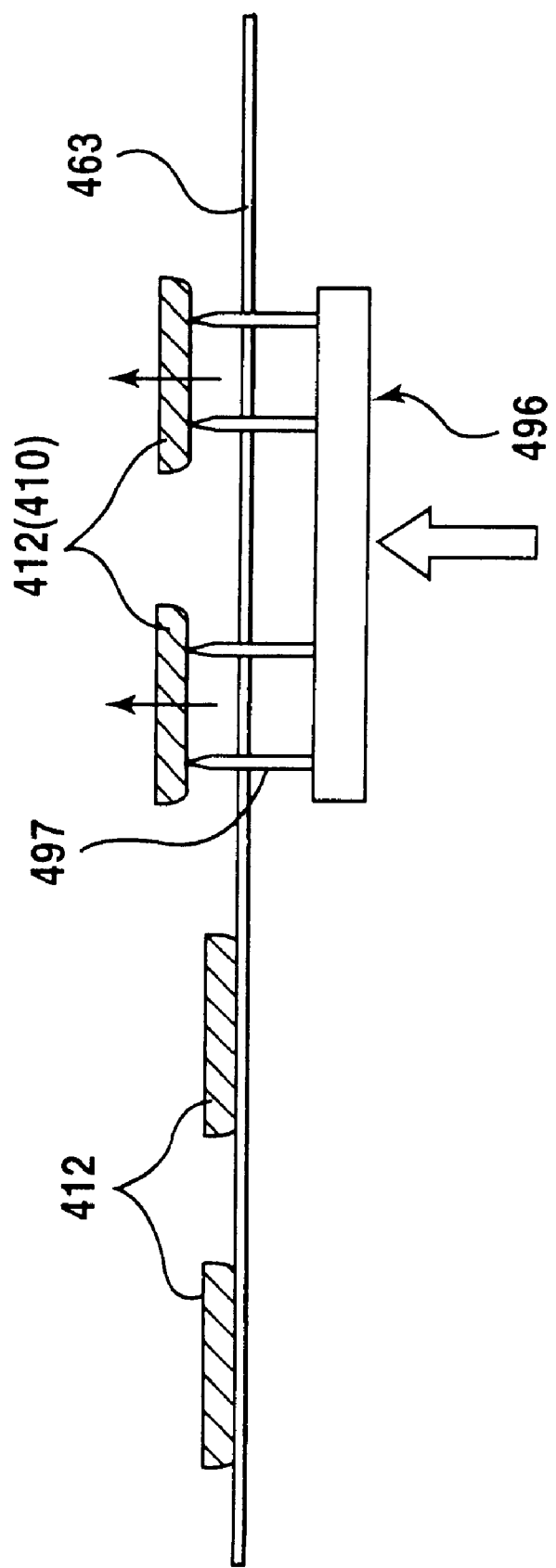
Figure 184:
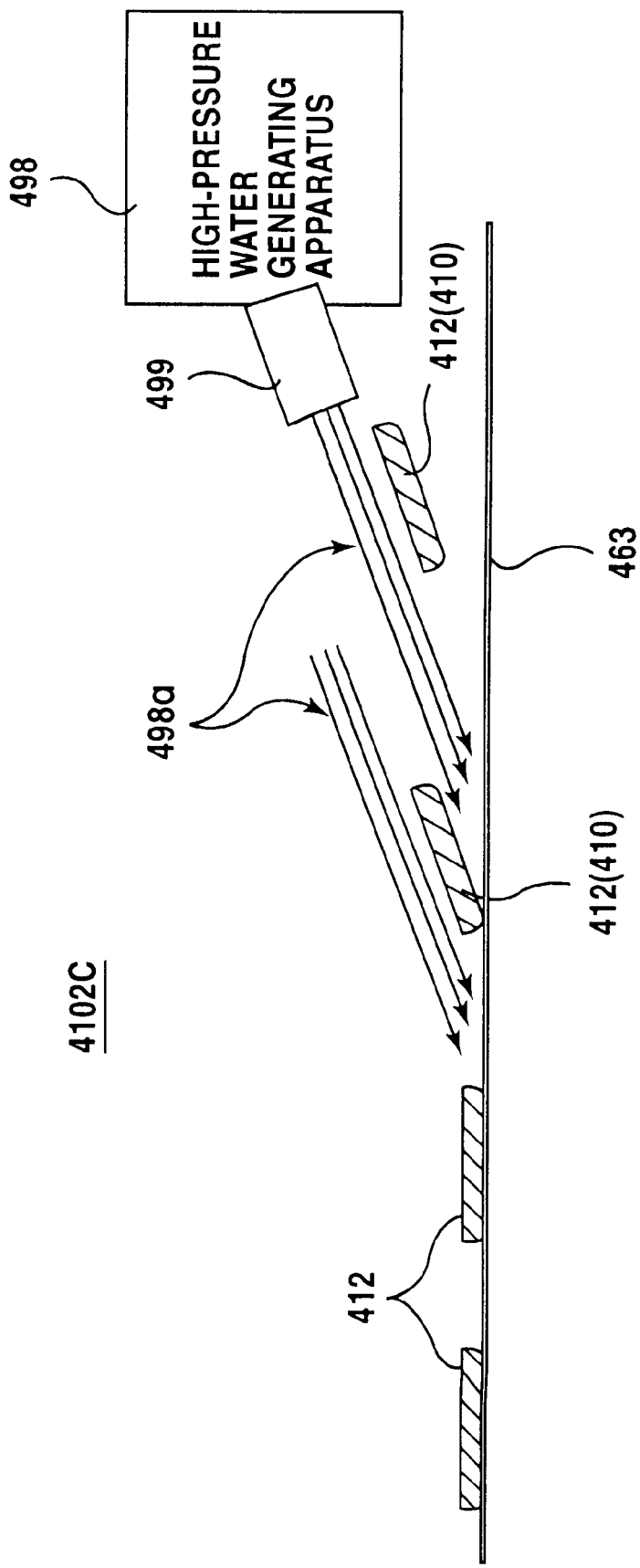
Figure 185:
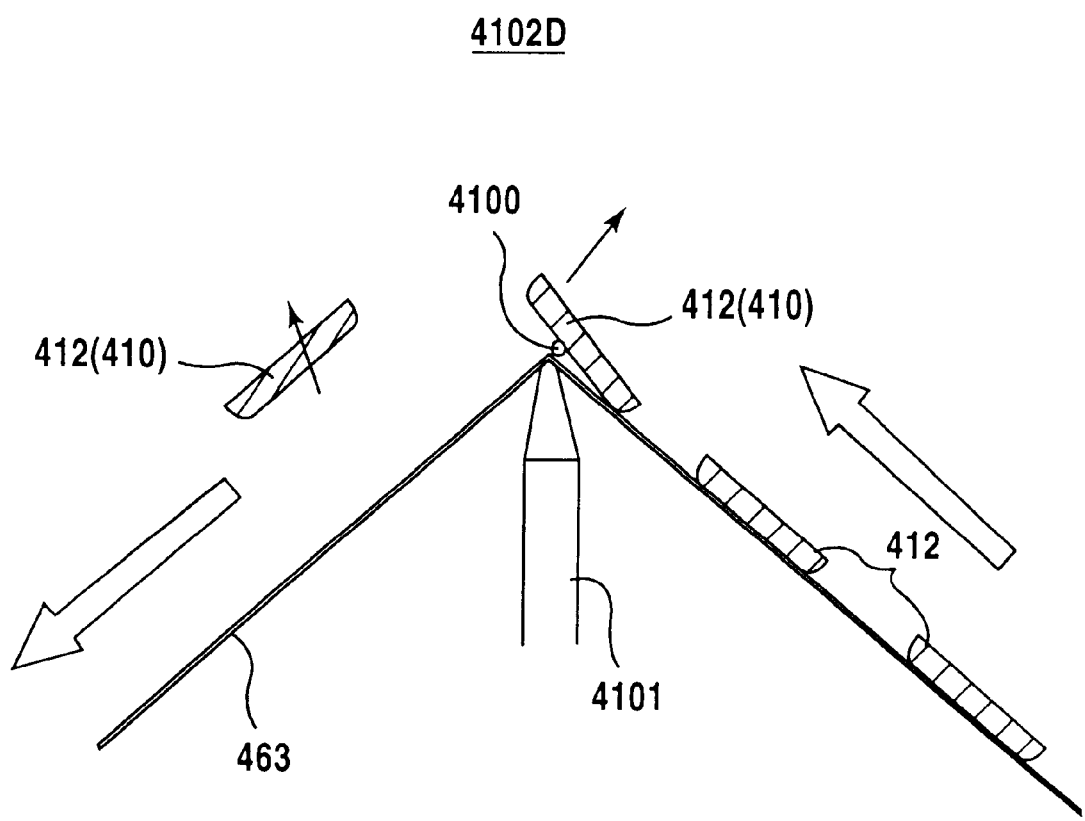
Figure 186:
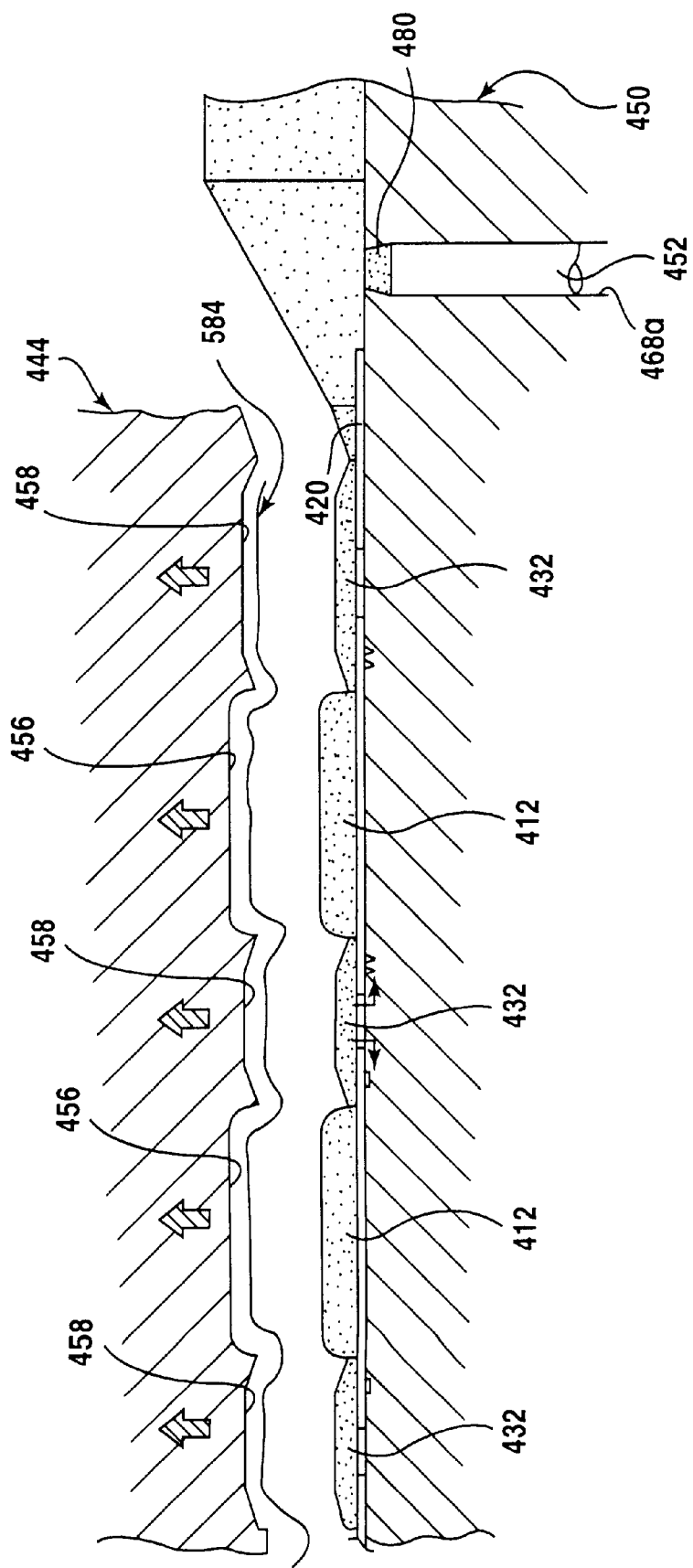
Figure 187:
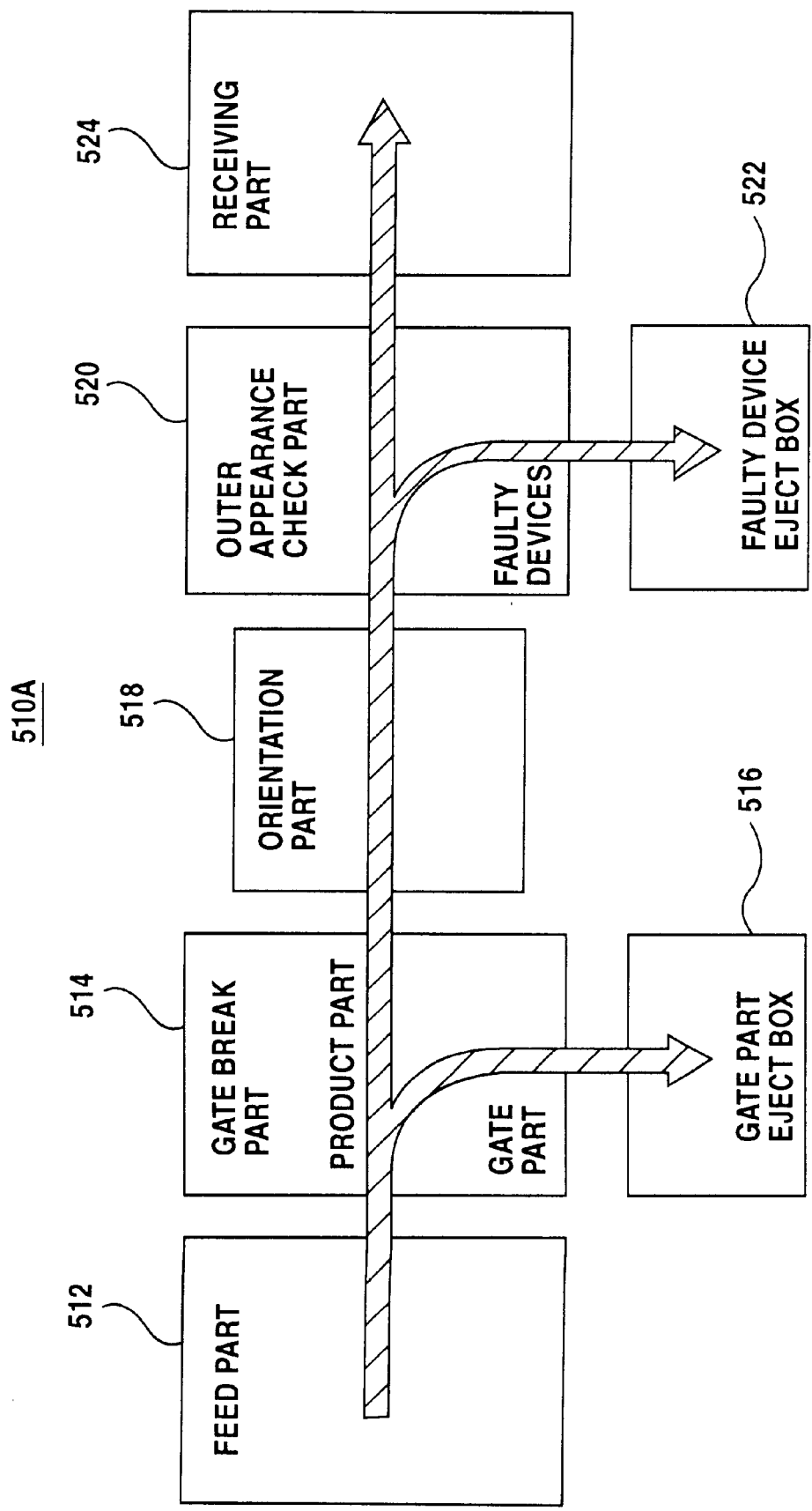
Figure 188:
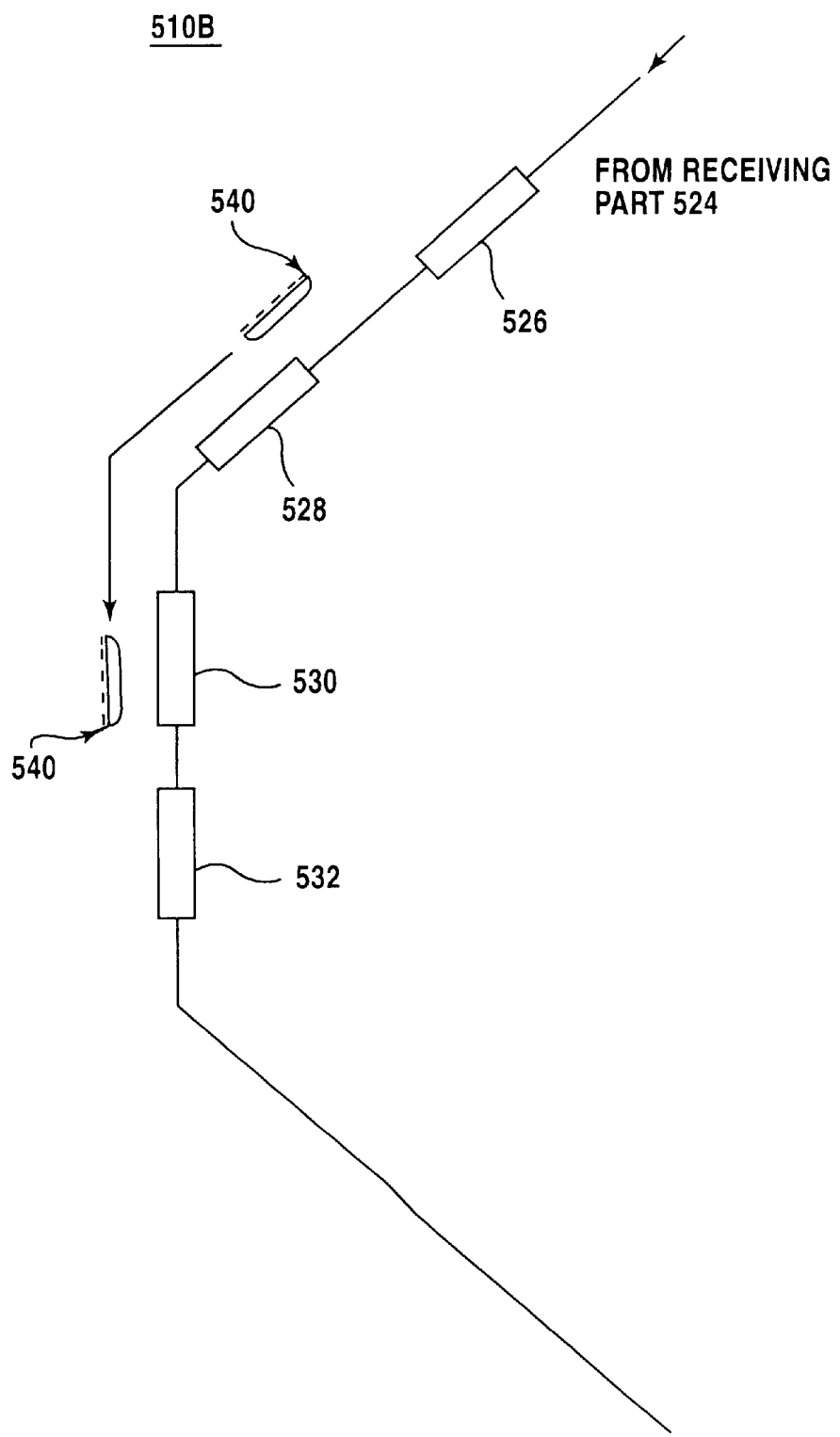
Figure 189:
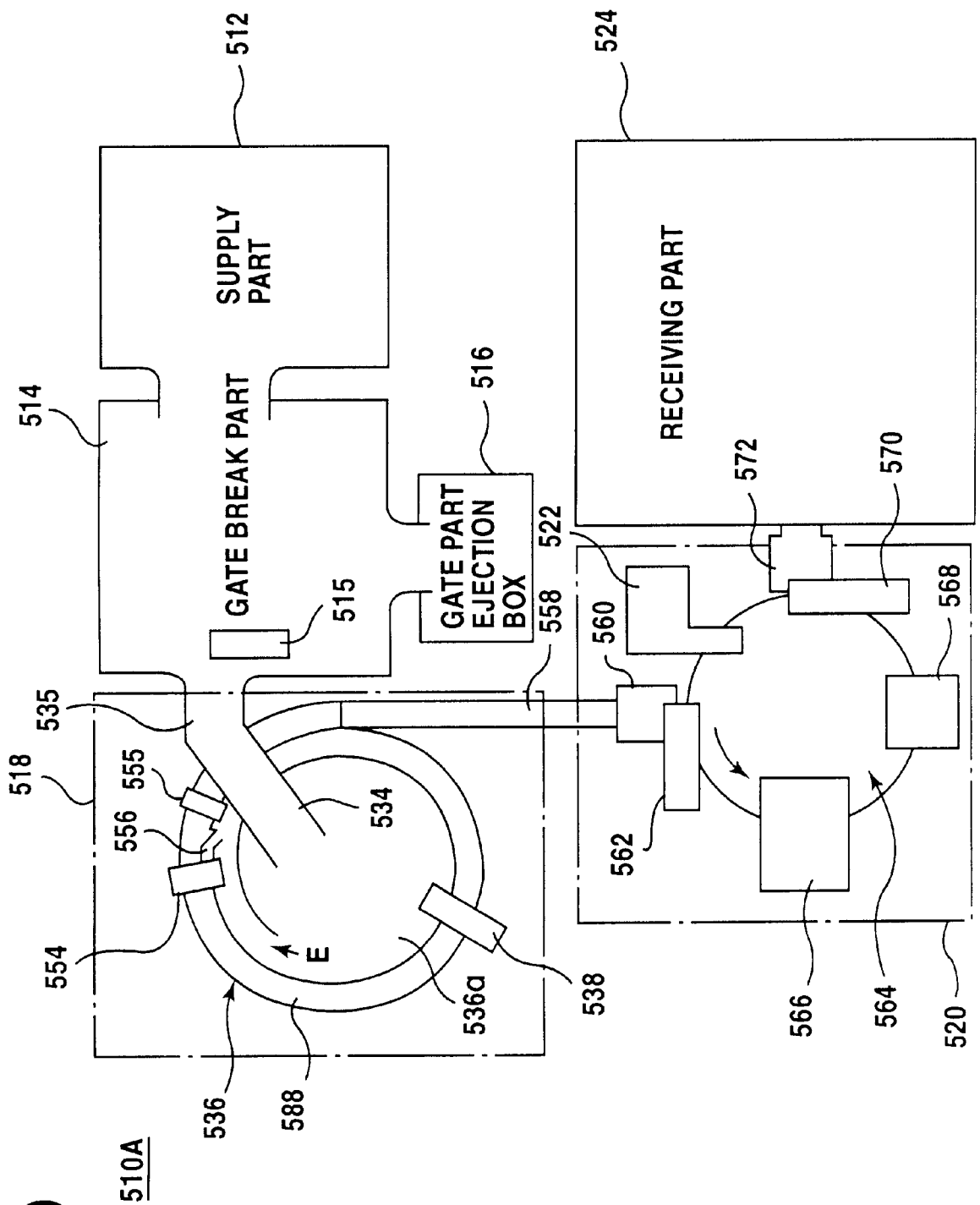
Figure 191A:
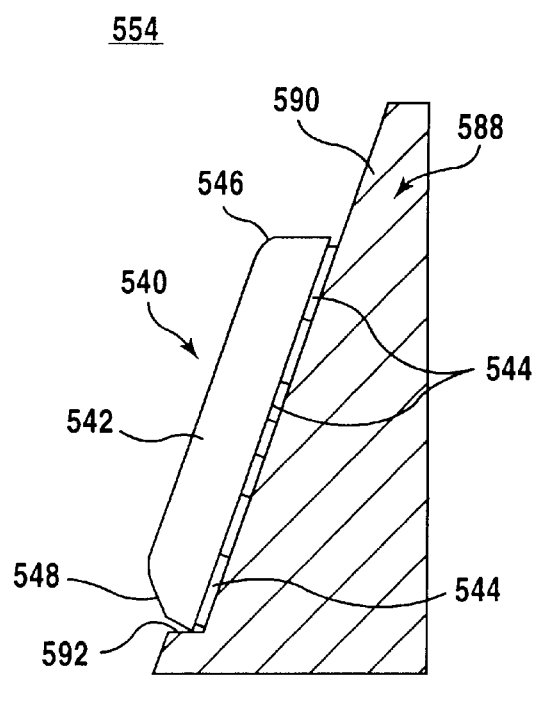
Figure 191B:
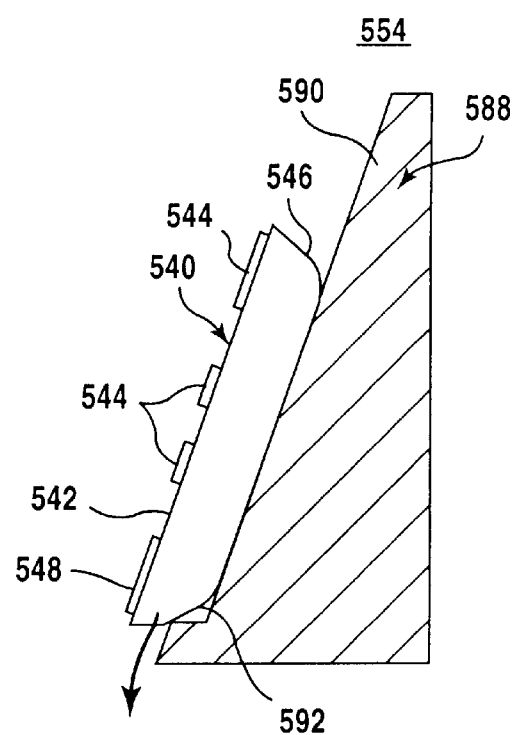
Figure 192A:
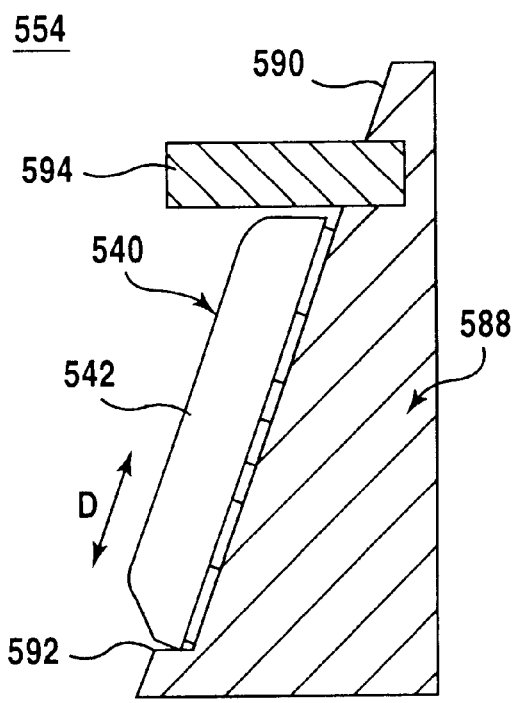
Figure 192B:
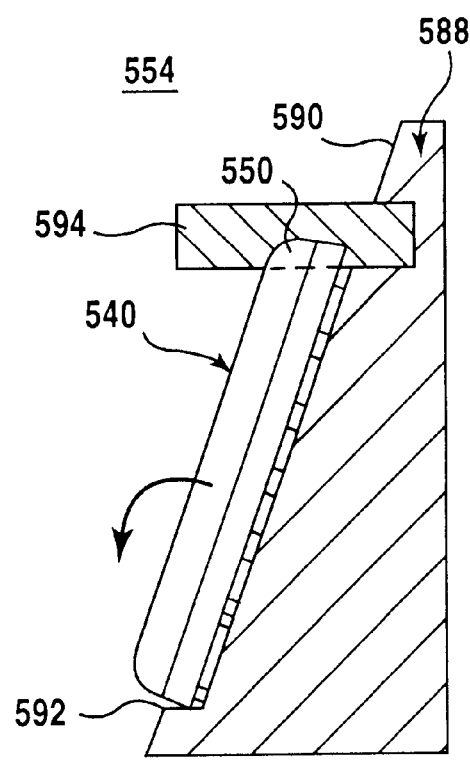
Figure 193:
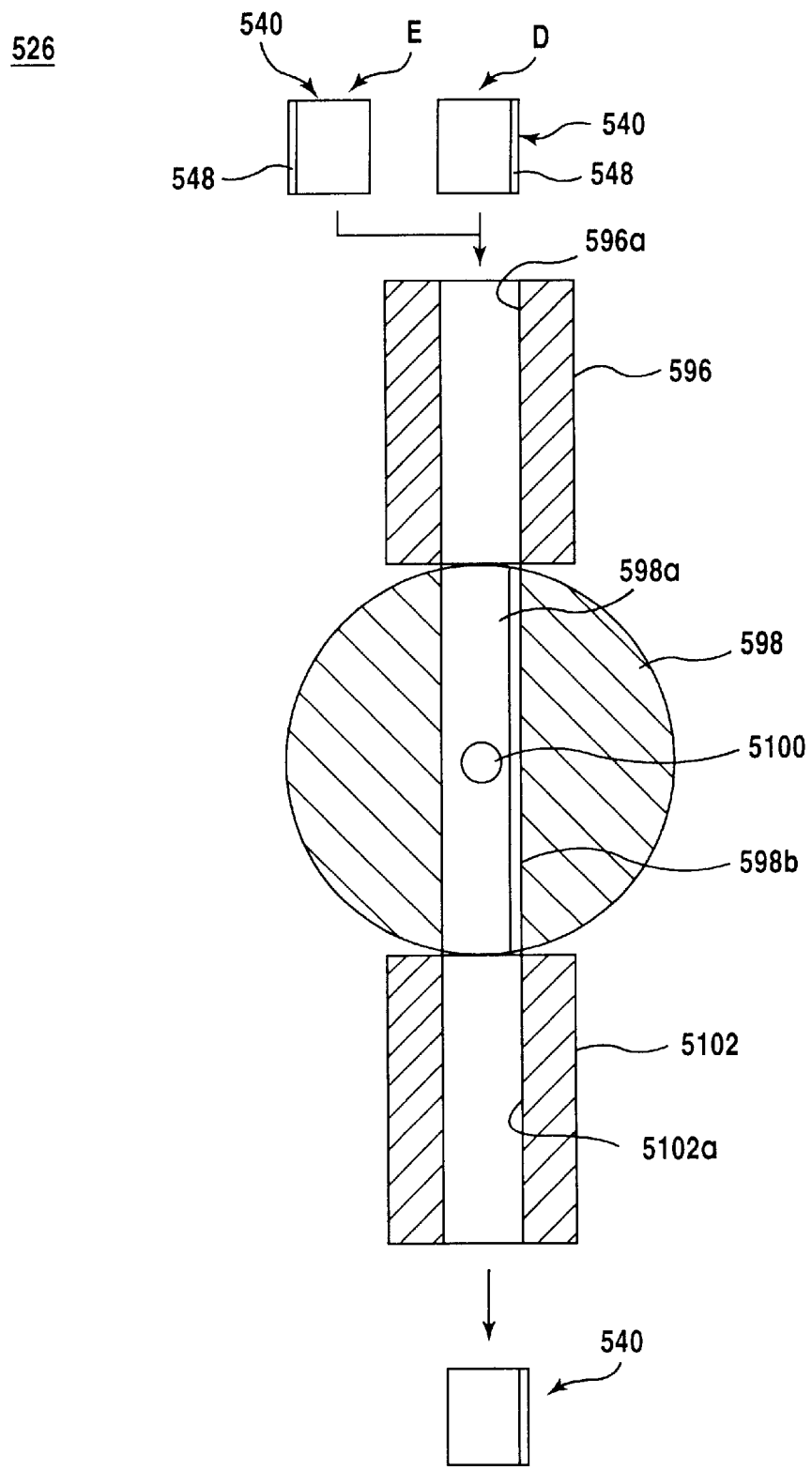
Figure 195:
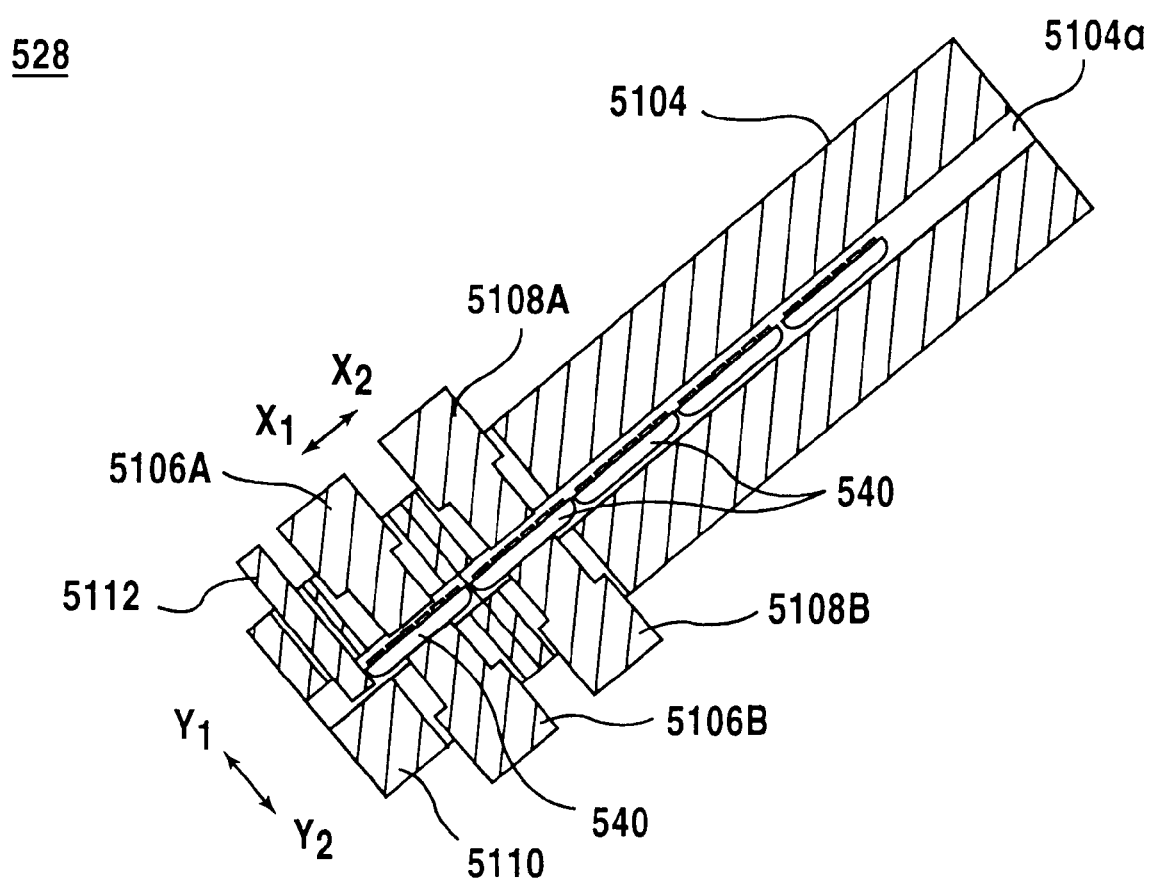
Figure 196:
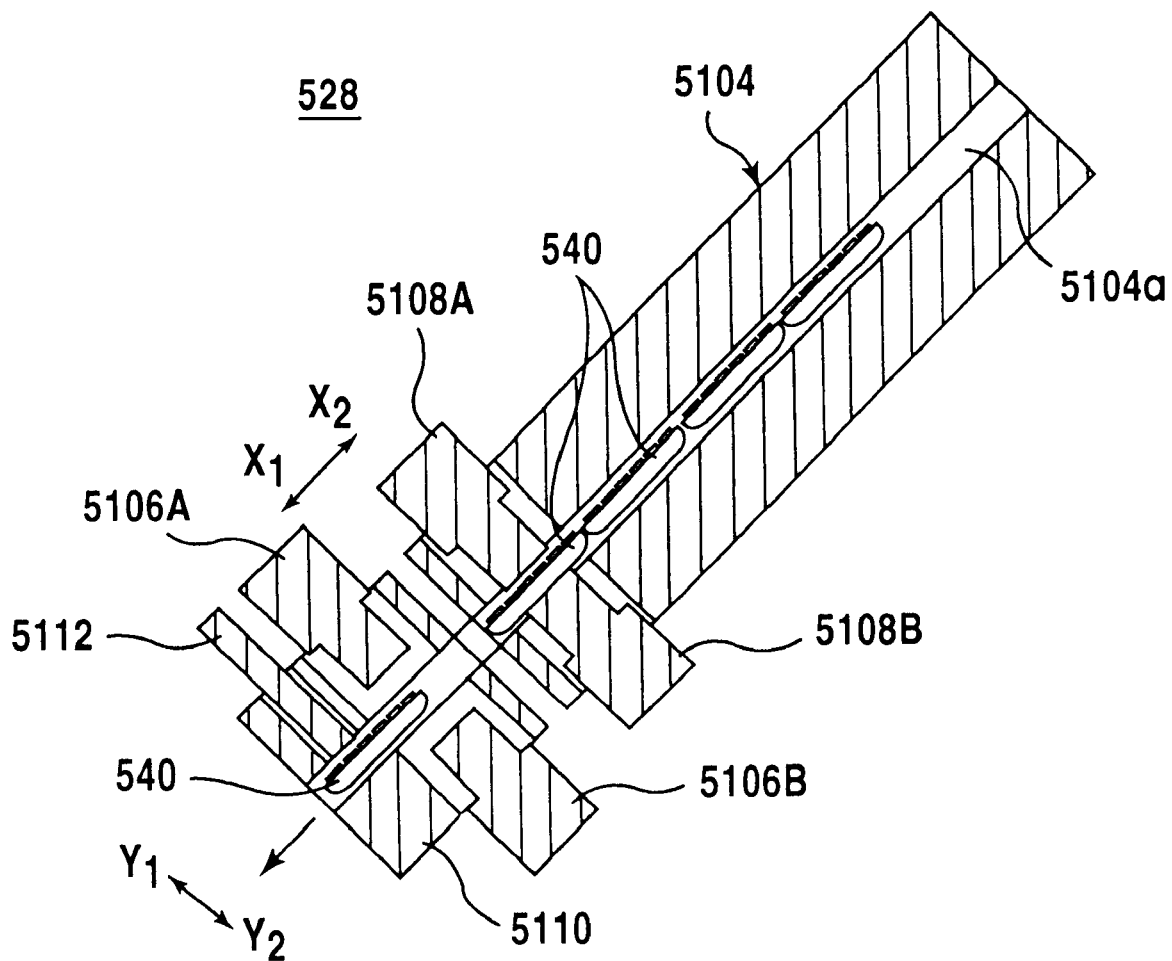
Figure 197:
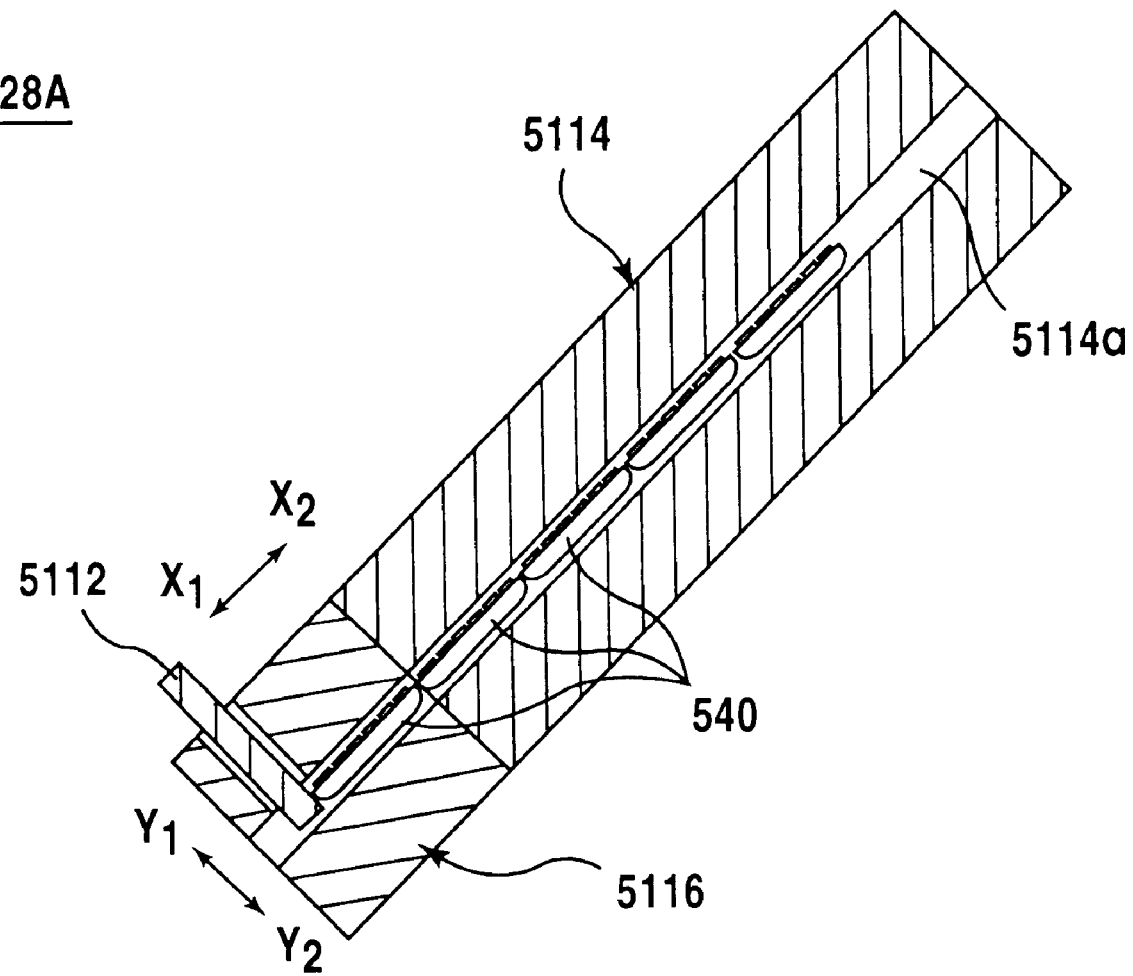
Figure 198:
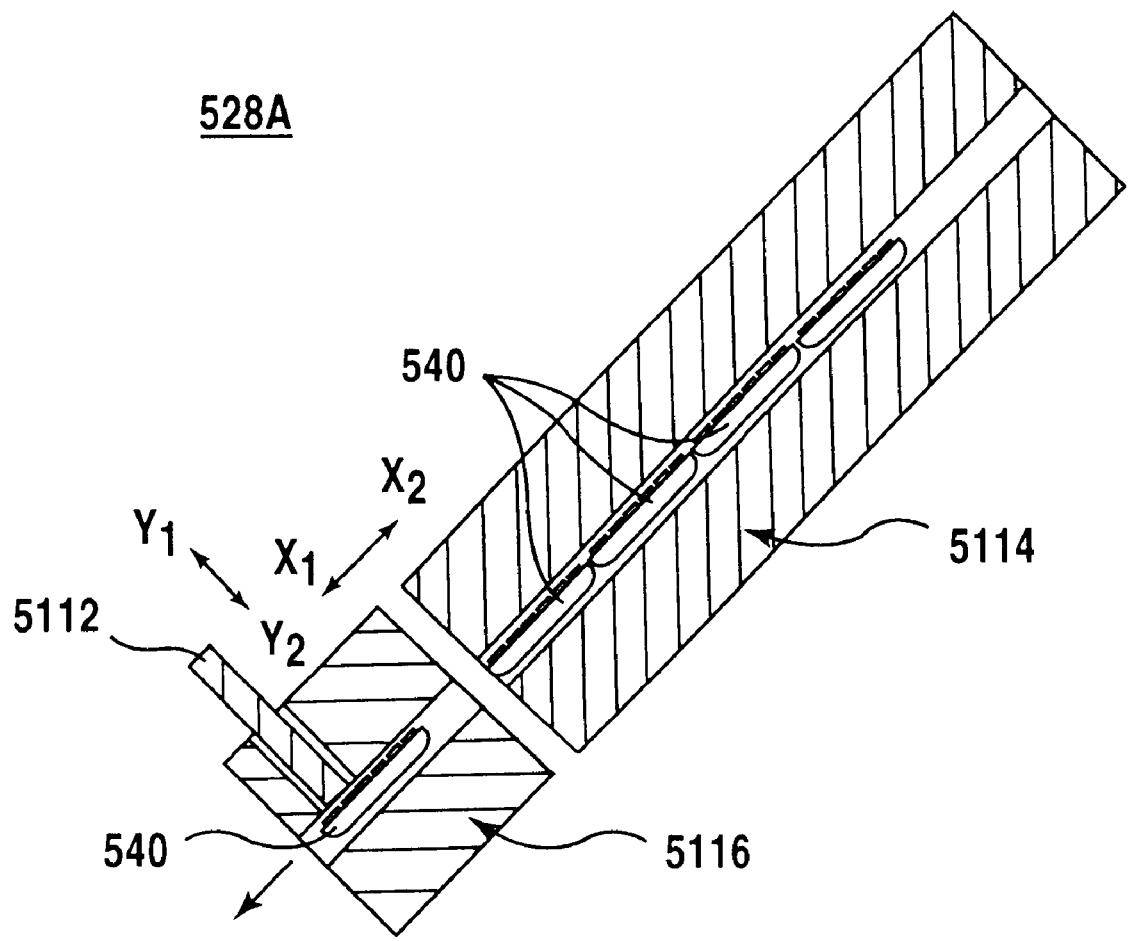
Figure 199:
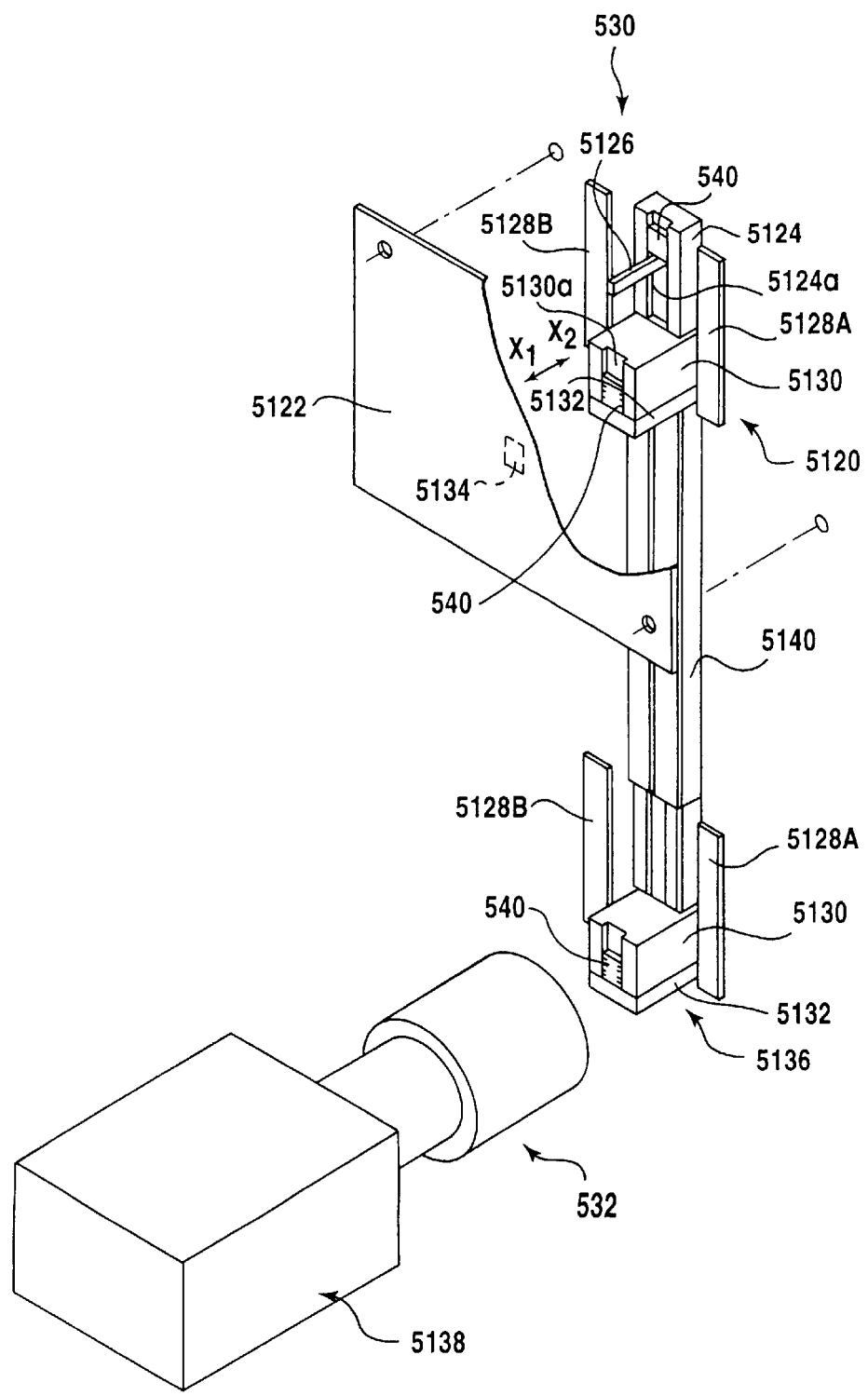
Figure 200:
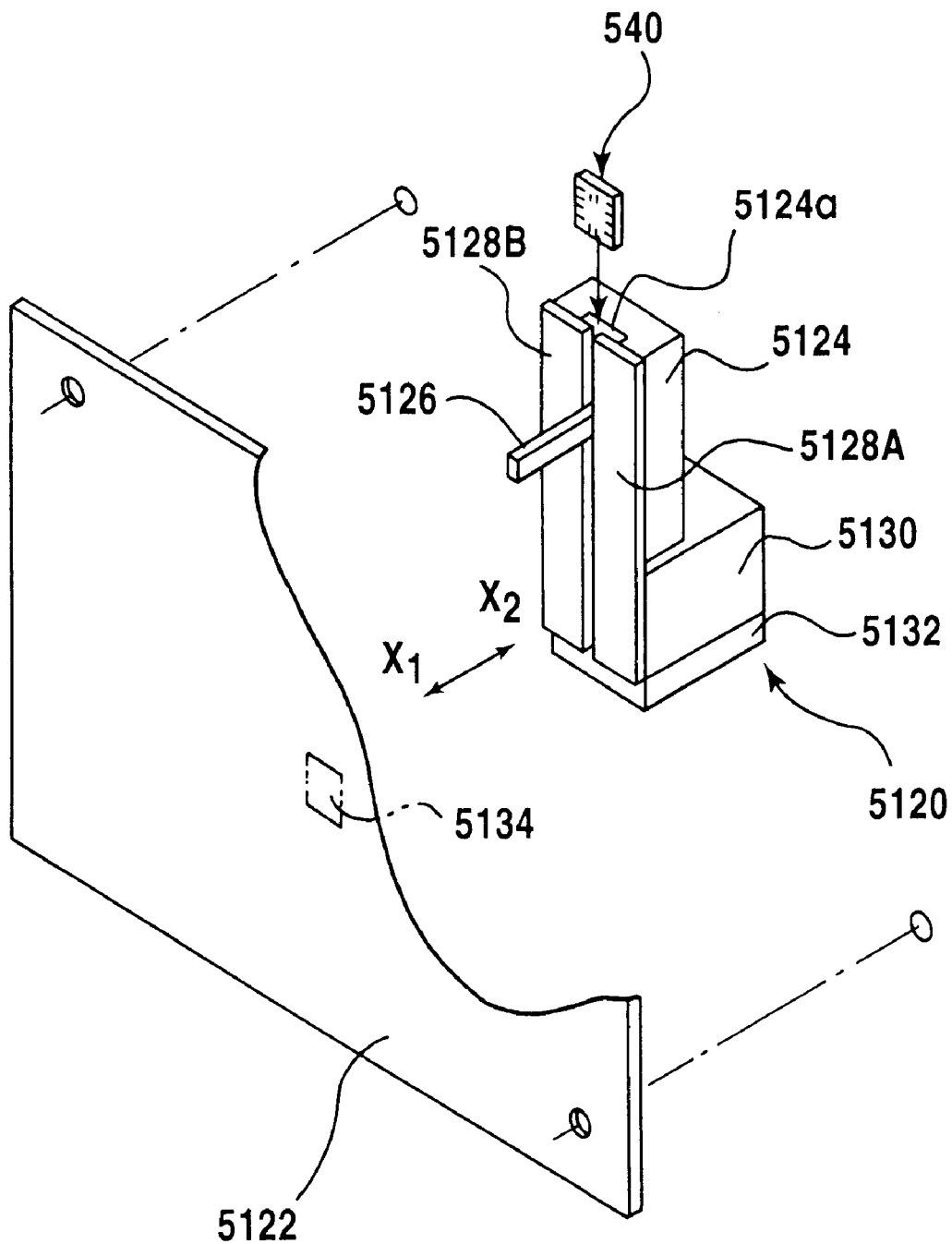
Figure 201:
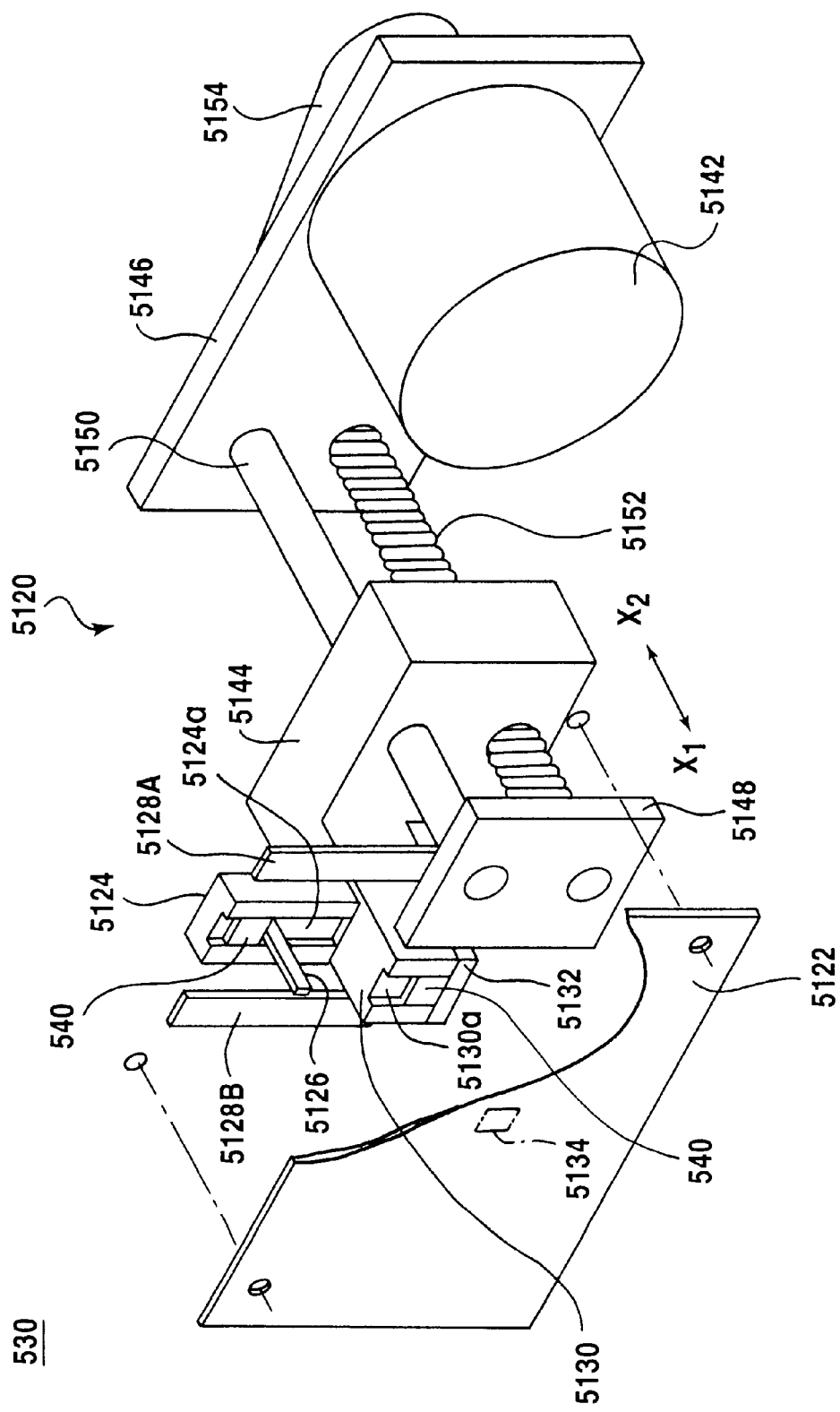
Figure 202:
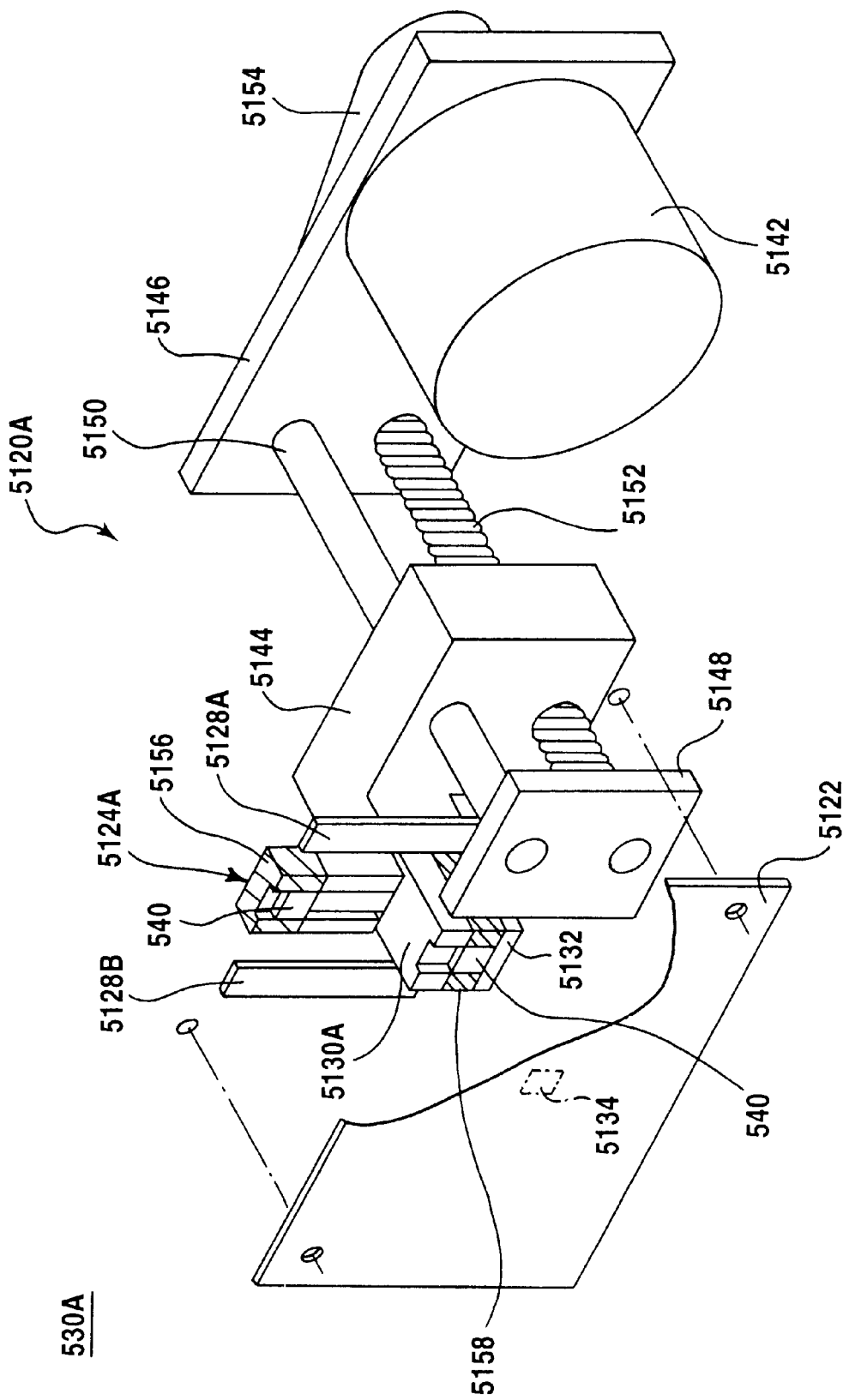
Figure 203:
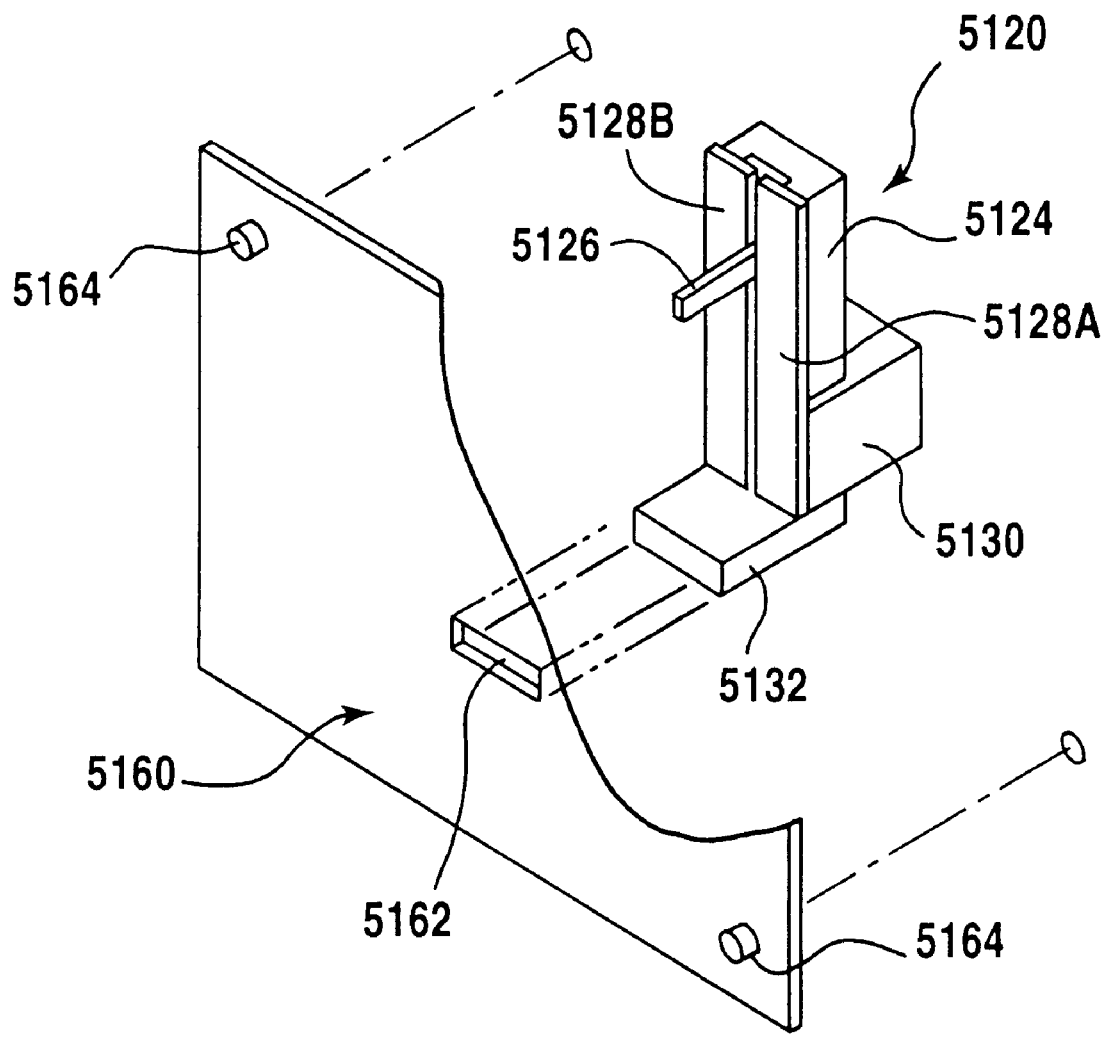
Figure 204:
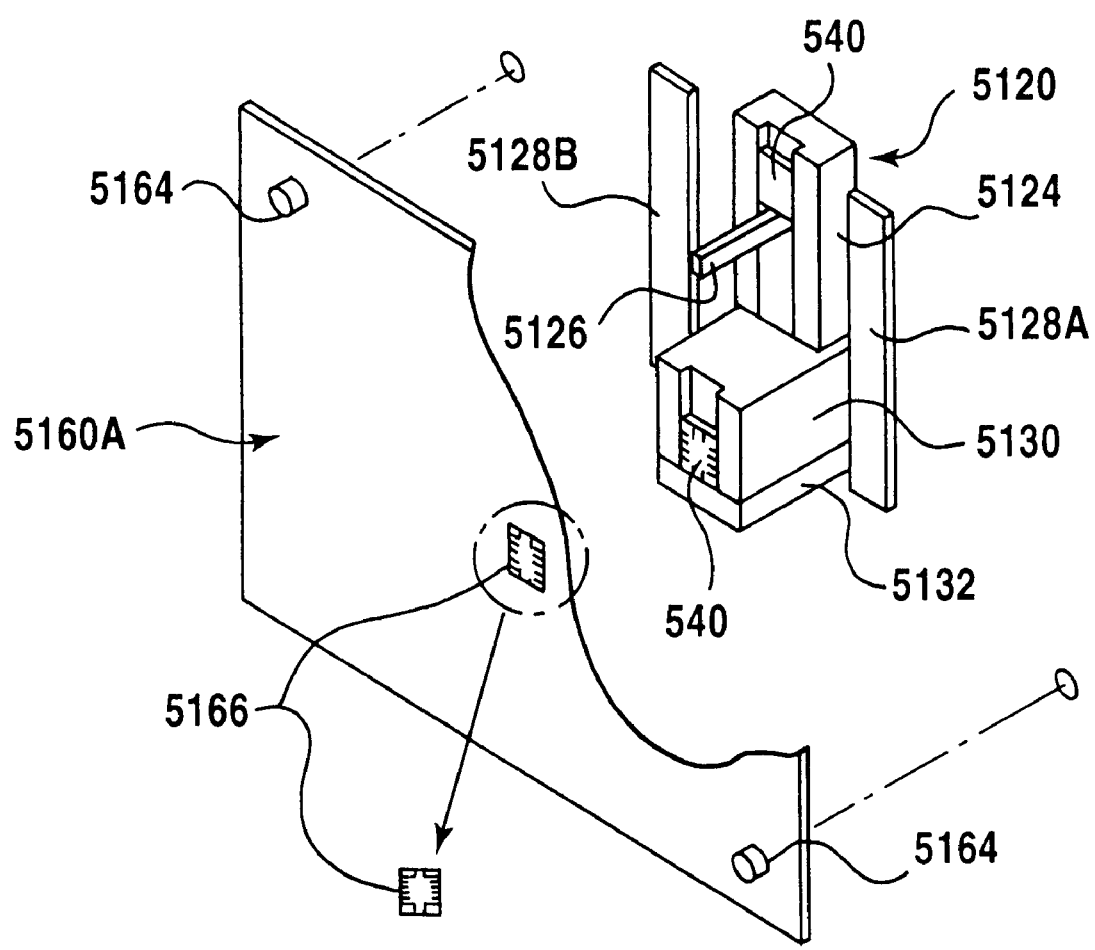

FIG. 119 is a cross-sectional view of a metallic film having a two-layer structure;

FIG. 120 is a cross-sectional view of a metallic film having a three-layer structure;

FIG. 121 is a cross-sectional view of a metallic film having a four-layer structure;

FIG. 122 is a cross-sectional view showing a resist coating step of a method of producing the semiconductor device according to the nineteenth embodiment of the present invention;

FIG. 123 is a cross-sectional view showing a resist pattern forming step of the method of producing the semiconductor device according to the nineteenth embodiment of the present invention;

FIG. 124 is a cross-sectional view showing a metallic film forming step of the method of producing the semiconductor device according to the nineteenth embodiment of the present invention;

FIG. 125 is a cross-sectional view of a completed lead frame;

FIG. 126 is a cross-sectional view showing a chip mounting step of the method of producing the semiconductor device according to the nineteenth embodiment of the present invention;

FIG. 127 is a cross-sectional view showing a connecting step of the method of producing the semiconductor device according to the nineteenth embodiment of the present invention;

FIG. 128 is a cross-sectional view showing a variation of the connecting step shown in FIG. 127;

FIG. 129 is a cross-sectional view of the lead frame observed when the sealing step is completed;

FIG. 130 is a cross-sectional view showing a separating step of the method of producing the semiconductor device according to the nineteenth embodiment of the present invention;

FIG. 131 is a cross-sectional view of a variation of the separating step shown in FIG. 130;

FIG. 132A is a cross-sectional view of a semiconductor device according to a twentieth embodiment of the present invention;

FIG. 132B is a top view of the semiconductor device shown in FIG. 132A in which inner parts are seen through a resin package thereof;

FIG. 133 is a cross-sectional view of a semiconductor device according to a twenty-first embodiment of the present invention;

FIG. 134 is a cross-sectional view of a semiconductor device according to a twenty-second embodiment of the present invention;

FIG. 135 is a cross-sectional view of a semiconductor device according to a twenty-third embodiment of the present invention;

FIG. 136A is a cross-sectional view-of a variation of the semiconductor device shown in FIG. 133, in which bumps as used in the device shown in FIG. 135 are employed;

FIG. 136B is a cross-sectional view of a variation of the structure shown in FIG. 136A;

FIG. 137 is a cross-sectional view of a variation of the semiconductor device shown in FIG. 134, in which bumps as used in the device shown in FIG. 135 are employed;

FIG. 138 is a cross-sectional view of a variation of the structure shown in FIG. 137;

FIG. 139A is a cross-sectional view of a semiconductor device in which a heat radiating member is attached to an exposed surface of a chip of the device shown in FIG. 138;

FIG. 139B is a cross-sectional view of a semiconductor device in which a heat radiating member having fins is attached to the exposed surface of the chip of the device shown in FIG. 138;

FIG. 140 is a cross-sectional view of a semiconductor device in which an insulating member is provided to the structure shown in FIG. 138;

FIGS. 141A, 141B and 141C are respectively cross-sectional views of a semiconductor device in which an anisotropically electrically conductive resin is employed;

FIG. 142 is a cross-sectional view of a miniaturized semiconductor device;

FIG. 143A is a plan view of a semiconductor device fabricated by a fabrication apparatus and method according to a twenty-fourth embodiment of the present invention;

FIG. 143B is a cross-sectional view of the semiconductor device shown in FIG. 143A;

FIG. 144 is a bottom view of the semiconductor device fabricated by the twenty-fourth embodiment of the present invention;

FIG. 145 is an enlarged cross-sectional view of a single-layer metallic film part;

FIG. 146 is an enlarged cross-sectional view of a metallic film part having a two-layer structure;

FIG. 147 is an enlarged cross-sectional view of a metallic film part having a three-layer structure;

FIG. 148 is an enlarged cross-sectional view of a metallic film part having a four-layer structure;

FIG. 149 is an enlarged cross-sectional view of a metallic film part having a five-layer structure;

FIG. 150A is an enlarged cross-sectional view of a metallic film part having a six-layer structure;

FIG. 150B is an enlarged cross-sectional view of a metallic film part having a seven-layer structure;

FIG. 151 shows an etching resist coating step according to the twenty-fourth embodiment of the present invention;

FIG. 152 shows an etching resist pattern forming step according to the twenty-fourth embodiment of the present invention;

FIG. 153 shows an etching step according to the twenty-fourth embodiment of the present invention;

FIG. 154 shows an etching resist removing step according to the twenty-fourth embodiment of the present invention;

FIG. 155 shows a plating resist coating step and a plating resist pattern forming step according to the twenty-fourth embodiment of the present invention;

FIG. 156 shows a metallic film forming step and a plating resist removing step according to the twenty-fourth embodiment of the present invention;

FIG. 157 is a cross-sectional view of a completed lead frame;

FIG. 158 shows an element mounting step of the fabrication method according to the twenty-fourth embodiment of the present invention;

FIG. 159 shows a connecting step according to the twenty-fourth embodiment of the present invention;

FIG. 160 shows a variation of wire bonding shown in FIG. 159;

FIGS. 161A through 161E show steps of forming the variation shown in FIG. 160;

FIGS. 162A through 162I show steps of forming stud bumps;

FIG. 163 shows the lead frame observed when the connecting step is completed;

FIG. 164 is a cross-sectional view of a mold used in a resin molding step according to the twenty-fourth embodiment of the present invention;

FIG. 164A show cavities formed in an upper-mold cavity insert;

FIG. 164B shows dam slits formed in a lower-mold cavity insert;

FIG. 165 shows upper and lower molds used in the resin sealing step;

FIGS. 166A and 166B show an etching apparatus used in a separation step;

FIG. 167 shows a carrier used in the etching apparatus;

FIG. 168 is a cross-sectional view taken along line A—A shown in FIG. 167;

FIG. 169 shows a resin package and gate portions formed on the lead frame;

FIG. 170 shows an attachment step executed in an attachment part;

FIG. 171 shows another attachment step;

FIG. 172 shows yet another attachment step;

FIGS. 173A and 173B show resin packages joined through gate portions;

FIG. 174 schematically shows a first embodiment of a gate break apparatus;

FIG. 175 is an enlarged view of a gate breaking position;

FIG. 176 is a plan view of the gate break apparatus shown in FIG. 175;

FIG. 177 schematically shows a second embodiment of the gate break apparatus;

FIG. 178 schematically shows a third embodiment of the gate break apparatus;

FIGS. 179A and 179B show a fourth embodiment of the gate break apparatus;

FIG. 180 schematically shows a fifth embodiment of the gate break apparatus;

FIG. 181 shows a chamber used for separating the resin packages and the gate portions from each other;

FIG. 182 schematically shows a first embodiment of a break away apparatus;

FIG. 183 schematically shows a second embodiment of the break away apparatus;

FIG. 184 schematically shows a third embodiment of the break away apparatus;

FIG. 185 schematically shows a fourth embodiment of the break away apparatus;

FIG. 186 shows a variation of the cavity inserts of the molds;

FIG. 187 is a block diagram of a fabrication apparatus according to a twenty-fifth embodiment of the present invention;

FIG. 188 is a diagram of another fabrication apparatus according to the twenty-fifth embodiment of the present invention;

FIG. 189 shows the fabrication apparatus shown in FIG. 187;

FIGS. 190A through 190D show a semiconductor device fabricated according to the twenty-fifth embodiment of the present invention;

FIGS. 191A and 191B show an orientation discrimination part;

FIGS. 192A and 192B show another orientation discrimination part;

FIG. 193 shows an orientation part provided in the fabrication apparatus shown in FIG. 188;

FIGS. 194A through 194F show an operation of the orientation part;

FIG. 195 shows a first embodiment of a separation part provided in the fabrication apparatus shown in FIG. 188;

FIG. 196 also shows the first embodiment of the separation part;

FIG. 197 shows a second embodiment of the separation part provided in the fabrication apparatus shown in FIG. 188;

FIG. 198 also shows the second embodiment of the separation part;

FIG. 199 is a perspective view of a measurement part and an outer appearance check part used in the fabrication apparatus shown in FIG. 188;

FIG. 200 shows a first embodiment of the measurement part;

FIG. 201 is an enlarged perspective view of the structure shown in FIG. 200;

FIG. 202 shows a second embodiment of the measurement part;

FIG. 203 is a perspective view showing how to position a movement apparatus; and FIG. 204 is a perspective view showing another method of positioning the movement apparatus.

DETAILED DESCRIPTION OF THE PREFERRED EMBODIMENTS

Figure 2:
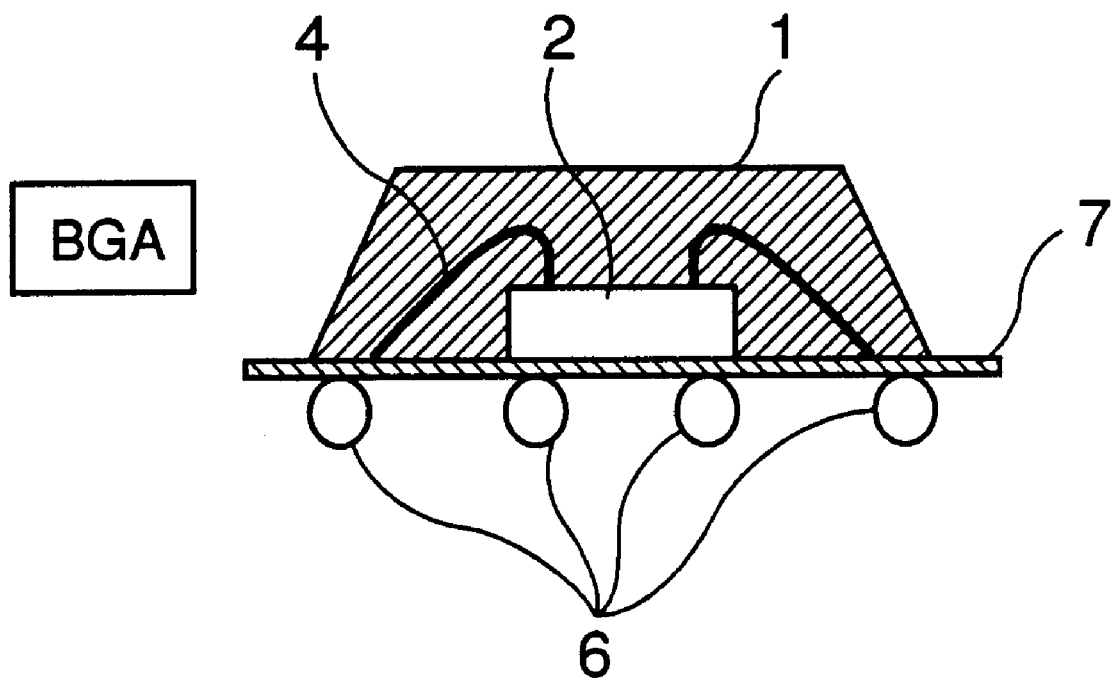
FIG. 2 is a cross-sectional view of a semiconductor device of a conventional BGA type.
Figure 3:
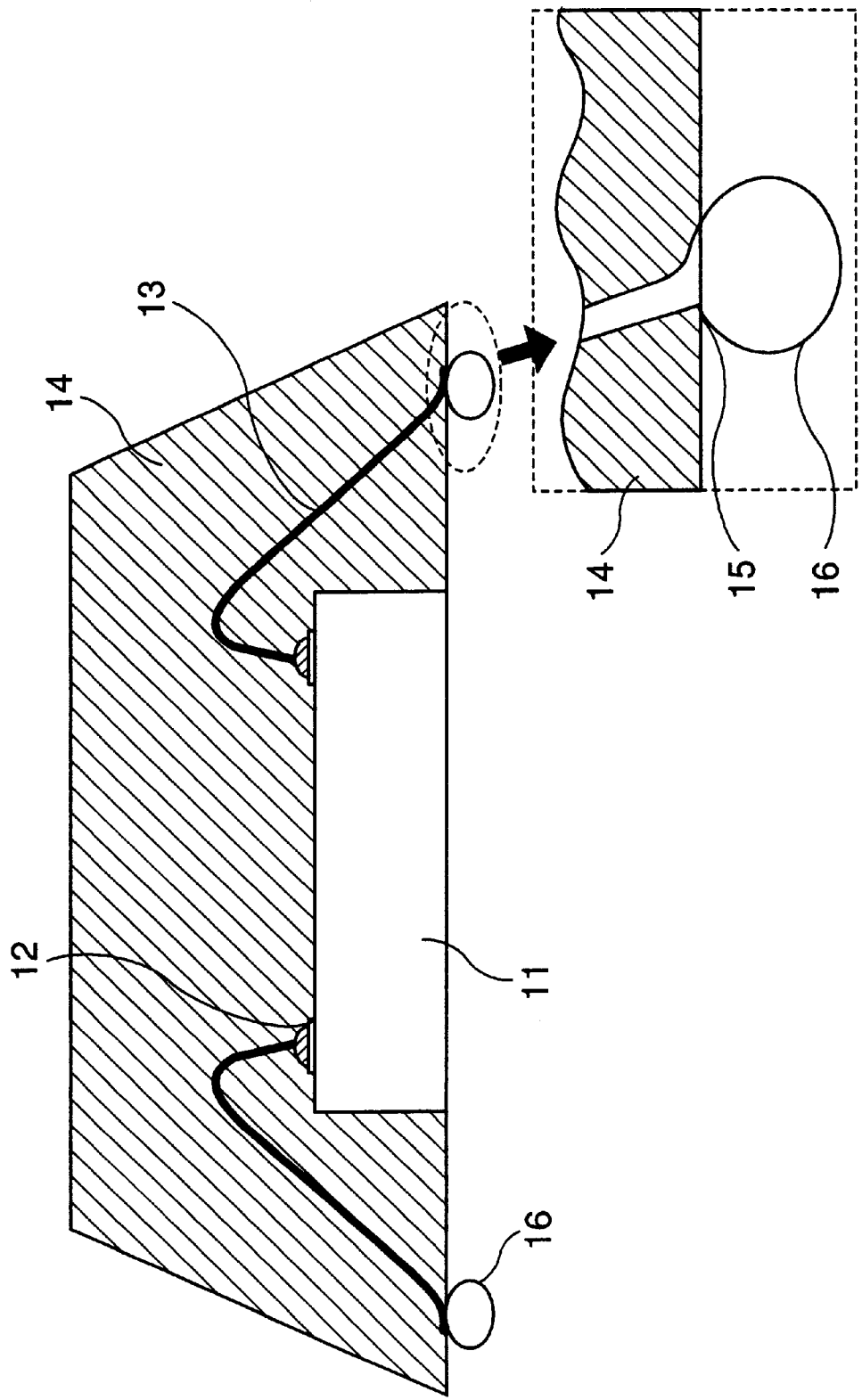
FIG. 3 is a cross-sectional view of a semiconductor device according to a first embodiment of the present invention.

FIG. 3 shows a semiconductor device according to a first embodiment of the present invention. The device shown in FIG. 3 includes a chip 11, electrode pads 12, bonding wires 13, a resin package 14, wire exposing portions 15, and solder balls 16. The chip 11 may be a semiconductor chip, a surface acoustic wave (SAW) chip, a multichip module or the like. In the specification, chips (including chips which will be described later) are semiconductor chips, and resin-packaged devices including the above chips are semiconductor devices. However, if an SAW chip is packaged, such a resin-packaged device should be called an SAW device or the like.

Ends of the bonding wires 13 are bonded to the electrode pads 12 provided on the chip 11 by a wire bonder, and the other ends of the bonding wires 13 are exposed in the wire exposing portions formed on the bottom surface of the resin package 14. The diameter of the wire exposing portions 15 is greater than that of the bonding wires 13. The exposed ends of the bonding wires 13 are flush with the bottom surface of the resin package. The solder balls 16 are joined to the bonding wires 13 in the wire exposing portions 15 in which the ends of the wires 13 are exposed from the resin package 14.

The above structure does not require the inner leads and outer leads necessary for the SSOP, so that there is no need to provide a lead extending area in which the inner leads are arranged as well as an area occupied by the outer leads. Further, the structure shown in FIG. 3 does not need a mount base necessary for providing solder balls in the BGA type. Hence, the semiconductor device according to the first embodiment of the present invention needs a smaller mounting area and is less expensive.

A description will now be given of a method of producing the semiconductor device shown in FIG. 3.

Figure 4:
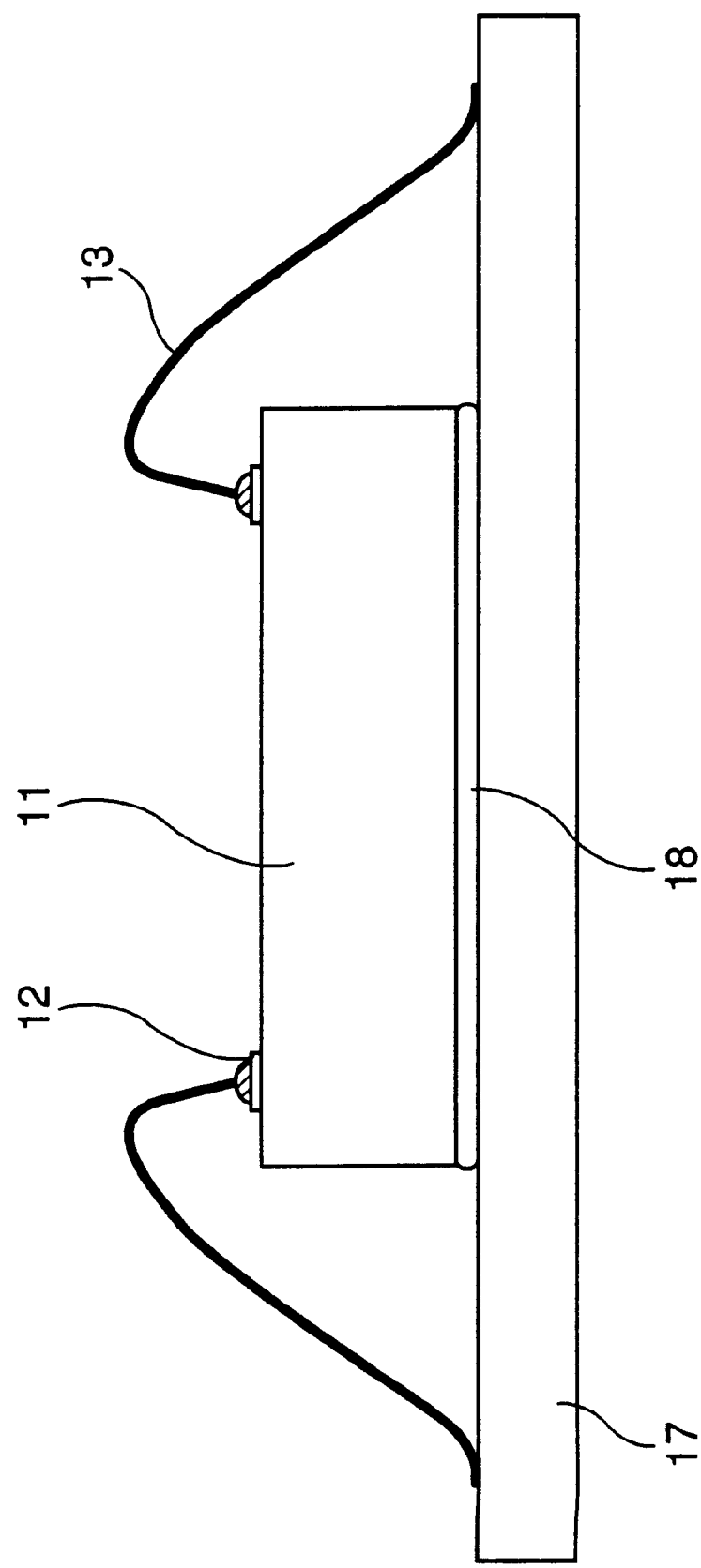
FIG. 4 is a side view of a step of a method of producing the semiconductor device shown in FIG. 3.

As shown in FIG. 4, the chip 11 is mounted on a lead frame 17 by a die attaching agent 18. The lead frame 17 is made of an alloy such as a copper alloy, and is 0.1–0.2 mm thick. Next, the bonding wires 13 are bonded to the electrode pads 12 on the chip 11 and predetermined portions of the lead frame 17. The above predetermined portions are plated with Au, Ag, Pd or the like.

Figure 5:
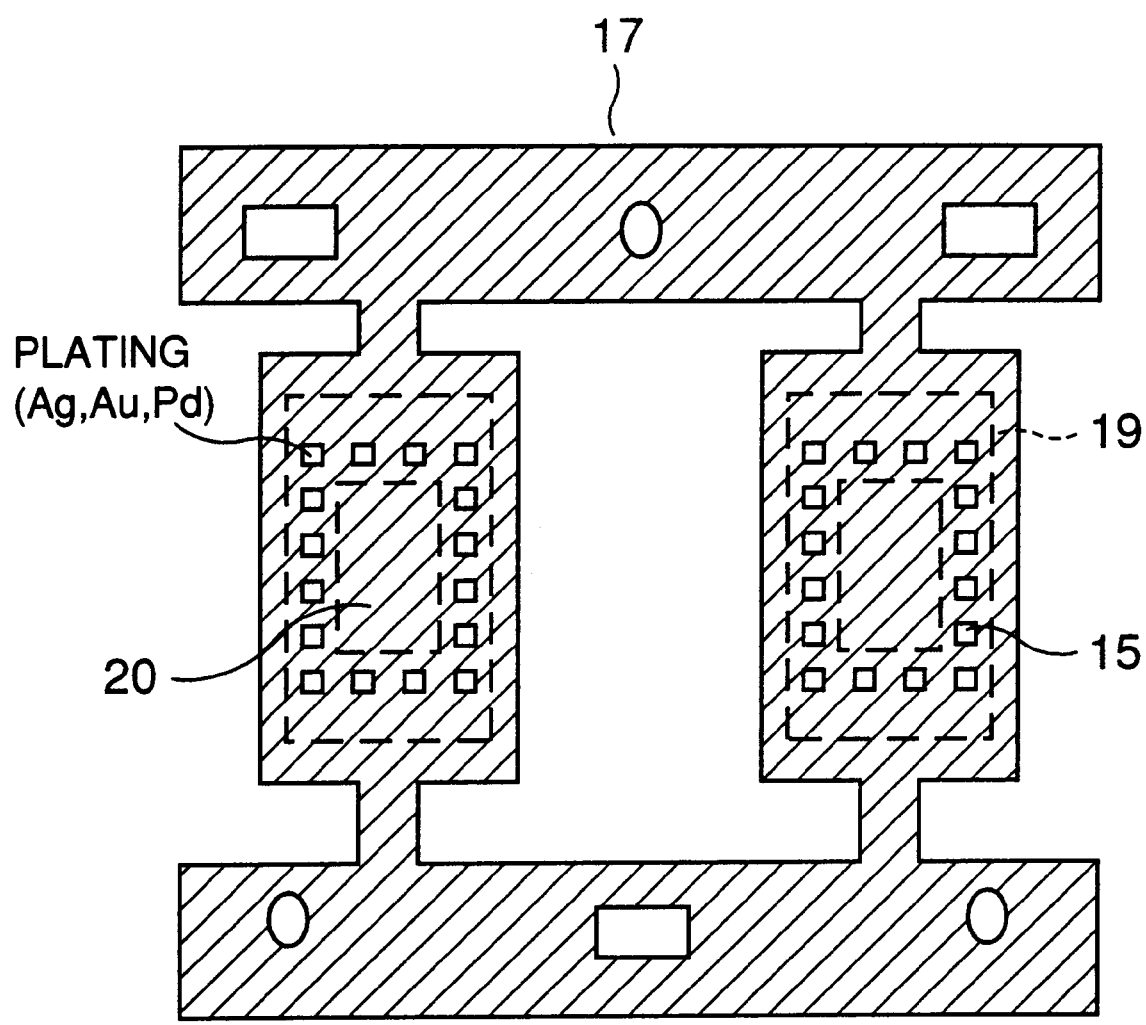
FIG. 5 is a plan view of a lead frame used to produce semiconductor devices according to the first embodiment of the present invention.

Then, as shown in FIG. 5, the lead frame 17 on which the chip 11 is mounted is accommodated in a die (not shown), and is then sealed by molding resin. In this step, the molded resin is provided up to an area indicated by mold lines 19 which enclose the wire exposing portions 15.

Figure 6:
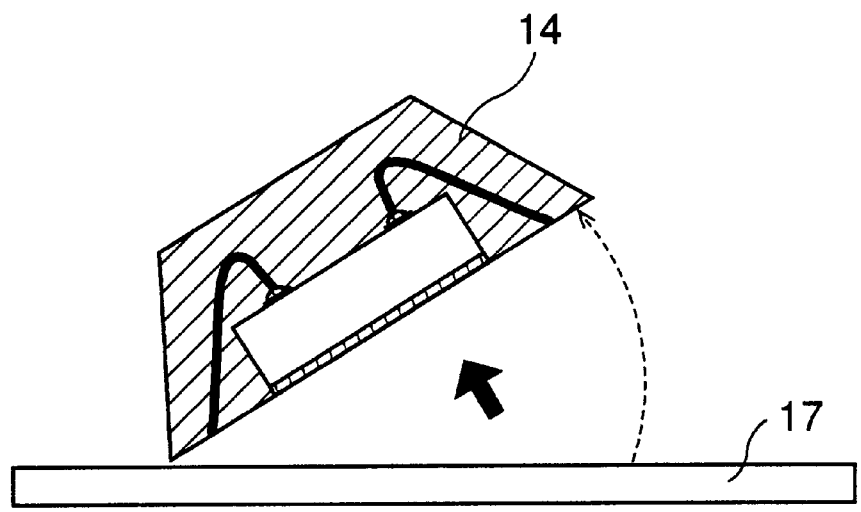
FIG. 6 is a cross-sectional view showing another step of the method of producing the semiconductor device shown in FIG. 3.

Thereafter, as shown in FIG. 6, the resin package 14 is separated from the lead frame 17. The separating step can be carried out by utilizing a process based on the difference between linear expansion coefficients of the resin package 14 and the lead frame 17, or another process in which the resin package 14 and the lead frame 17 are joined with a less-tight adhesiveness. For example, the surface of the lead frame 17 is plated or made to be flat. By the above process, the separating process can be facilitated.

Figure 7:
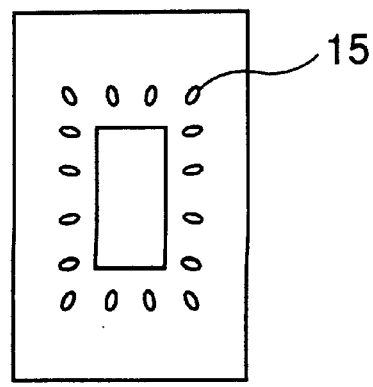
FIG. 7 is a bottom view of a resin package observed when the step shown in FIG. 6 is completed.

FIG. 7 is a bottom view of the package after the separating process is carried out. The wire exposing portions 15 are located so as to surround the chip 11. The area of each of the wire exposing portions 15 is greater than the area of the cross section of each of the bonding wires 13 because the ends of the wires are crushed and shaped into a nail head shape during the bonding process.

The bonding may be carried out in the state shown in FIG. 7. Alternatively, the solder balls 16 can be provided to the wire exposing portions 15, as shown in FIG. 3. The solder balls 16 can be formed by forming balls of solder (about 0.5–0.8) beforehand, placing the balls in the wire exposing portions 15 with a flux applied, and performing a reflow heat treatment, so that the spherically-shaped solder balls 16 can be formed.

[Second Embodiment]

A description will now be given, with reference to FIGS. 8 through 13, of a semiconductor device and its production method according to a second embodiment of the present invention. In these figures, parts that are the same as those shown in the previously described figures are given the same reference numbers.

Figure 8:
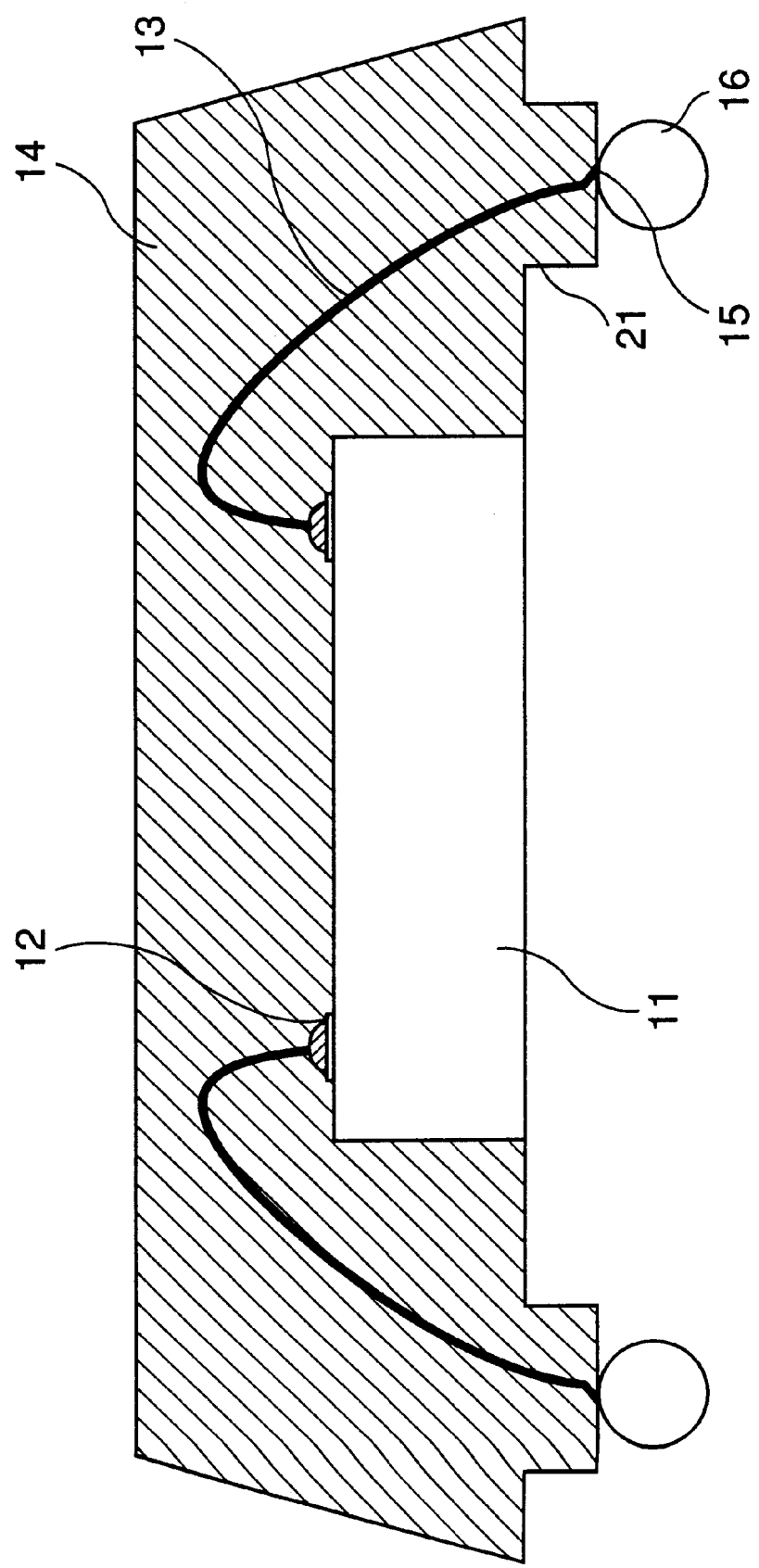
FIG. 8 is a cross-sectional view of a semiconductor device according to a second embodiment of the present invention.

FIG. 8 shows a semiconductor device according to the second embodiment of the present invention, which has resin projections 21 projecting from the bottom surface (the mounting side) of the package by, for example, 0.05–1.00 mm. The bonding wires 13 are exposed from the bottom surfaces of the resin projections 21. The area of each of the wire exposing portions 15 is greater than the area of the cross-section of each of the bonding wires 13.

Figure 9:
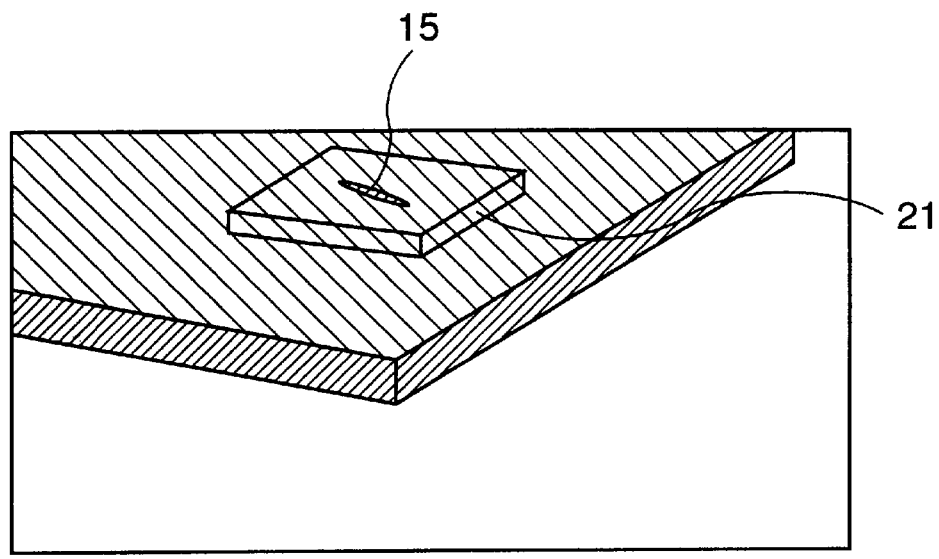
FIG. 9 is an enlarged perspective view of a resin projection used in the semiconductor device shown in FIG. 8.
Figure 10:
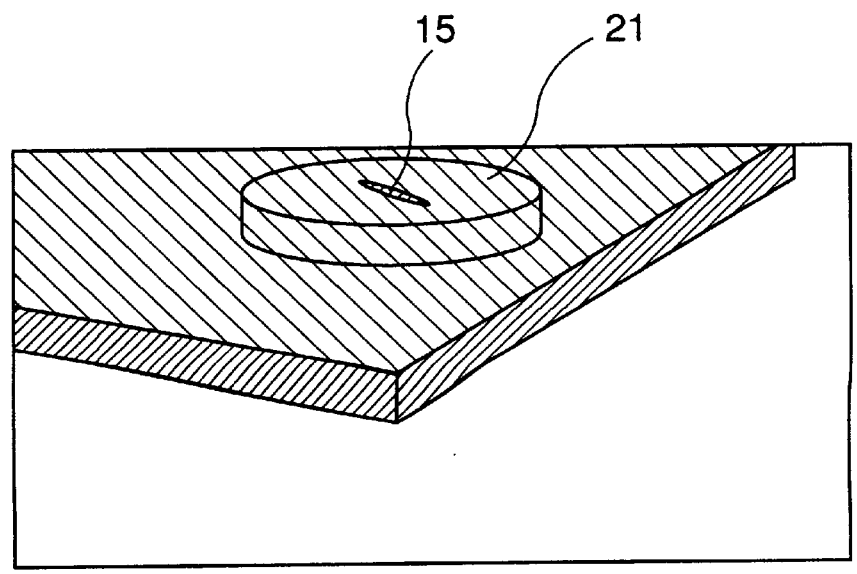
FIG. 10 is an enlarged perspective view of an alternative of the resin projection used in the semiconductor device shown in FIG. 8.

The resin projections 21 may have a rectangular parallelepiped shape as shown in FIG. 9, a cylindrical shape as shown in FIG. 10, or an arbitrary shape.

The solder balls 16 are joined to the wire exposing portions 15. Due to the resin projections 21, the solder balls 16 do not flush with the bottom surface of the package. This structure is not affected by a curvature or deformation of the package. Further, the above structure reduces the possibility of occurrence of a bridge of solder, which connects some solder balls.

The semiconductor device according to the second embodiment of the present invention can be produced as follows.

Figure 11:
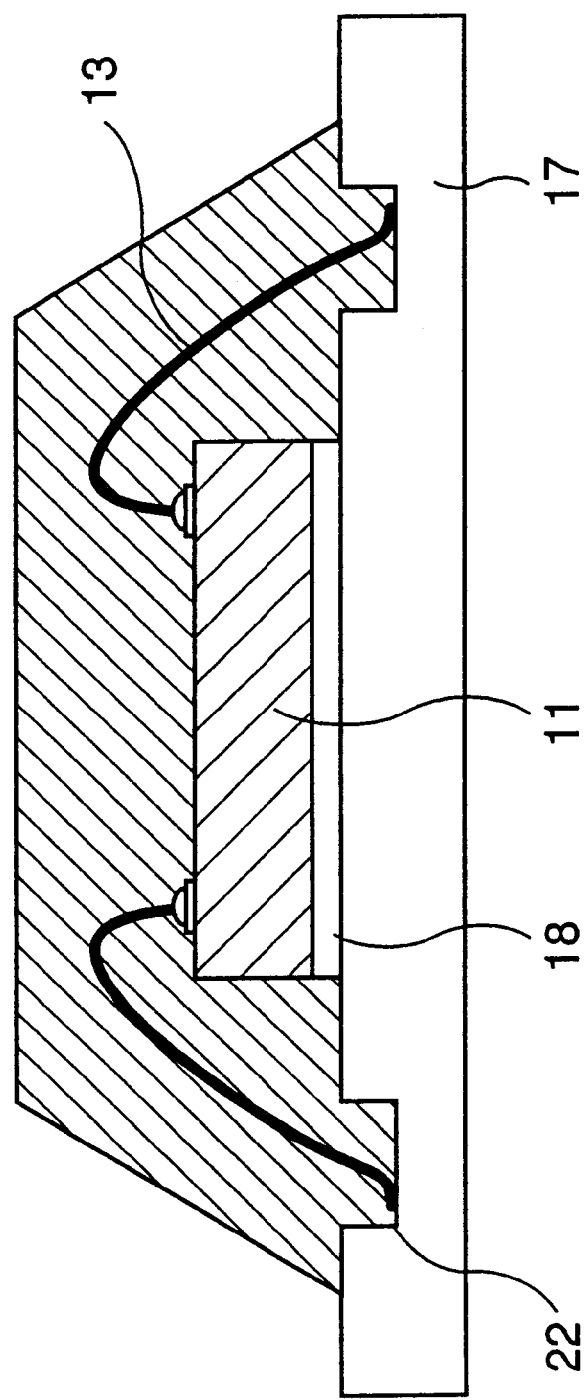
FIG. 11 is a cross-sectional view showing a step of a method of producing the semiconductor device according to the second embodiment of the present invention.

As shown in FIG. 11, the chip 11 is mounted on the lead frame 17 by the die attaching agent 18. Next, the electrode pads provided on the chip 11 and recess portions 22 formed on the lead frame 17 are bonded together by the bonding wires 13. The bottom surfaces of the recess portions 22 formed on the lead frame 17 are plated in order to enable wire bonding.

Then, in the same manner as that of the first embodiment of the present invention, the lead frame 17 on which the chip 11 is mounted is accommodated in a die (not shown), and is then sealed by molding resin. In this process, the resin is molded up to the area which encloses the wire exposing portions 15, as in the case of the first embodiment of the present invention.

Figure 12:
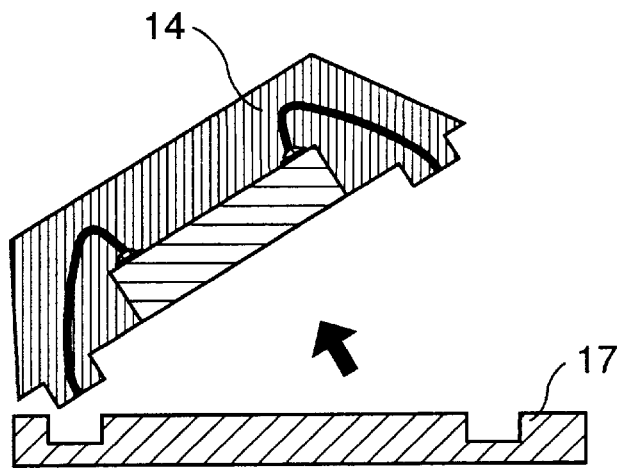
FIG. 12 is a cross-sectional view showing another step of the method of producing the semiconductor device according to the second embodiment of the present invention.

Thereafter, as shown in FIG. 12, the resin package 14 is separated from the lead frame 17 in the same manner as that of the first embodiment of the present invention.

Figure 13:
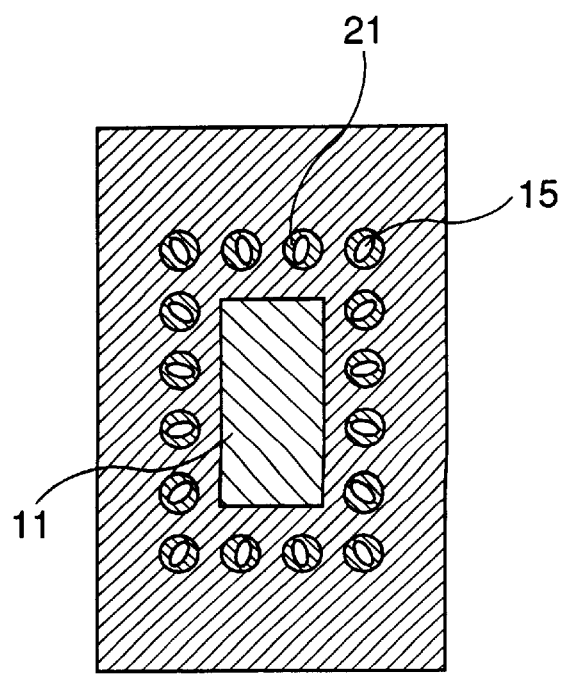
FIG. 13 is a bottom view of a package after the step shown in FIG. 12 is completed.

FIG. 13 shows a bottom view of the package after the separating process is carried out. The wire exposing portions 15 in the resin projections 15 are located so as to surround the chip 11. The area of each of the wire exposing portions 15 is greater than the area of the cross section of each of the bonding wires 13.

In the state shown in FIG. 13, solder paste may be coated to lands provided on a circuit board, and then the package may be mounted on the circuit board. Alternatively, solder balls 16 shown in FIG. 8 may be provided to the wire exposing portions 15. The solder balls 16 can be formed in the same manner as those used in the first embodiment of the present invention.

[Third Embodiment]

A description will now be given, with reference to FIGS. 14 through 18, of a semiconductor device according to a third embodiment of the present invention and its production method. In these figures, parts that are the same as those shown in the previously described figures are given the same reference numbers.

Figure 14:
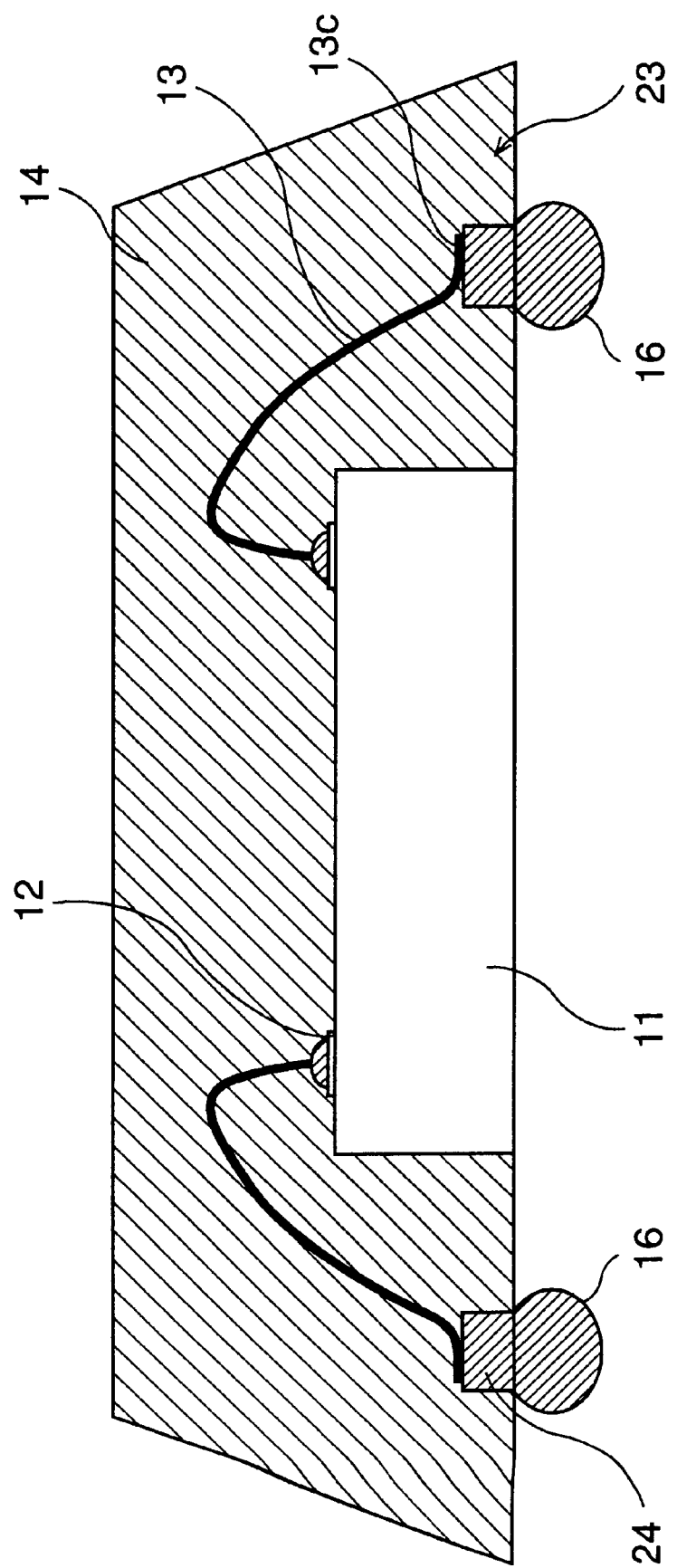
FIG. 14 is a cross-sectional view of a semiconductor device according to a third embodiment of the present invention.

FIG. 14 shows a semiconductor device according to the third embodiment of the present invention, which has recess portions 23 formed in the resin package 14 and solder-buried portions 24. The solder balls 16 are connected to the bonding wires 13 via the solder-buried portions 24.

Figure 15:
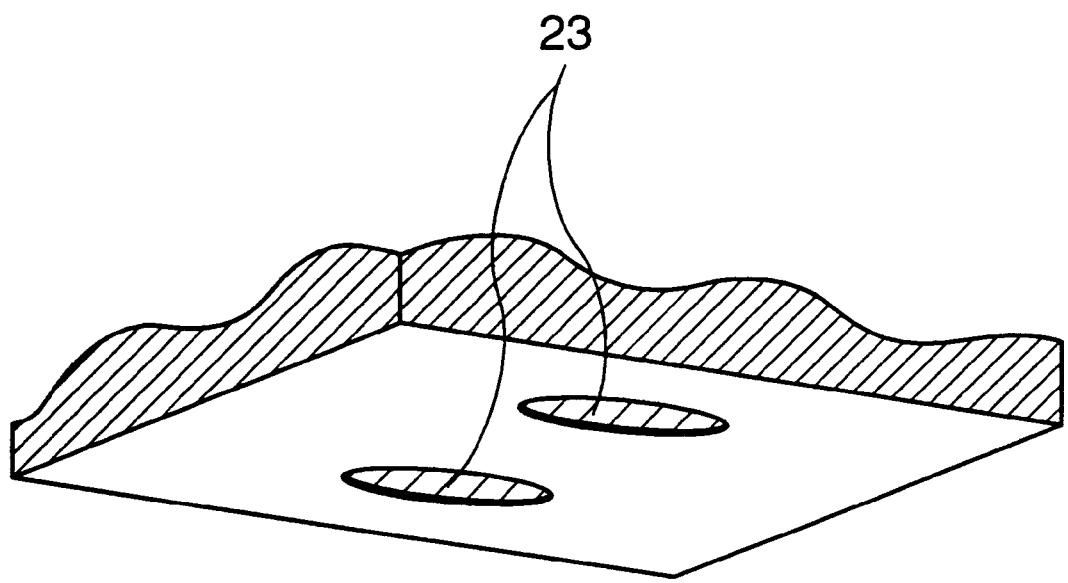
FIG. 15 is an enlarged perspective view of resin projections used in the semiconductor device according to the third embodiment of the present invention.

FIG. 15 shows a package observed before the solder balls 16 are provided and the solder-buried portions 24 are formed. The bottoms of the recess portions 23 are 0.05–0.20 mm lower than the bottom surface of the package. The ends of the bonding wires 13 are exposed in the bottoms of the recess portions 23. The area of each of the wire exposing portions is greater than the area of the cross section of each of the bonding wires 13. The recess portions 23 may have a rectangular parallelepiped shape, a cylindrical shape or an arbitrary shape.

The solder-buried portions 24 are provided between the solder balls 16 and the wire exposing portions 15. Due to the solder-buried portions 24, the strength of joining the solder balls 16 and the wire exposing portions 15 can be enhanced as compared with those in the first and second embodiments of the present invention. This is because larger end portions 13c of the bonding wires 13 can be joined to the solder-buried portions 24, and the solder balls 16 can be joined to the entire exposed surfaces of the solder-buried portions 24.

A method of producing the semiconductor device shown in FIG. 14 will be described below.

Figure 16:
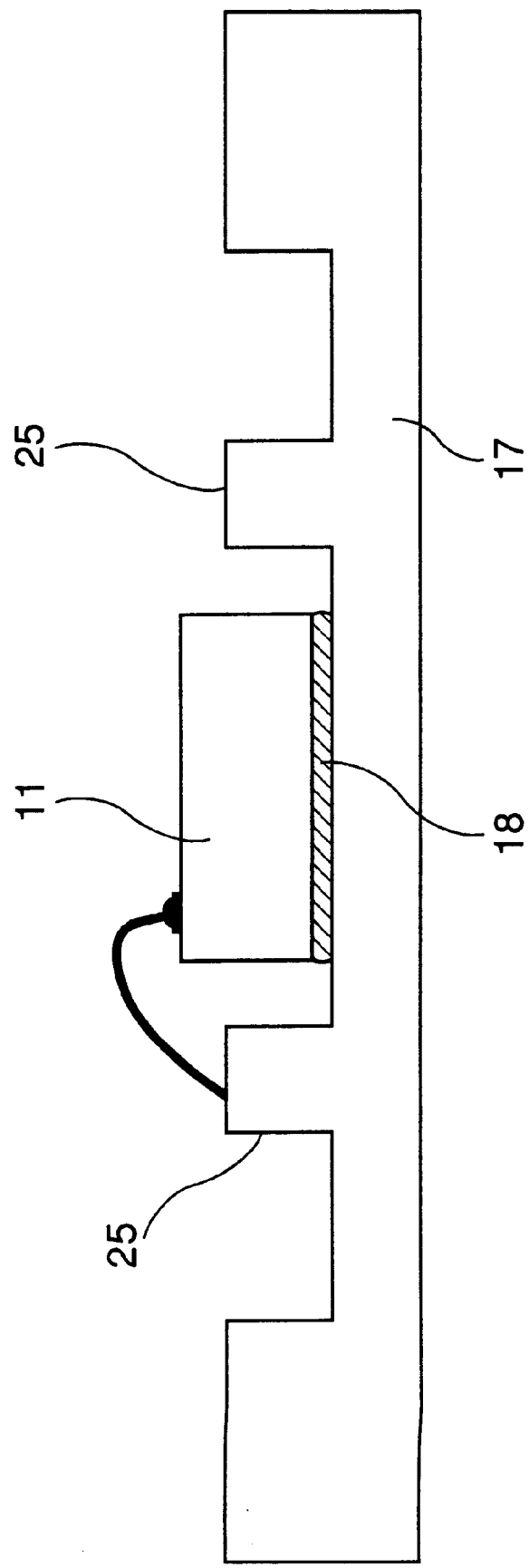
FIG. 16 is a side view showing a step of a method of producing the semiconductor device according to the third embodiment of the present invention.

As shown in FIG. 16, the chip 11 is mounted on the lead frame 17 by the dice attaching agent 18. Next, the electrode pads provided on the chip 11 and protruding portions 25 formed on the lead frame 17 are bonded together by the bonding wires 13. The protruding portions 25 formed on the lead frame 17 are plated in order to enable wire bonding.

Figure 17:
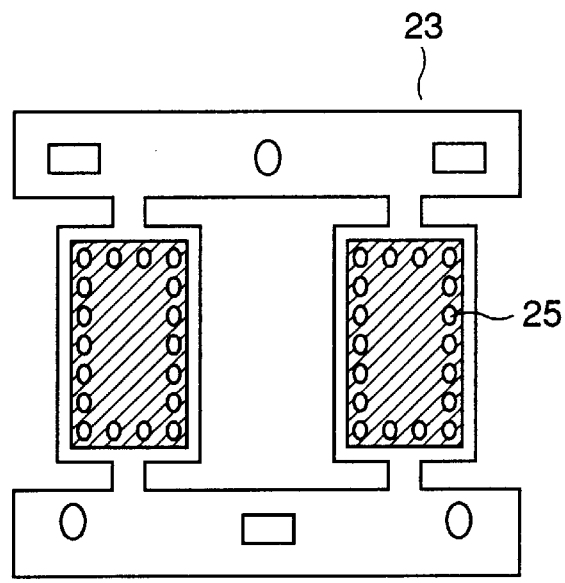
FIG. 17 is a plan view of a lead frame used to produce semiconductor devices according to the third embodiment of the present invention.

A half-etching step is carried out for the lead frame 17, as shown by oblique lines shown in FIG. 17 except for the protruding portions 25 in order to define the protruding portions 25. Alternatively, a stamping process can be used to form the protruding portions 25. In the stamping process, punches are provided to terminal forming areas and the lead frame 17 is plastically deformed Then, in the same manner as that of the first embodiment of the present invention, the lead frame 17 on which the chip 11 is mounted is accommodated in a die (not shown), and is then sealed by molding resin. In this process, the molded resin extends up to the area which encloses the wire exposing portions 15, as in the case of the first embodiment of the present invention.

Figure 18:
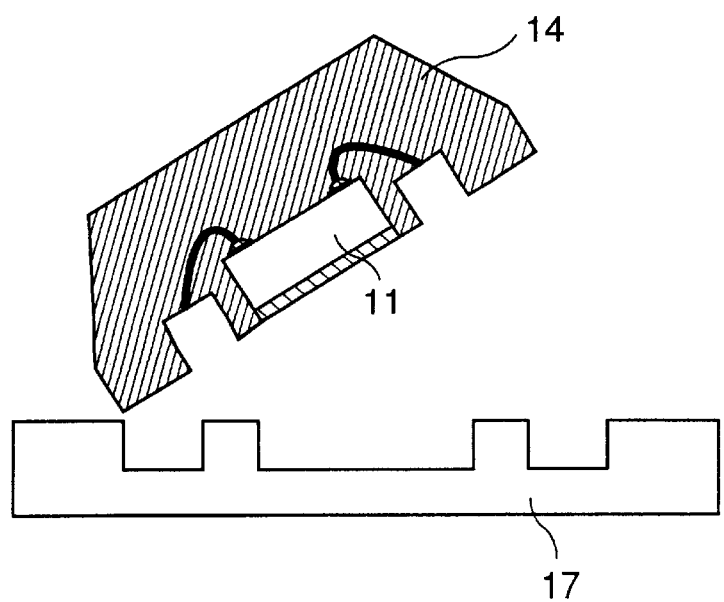
FIG. 18 is a cross-sectional view showing another step of the method of producing the semiconductor device according to the third embodiment of the present invention.

Thereafter, as shown in FIG. 18, the resin package 14 is separated from the lead frame 17 in the same manner as that of the first embodiment of the present invention.

FIG. 13 shows a bottom view of the package after the separating process is carried out. It will be noted that FIG.

13 was used in the aforementioned description directed to the second embodiment of the present invention. It will be noted that the recess and protruding portions cannot be discriminated in the bottom views of the packages used in the second and third embodiments. The wire exposing portions 15 exposed in the recess portions 23 are located so as to surround the chip 11. The area of each of the wire exposing portions 15 is greater than the area of the cross section of each of the bonding wires, as in the case of the first embodiment of the present invention.

The solder balls 16 provided to the wire exposing portions 15 shown in FIG. 14 are needed to mount the semiconductor device on a circuit board. The solder balls 16 can be formed by directly placing solder balls in the recess portions 23 and forming them into a spherical shape after the reflow heat treatment. In this step, solder is provided in the solder-buried portions 24. Alternatively, solder paste can be buried in the solder-buried portions 24 by a screen printing process, and solder balls are given thereto and heated so that the solder balls are shaped in a sphere.

[Fourth Embodiment]

A description will now be given, with reference to FIGS. 19 and 20, of a semiconductor device according to a fourth embodiment of the present invention. In these figures, parts that are the same as those shown in the previously described figures are given the same reference numbers.

The fourth embodiment of the present invention differs from the first embodiment thereof in that bonding balls (bumps) 26 are provided between the ends of the bonding wires 13 and the solder balls 16. The area of each of the wire exposing portions 15 is greater than the area of the cross-section of each of the bonding wires 13. Hence, it is possible to make a more reliable contact between the bonding wires 13 and the solder balls 16.

Figure 19:
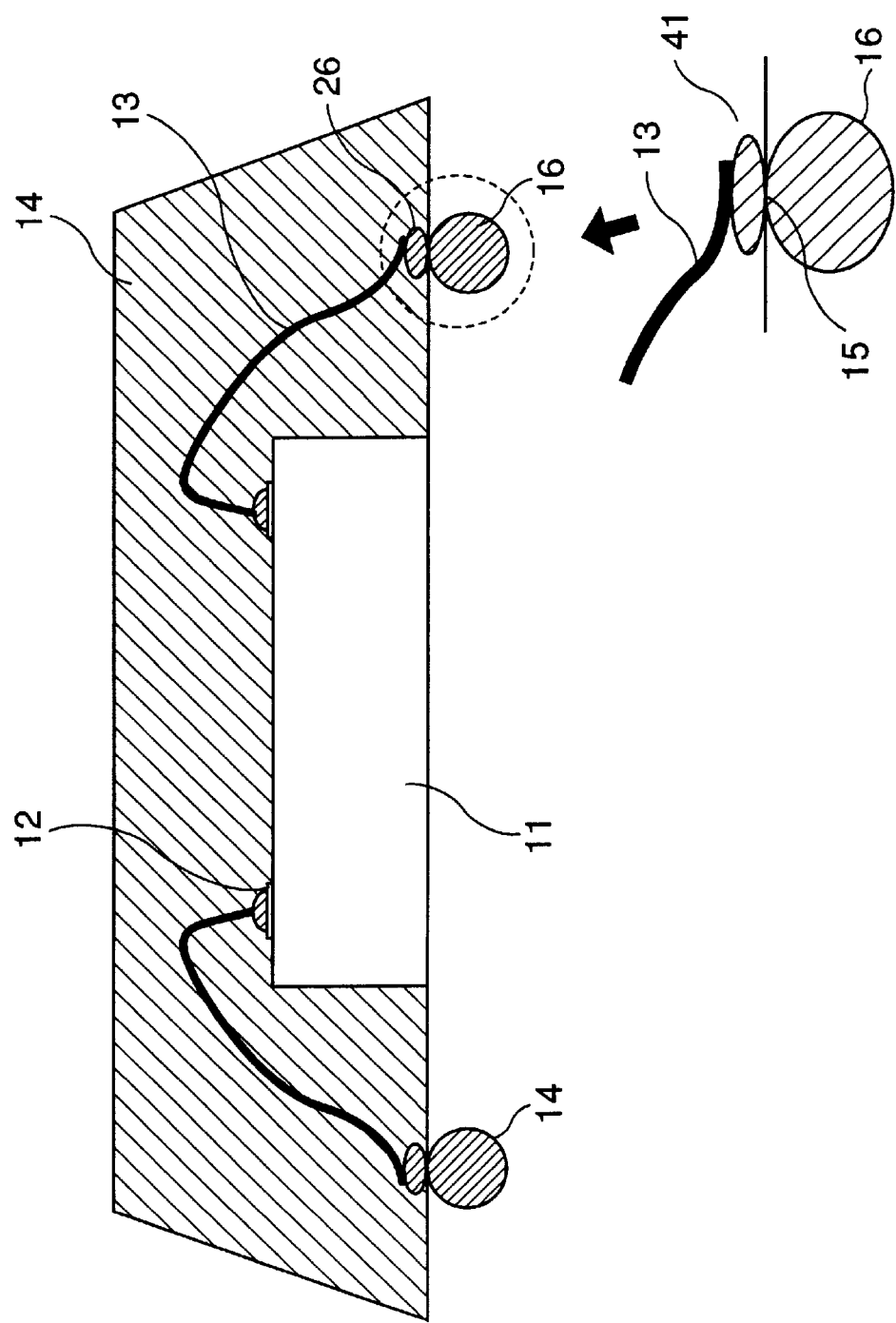
FIG. 19 is a cross-sectional view of a semiconductor device according to a fourth embodiment of the present invention.
Figure 20:
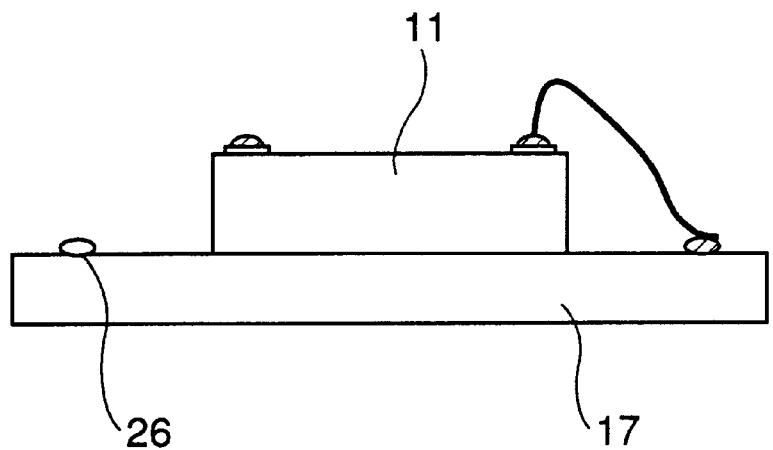
FIG. 20 is a side view showing a process of a method of producing the semiconductor device shown in FIG. 19.

The device shown in FIG. 19 is produced as follows. Referring to FIG. 20, the chip 11 is mounted on the lead frame 17, and then the bonding wires 13 are bonded, by means of a wire bonder, to electrode pads provided on the chip 11 and the bonding balls 26 provided on the lead frame 17. The bonding balls 26 are provided in given positions on the lead frame 17 after the chip 11 is mounted on the lead frame 17 and before the bonding wires 13 are bonded.

Then, in the same manner as that of the first embodiment of the present invention, the lead frame 17 on which the chip 11 is mounted is accommodated in a die (not shown), and is then sealed by molding resin. Thereafter, the resin package 14 is separated from the lead frame 17 in the same manner as that of the first embodiment of the present invention. In this state, the device may be mounted on a circuit board. Alternatively, the solder balls 16 may be provided to the wire exposing portions 15, as shown in FIG. 19. The solder balls 16 can be formed in the same manner as those of the first embodiment of the present invention.

[Fifth Embodiment]

Figure 21:
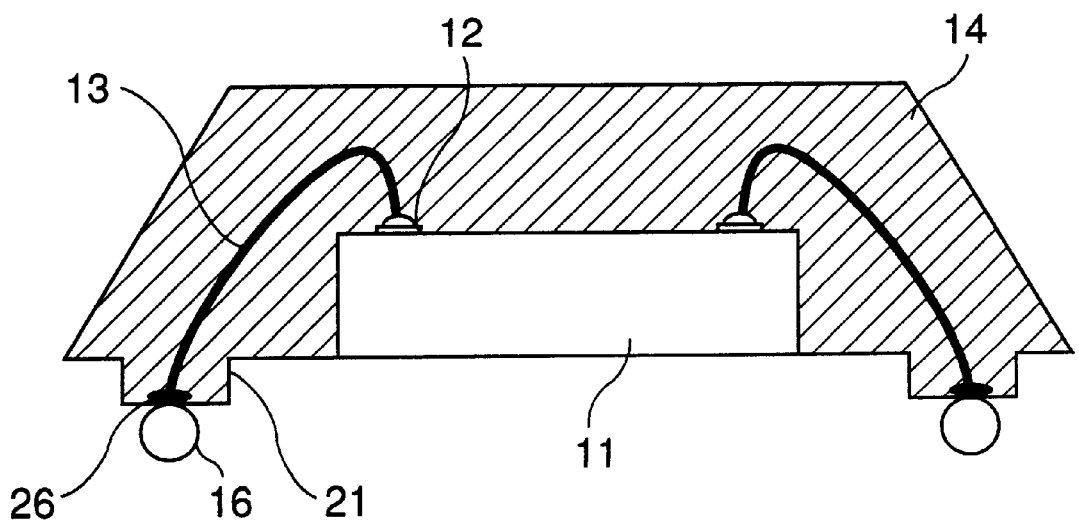
FIG. 21 is a cross-sectional view of a semiconductor device according to a fifth embodiment of the present invention.

A description will now be given, with reference to FIG. 21, of a semiconductor device according to a fifth embodiment of the present invention. The semiconductor device shown in FIG. 21 corresponds to a combination of the second embodiment of the present invention shown in FIG. 8 and the fourth embodiment thereof shown in FIG. 19. In FIG. 21, parts that are the same as those shown in the previously described figures are given the same reference numbers.

The fifth embodiment of the present invention has a feature such that the bonding balls 26 are exposed from the bottom surfaces of the resin projections 21, and the solder balls 16 are connected to the exposed bonding balls 26. This structure is not affected by a curvature of the package. Further, the above structure reduces the possibility of occurrence of a bridge of solder, which connects some solder balls. Furthermore, the bonding balls 26 are greater than the ends of the bonding wires 13, so that a more reliable contact can be made when mounting the device on a circuit board.

[Sixth Embodiment]

A description will now be given, with reference to FIGS. 22 and 23, of a semiconductor device according to a sixth embodiment of the present invention. In these figures, parts that are the same as those shown in the previously described figures are given the same reference numbers.

Figure 22:
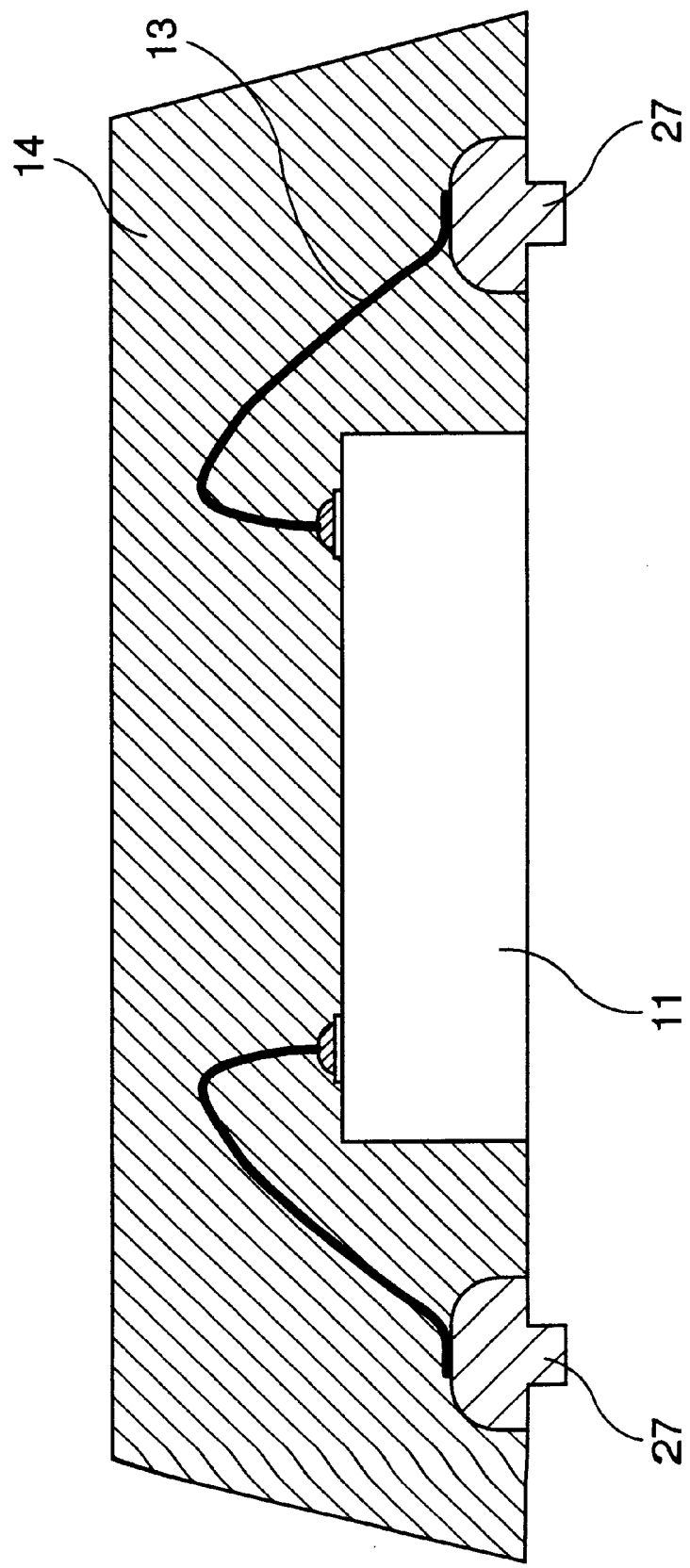
FIG. 22 is a cross-sectional view of a semiconductor device according to a sixth embodiment of the present invention.

The sixth embodiment of the present invention has a feature such that bonding balls 27 as shown in FIG. 22 serving as terminals for mounting are provided instead of the above-mentioned solder balls 16. Each of the bonding balls 27 has a projection projecting from the bottom surface of the resin package 14. The length of the projection is, for example, tens of microns. Hence, the bonding balls 27 do not need any solder balls like the solder balls 16. That is, the bonding balls 27 can be directly mounted to a circuit board.

The semiconductor device shown in FIG. 22 can be produced as follows.

Figure 23:
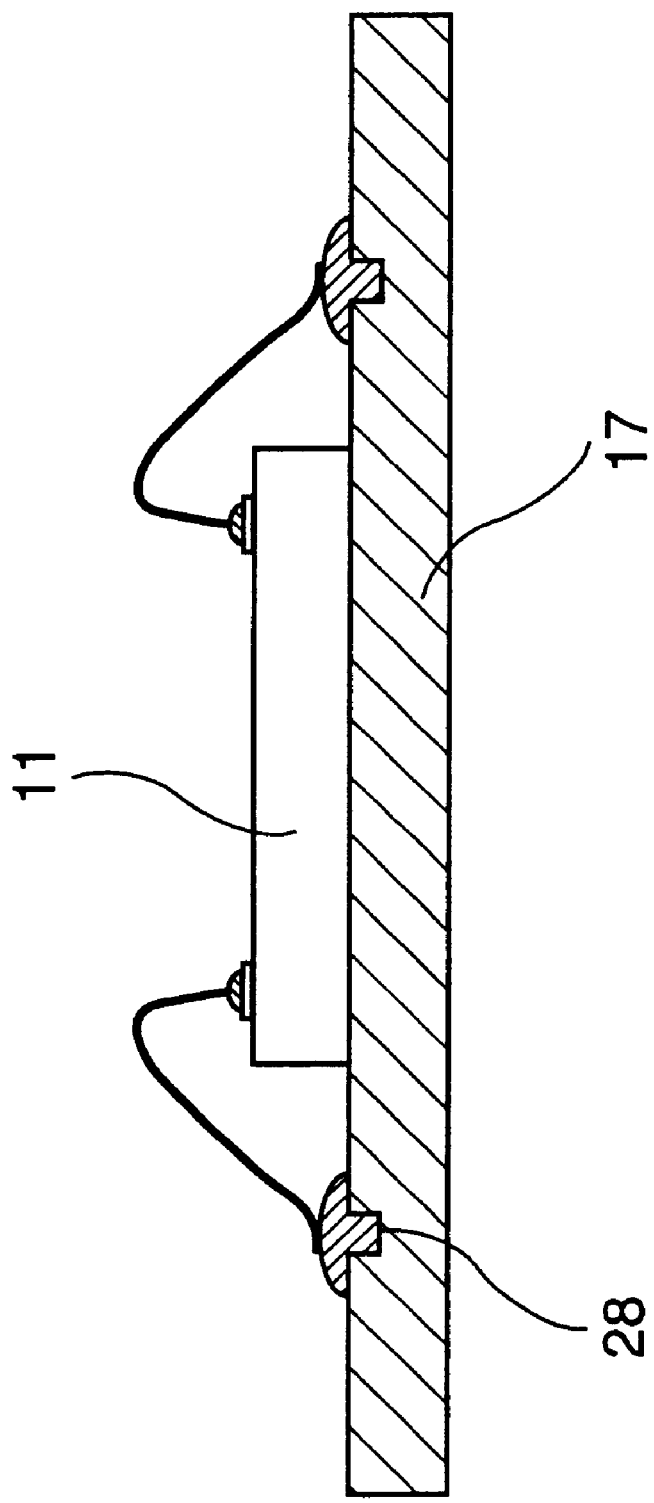
FIG. 23 is a cross-sectional view showing a step of a method of producing the semiconductor device shown in FIG. 22.

Referring to FIG. 23, the chip 11 is mounted on the lead frame 17 by the die attaching agent 18, as in the case of the first through fifth embodiments of the present invention. Next, the bonding wires 13 are bonded to the electrode pads provided on the chip 11 and recess portions 28 formed on the lead frame 17. The diameter of the recess portions 28 is less than that of the bonding balls 27. When the bonding balls 27 are pressed against the recess portions 28, the bonding balls 27 are partially inserted into the recess portions 28, so that the relationship between the bonding balls 27 and the recess portions 28 is as shown in FIG. 23. The bottom surfaces of the recess portions 28 formed in the lead frame 17 are plated in order to enable wire bonding.

Then, in the same manner as that of the first embodiment of the present invention, the lead frame 17 on which the chip 11 is mounted is accommodated in a die (not shown), and is then sealed by molding resin. Thereafter, the resin package 14 is separated from the lead frame 17 in the same manner as that of the first embodiment of the present invention.

[Seventh Embodiment]

A description will now be given, with reference to FIG. 24, of a semiconductor device according to a seventh embodiment of the present invention, which has almost the same structure as that of the third embodiment thereof except that the device shown in FIG. 24 employs bonding balls 29.

Figure 24:
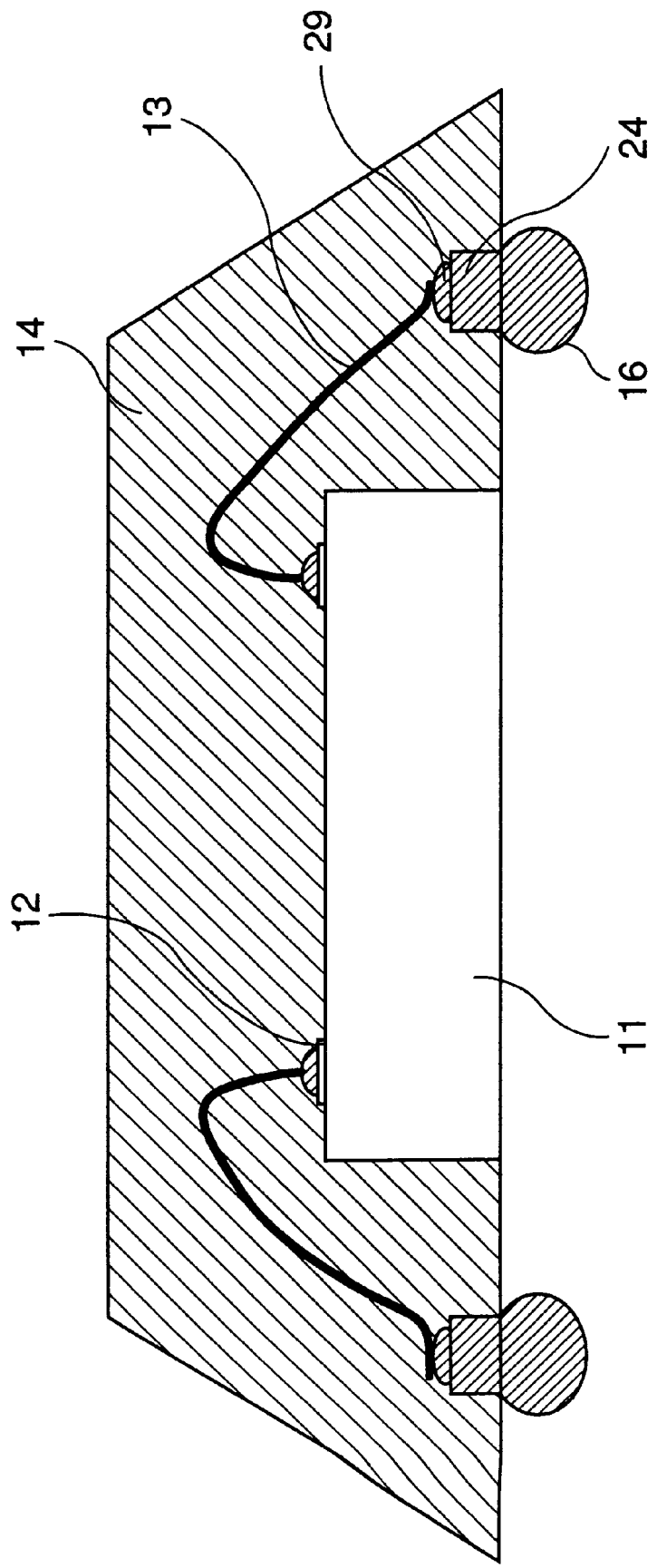
FIG. 24 is a cross-sectional view of a semiconductor device according to a seventh embodiment of the present invention.

As shown in FIG. 24, the solder balls 16 are connected to the bonding wires 13 through the solder-buried portions 24. Further, the bonding balls 29 are provided between the solder-buried portions 24 and the bonding wires 13. The bonding balls 29 are greater in size than the ends of the bonding wires 13, so that the reliability of making a contact can be increased. Further, due to the solder-buried portions 24, the strength of joining the solder balls 16 thereto can be enhanced.

[Eighth Embodiment]

Figure 28:
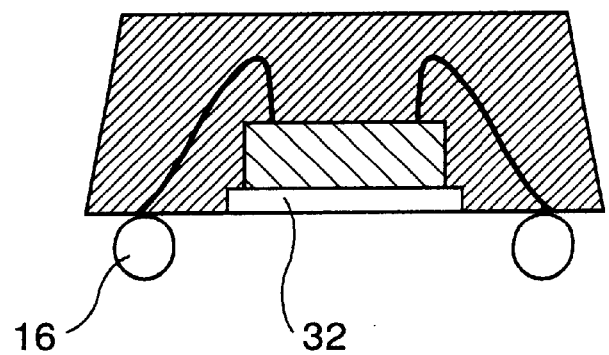
FIG. 28 is a cross-sectional view of the semiconductor device according to the eighth embodiment of the present invention.

A description will now be given, with reference to FIGS. 25 through 28, of a semiconductor device and its production method according to an eighth embodiment of the present invention. In the above-mentioned first through seventh embodiments of the present invention, the chip 11 is exposed in the bottom surface of the resin package 14. In the eighth embodiment of the present invention, the chip 11 is mounted on a die stage 32, which is exposed in the bottom surface of the resin package 14, as shown in FIGS. 26 and 28.

The semiconductor device shown in FIG. 28 can be produced as follows.

The chip is mounted on the die stage 32 of a lead frame 31 by a die attaching agent. Next, the lead frame 31 is stacked on a lead frame 30, and is fixed thereto by spot welding. Then, the bonding wires 13 are bonded to electrode pads on the chip 11 and given positions on the lead frame 30. The given positions of the lead frame 30 or the entire lead frame 30 is plated in order to enable wire bonding.

Figure 25:
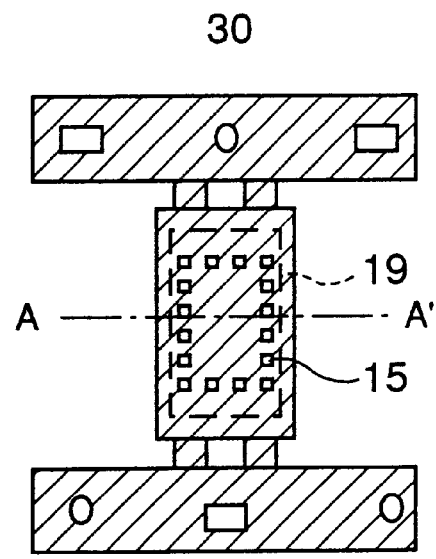
FIG. 25 is a plan view of a lead frame used to produce a semiconductor device according to an eighth embodiment of the present invention.
Figure 26:
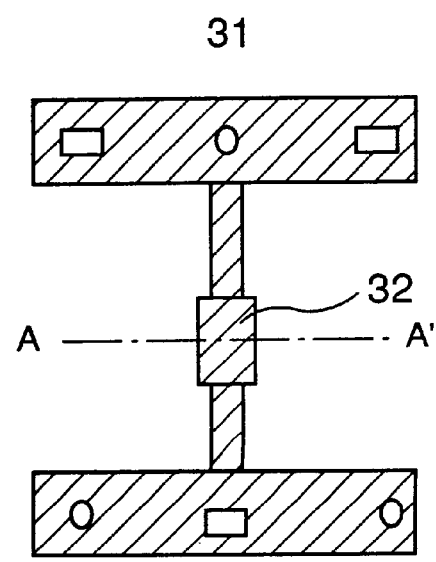
FIG. 26 is a plan view of another lead frame used to produce the semiconductor device shown in FIG. 24.
Figure 27:
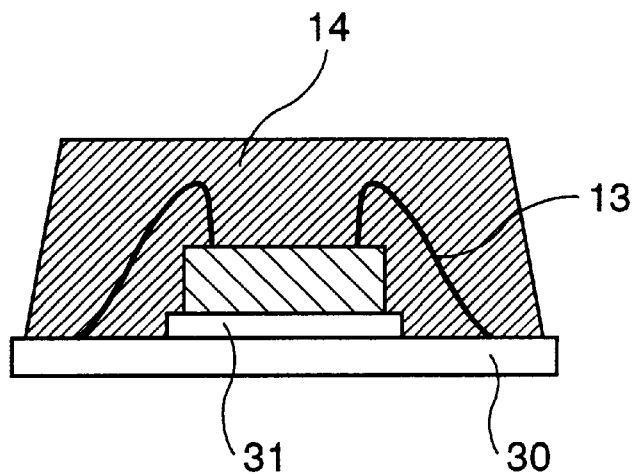
FIG. 27 is a cross-sectional view showing a step of a method of producing the semiconductor device according to the eighth embodiment of the present invention.

As shown in FIG. 25, the lead frames 30 and 31 are accommodated in a die (not shown), and are then sealed by molding resin. In this process, the molded resin extends up to the area which encloses the wire exposing portions 15. Thereafter, only the lead frame 30 is mechanically separated from the resin package 14. Then, the solder balls 16 are provided as in the case of the first embodiment of the present invention.

[Ninth Embodiment]

A description will now be given, with reference to FIGS. 29 through 31, of a semiconductor device and its production method according to a ninth embodiment of the present invention. In these figures, parts that are the same as those shown in the previously described figures are given the same reference numbers.

Figure 29:
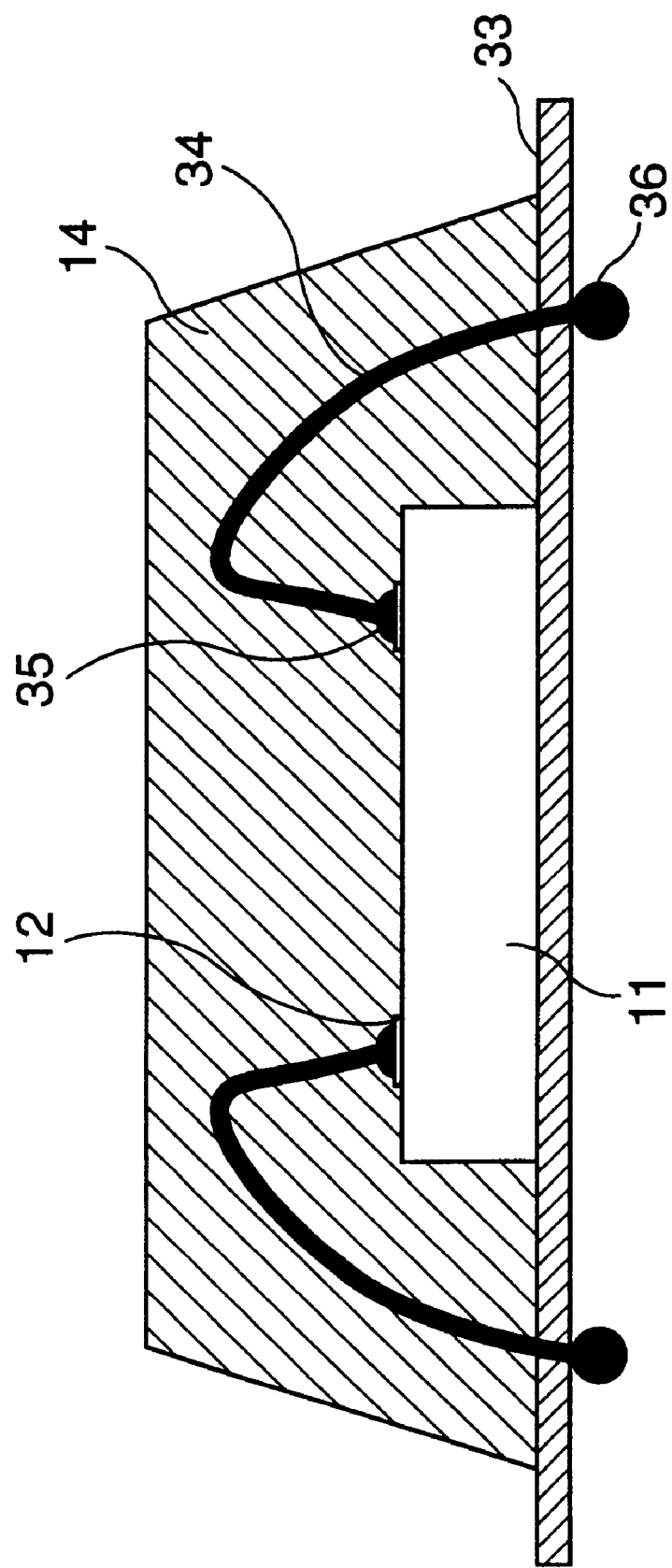
FIG. 29 is a cross-sectional view of a semiconductor device according to a ninth embodiment of the present invention.

As shown in FIG. 29, first balls 35 are formed by bonding solder wires 34 mainly containing Pb—Sn to the electrode pads 12 on the chip 11. The solder wires 34 penetrate through a lead frame 33, and form second balls 36 on the surface of the lead frame 33 opposite to the surface thereof on which the chip 11 is mounted.

The mounting of the semiconductor device shown in FIG. 29 on a circuit board is completed by soldering the second balls 36 to a foot print on the circuit board. Since the ends of the solder wires 34 form the second balls 36 for electrical connections to the circuit board, the wire bonding process and the process for forming the terminals for electrical connections to the circuit board are simultaneously carried out.

The semiconductor device shown in FIG. 29 can be produced as follows.

Figure 30:
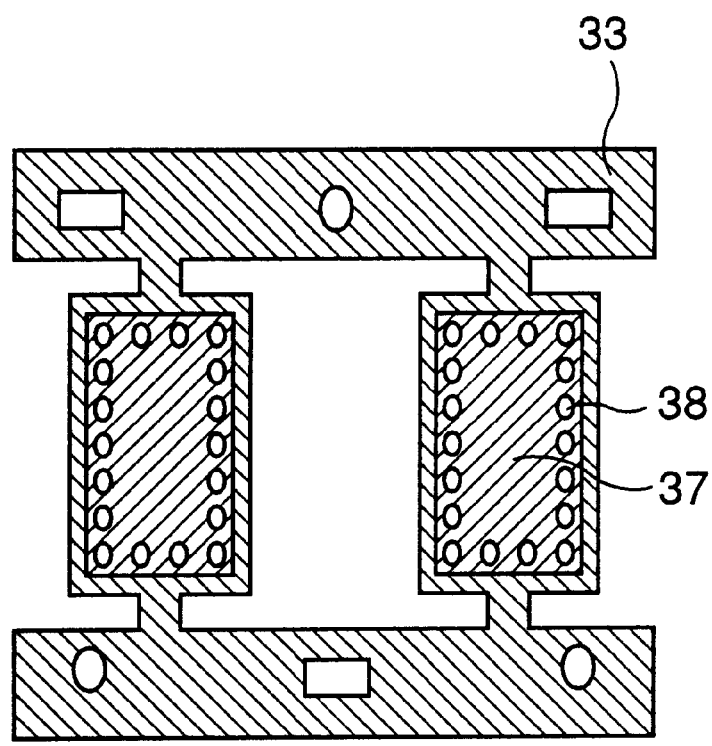
FIG. 30 is a plan view of a lead frame used to produce semiconductor devices according to the ninth embodiment of the present invention.
Figure 31:
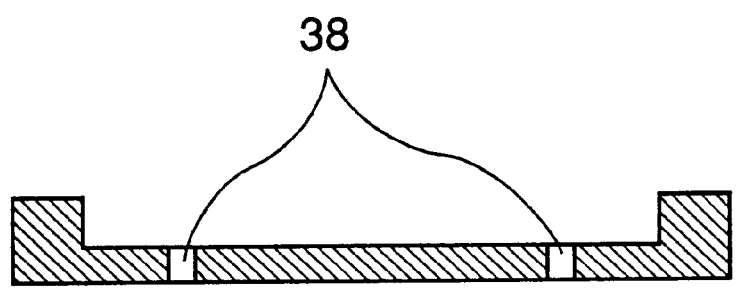
FIG. 31 is a cross-sectional view of the lead frame shown in FIG. 30.

As shown in FIG. 30, a half-etching process is carried out so that the central portion of the lead frame 33 is half-etched so that the peripheral portion of each die stage remains. Hence, a half-etched area 37 is formed. The lead frame 33 has through holes 38, as shown in FIGS. 30 and 31. Next, the chip 11 is mounted on the die stage of the lead frame 33 by a dice attaching agent.

Then, the solder wires 34 first are bonded to the electrode pads 12 on the chip 11, and second are bonded to the given positions on the lead frame 33. In the second bonding process, the solder balls formed by a spark are pushed against the through holes 38 by means of an end of a capillary (not shown), so that the solder balls are pushed out of the through holes 38. Hence, the second balls 36 are formed on the surface of the lead frame 33 opposite to its chip mounting surface.

Thereafter, the lead frame 33 on which the chip 11 is mounted is accommodated in a die, and is then sealed by molding resin. In this process, the molded resin extends up to the area which surrounds the second balls 36. Then, the resin package 14 is separated from the lead frame 33.

[Tenth Embodiment]

A description will now be given of a semiconductor device and its production method according to a tenth embodiment of the present invention.

Figure 32:
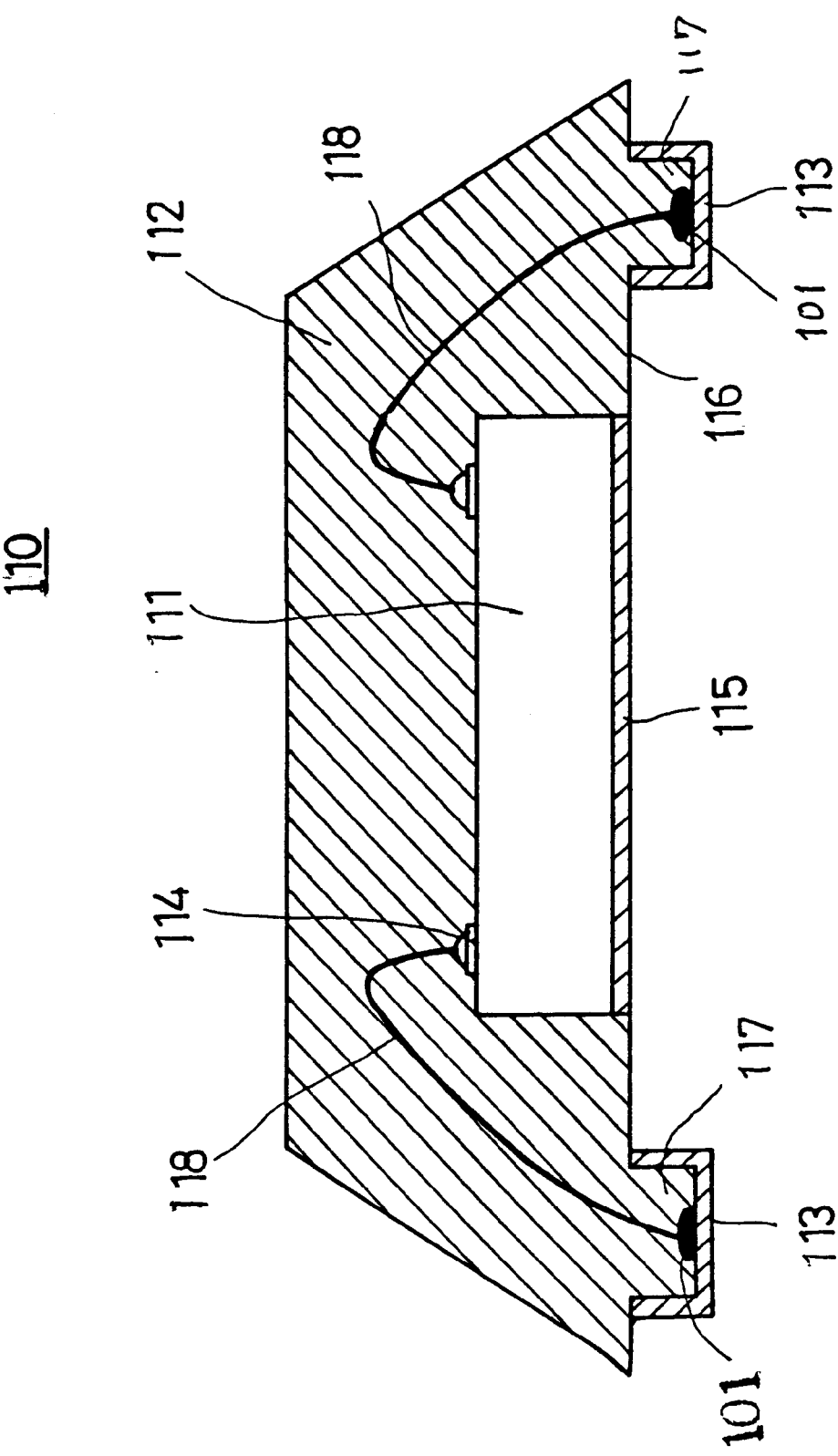
FIG. 32 is a cross-sectional view of a semiconductor device according to a tenth embodiment of the present invention.
Figure 33:
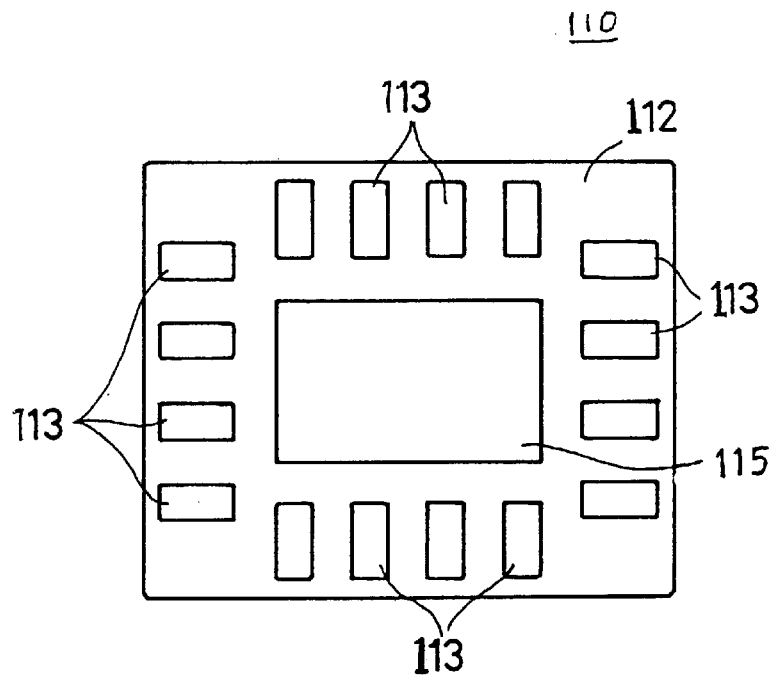
FIG. 33 is a bottom view of the semiconductor device according to the tenth embodiment of the present invention.
Figure 34:
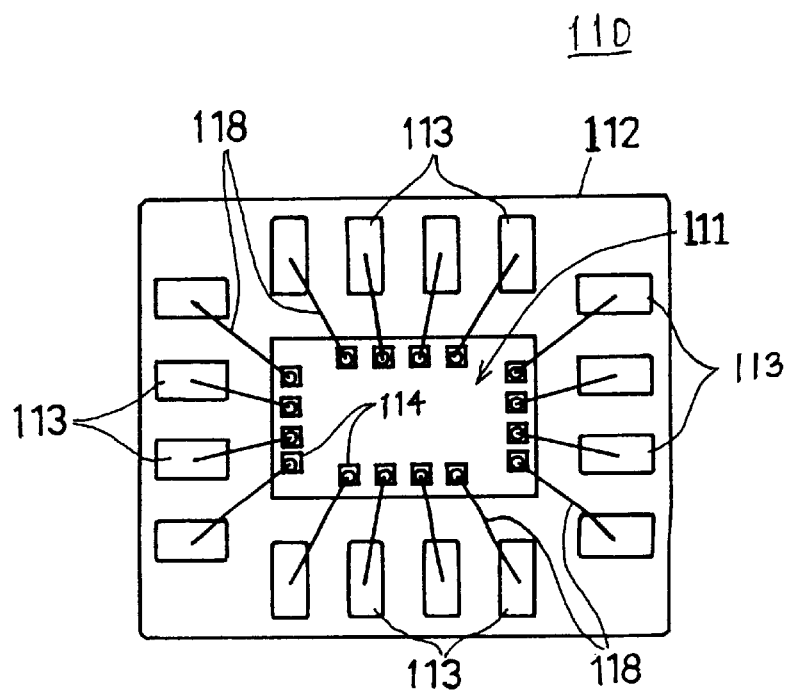
FIG. 34 is a plan view of the semiconductor device according to the tenth embodiment of the present invention, in which inner parts thereof are seen through a resin package.

FIG. 32 is a cross-sectional view of a semiconductor device 110 according to the tenth embodiment of the present invention, and FIG. 33 is a bottom view of the semiconductor device 110. FIG. 34 is a plan view of the semiconductor device 110 seen through a resin package 112 which will be described later.

The semiconductor device 110 is mainly made up of a chip 111, a resin package 112 and metallic films 113. A plurality of electrode pads 114 are provided on the upper surface of the chip 111, which is mounted on a chip fixing resin 115. The chip 111 may be a semiconductor chip, a SAW chip, a multichip module or the like.

The resin package 112 is formed by molding epoxy resin or the like, as will be described later. A potting can be used to form the resin package 112. Resin projections 117, which are integrally formed with the resin package 112, are located in given positions on the bottom surface (mounting-side surface) of the resin package 112. The resin projections 117 are arranged at a pitch equal to, for example, 0.8 mm.

The metallic films 113 are provided so that they respectively cover the resin projections 117. Bonding wires 118 are provided between the metallic films 113 and the electrode pads 114, so that the metallic film 113 and the chip 111 are electrically connected together. Bonding balls 101 like the aforementioned bonding balls 26 are provided in order to improve the bondability of the bonding wire 118 to the metallic film 113. The details of the metallic films 113 will be described later.

The semiconductor device 110 thus formed does not need any inner and outer leads used in the SSOP. Hence, there is no need to provide an area for leading the inner leads and a space in which the outer leads extend. Hence, a down-sized semiconductor device can be provided. Further, the semiconductor device 110 does not need any solder balls used in the BGA type, and is thus less expensive. Furthermore, the resin projections 117 and the metallic films 113 cooperate with each other as if they function as solder bumps of the BGA-type devices, so that a high mounting density can be obtained. Furthermore, the semiconductor device 110 is not affected by a curvature or deformation of the resin package 112.

A description will now be given, with reference to FIGS. 35 through 38, of the metallic films 113. These figures are enlarged views of one of the metallic films 113.

As described above, the metallic film 113 covers the resin projection 117 and is electrically connected to the chip 111 by the bonding wire 118. The metallic film 113 functions as a terminal for an external connection, and is connected to an electrode part formed on a circuit board by soldering.

Figure 35:
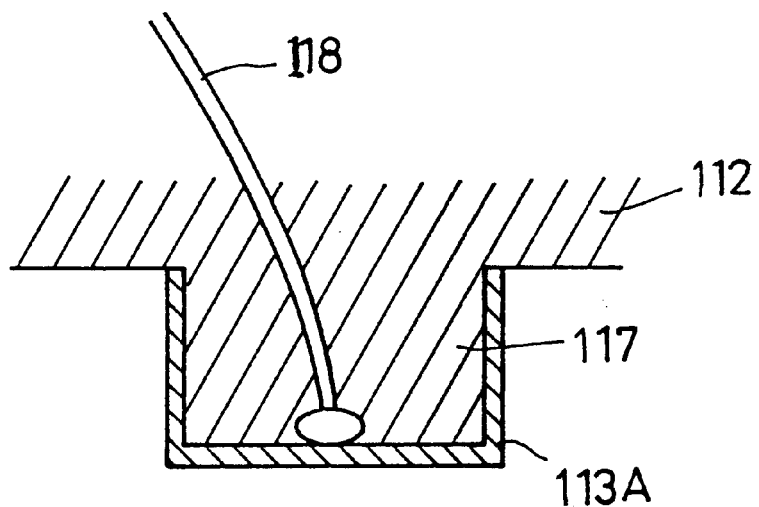
FIG. 35 is a cross-sectional view of a metallic film having a single-layer structure.

The metallic film 113 can be formed of a single metallic layer or a plurality of metallic layers stacked. FIG. 35 shows a metallic film 113A, which is formed of a single metallic layer, and FIGS. 36 through 38 respectively show metallic films 113B, 113C and 113D formed of a plurality of metallic layers.

A substance or substances of the metallic films 113 (113A–113D) should be selected taking into account the following. The inner portion of the metallic film 113 is to be bonded to the bonding wire 118, and the outer portion thereof is to be soldered to an electrode on the circuit board. Hence, it is required that the inner portion (the innermost layer) of the metallic film 113 has a good bondability and the outer portion (the outermost layer) thereof has a good ability of soldering. The above requirement (hereinafter referred to as a film requirement) can be satisfied by the following substances.

It is required that a substance of the metallic film 113A shown in FIG. 35 has both a good bondability and a good ability of soldering. Such a material is, for example, silver (Ag) or palladium (Pd).

Figure 36:
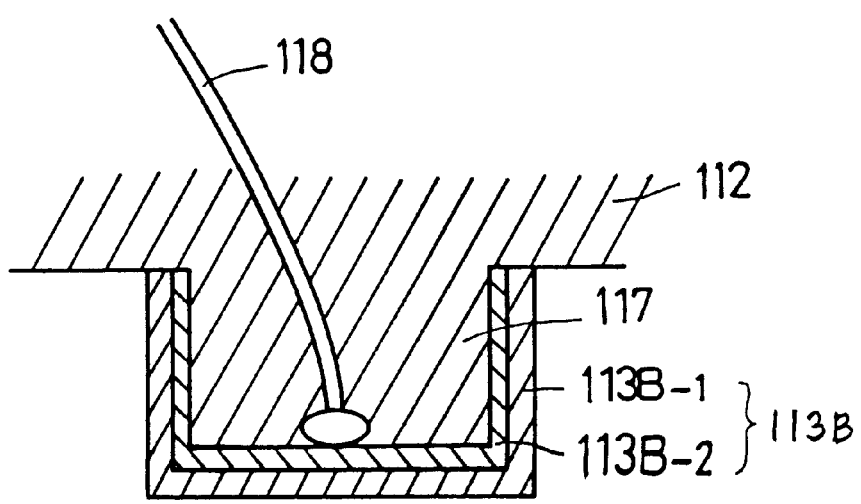
FIG. 36 is a cross-sectional view of a metallic film having a two-layer structure.

The metallic film 113B shown in FIG. 36 is made up of an outer layer 113B-1 and an inner layer 113B-2. By way of example, the outer layer 113B-1 can be made of palladium (Pd), and the inner layer 113B-2 can be made of gold (Au) so that the film requirement can be satisfied.

Figure 37:
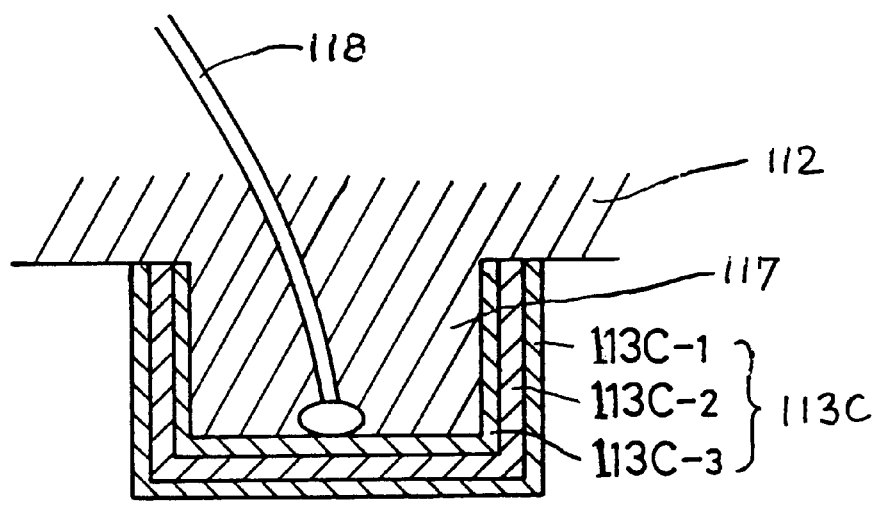
FIG. 37 is a cross-sectional view of a metallic film having a three-layer structure.

The metallic film 113C shown in FIG. 37 is made up of an outer layer 113C-1, an intermediate layer 113C-2 and an inner layer 113C-3. By way of example, the outer layer 113C-1 can be made up of gold (Au), the intermediate layer 113C-2 can be made up of nickel (Ni), and the inner layer 113C-3 can be made up of gold (Au) so that the film requirement can be satisfied.

Alternatively, the following combinations can be employed.

| 113-1 | 113C-2 | 113C-3 |
|---|---|---|
| palladium (Pd) | nickel (Ni) | palladium (Pd) |
| gold (Au) | palladium (Pd) | gold (Au) |
| solder | nickel (Ni) | gold (Au) |
| solder | nickel (Ni) | palladium (Pd) |

The above combinations satisfy the film requirement and improve the ability of joining the outer layer 113C-1 and the inner layer 113C-3 due to the intermediate layer 113C-2.

Figure 38:
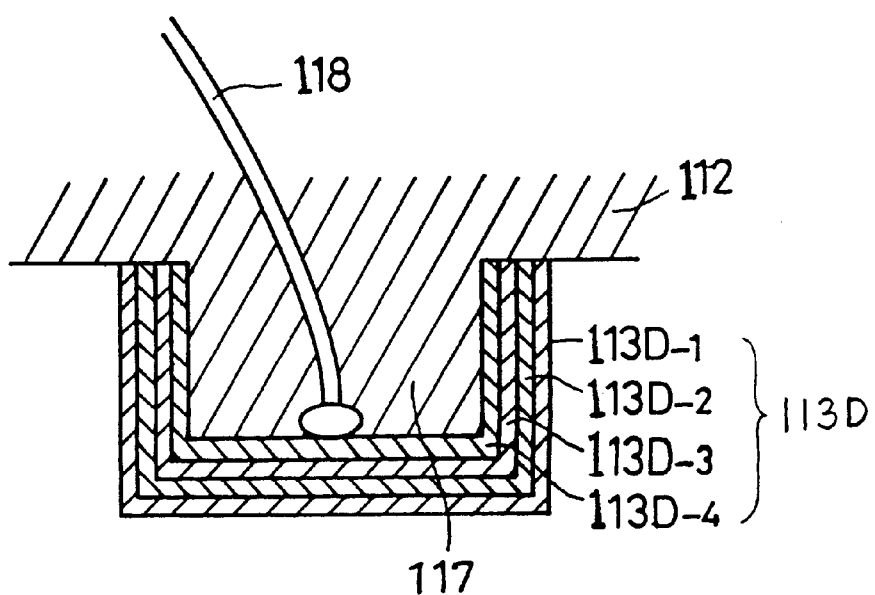
FIG. 38 is a cross-sectional view of a metallic film having a four-layer structure.

The metallic film 113D shown in FIG. 38 is made up of an outer layer 113D-1, a first intermediate layer 113D-2, a second intermediate layer 113D-3 and an inner layer 113D-4. These layers can be formed by the following substances.

| 113D-1 | 113D-2 | 113D-3 | 113D-4 |
|---|---|---|---|
| solder | (Ni) | (Pd) | (Au) |
| (Pd) | (Ni) | (Pd) | (Au) |

The above combinations satisfy the film requirement and improve the ability of joining the outer layer 113D-1 and the inner layer 113D-4 due to the intermediate layers 113D-2 and 113D-3.

A description will now be given of a method of producing the semiconductor device 110 according to the tenth embodiment of the present invention. By way of example, the following description is directed to forming the semiconductor device 110 equipped with the three-layer structure metallic film 113C made up of the outer layer 113C-1, the intermediate layer 113C-2 and the inner layer 113C-3.

Figure 45:
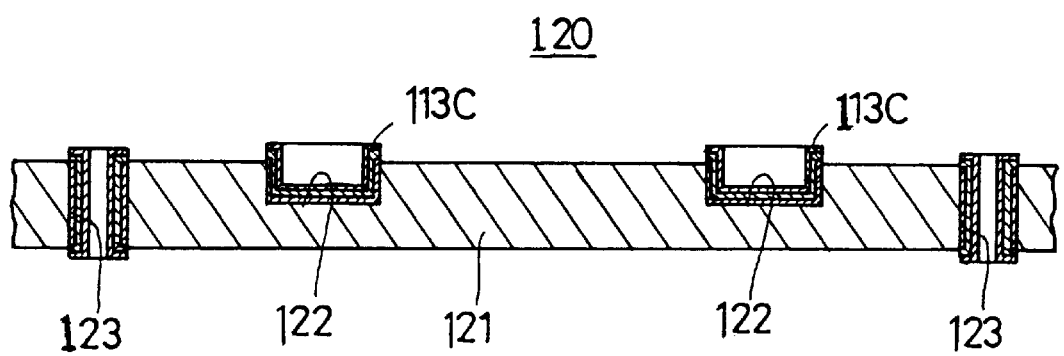
FIG. 45 is a cross-sectional view of the completed lead frame.

The semiconductor device 110 is produced by using a lead frame 120 shown in FIG. 45. The lead frame 120 has an electrically conductive metallic member 121 having a plurality of recess portions 122. The metallic films 113C are respectively provided in the recess portions 122. The recess portions 122 are positioned so that they correspond to the positions in which the resin projections 117 should be formed. The metallic films 113C are formed so as to engage the resin projections 117.

As will be described later, the lead frame 120 is configured so that a plurality of semiconductor devices 110 can be produced. Hence, the metallic member 121 has the plurality of recess portions 122 and the plurality of metallic films 113C, as shown in FIG. 42A, in which a reference number 123 indicates tool engagement holes with which a tool for handling the lead frame 120 engages.

Before describing the method of producing the semiconductor device 110, a description will first be given, with reference to FIGS. 39 through 45, of a method of producing the lead frame 120.

Figure 39:
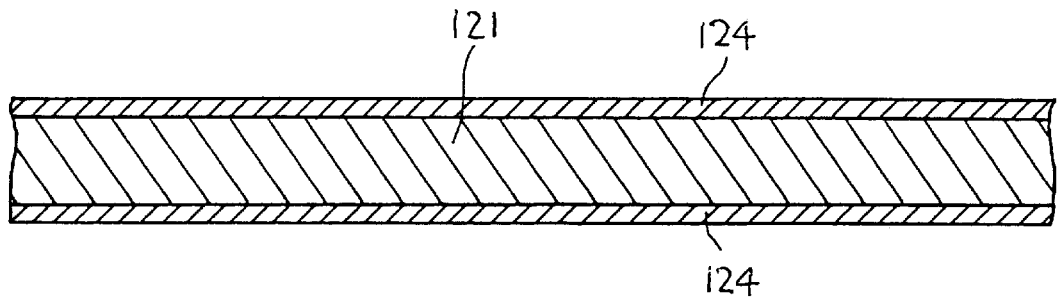
FIG. 39 is a cross-sectional view showing a resist forming step of a method of producing the semiconductor device according to the tenth embodiment of the present invention.

As shown in FIG. 39, the plate-shaped metallic member 121 made of an electrically conductive material such as copper is prepared. Etching resist films 124 are provided on the upper and lower surfaces of the metallic member 121 (resist coating step). The etching resist films 124 are made of a photosensitive resin, and are provided to a given thickness by means of a spinner. Alternatively, it is possible to use a metallic member in which the tool engagement holes 123 are formed by stamping or the like before the etching resist films 124 are provided.

Figure 40:
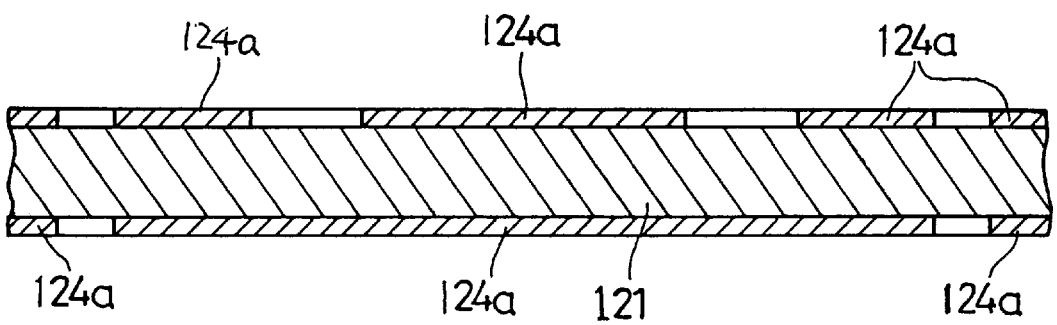
FIG. 40 is a cross-sectional view showing a resist pattern forming step of the method of producing the semiconductor device according to the tenth embodiment of the present invention.

Then, an exposure step is carried out by using masks (not shown) formed on the etching resist films 124. Subsequently, a developing step is carried out so that portions of the etching resist films 124 corresponding to the positions of the recess portions 122 and the tool engagement holes 123 are removed. Hence, resist patterns 124a are formed, as shown in FIG. 40 (resist pattern forming step). In the resist pattern forming step, portions of the etching resist films 124 in which power supply portions 125 (FIGS. 42A and 42B) should be formed are removed. The power supply portions 125 are plated in a metallic film forming step which will be described later. If the above alternative metallic member is used, there is no need to form windows therein directed to forming the tool engagement holes 123.

Subsequent to the above resist pattern forming step, the metallic member 121 on which the resist patterns 124a are formed is etched (etching step). In the etching step, portions of the metallic member 121 corresponding to the recess portions 122 and the power supply portions 125 are half-etched from the upper surface thereof. Further, portions of the metallic member 121 corresponding to the tool engagement holes 123 are etched from the upper and lower surfaces of the metallic member 121. When the metallic member 121 is made of copper, an etchant used in the etching step is, for example, ferric chloride.

Figure 41:
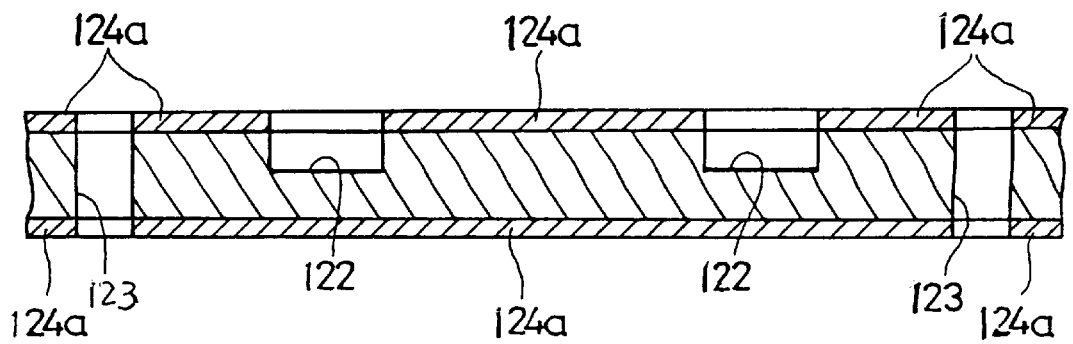
FIG. 41 is a cross-sectional view showing an etching step of the method of producing the semiconductor device according to the tenth embodiment of the present invention.

Hence, as shown in FIG. 41, the recess portions 122 and the tool engagement holes 123 are formed in given positions of the metallic member 121. As shown in FIGS. 42A and 42B, the power supply portions 125 are formed in the metallic member 121. The depth of the recess portions 122 defined by the half-etching process is made equal to 60% of the thickness of the metallic member 121.

The power supply portions 125 are located in end portions of the metallic member 121 in the longitudinal direction thereof. In the power supply portions 125, the metallic member 121 is exposed. Hence, by plating the power supply portions 125, the metallic member 121 can be set to a given potential. It will be noted that FIG. 42B is a cross-sectional view taken along a line A—A shown in FIG. 42A.

In FIG. 42A, blocks depicted by broken lines respectively denote positions in which the semiconductor devices 110 are formed. In the metallic member 121 shown in FIG. 42A, 34 semiconductor devices 110 can be derived therefrom. A plurality of recess portions 122 are formed for each of the plurality of semiconductor devices 110.

Figure 43:
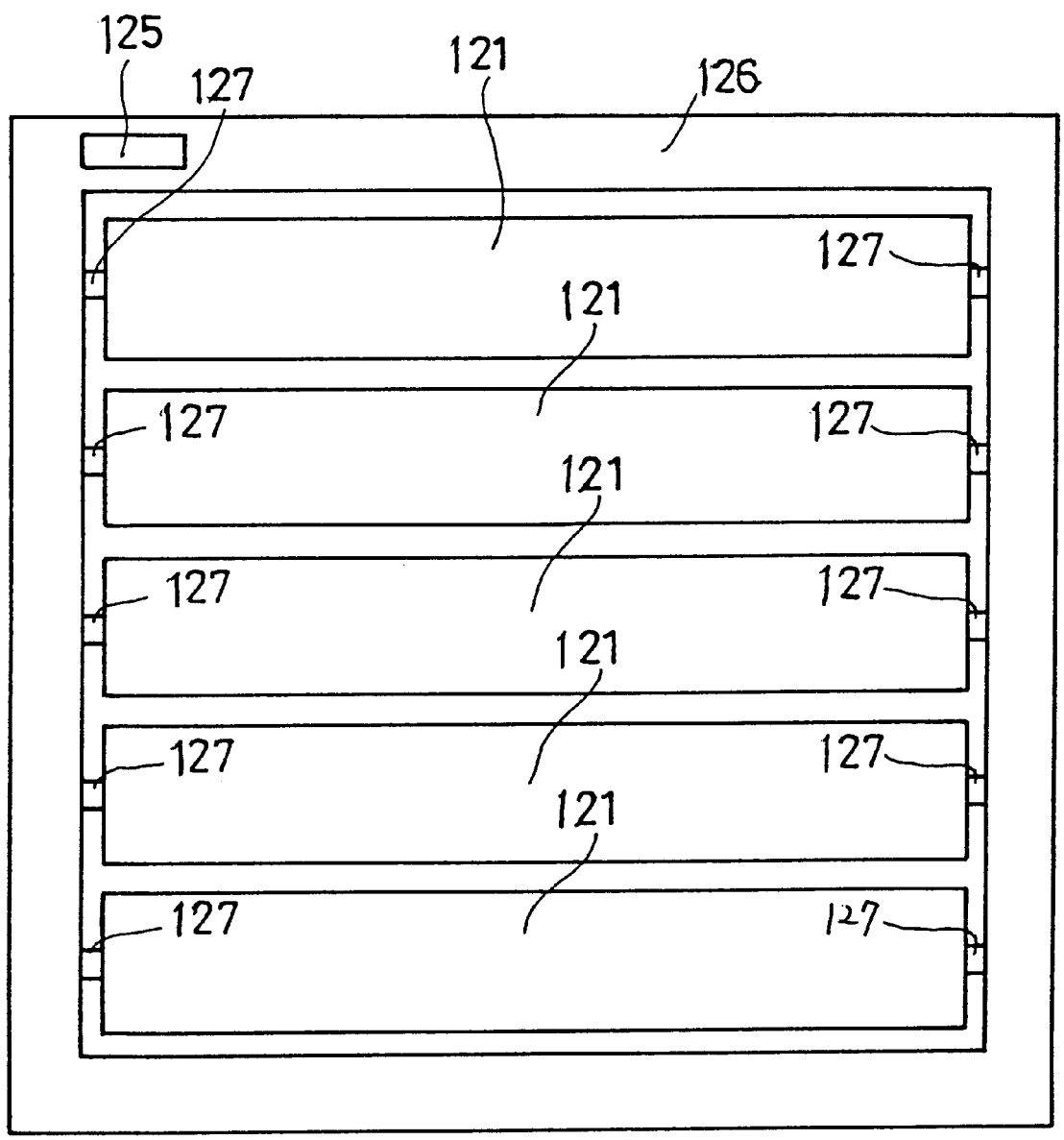
FIG. 43 is a plan view of a lead frame unit which can be used in the method of producing the semiconductor devices according to the tenth embodiment of the present invention.

In order to form more semiconductor devices 110 from a single metallic member, a lead frame unit 128 as shown in FIG. 43 can be used. The lead frame unit 128 has a frame 126, and a plurality of metallic members 121 joined to the frame 126 by means of joint portions 127 provided on two opposite sides of each of the metallic members 121 in the longitudinal direction thereof. It is necessary to form power supply portions 125 in the lead frame unit 128. The power supply portions 125 can be formed in the frame 126 so that electricity can be supplied to all the metallic members 121 via the joint portions 127.

The use of the lead frame unit 128 contributes to improving the efficiency of the method of producing the semiconductor devices 110. Further, as compared to the structure shown in FIG. 42A, a simplified resist pattern forming step and a simplified etching step can be employed.

After the etching step, the metallic film forming step which has been briefly referred to is carried out in order to form the metallic film 113C. In the tenth embodiment of the present invention, the metallic film 113C is formed by plating. For example, electrolytic plating can be employed in which the metallic member 121 is placed in a plating chamber. In this step, the aforementioned power supply portions 125 are concurrently plated.

Figure 44:
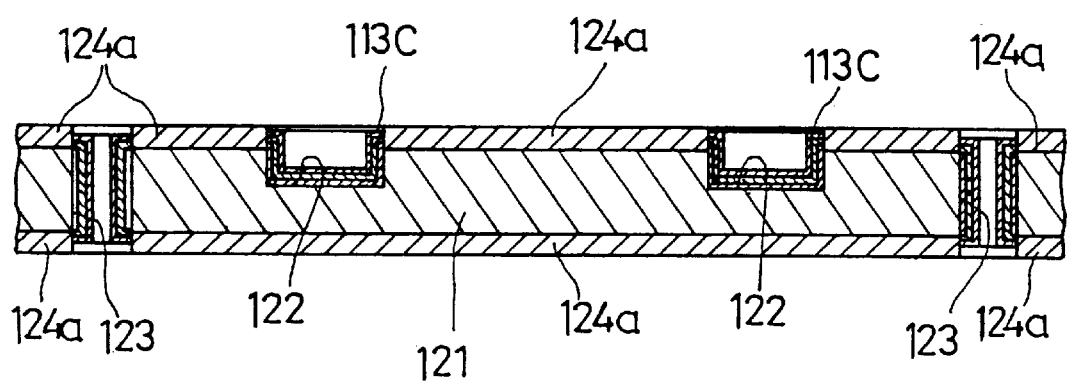
FIG. 44 is a cross-sectional view showing a metallic film forming step of the method of producing the semiconductor device according to the tenth embodiment of the present invention.

Since the metallic film 113C is made up of the outer layer 113C-1, the intermediate layer 113C-2 and the inner layer 113C-3, the plating step is carried out for each of these three layers. If the outer layer 113C-1, the intermediate layer 113C-2 and the inner layer 113C-3 are respectively formed of gold (Au), palladium (Pd) and gold (Au), the plating step commences with plating of the inner layer 113C-1 with gold. Next, the intermediate layer 113C-2 is plated with palladium (Pd), and then the outer layer 113C-3 is plated with gold (Au). The thickness of each of the layers 113C-1 through 113C-3 can be regulated by controlling the plating time. FIG. 44 shows the metallic member 121 on which the metallic films 113C are formed.

As will be described in detail later, it is necessary to separate the metallic films 113C together with the resin package 112 from the lead frame 120. Hence, it is required that the metallic films 113C have a nature which enables the metallic films 113C to be smoothly separated from the metallic member 121. With the above in mind, a material which facilitates the separating process, such as an electrically conductive paste, is provided In the recess portions 122 before the metallic films 113C are formed therein. Hence, the metallic films 113C are formed on the above material.

It should be noted that the metallic films 113C can be formed by thin-film forming processes other than the plating process, such as an evaporating process and a sputtering process.

In addition to the recess portions 122, the metallic member 121 is exposed in the tool engagement holes 123, so that a film having the same structure as that of the metallic film 113C is formed in each of the tool engagement portions 123 in the metallic film plating step. However, there is no problem because the tool engagement portions 123 are specifically directed to being engaged with the tool and used to position and handle the metallic member 121.

Then, a resist removing step is carried out in order to remove the resist patterns 124a (etching resist films 124). Hence, the lead frame 120 shown in FIG. 45 is formed. As described above, the lead frame 120 can be formed by a simple sequence including the resist coating step, the resist pattern forming step, the etching step, the metallic film forming step and the resist removing step.

A description will now be given, with reference to FIGS. 46 through 59, of a method of producing the semiconductor device 110 using the lead frame 120 produced in the above-mentioned process.

Figure 46:
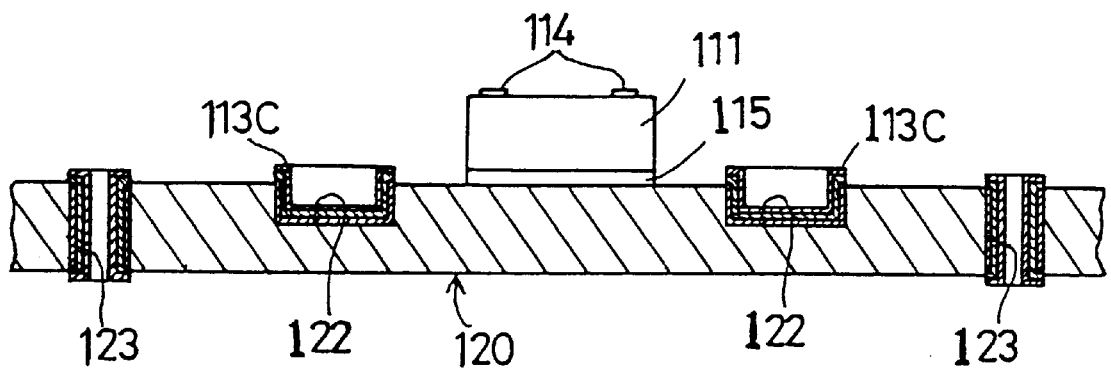
FIG. 46 is a cross-sectional view showing a chip mounting step of the method of producing the semiconductor device according to the tenth embodiment of the present invention.

As shown In FIG. 46, a chip fixing resin 115 is provided on a portion of the lead frame 120 on which the chip 111 should be placed. Then, the chip 111 is mounted on the chip fixing resin 115 (chip mounting step). The chip fixing resin 115 has insulation, and functions as an adhesive. Thus, the chip 111 is fixed to the lead frame 120 by adhesive force of the chip fixing resin 115.

Figure 47:
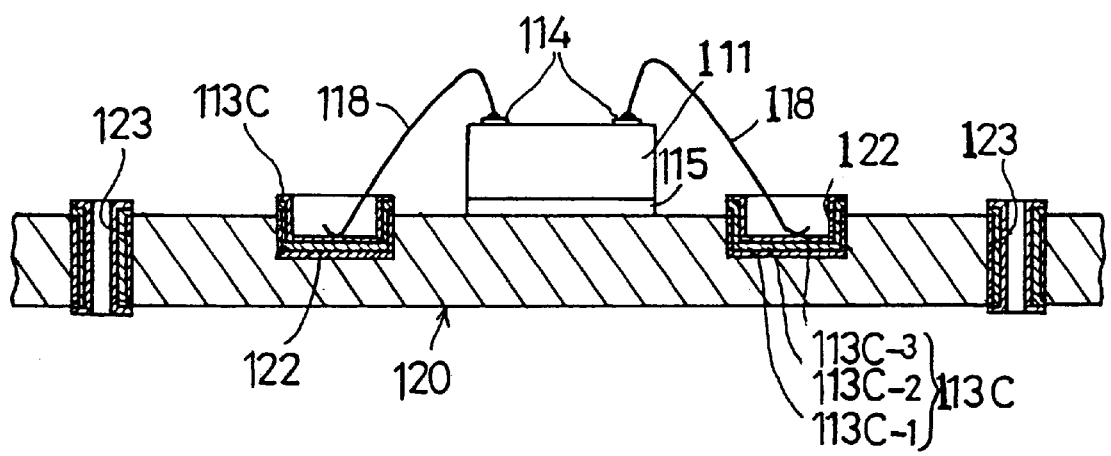
FIG. 47 is a cross-sectional view showing a connecting step of the method of producing the semiconductor device according to the tenth embodiment of the present invention.

After the chip mounting step, the lead frame 120 is loaded to a wire bonding apparatus. As shown in FIG. 47, the bonding wires 118 are provided between the electrode pads 114 provided on the chip 111 and the metallic films 113C (more particularly, the inner layer 113C-3). Hence, the chip 111 and the metallic films 113C are electrically connected together. In the wire bonding step, the ends of the bonding wires 118 are bonded to the electrode pads 114 first (first bonding step), and the other ends thereof are bonded to the metallic films 113C.

Figure 48:
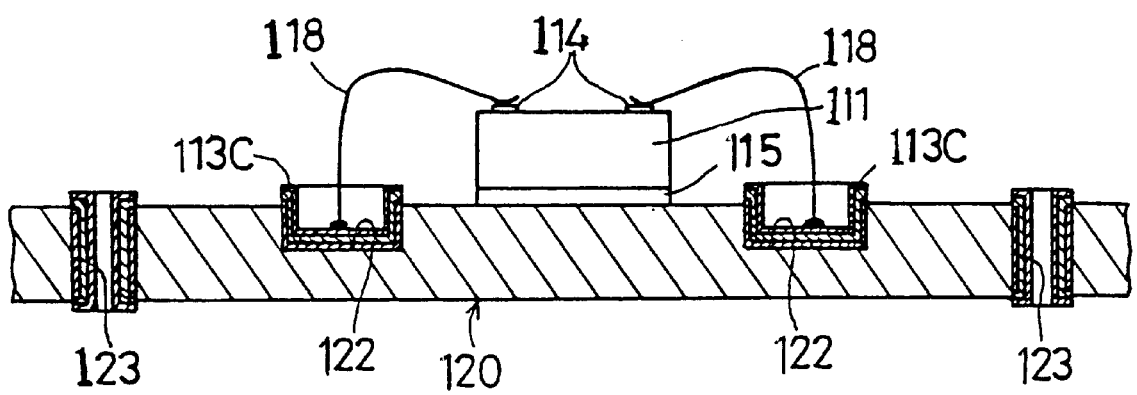
FIG. 48 is a cross-sectional view showing a variation of the connecting step shown in FIG. 47.

Alternatively, as shown in FIG. 48, the ends of the wires 118 are bonded to the metallic films 113C first, and the other ends thereof are bonded to the electrode pads 114 second. This alternative makes it possible to reduce the height of the bonding wires 118. This leads to a reduction in the thickness of the semiconductor device 110.

Further, the aforementioned bonding balls 101 as shown in FIG. 32 can be employed. In this case, the bonding wires 118 are bonded to the bonding balls 101.

The electrode pads 114 are arranged at a pitch less than that at which the metallic films 113C are arranged. Further, the area in which the first bonding is carried out is greater than the area in which the second bonding is carried out. Hence, it is possible to arrange the bonding wires 118 at a high density by performing the first bonding to the metallic films 113C first and the second bonding to the electrode pads 114 second.

After the bonding step, a sealing step is carried out so that a resin 129 is formed on the lead frame 120 so as to seal the chip 111 and thus form the resin package 112. In the following description, the resin package 112 is formed by molding. Alternatively, a potting process can be employed.

Figure 49:
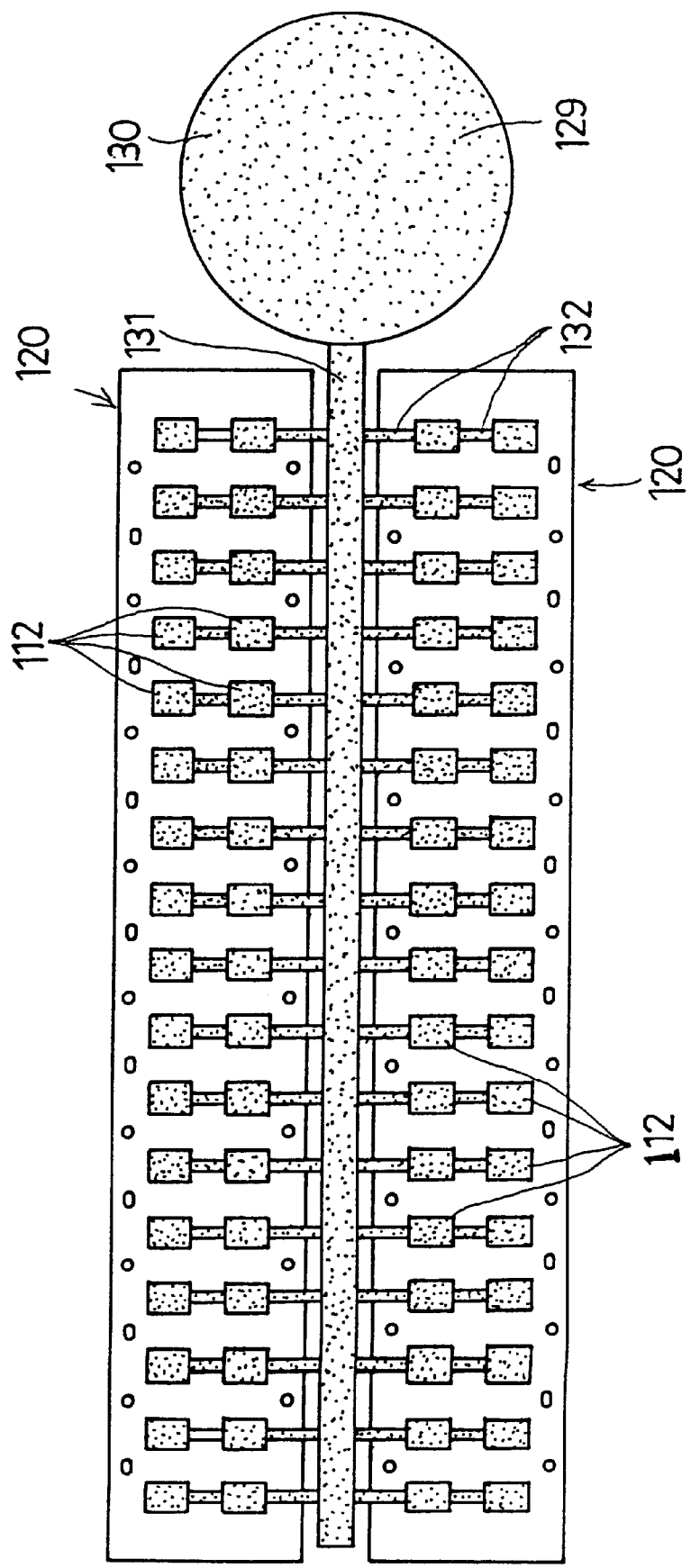
FIG. 49 is a plan view of a sealing step of the method of the semiconductor device according to the tenth embodiment of the present invention.

FIG. 49 schematically shows the state observed immediately after the lead frame 120 is loaded to a die and the resin 129 is molded. In FIG. 49, a reference number 130 indicates a curl, a reference number 131 indicates a runner, and a reference number 132 indicates a gate. As shown in FIG. 49, a plurality of resin packages 112 are formed on the lead frame 120. In the state immediately after the sealing step, the resin packages 112 are joined via portions of the resin 129 located on the gates 132. Hereinafter, such resin portions are referred to as on-gate resin portions.

FIG. 50 is an enlarged cross-sectional view of one of the resin packages 112 corresponding to one semiconductor device 110. As shown in FIG. 50, the resin 129 is formed in a given shape by a cavity (not shown) of a die (upper die), while the lead frame 120 functions as a lower die. The resin 129 is filled in the recess portions 122 (more particularly, recesses respectively defined by the metallic films 113C), so that the aforementioned resin projections 117, which are counterparts of the recess portions 122, are formed. In this state, the resin package 112 is impregnated to the lead frame 120.

After the resin packages 112 are formed, the on-gate resin, resin remaining in the runner 131 and the curl 130 are removed. Hence, as shown in FIGS. 51A and 51B, the resin packages 112 are separated from each other on the lead frame 120. As described above, the resin packages 112 are impregnated to the lead frame 120 and thus are not detached from the lead frame 120 even if the resin packages 112 are separated from each other.

Subsequent to the sealing step, a tape arranging step is carried out. In this step, as shown in FIGS. 52A and 52B, a tape member 133 is arranged on the tops of the resin packages 112. The tape member 133 has a surface coated with an adhesive, and a base tape which cannot be damaged by an etchant used in a separating step which will be carried out later. The tape member 133 joins the resin packages 112 together, so that the resin packages 112 are supported by the tape member 133 even when the resin packages 112 are separated from the lead frame 120.

The tape member 133 can be arranged at an appropriate time before the resin packages 112 are formed. For example, the tape member 133 can be arranged within the die prior to the sealing step. In this case, when the resin packages 112 are formed, the resin packages 112 are joined together by the tape member 133.

Figure 53:
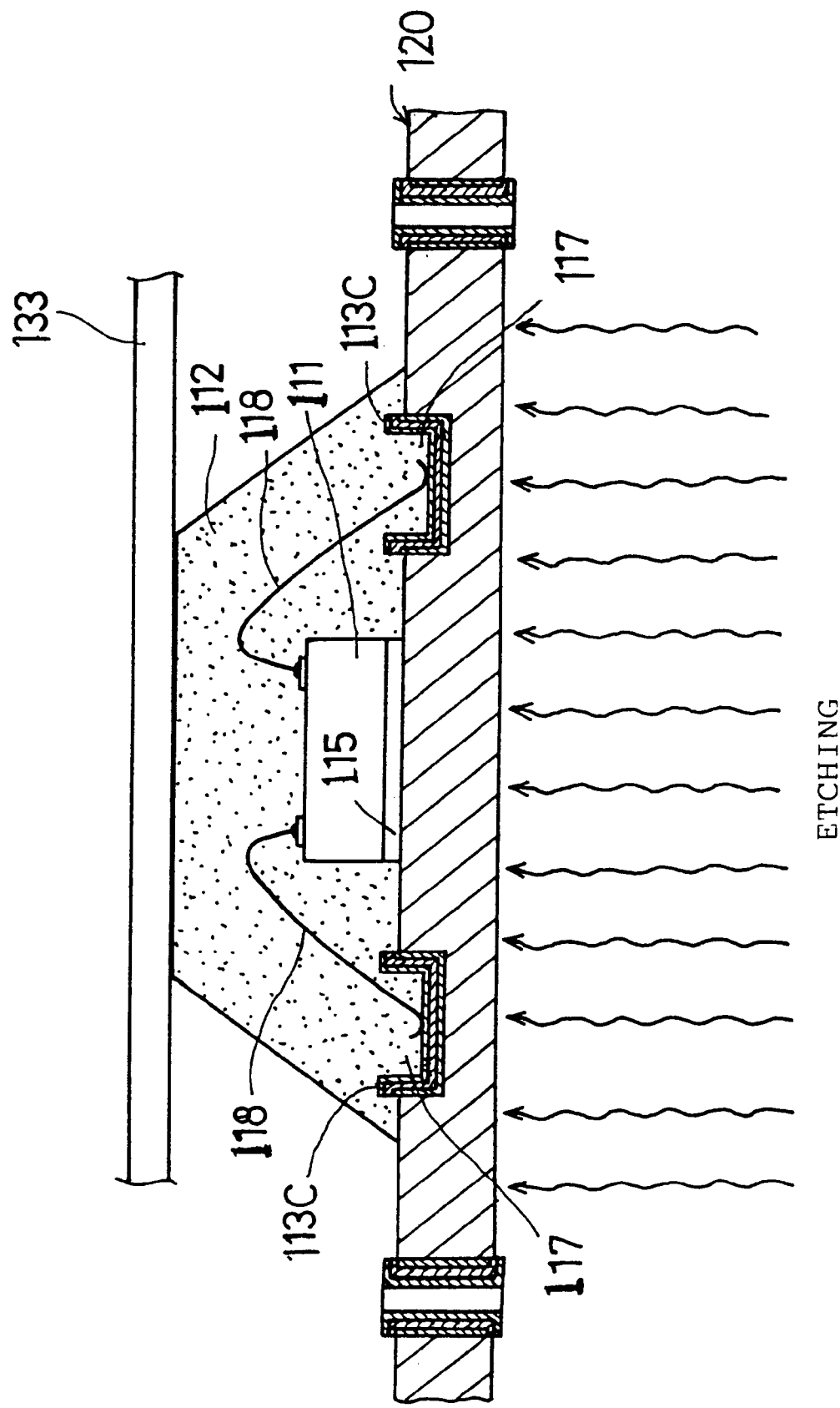
FIG. 53 is a cross-sectional view of a separating step of the method of the semiconductor device according to the tenth embodiment of the present invention.

Following the tape arranging step, a separating step is carried out in order to separate the resin packages 112 from the lead frame 120. FIG. 53 shows the separating step, in which the lead frame 120 is placed in the etchant and is thus dissolved. It is required that the etchant used in the separating step can dissolve the lead frame 120 only and does not dissolve the metallic films 113C. When the lead frame 120 is completely dissolved, the resin packages 112 are separated from the lead frame 120. The above separating step makes it possible to certainly and easily separate the resin packages 112 from the lead frame 120.

FIGS. 54A and 54B show the semiconductor devices 110 when the separating step is completed. At this time, the semiconductor devices 110 are supported by the tape member 133. Hence, it is easy to handle the chips 110 after the separation step. When the tape member 133 is wound and shipped, it is possible to automatically mount the semiconductor devices 110 to a circuit board, as in the case of chips or electronic components.

The above-mentioned production method does not need a lead cutting step and lead shaping step (into a gull wing) necessary for the conventional production process, and is therefore simple.

A description will now be given of variations of the above-mentioned method of producing the semiconductor device 110.

Figure 55A:
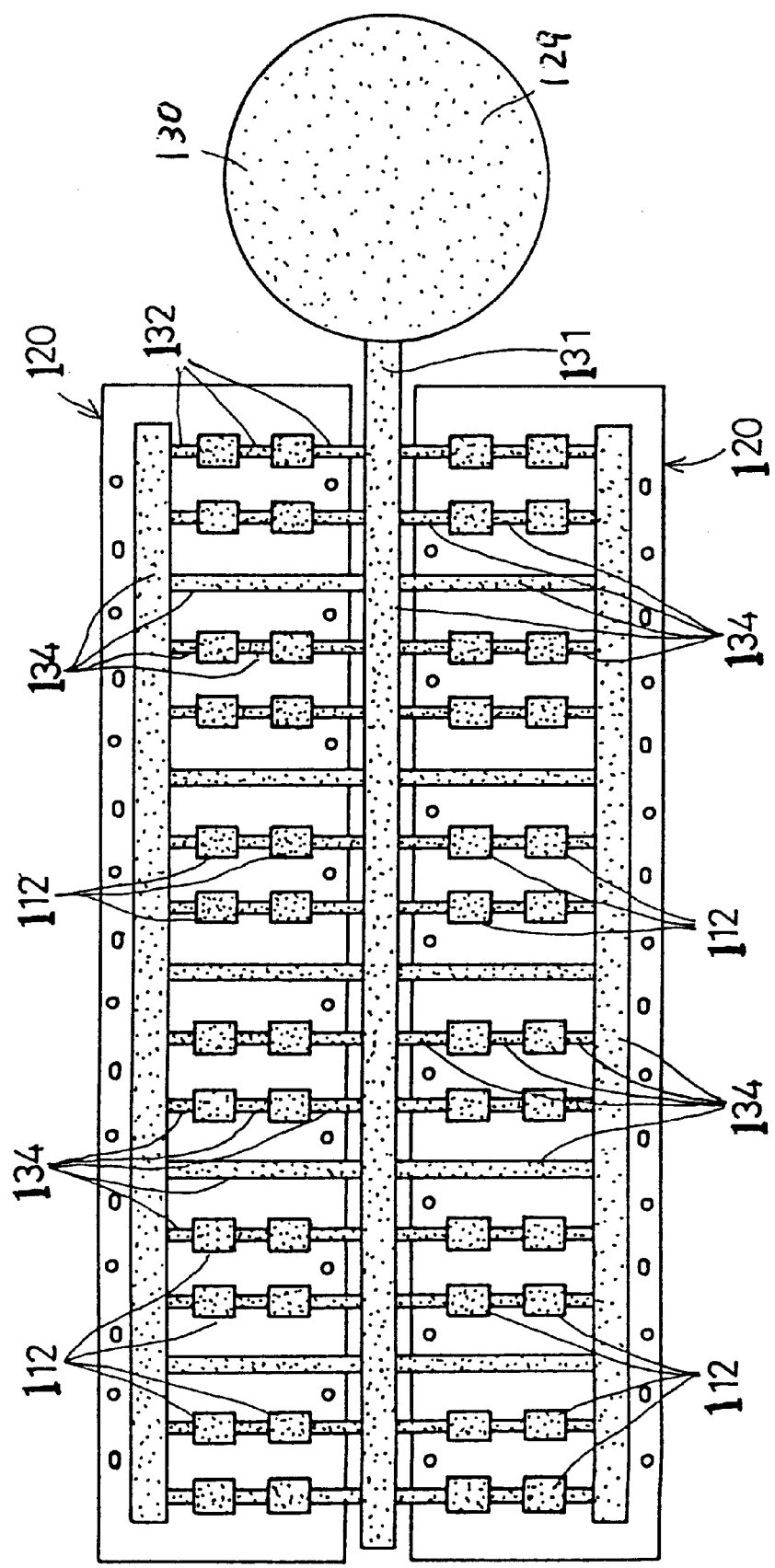
FIG. 55A is a plan view showing a first variation of the sealing step of the method of producing the semiconductor device according to the tenth embodiment of the present invention.

FIG. 55A shows a first variation of the sealing step. In the above-mentioned method, the resin packages 112 are joined by the on-gate resin portions as has been described with reference to FIG. 49. The on-gate resin portions are removed as shown in FIGS. 51A and 51B, and the tape member 133 is arranged as shown in FIGS. 52A and 52B. As has been described, the tape member 133 is used to maintain the separated resin packages 112 in the respective original positions.

Figure 56:
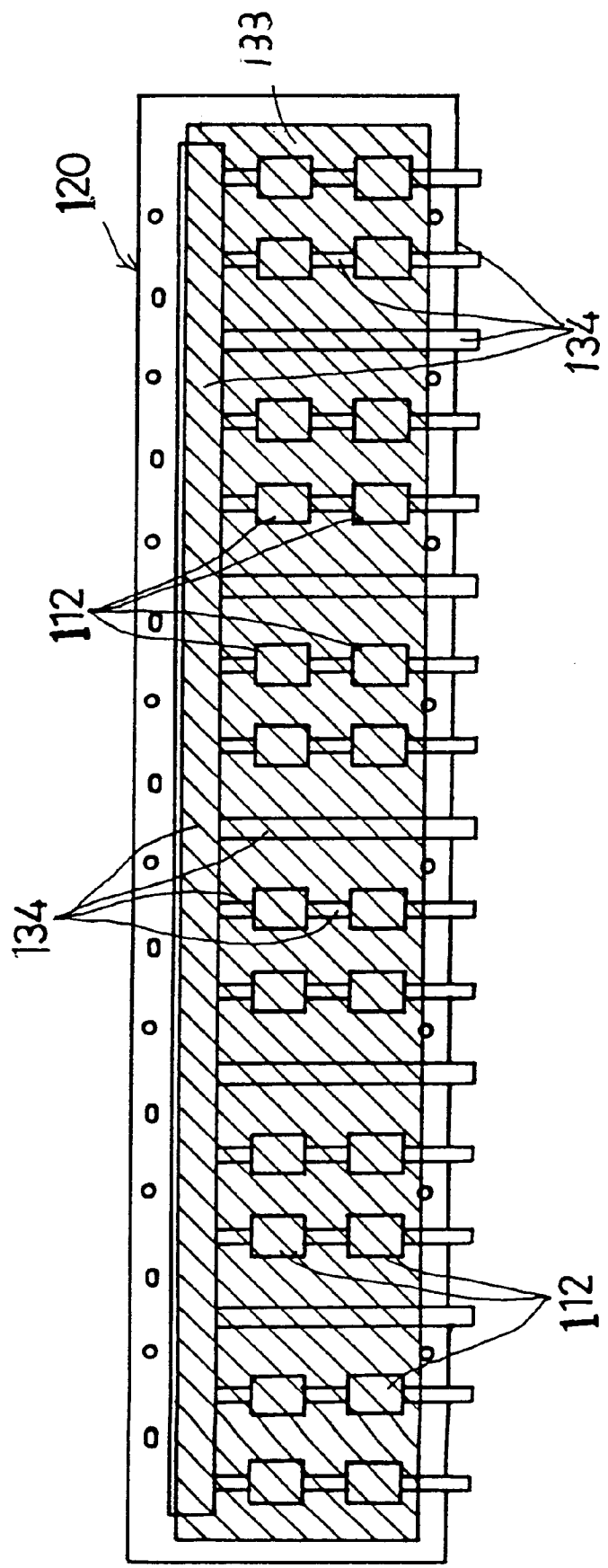
FIG. 56 is a plan view observed when the tape arranging step for the lead frame shown in FIG. 55A is completed.

In the first variation, the on-gate resin portions and the resin 129 remaining in the runner 131 are used, instead of the tape member 133, as resin joint members joining the resin packages 112 together. Hereinafter, such resin joint members are referred to as a runner frame 134. Hence, it is possible to efficiently utilize the on-gate resin portions and the resin 129 remaining in the runner 131. The runner frame 134 should be removed when shipping the semiconductor devices 110. In this case, before shipping, the tape member 133 is provided as shown in FIG. 56, and the runner frame 134 is removed (resin joint member removing step).

It is possible to prevent the tape member 133 from being damaged in the separating step and a step of testing the semiconductor devices 110 by providing the tape member 133 before shipping. This is advantageous when the semiconductor devices 110 are shipped in the state in which the devices 110 are shipped.

Figure 55B:
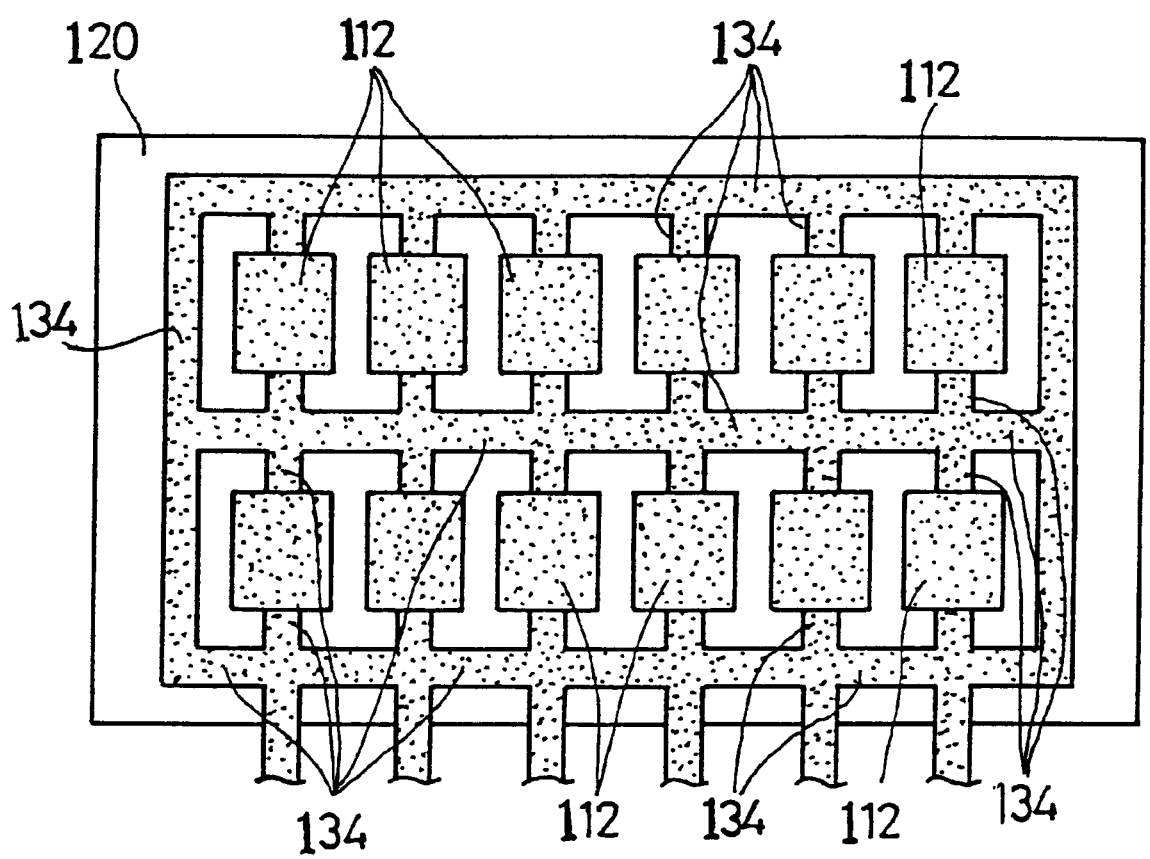
FIG. 55B is a plan view showing a second variation of the sealing step of the method of producing the semiconductor device according to the tenth embodiment of the present invention.

FIG. 55B shows a variation of the sealing step shown in FIG. 55A, in which the runner frames 134 extend laterally and longitudinally.

Figure 55C:
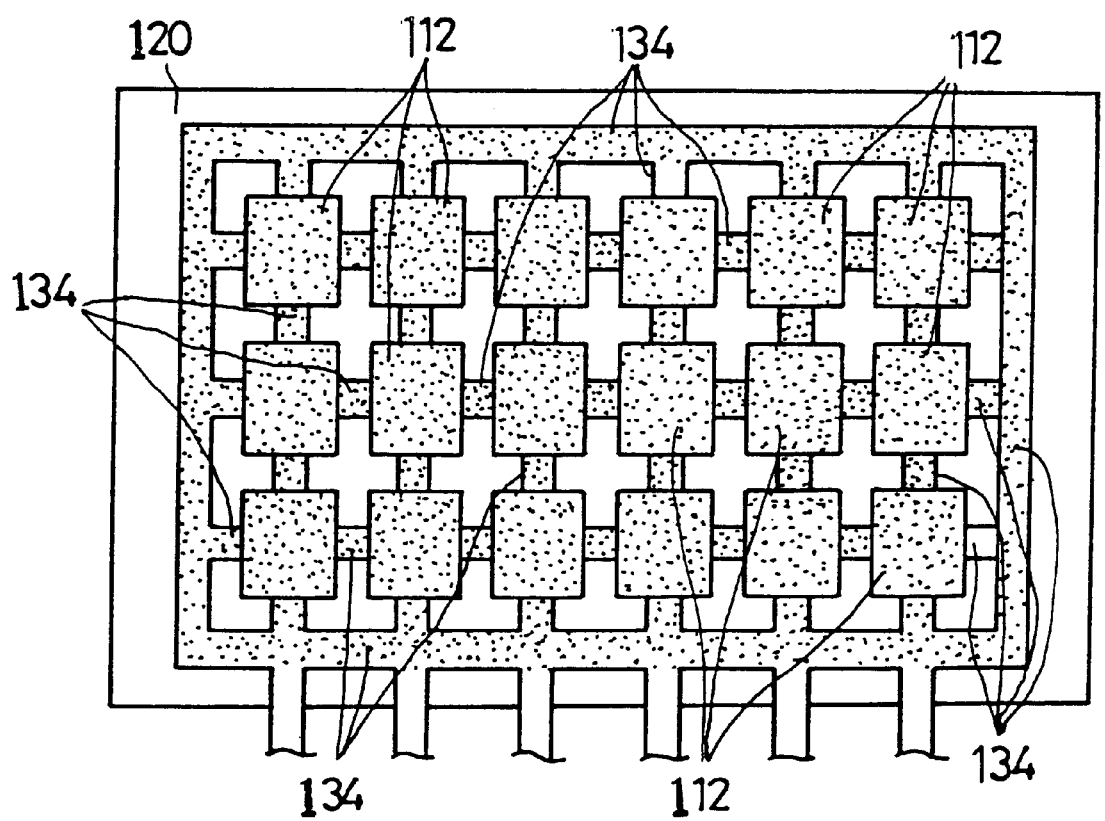
FIG. 55C is a plan view showing a third variation of the sealing step of the method of producing the semiconductor device according to the tenth embodiment of the present invention.

FIG. 55C shows another variation of the sealing step shown in FIG. 55A, in which the resin frames 112 are laterally and longitudinally supported by the runner frames 134. The resin to be removed can be efficiently utilized as the on-gate resin portions and the runner frames.

Figure 58:
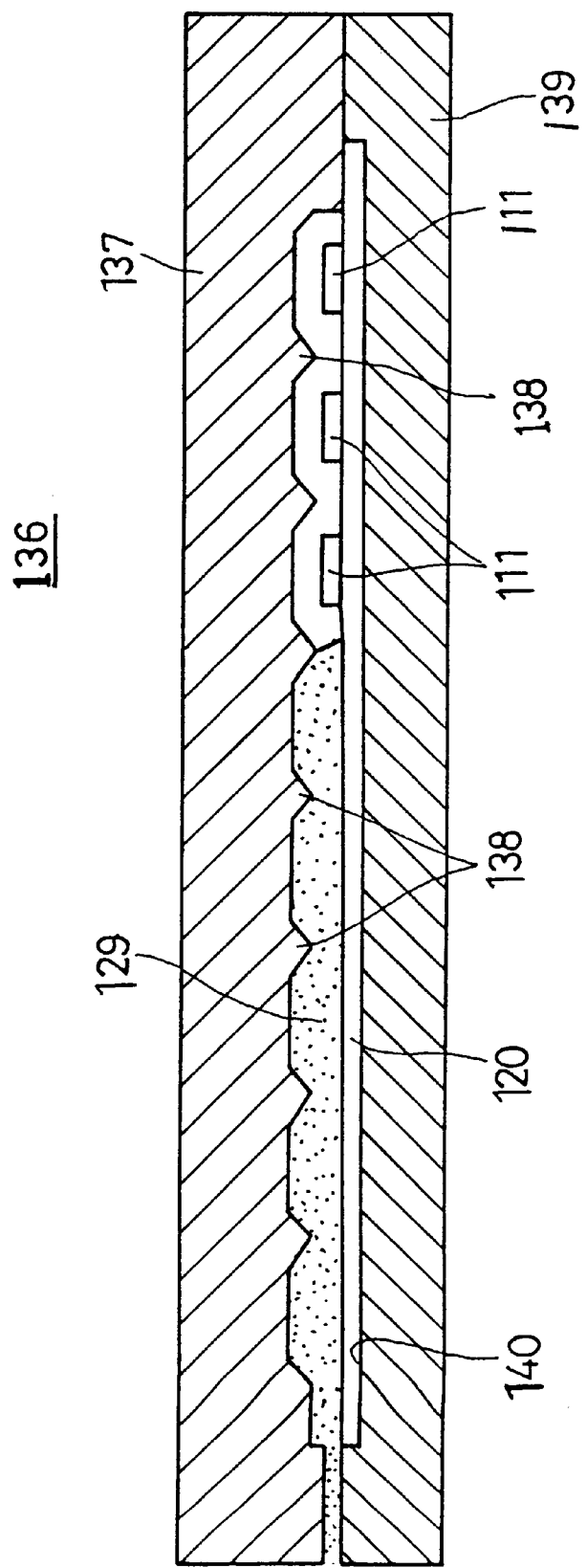
FIG. 58 is a cross-sectional view of the lead frame observed when the fourth variation shown in FIGS. 57A and 57B is completed.

FIGS. 57A, 57B and 58 show a fourth variation of the sealing step. In the aforementioned tenth embodiment of the present invention, the resin packages 112 are separated from each other when the sealing step is completed. In the fourth variation, the resin packages 112 are joined together when the sealing step is completed.

FIGS. 57A and 57B show the lead frame 120 when the sealing step is completed in the fourth variation. As shown in these figures, the resin packages 112 are joined like a plate-shaped chocolate. There are grooves 135 at the boundaries of the adjacent resin packages 112. Hence, it is possible to keep the original positions of the resin packages 112 without the tape member 133. The resin packages 112 can be separated from each other in the grooves 135, which facilitate the separating step.

FIG. 58 shows a die 136 used to form the resin packages 112 shown in FIGS. 57A and 57B. As shown in FIG. 58, an upper die of the die 136 has a cavity in which projections 138 corresponding to the grooves 135 are formed. A lower die 139 of the die 136 has a recess portion 140 in which the lead frame 120 is placed. The resin packages 112 joined together as shown in FIGS. 57A and 57B can be formed by using the die 136 having a simple structure.

Figure 59:
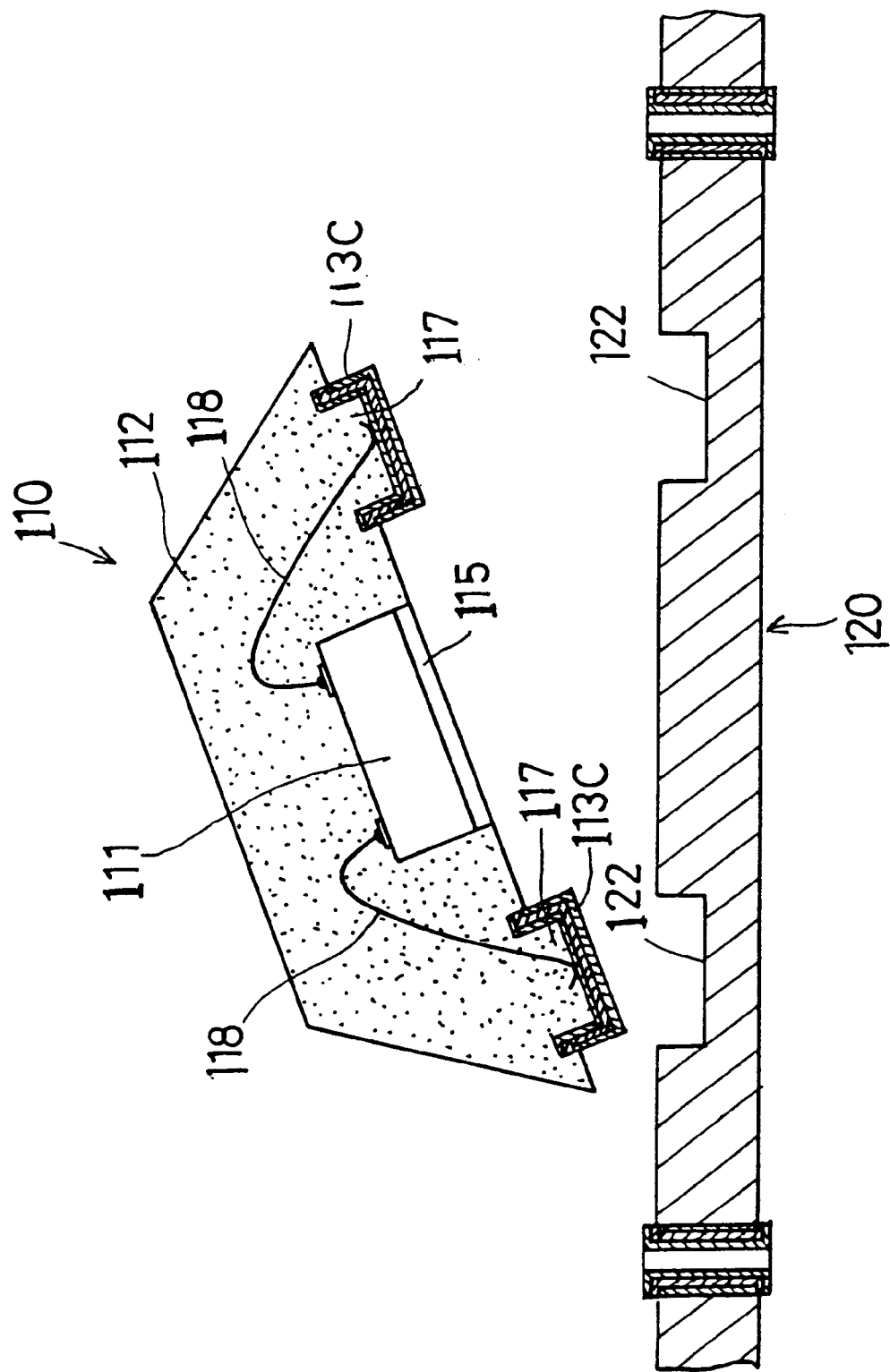
FIG. 59 is a cross-sectional view of another separation step of the method of producing the semiconductor device according to the tenth embodiment of the present invention.

FIG. 59 shows a variation of the separating step. The above-mentioned separating step employs etching. Instead, the variation is intended to mechanically separate the resin packages 112 from the lead frame 120 rather than dissolving the lead frame 20. The variation does not need any etchant and a smaller amount of time is necessary for the separation step. On the other hand, it should be considered whether the mechanical separating process certainly allows the metallic films 113C to move to the resin projections 117. The above possibility will be eliminated by providing a member which facilitates the mechanical separating process in the recess portions 122 beforehand.

[Eleventh Embodiment]

A description will now be given of a semiconductor device according to an eleventh embodiment of the present invention.

Figure 60:
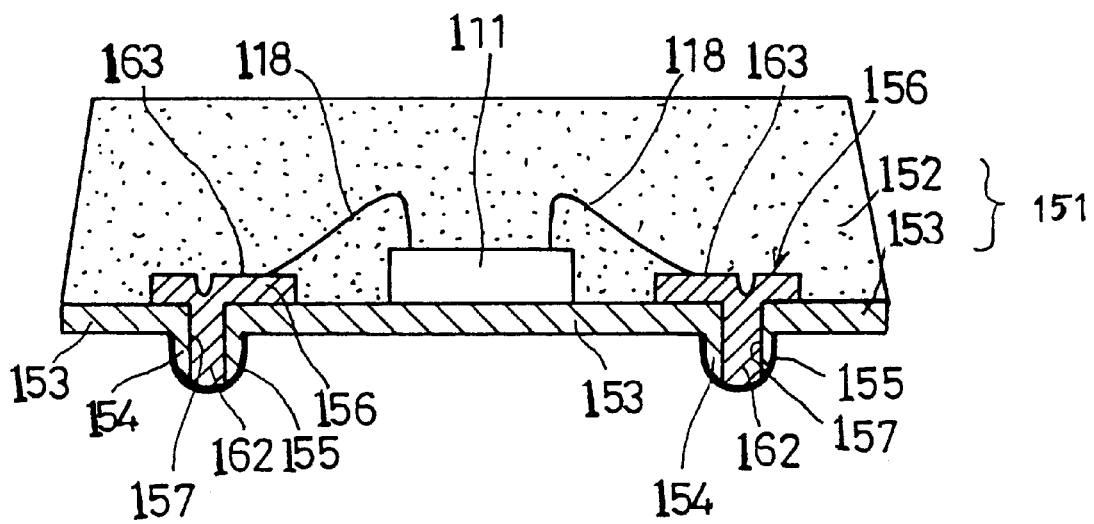
FIG. 60 is a cross-sectional view of a semiconductor device according to an eleventh embodiment of the present invention.

FIG. 60 shows a semiconductor device 150 according to the eleventh embodiment of the present invention. In this figure, parts that are the same as those shown in the previously described figures relating to the semiconductor device 110 are given the same reference numbers.

The semiconductor device 150 has a feature in which it has a resin package 151 having a two-layer structure made up of a upper resin layer 152 and a lower resin layer 153. A plurality of resin projections 154 are formed in given positions of the lower resin layer 153. Metallic films 155 each having a single-layer structure made of, for example, palladium (Pd) respectively cover the resin projections 154.

Connection electrodes 156 are provided to the lower resin layer 153, and have lower extending portions 162 extending through through-holes 157 formed in the lower resin layer 153. The ends of the lower extending portions 162 are electrically connected to the corresponding metallic films 155. The connection electrodes 156 respectively have upper bonding portions 163 located on the lower resin layer 153. The bonding wires 118 are bonded to the upper bonding portions 163.

The upper resin layer 152 and the lower resin layer 153 can be made of an identical substance or different substances. For example, the lower resin layer 153 on which the chip 111 is mounted is made of a resin having a good heat resistance and a good mechanical strength. The upper resin layer 152 is made of a resin having a good heat radiating nature. Hence, the characteristic of the chip 111 can be improved.

It is possible to employ a resin package consisting of three resin layers or more.

A description will now be given, with reference to FIGS. 61 through 70, of a method of producing the semiconductor device 150 according to the eleventh embodiment of the present invention. The method of producing the semiconductor device 150 has a step of forming the metallic films 155 and the connection electrodes 156 which is not used in the method of producing the semiconductor device 110. The steps of producing the other portions of the semiconductor device 150 can be the same as corresponding ones of the step of producing the semiconductor device 110. Hence, the following description will be focused on the step of producing the metallic films 155 and the connection electrodes 156.

Figure 61:
FIG. 61 is a cross-sectional view showing a metallic base forming step of a method of producing the semiconductor device according to the eleventh embodiment of the present invention.
Figure 62:
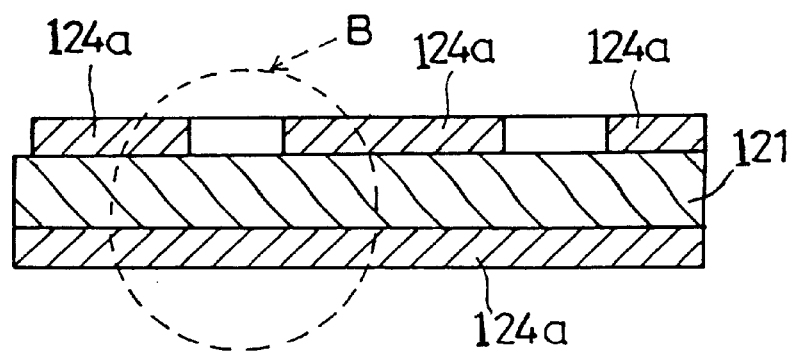
FIG. 62 is a cross-sectional view showing a resist forming step of the method of producing the semiconductor device according to the eleventh embodiment of the present invention.

As shown in FIG. 61, the plate-shaped metallic member 121 made of copper (Cu) or the like is prepared. An etching resist film made of a photosensitive resin is provided on the upper and lower surfaces of the metallic member 121 (resist coating step). Then, an exposure process is carried out using masks provided to the etching resist films. Thereafter, a developing process is carried out in order to remove portions of the etching resist films corresponding to the recess portions. Hence, the resist patterns 124a shown in FIG. 62 can be obtained (resist pattern forming step).

Figure 63:
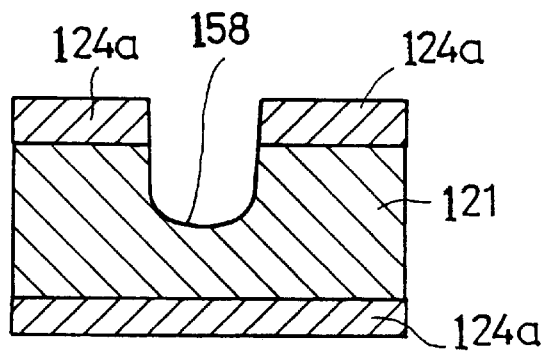
FIG. 63 is a cross-sectional view showing a half-etching step of the method of producing the semiconductor device according to the eleventh embodiment of the present invention.

After the resist pattern forming step, the metallic member 121 on which the resist patterns 124a are formed is etched (etching step). In the etching step, the metallic member 121 is half-etched from only the upper surface thereof. Hence, as shown in FIG. 63, which is an enlarged view of a part B shown in FIG. 62, a recess portion 158 is formed in the recess forming portion defined by the upper resist pattern 124a.

Figure 64:
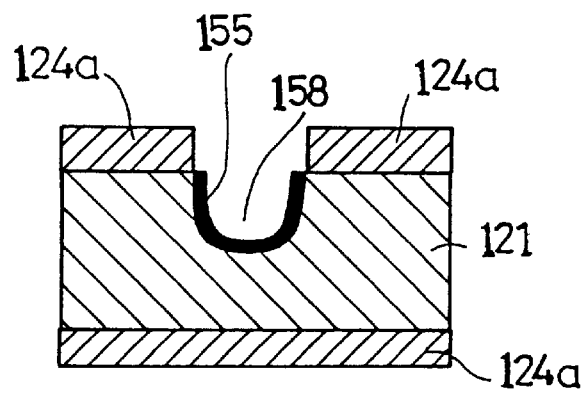
FIG. 64 is a cross-sectional view showing a plating step of the method of producing the semiconductor device according to the eleventh embodiment of the present invention.

The etching step is followed by a metallic film forming step in which the metallic films 155 are formed by plating. The metallic member 121 is placed in the plating chamber and electrolytic plating is carried out. Each of the metallic films 155 used in the embodiment of the present invention being considered has a palladium (Pd) single-layer structure. Hence, the metallic films 155 can be formed by performing the plating step once. FIG. 64 shows the metallic member 121 with the metallic film 155 plated in the recess portion 158.

It should be noted that the metallic films 155 can be formed by thin-film forming processes other than the plating process, such as an evaporating process and a sputtering process.

Figure 65:
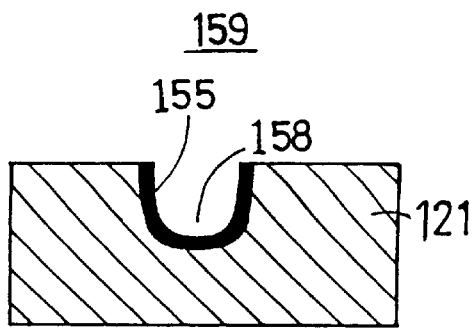
FIG. 65 is a cross-sectional view showing a resist removing step of the method of producing the semiconductor device according to the eleventh embodiment of the present invention.

After the metallic films 155 are formed, a resist removing step is carried out in which the resist pattern films 124a are removed. Hence, the lead frame 159 shown in FIG. 65 is formed.

Figure 66:
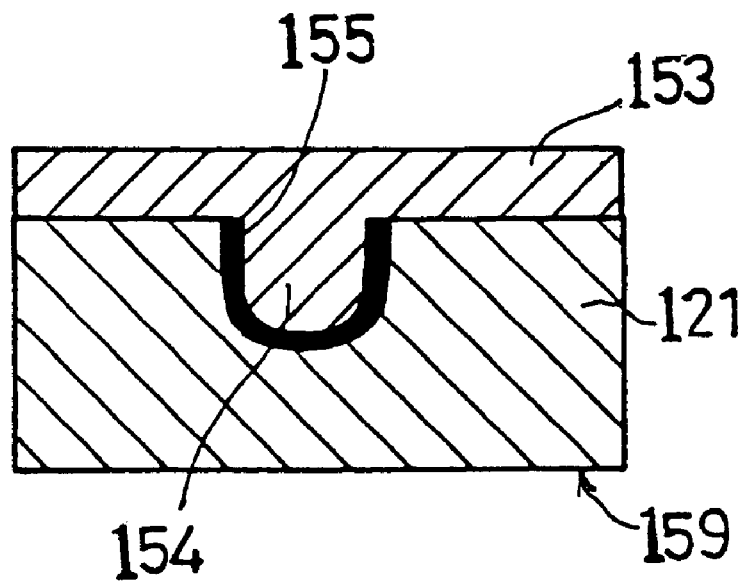
FIG. 66 is a cross-sectional view showing a photosensitive resin coating step of the method of producing the semiconductor device according to the eleventh embodiment of the present invention.

Then, the semiconductor devices 150 are produced by using the lead frame 159 thus formed. First, the lower resin layer 153 is formed on the surface on which the plated recess portions 155 are formed. As shown in FIG. 66, a portion of the lower resin layer 153 in the recess portion 155 forms the resin projection 154.

Figure 67:
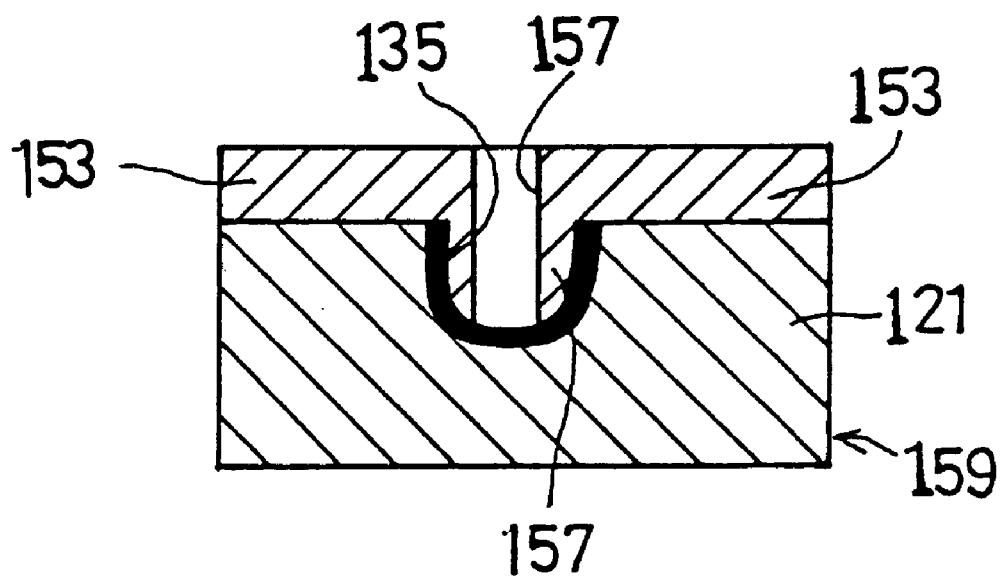
FIG. 67 is a cross-sectional view showing a through hole forming step of the method of producing the semiconductor device according to the eleventh embodiment of the present invention.

Thereafter, as shown in FIG. 67, the through hole 157 is formed in the resin projection 154 of the lower resin layer 153. Hence, the metallic film 155 is exposed through the through hole 157.

Figure 68:
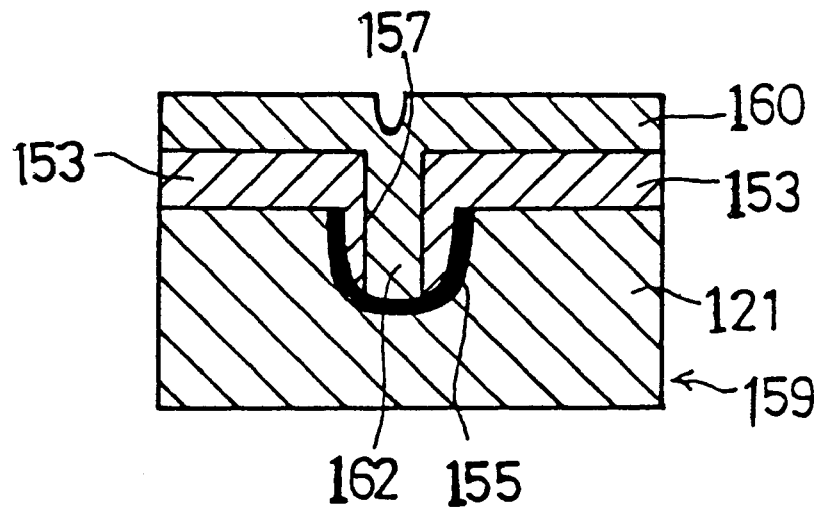
FIG. 68 is a cross-sectional view showing a plating step of the method of producing the semiconductor device according to the eleventh embodiment of the present invention.
Figure 69:
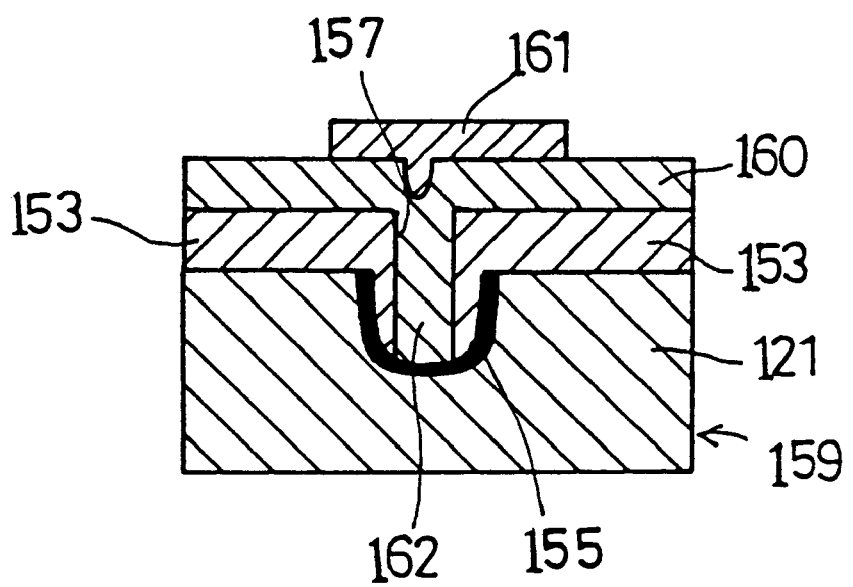
FIG. 69 is a cross-sectional view showing a resist forming step of the method of producing the semiconductor device according to the eleventh embodiment of the present invention.

Then, an electrically conductive metallic film 160 is formed to a given thickness on the entire surface of the lower resin layer 153, as shown in FIG. 68. The aforementioned connection electrodes 156 are derived from the metallic film 160. The metallic film 160 is formed by non-electrolytic plating, evaporating or sputtering. During the process of forming the metallic film 160, the metallic film 160 is filled in the through hole 157, so that the lower extending portion 162 is formed, as shown in FIG. 69. Hence, the metallic film 160 and the metallic film 155 are electrically connected together.

Subsequently, an etching resist film is coated on the metallic film 160 and exposing and developing steps are carried out. Then, as shown in FIG. 69, a resist pattern 161 is formed in the position in which the connection electrode 156 should be formed. Then, the metallic film 160 is etched so that the resist pattern 161 functions as a mask. Hence, the metallic film 160 is removed except for the portions in which the connection electrodes 156 should be formed.

Figure 70:
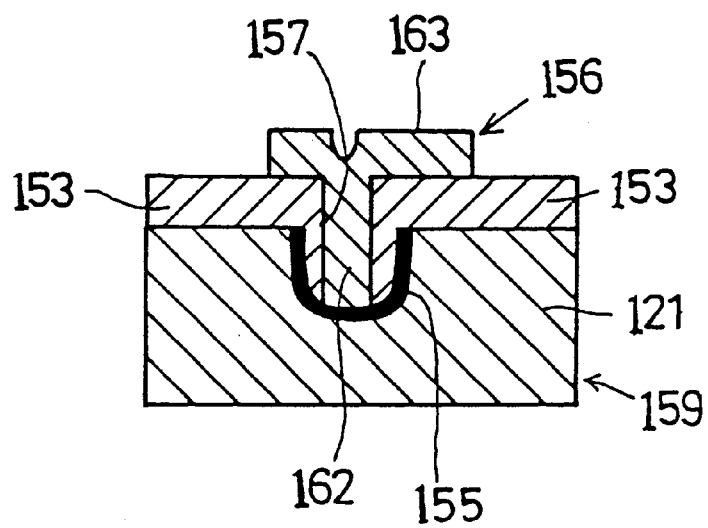
FIG. 70 is a cross-sectional view showing etching and resist removing steps of the method of producing the semiconductor device according to the eleventh embodiment of the present invention.

As shown in FIG. 70, the connection electrode 156 is formed which has a structure in which the lower extending portion 162 is connected to the metallic film 155, and the upper bonding portion 163 to which the wire 118 is to be bonded extends over the lower resin layer 153.

The remaining production steps following the step of forming the connection electrodes 156 are the same as corresponding ones which have been described with reference to FIGS. 46 through 54B, and a description thereof will be omitted.

[Twelfth Embodiment]

A description will now be given of a semiconductor device according to a twelfth embodiment of the present invention.

Figure 71:
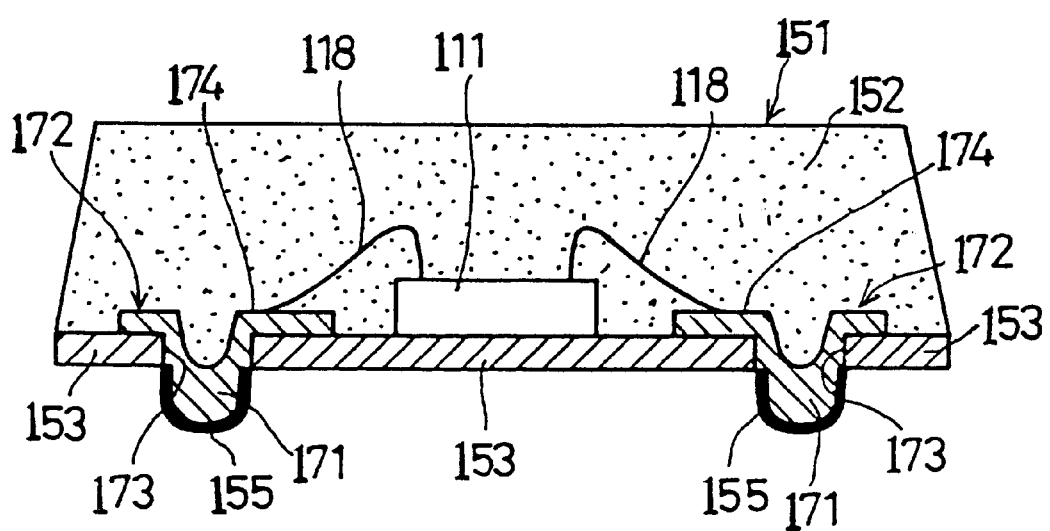
FIG. 71 is a cross-sectional view of a semiconductor device according to a twelfth embodiment of the present invention.

FIG. 71 shows a semiconductor device 170 according to the twelfth embodiment of the present invention. In FIG. 71, parts that are the same as those of the semiconductor device 150 are given the same reference numbers.

The semiconductor device 170 has the resin package 151 of the two-layer structure including the upper resin layer 152 and the lower resin layer 153, and has metallic projections 171 integrally formed in connection electrodes 172. The metallic projections 171 are substituted for the resin projections 154. The single-layer metallic film 155 made of, for example, palladium (Pd) is provided to each of the metallic projections 171.

The connection electrodes 172 are provided to the lower resin layer 153. The metallic projections 171 are electrically connected to the corresponding metallic films 155 through windows (through holes) 173 formed in the lower resin layer 153. The bonding wires 118 are bonded to bonding portions 174 which are upper portions of the connection electrodes 172 and extend on the upper surface of the lower resin layer 153.

The semiconductor device 170 has the two-layer-structure resin package 151 as in the case of the semiconductor device 150, so that the characteristics of the semiconductor device 170 can be improved. Further, it is possible to decrease the impedance between the metallic projection 171 and the metallic film 155 because the metallic film 155 is directly connected to the metallic projection 171. Hence, the electrical characteristics of the semiconductor device 170 can further be improved. It should be noted that the resin package 151 is not limited to the two-layer structure and may have a structure consisting of three layers or more.

A description will now be given, with reference to FIGS. 72 through 81, of a method of producing the semiconductor device 170. This method has particular features in the steps of forming the metallic films 155 and the connection electrodes 172, and has the other steps almost the same as those of the method of producing the semiconductor device 150. Hence, the following description is specifically directed to the steps of forming the metallic films 155 and the connection electrodes 172.

Figure 72:
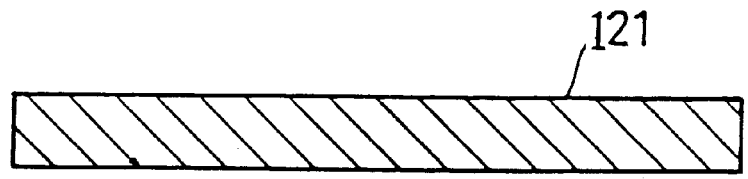
FIG. 72 is a cross-sectional view showing a metallic base forming step of a method of producing the semiconductor device according to the twelfth embodiment of the present invention.
Figure 73:
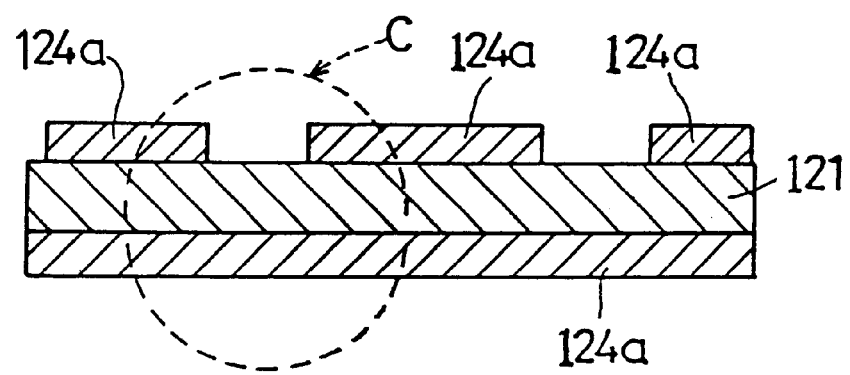
FIG. 73 is a cross-sectional view showing a resist forming step of the method of producing the semiconductor device according to the twelfth embodiment of the present invention.

As shown in FIG. 72, the plate-shaped metallic member 121 made of copper (Cu) or the like is prepared. Next, etching resist films made of photosensitive resin are provided to two opposite surfaces of the metallic member 121. Then, the etching resist films are subjected to the exposing and developing processes, so that the resist patterns 124a having windows located in the positions in which the recess portions 158 should be formed can be formed, as shown in FIG. 73.

Figure 74:
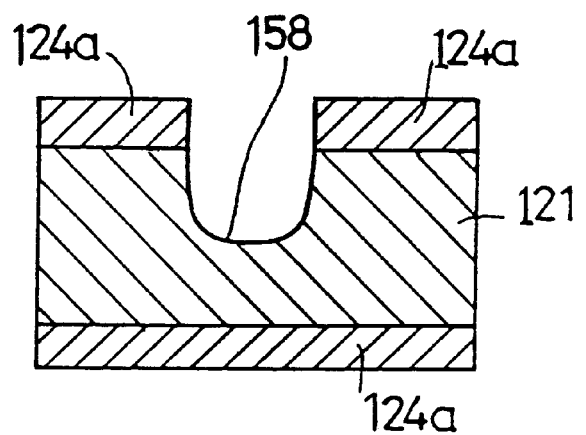
FIG. 74 is a cross-sectional view showing a half-etching step of the method of producing the semiconductor device according to the twelfth embodiment of the present invention.

The metallic member 121 on which the resist patterns 124a are formed is etched (etching step). In this etching step, the metallic member 121 is half-etched from only the upper surface thereof. Hence, the recess portions 158 are formed in the metallic member 121, as shown in FIG. 74, which is an enlarged cross-sectional view of a part C shown in FIG. 73.

Figure 75:
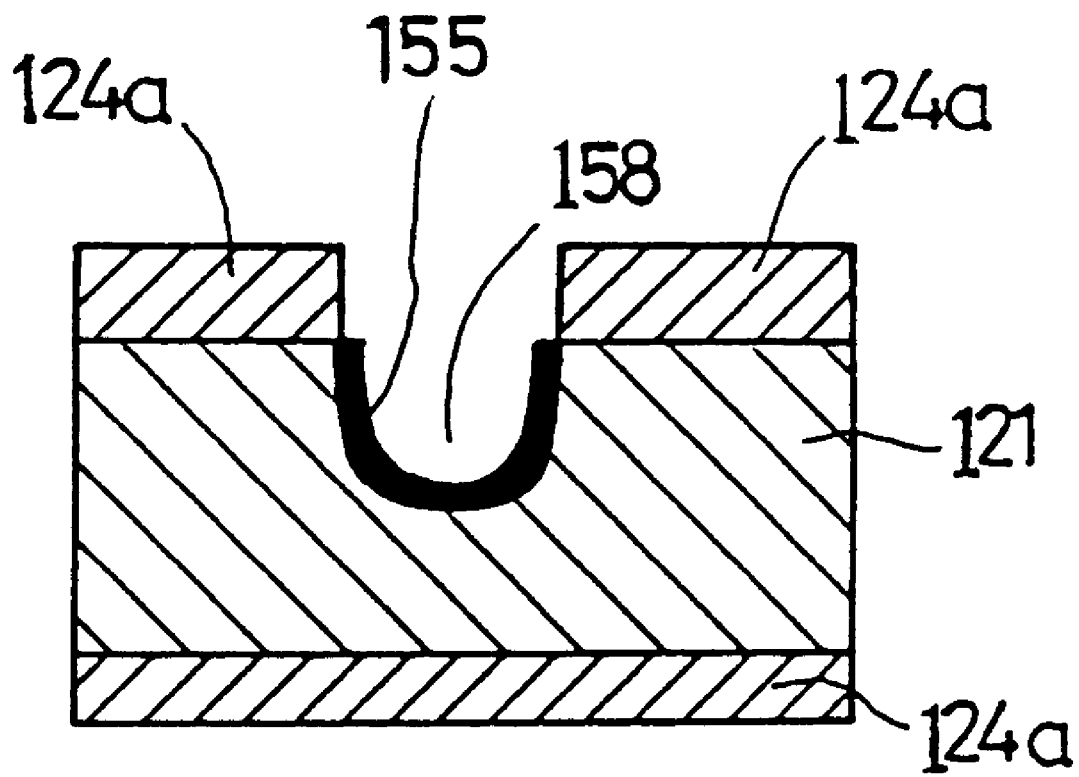
FIG. 75 is a cross-sectional view showing a half-etching step of the method of producing the semiconductor device according to the twelfth embodiment of the present invention.
Figure 76:
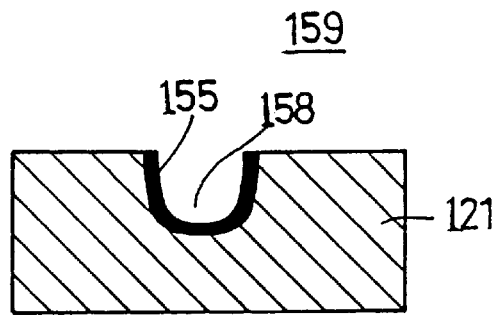
FIG. 76 is a cross-sectional view showing a resist removing step of the method of producing the semiconductor device according to the twelfth embodiment of the present invention.

After the etching step is completed, a metallic film forming step is executed so that the metallic film 155 is formed in the recess portion 158 by plating, as shown in FIG. 75. Besides the plating process, an evaporating or sputtering process can be employed. Then, the resist patterns 124a are removed by the resist removing step, so that a lead frame 159 shown in FIG. 76 can be formed.

Figure 77:
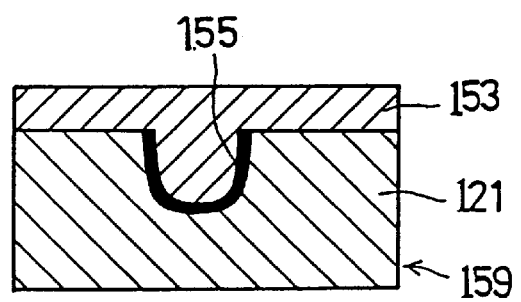
FIG. 77 is a cross-sectional view showing a photosensitive resin coating step of the method of producing the semiconductor device according to the twelfth embodiment of the present invention.
Figure 78:
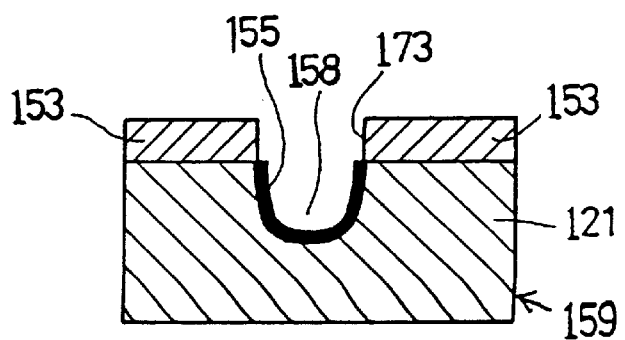
FIG. 78 is a cross-sectional view showing a window forming step of the method of producing the semiconductor device according to the twelfth embodiment of the present invention.

Then, the semiconductor devices 170 are derived from the lead frame 159. As shown in FIG. 77, the lower resin layer 153 is provided to the surface of the metallic member 121 on which the recess portions 158 are formed. Thereafter, as shown in FIG. 78, the portion of the lower resin layer 153 corresponding to the recess portion 158 is removed, so that a window or through hole 173 is formed therein. The metallic member 121 is exposed through the window 173.

Figure 79:
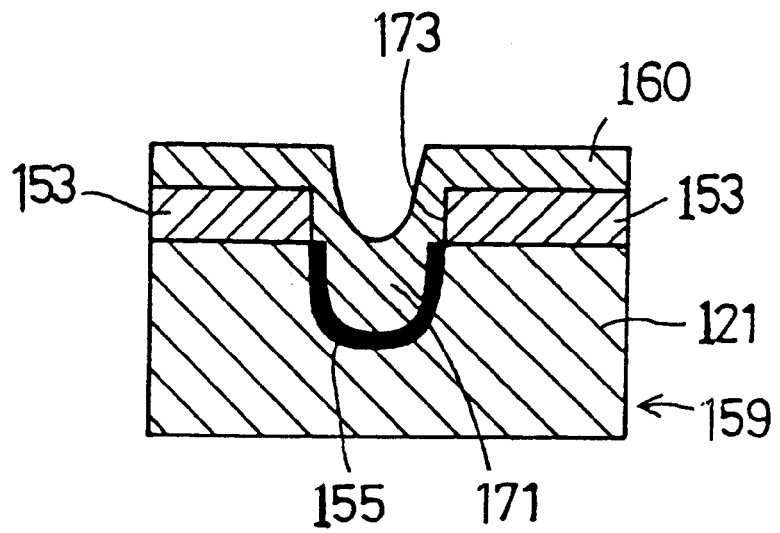
FIG. 79 is a cross-sectional view showing a plating step of the method of producing the semiconductor device according to the twelfth embodiment of the present invention.
Figure 80:
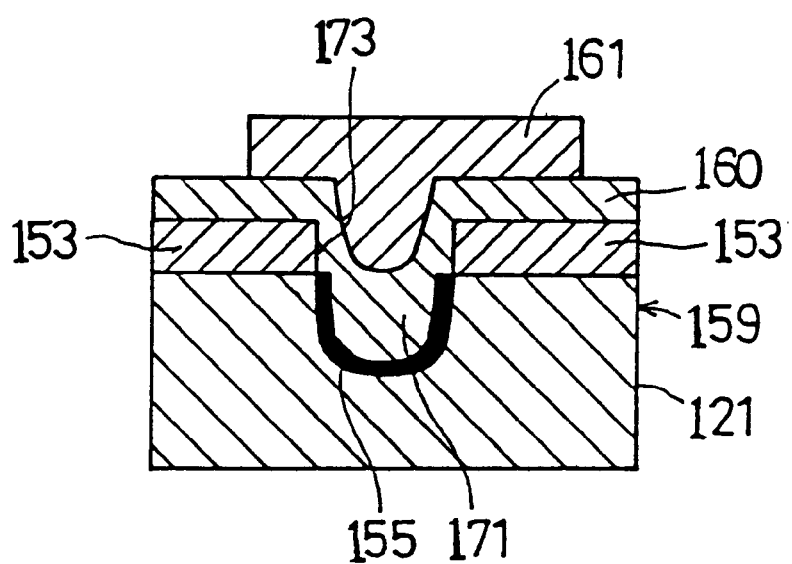
FIG. 80 is a cross-sectional view showing a resist forming step of the method of producing the semiconductor device according to the twelfth embodiment of the present invention.

Thereafter, the electrically conductive metallic film 160 is formed to a given thickness on the entire surface of the lower resin layer 153. The metallic film 160 can be formed by non-electrolytic plating, evaporating or sputtering. During the process of forming the metallic film 160, the metallic film 160 is filled in the through hole 158, so that the metallic projection 171 is formed, as shown in FIG. 79. Hence, the metallic film 160 and the metallic film 155 are electrically connected together.

The area of the window 173 is greater than the diameter of the through hole 157, so that a greater contact area between the metallic projection 171 and the metallic film 155 can be obtained. Hence, the metallic projection 171 and the metallic film 155 can be electrically connected together with a lower impedance.

After forming the metallic film 160, an etching resist film is deposited thereon, and the exposing and developing processes are carried out. Hence, the resist pattern 161 located in the position in which the connection electrode 172 should be formed is formed. Then, the metallic film 160 is etched in such a way that the resist pattern 161 serves as a mask. Hence, the metallic film 160 is removed except for the portion covered by the mask.

Figure 81:
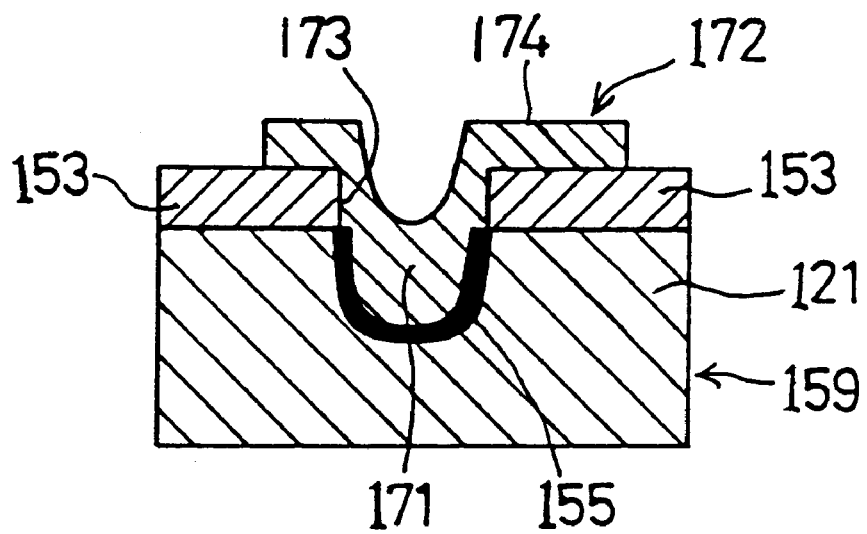
FIG. 81 is a cross-sectional view showing etching and resist separating steps of the method of producing the semiconductor device according to the twelfth embodiment of the present invention.

Hence, as shown in FIG. 81, the connection electrode 172 is formed, the connection electrode 172 having a structure in which the metallic projection 171 is connected to the metallic film 155, and the bonding portion 174 to which the wire 118 is to be bonded extends over the lower resin layer 153.

The remaining production steps following the step of forming the connection electrodes 172 are the same as corresponding ones which have been described with reference to FIGS. 46 through 54B, and a description thereof will be omitted.

[Thirteenth Embodiment]

Figure 82:
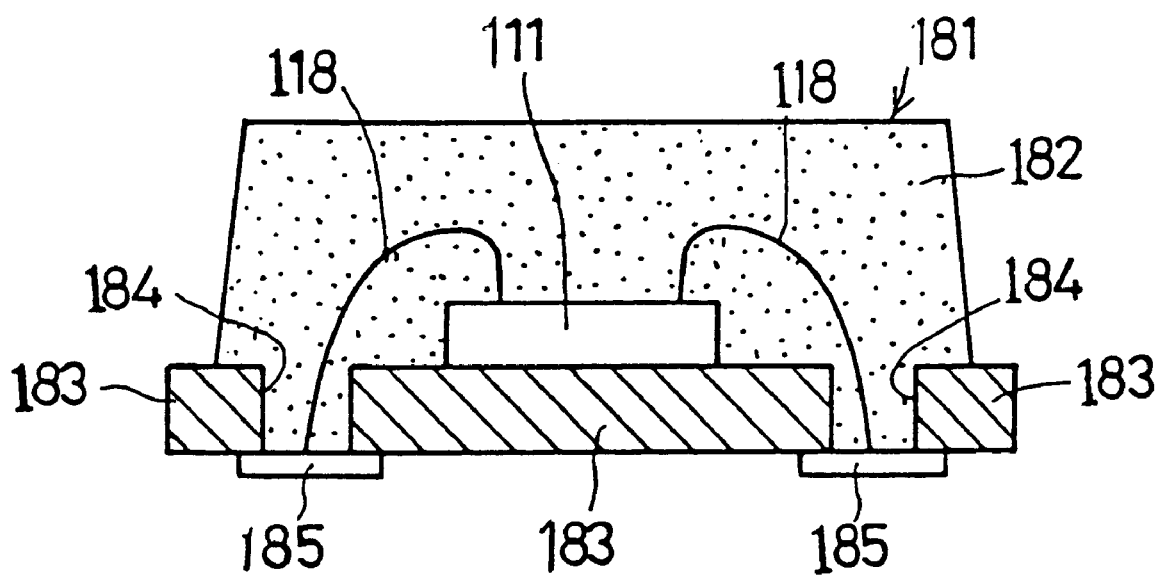
FIG. 82 is a cross-sectional view of a semiconductor device according to a thirteenth embodiment of the present invention.

A description will now be given, with reference to FIG. 82, of a semiconductor device 180 according to a thirteenth embodiment of the present invention. In FIG. 82, parts that are the same as those of the semiconductor device 150 are given the same reference numbers.

The semiconductor device 180 has a resin package 181 made up of an upper resin layer 182 and a lower resin layer 183, in which the lower resin layer 183 is formed by an insulation resin tape. Windows 184 are formed in given positions in the resin tape 183, and external electrode films 185 are formed to the lower surface (mounting surface) of the resin tape 183 so that the electrode films 185 cover the windows 184. The bonding wires 118 are bonded to the electrode films 185 through the windows 184.

The semiconductor device 180 has improved characteristics resulting from the two-layer package structure, and a cost reduction due to the resin tape 183 used instead of the lead frame 120 or 159.

[Fourteenth Embodiment]

Figure 83:
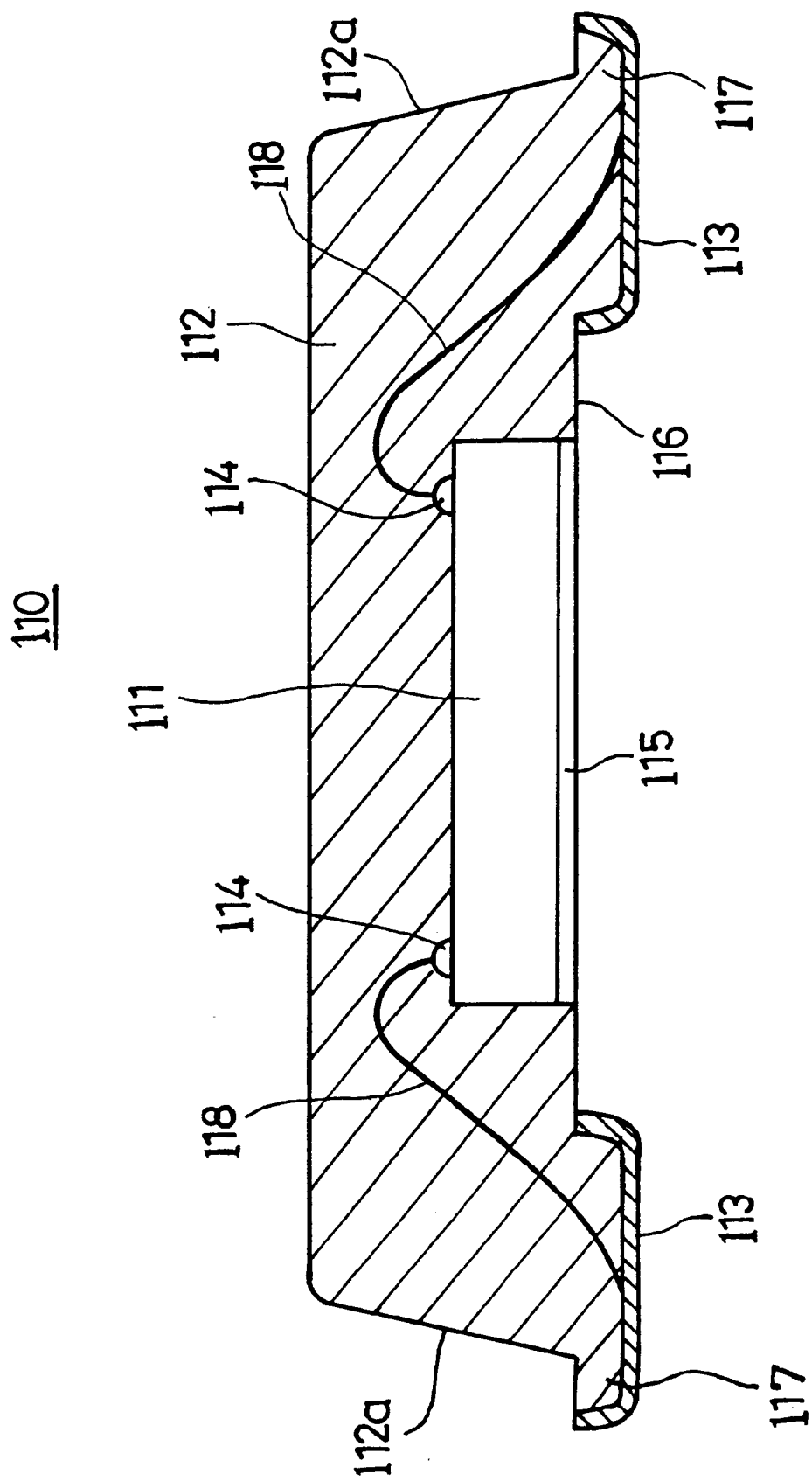
FIG. 83 is a cross-sectional view of a semiconductor device according to a fourteenth embodiment of the present invention.
Figure 84A:
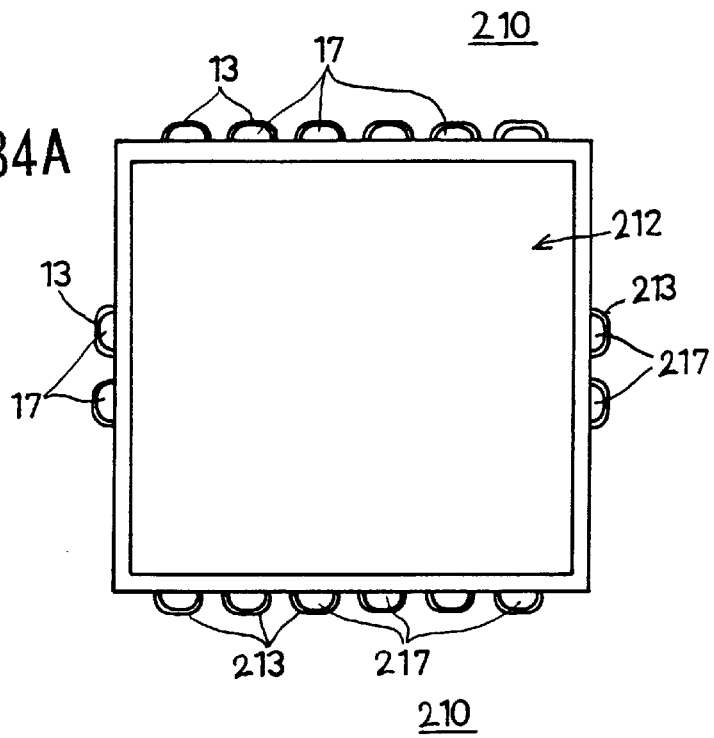
FIG. 84A is a plan view of the semiconductor device shown in FIG. 83.
Figure 84B:
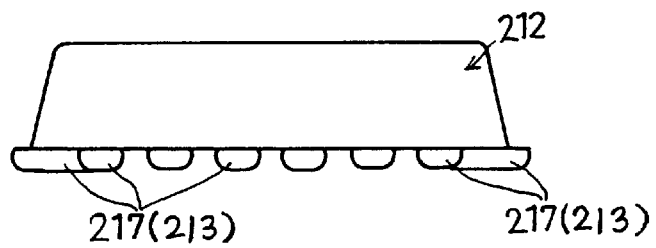
FIG. 84B is a side view of the semiconductor device shown in FIG. 83.
Figure 84C:
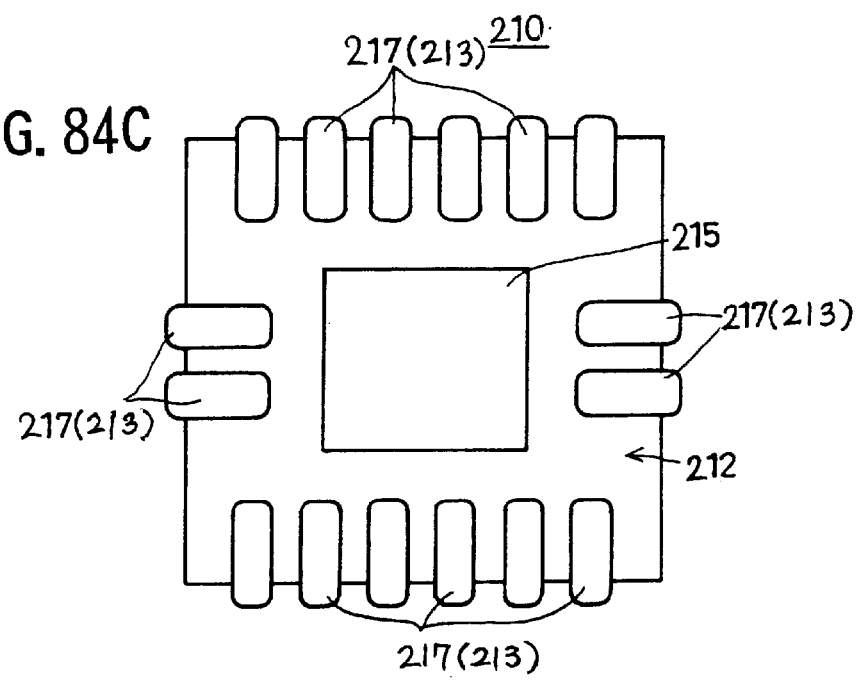
FIG. 84C is a bottom view of the semiconductor device shown in FIG. 83.

A description will now be given of a semiconductor device according to a fourteenth embodiment of the present invention. FIG. 83 is a cross-sectional view of a semiconductor device 210 according to the fourteenth embodiment of the present invention. FIG. 84A is a plan view of the semiconductor device 210, FIG. 84B is a front view thereof, and FIG. 84C is a bottom view thereof.

The semiconductor device 210 has a simple structure including a chip 211, a resin package 212 and metallic films 213. A plurality of electrode pads 214 are formed on the upper surface of the chip 211, which is mounted on a chip fixing resin 215. The chip 211 may be a semiconductor chip, a SAW chip, a multichip module or the like.

The resin package 212 is formed by molding (or potting) an epoxy resin, and has resin projections 217 integrally formed with the other portion of the resin package 212. The resin projections 217 are located in given positions. Each of the resin projections 217 projects downwards from a bottom surface (mount-side surface) 216 of the resin package 212, and also projects laterally from a side surface 212a thereof. The resin projections 217 are arranged at a pitch approximately equal to, for example, 0.8 mm.

The metallic films 213 are provided so as to cover the respective resin projections 217. Bonding wires 218 are provided between the metallic films 213 and the electrode pads 214, and are electrically connected together. The metallic films 213 can be configured as shown in FIGS. 35 through 38. The metallic films 213 may be configured as will be described later.

The semiconductor device 210 thus formed does not need any inner and outer leads used in the SSOP. Hence, there is no need to provide an area for leading the inner leads and a space in which the outer leads extend. Hence, a down-sized semiconductor device can be provided. Further, the semiconductor device 210 does not need any solder balls used in the BGA type, and is thus less expensive. Furthermore, the resin projections 217 and the metallic films 213 cooperate with each other as if they function as solder bumps of the BGA-type devices, so that a high mounting density can be obtained. Furthermore, the semiconductor device 210 is not affected by a curvature or deformation of the resin package 212.

The semiconductor device 210 has another advantage, which will now be described with reference to FIG. 85. Referring to FIG. 85, the semiconductor device 210 is mounted on a circuit board 250, on which connection electrodes 251 are provided in positions corresponding to those of the metallic films 213. The metallic films 213 are soldered to the connection electrodes 251. A reference number 219 indicates a solder portion. The solder portions 219 laterally extend along the metallic films 213 and laterally project from the resin package 212. Hence, the solder portions 219 can be visually checked, as shown in FIG. 85. This advantage facilitates the test of determining whether the semiconductor device 210 is duly mounted on and soldered to the circuit board 250.

Figure 86:
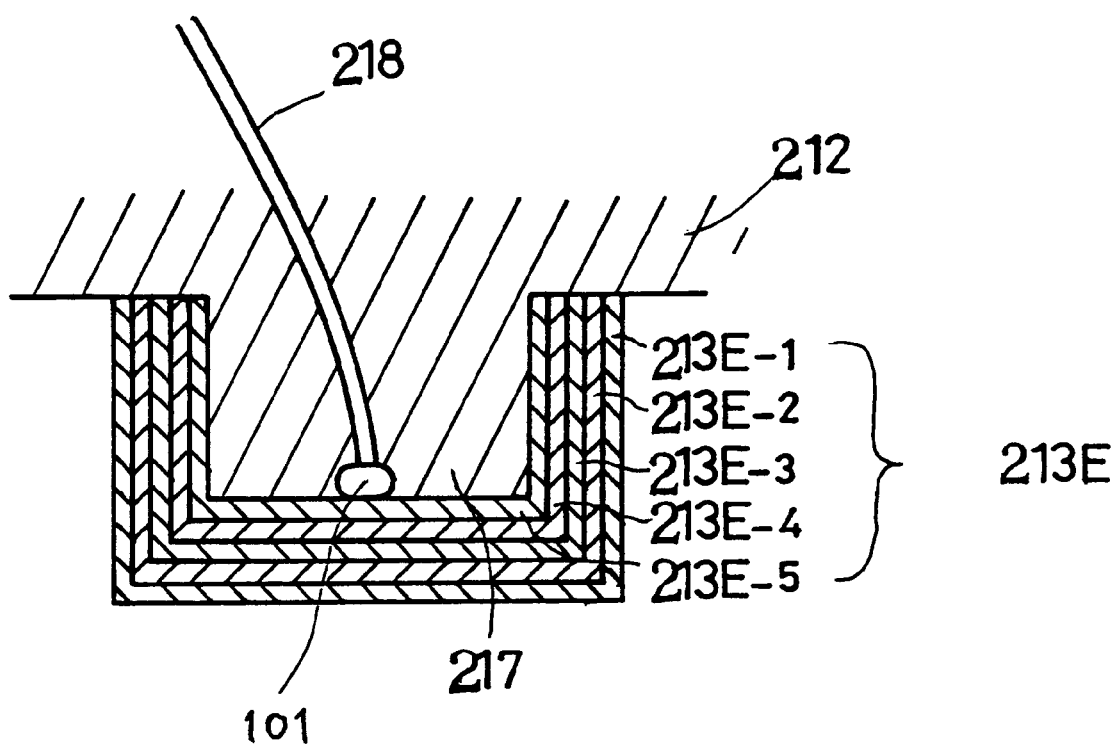
FIG. 86 is a cross-sectional view of a metallic film having a five-layer structure.
Figure 87:
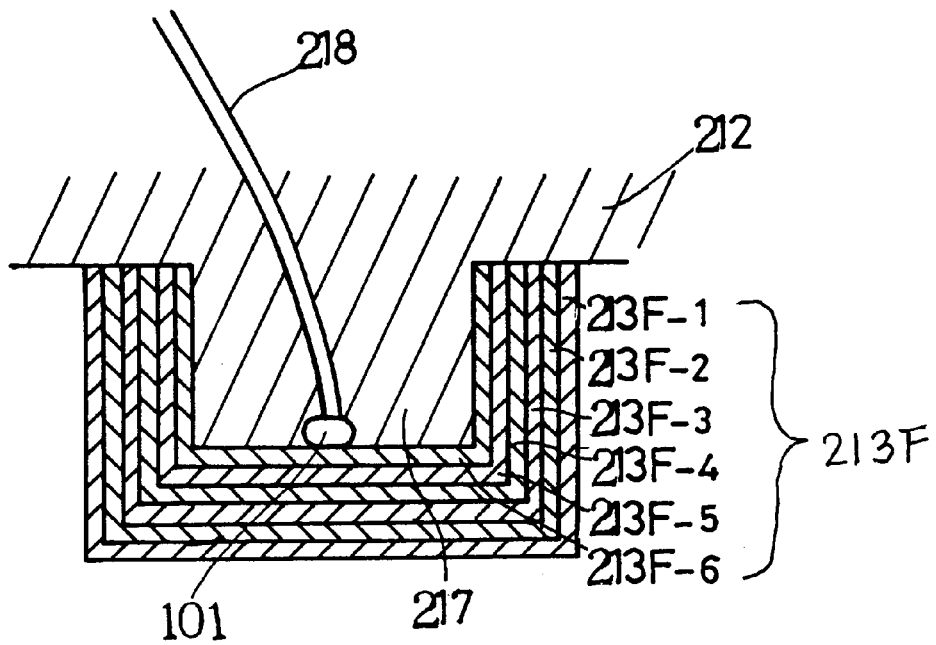
FIG. 87 is a cross-sectional view of a metallic film having a six-layer structure.
Figure 88:
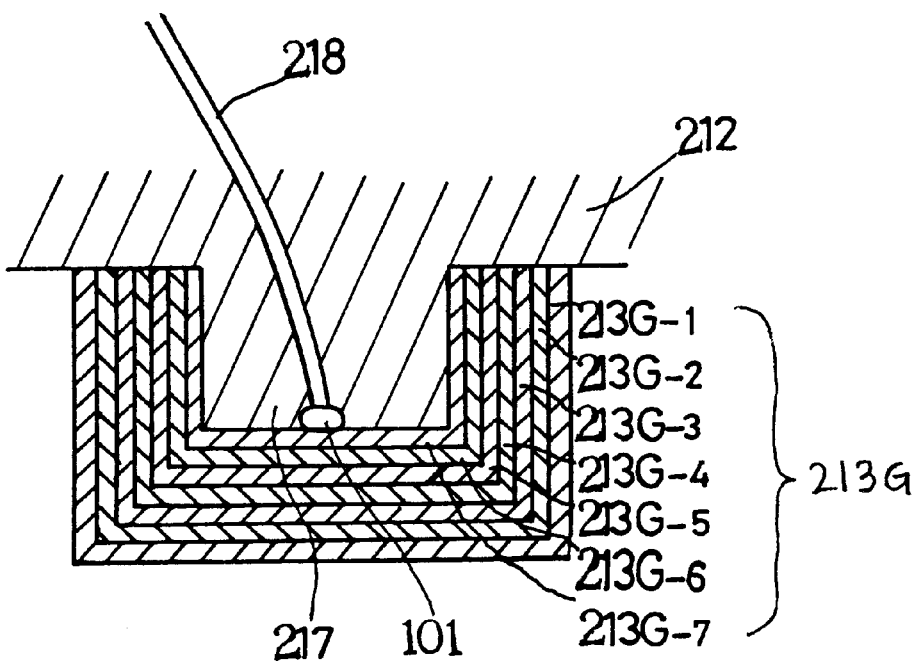
FIG. 88 is a cross-sectional view of a metallic film having a seven-layer structure.

Each of the metallic films 213 can have one of the multilayer structures shown in FIGS. 86, 87 and 88 which satisfy the aforementioned film requirement.

FIG. 86 shows a metallic film 213E having a five-layer structure consisting of an outer layer 213E-1, a first intermediate layer 213E-2, a second intermediate layer 213E-3, a third intermediate layer 213E-4, and an inner layer 213E-5. These layers can be made of the following combinations.

| 213E-1 | 213E-2 | 213E-3 | 213E-4 | 213E-5 |
|--------|--------|--------|--------|--------|
| Au     | Pd     | Ni     | Pd     | Au     |
| solder | Ni     | Au     | Pd     | Au     |
| Pd     | Ni     | Au     | Pd     | Au     |
| Pd     | Ni     | Cu     | Ni     | Pd     |
| Au     | Ni     | Cu     | Ni     | Au     |
| Au     | Pd     | Ni     | Au     | Pd     |

FIG. 87 shows a metallic film 213F having a six-layer structure consisting of an outer layer 213F-1, a first intermediate layer 213F-2, a second intermediate layer 213F-3, a third intermediate layer 213F-4, a fourth intermediately layer 213F-5, and an inner layer 213F-6. These layers can be made of the following combinations.

| 213F-1 | 213F-2 | 213F-3 | 213F-4 | 213F-5 | 213F-6 |
|--------|--------|--------|--------|--------|--------|
| Au     | Pd     | NI     | Au     | Pd     | Au     |
| Au     | Pd     | Ni     | Cu     | Ni     | Pd     |
| Pd     | Ni     | Cu     | Ni     | Pd     | Au     |

FIG. 88 shows a metallic film 213G having a seven-layer structure consisting of an outer layer 213G-1, a first intermediate layer 213G-2, a second intermediate layer 213G-3, a third intermediate layer 213G-4, a fourth intermediate layer 213G-5, a fifth intermediately layer 213G-6, and an inner layer 213G-7. These layers can be made of the following combinations.

| 213G-1 | 213G-2 | 213G-3 | 213G-4 | 213G-5 | 213G-6 | 213-7 |
|--------|--------|--------|--------|--------|--------|-------|
| Au     | Pd     | Ni     | Cu     | Ni     | Pd     | Au    |

In FIGS. 86, 87 and 88, the aforementioned bonding balls 101 are depicted. The bonding balls 101 can be employed or can be omitted as shown in FIG. 83.

The semiconductor device 210 can be produced in the same manner as has been described with reference to FIG. 39 through 59.

Instead of the bonding balls 101, it is also possible to use stud balls or stud bumps as will be described below.

Figure 89A:
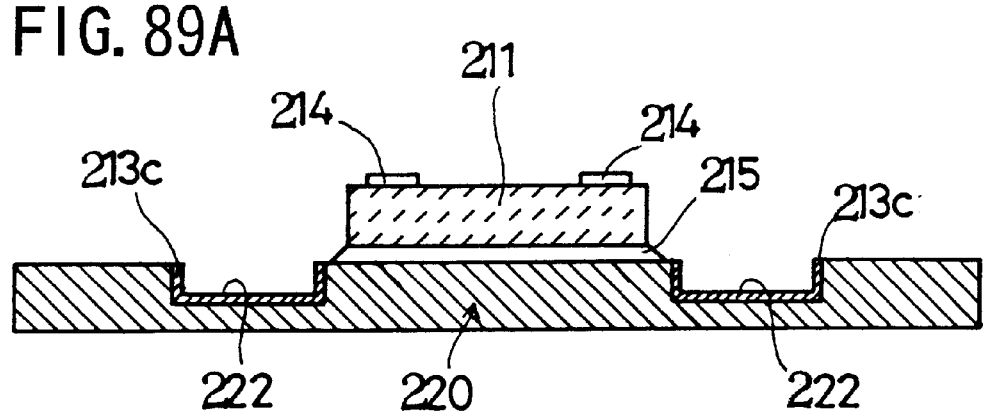
FIGS. 89A, 89B, 89C, 89D and 89E are respectively cross-sectional views showing a variation of the connecting step.

FIG. 89A shows a state observed when the chip mounting step, which has been described with reference to FIG. 46, is completed. A lead frame 220, produced in the aforementioned manner, includes recess portions 222, in which metallic films 213C having a three-layer structure shown in FIG. 37 are provided. The chip 211 having the electrode pads 214 is mounted on the chip fixing resin 215.

Figure 89B:
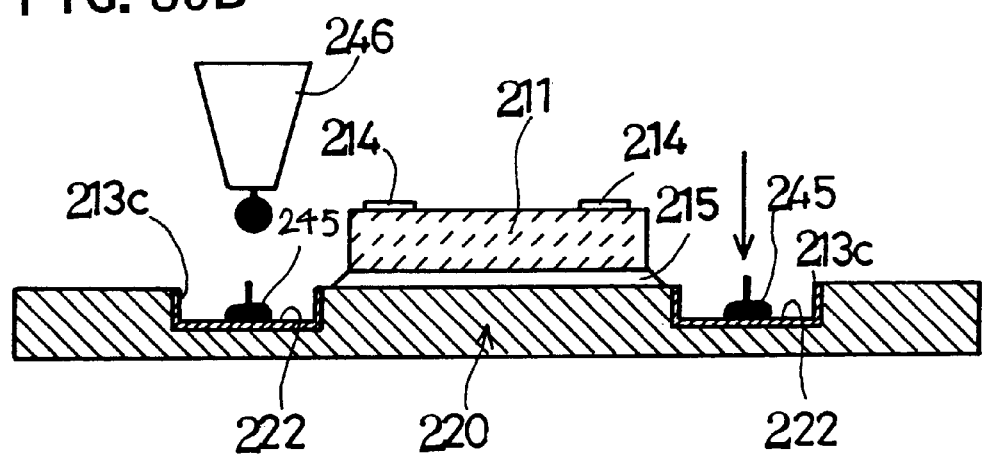
Figure 89C:
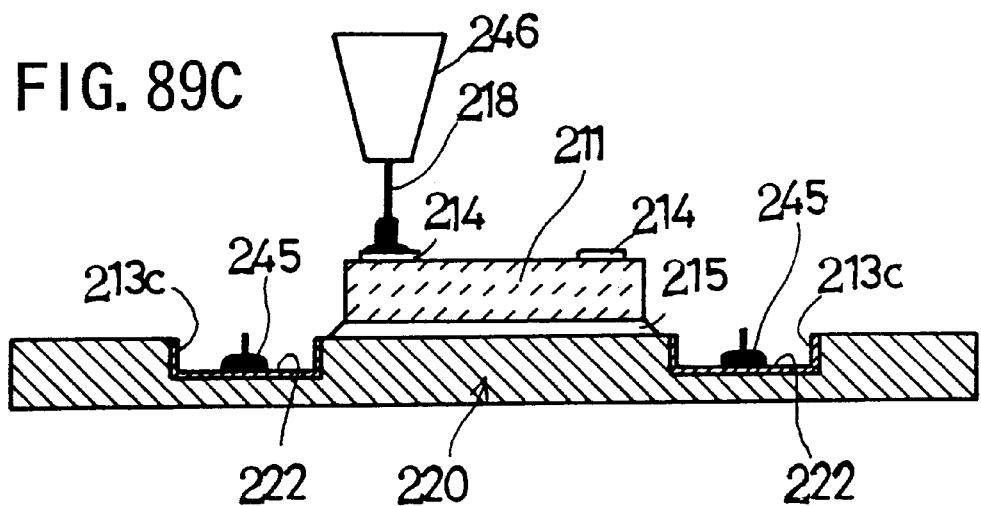

FIG. 89B shows a state in which stud bumps 245 are provided on the inner walls of the metallic films 213C. After forming the stud bumps 245, a capillary 246 is moved so as to be positioned just above the target electrode pad 214, as shown in FIG. 89C. In this state, the bonding wire 218 is bonded to the electrode pad 214 (first bonding). Then, the capillary 246 is moved so as to be positioned just above the target stud bump 245. By this movement, the bonding wire 218 is extended up to the position just above the stud bump 245.

Figure 89D:
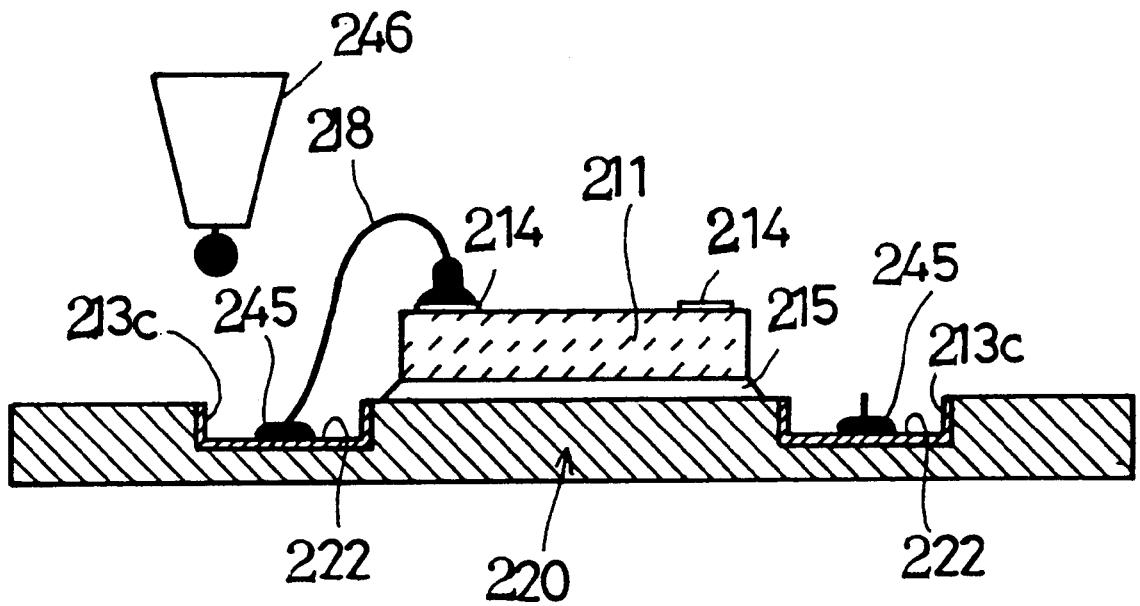
Figure 89E:
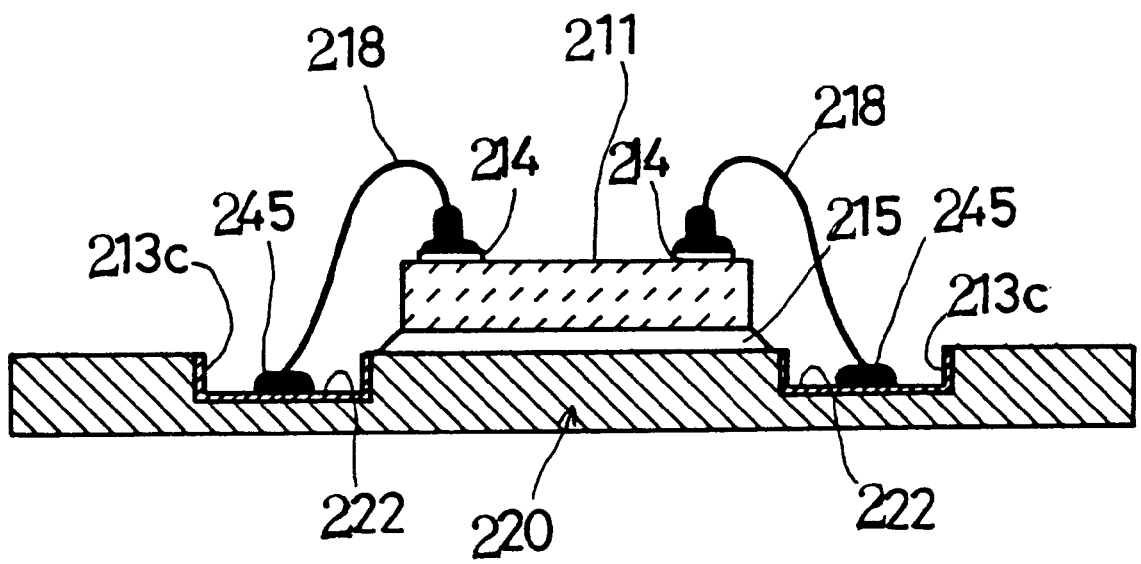

Then, as shown in FIG. 89D, the capillary 246 is pressed by the stud bump 245, so that the bonding wire 218 is bonded to the stud bump 245 (second bonding). The above process is repeatedly carried out in order to electrically connect the electrode pads 214 and the stud bumps 245 (the metallic films 213C) by the bonding wires 218, as shown in FIG. 89E.

The use of the stud bumps 245 improves the reliability of bonding as in the case of the use of the bonding balls 101. That is, the bonding wires 218 can be certainly bonded to the stud bumps 245, so that the electrical connections between the bonding wires 218 and the metallic films 213C can be highly reliable.

The stud bumps 245 can be formed as shown in FIGS. 90A through 90I. In the following description, a gold wire is used as the bonding wire 218. For the sake of simplicity, FIGS. 90A through 90I show the metallic film 213C and its vicinity.

First, as shown in FIG. 90A, the capillary 245 is moved and positioned above the metallic film 213C. Next, a spark is generated by using a spark rod (not show) provided in the wire bonding apparatus, so that a ball (having a diameter of, for example, 90 m) is formed on the end of the wire 218.

Then, as shown in FIG. 90B, the capillary 245 is lowered so that the ball 247 is pressed. In this state, the ball 247 is bonded to the metallic film 213C by, for example, ultrasonic welding. The ball 247 is pressed and much deformed by the capillary 245, so that the ball 247 has a diameter of 10–120 m and a height of 30–40 m.

Subsequent to the above bonding step, as shown in FIG. 90C, the capillary 246 is raised by about 300 m from the ball 247. Then, as shown in FIG. 90D, the capillary 246 is moved laterally by approximately 40–50 m. Hence, the capillary 246 is positioned in an offset position laterally deviating from the center of the ball 247.

Thereafter, as shown in FIG. 90E, the capillary 246 is lowered while the offset position is maintained, and crushes the ball 247. Then, in the state in which the wire 218 is clamped (no feeding of the wire 218 is carried out), as shown in FIG. 90F, the capillary 246 is raised. Hence, the wire 218 is cut and the stud bump 245 is formed.

In the above-mentioned manner of forming the stud bump 245, the capillary 245 crushes the ball 247, so that a tight contact between the stud bump 245 and the metallic film 213C can be made. Further, the ball 247 is made to have a wider area. Hence, as shown in FIGS. 90G through 90I, the wider area of the ball 247 makes it possible to certainly perform the bonding process. The wire 218 and the stud bump 245 are of an identical substance (gold), and an excellent bondability can be obtained. Hence, the reliability of the joint between the wire 218 and the stud bump 245 can be highly improved.

As has been described with reference to FIG. 90F, the wire 218 is cut by the capillary 246 as it ascends after crushing the ball 247. At this time, the capillary 246 is in the offset position. Hence, the bonding is not affected due to the presence of a projection 248 (the remaining wire) extending upwards from the ball 247.

The wire 218 is not limited to gold, and can be formed of a coated gold wire with a gold core wire coated by an insulating member. The use of such a coated wire prevents short-circuiting between the wire 218 and another portion. Hence, it is preferable to use the coated bonding wire if it is required to arrange the wires 218 at a high density.

As has been described previously, the semiconductor device 210 can be produced in the same manner as the semiconductor device 110. However, a die used in the molding step has a shape slightly different of that of the die used in the method of producing the semiconductor device 210. This is because each of the resin projections 217 laterally extends from the package 212 as shown in FIG. 85.

Figure 91:
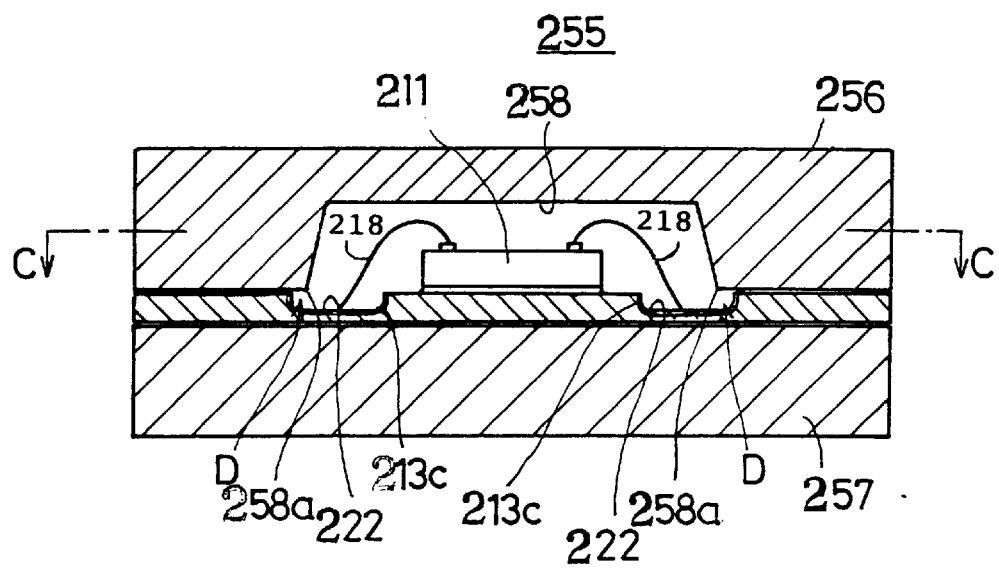
FIG. 91 is a cross-sectional view of a die used in the molding step.

FIG. 91 shows an upper die 256 and a lower die 257, which are used to form the resin package 212 by molding. The upper die 256 has a cavity 258, which has corner portions 258a. The corner portions 258 are located above the recess portions 222, so that the recess portions 222 are partially covered by the upper die 256. Hence, the resin projections 217 respectively having laterally extending portions which should be located at D in FIG. 91 can be formed.

Figure 92:
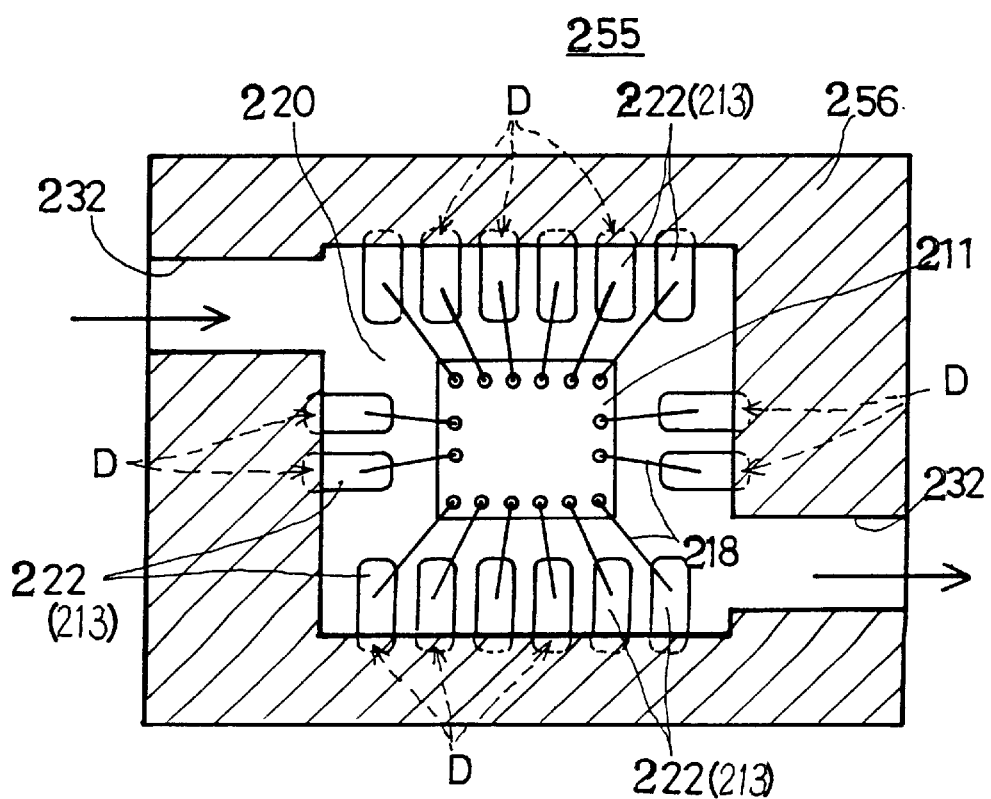
FIG. 92 is a transverse-sectional view of an upper die of the die shown in FIG. 91.
Figure 93:
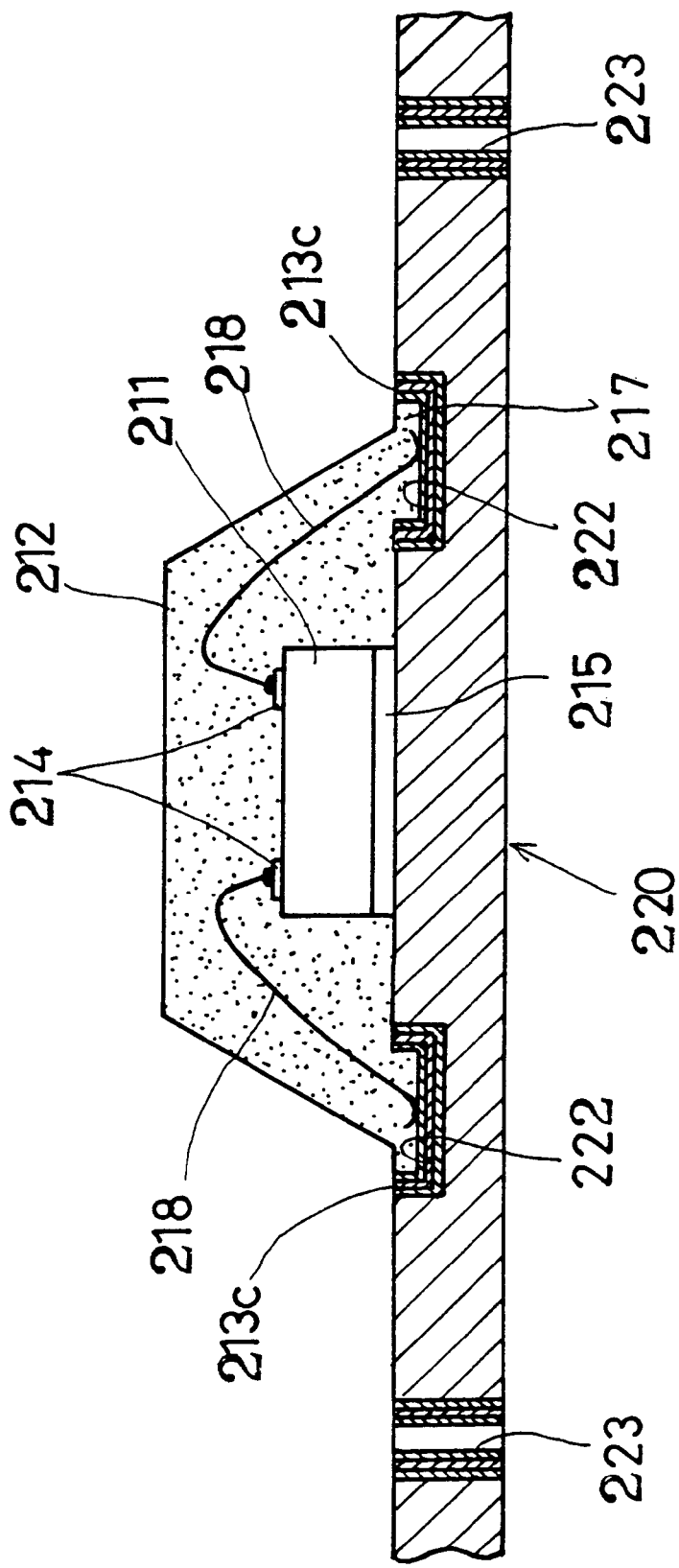
FIG. 93 is a cross-sectional view of the lead frame observed when the sealing step is completed.

As shown in FIG. 92, the upper die 256 has gates 232, and resin is supplied to pass through the gates 232, as indicated by the arrows. Hence, the resin package 212 is formed, as shown in FIG. 93, which corresponds to FIG. 50. It will be noted that a plurality of resin packages 212 are formed on the lead frame 220. A reference number 223 indicates tool engagement portions, which correspond to the tool engagement portions shown in FIG. 50.

Figure 94:
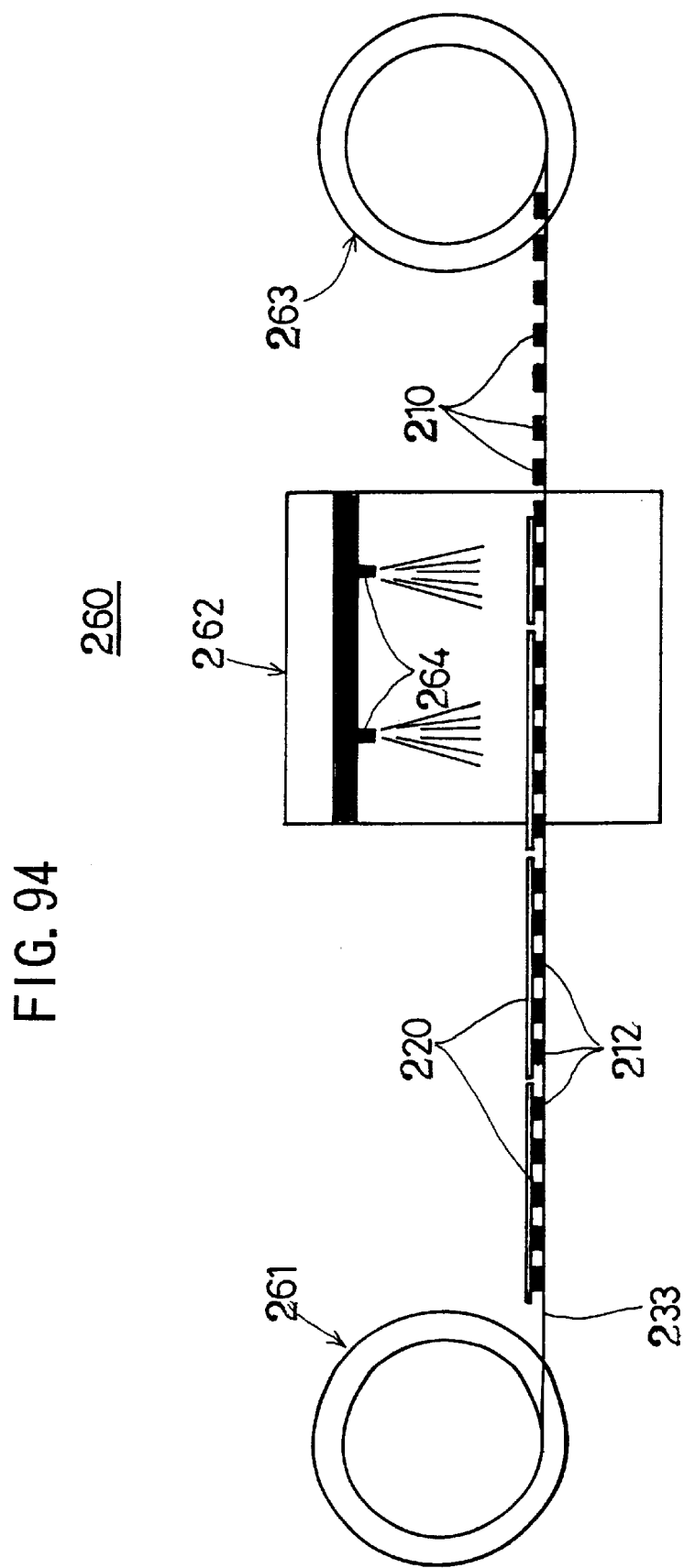
FIG. 94 is a side view showing a variation of the separating step.

An alternative separating step shown in FIG. 94 can be employed instead of the separating step shown in FIG. 53. An etching apparatus 260 shown in FIG. 94 includes a feed reel 261, an etching chamber 262, and a take-up reel 263. A plurality of lead frames 220 to which the resin packages 212 are provided are attached to a tape member 233, which is wound on the feed reel 261. Nozzles 264 for injecting etchant are provided in the etching chamber 262. The tape member 233 is fed from the feed reel 261 and is supplied to the etching chamber 262, in which the lead frame 262 facing the nozzles 264 is etched. By the etching process, the lead frame 220 is dissolved except for the metallic films 231C. Hence, the resin packages 212 are separated from the lead frame 220.

The tape member 233 is formed of a material not affected by the etchant, so that the resin packages 212 are supported by the tape member 233 after the lead frame 220 is dissolved. The tape member 233 by which the packages 212 are supported goes out of the etching chamber 262, and is wound by the take-up reel 263. By using the above etching apparatus, it is possible to automatically separate the packages 212 from the lead frame 220.

The etching apparatus shown in FIG. 94 can be used to produce the semiconductor devices according to the other embodiments of the present invention.

Figure 95:
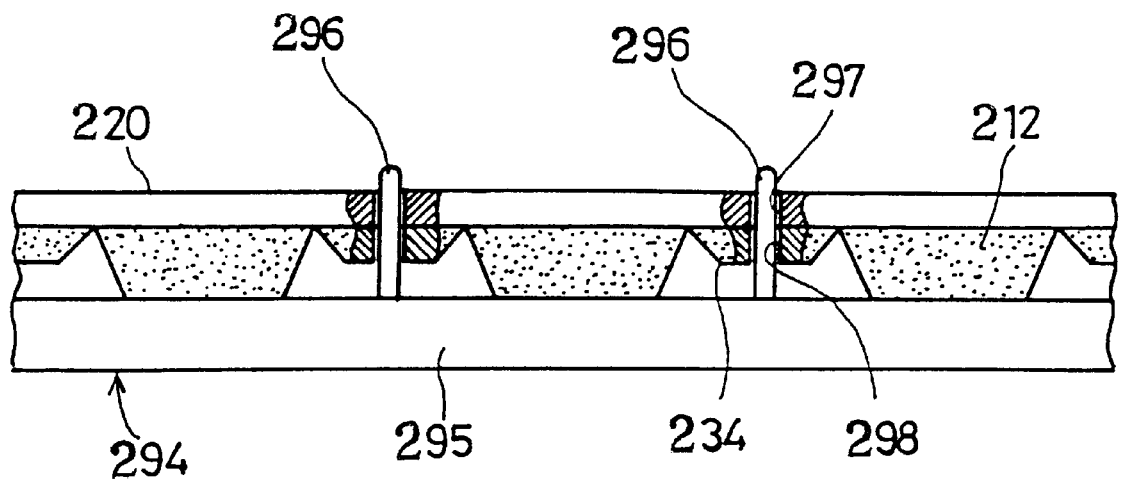
FIG. 95 is a cross-sectional view showing another variation of the separating step.
Figure 96:
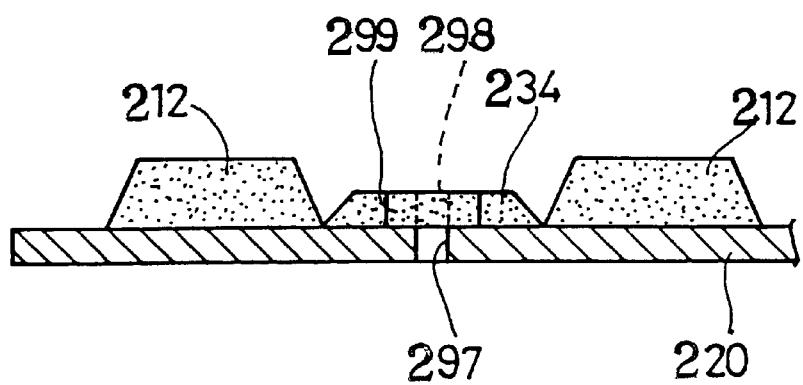
FIG. 96 is a cross-sectional view showing a through hole formed in the lead frame.

It is possible to employ a separating step shown in FIG. 95 instead of the separating step shown in FIG. 53 or 59. The separating step shown in FIG. 95 employs the step of etching the lead frame 220 in such a way that the resin packages 212 are supported by a fixing tool 294. As shown in FIG. 95, the fixing tool 294 is made up of a plate-shaped base 295, and fixing pins 296 which stand upright. The lead frame 220 and the runner frames 234 have through holes 297 and 298 as shown in FIG. 96. More particularly, the through holes 297 are formed in the lead frame 220, and the through holes 298 are formed in the runner frames 234. As shown in FIG. 96, the through holes 297 and 298 are connected so that single holes can be respectively formed. The fixing pins 296 provided to the fixing tool 294 can be inserted into the through holes 297 and 298.

Figure 97:
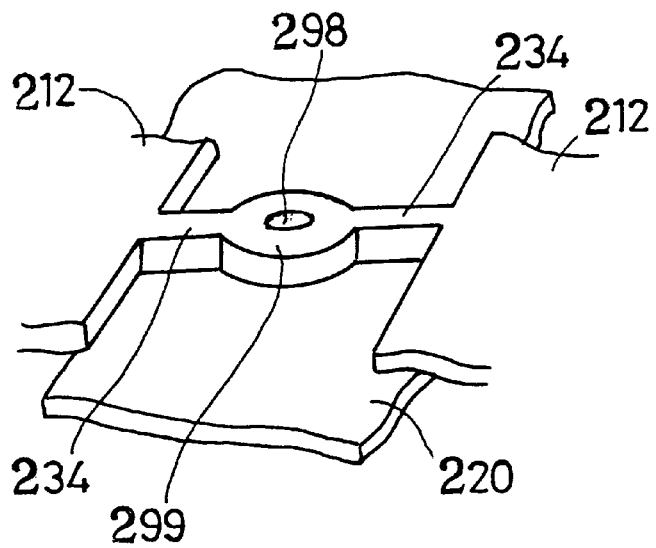
FIG. 97 is an enlarged perspective view of a through hole formed in a runner frame.
Figure 98A:
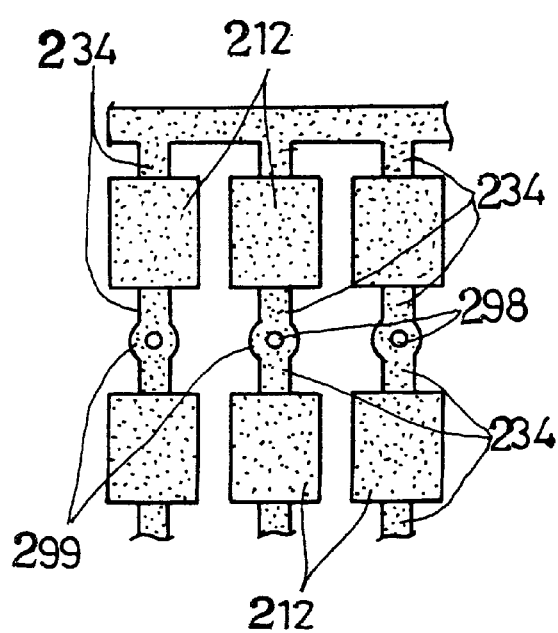
FIGS. 98A and 98B are respectively enlarged plan views of through holes formed in runner frames.
Figure 98B:
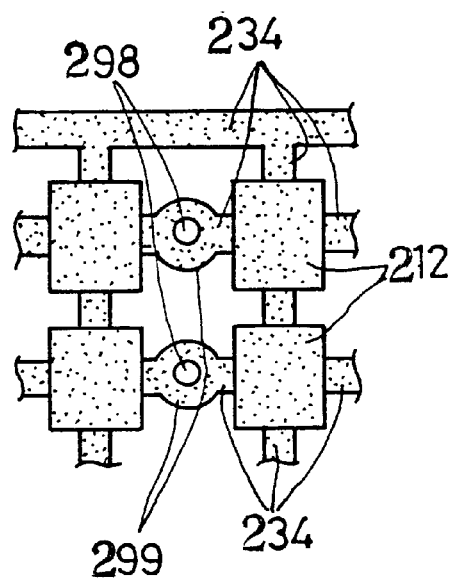

FIG. 97 shows one through hole 298 formed in the runner frame 234. FIGS. 98A and 98B also show through holes 298 formed in the runner frames 234. A ring portion 299 is formed in the runner frame 234, and the through hole 298 is formed in the ring portion 299. Hence, the runner frames 234 having the through holes 298 in the ring portions 299 can have a given mechanical strength. Hence, there is no possibility that the runner frames 234 may be broken in the through holes 298 and the resin packages 212 may be separated during the separating step.

Turning to FIG. 95 again, the fixing pins 296 are inserted into the through holes 297 and 298 so that the resin packages 212 face the base 295. Hence, the relative movement of the lead frame 220 and the fixing tool 294 is prevented. In this state, the resin packages 212, the runner frames 234 and the lead frame 220 are inserted, along with the fixing tool 294, into the etching chamber 262 shown in FIG. 94. The etchant is injected at a high pressure and the lead frame 220 is dissolved. During this process, the highly pressured etchant is applied to the resin packages 212 and the runner frames 234. However, the fixing tool 294 certainly supports the resin packages 212 and the runner frames 234, so that any displacement of these components cannot be caused due to the injection of the etchant. If these components are displaced, it will be necessary to place them back in the original positions. The fixing tool 294 is made of a material not affected by the etchant, and thus can be repeatedly used.

Figure 99A:
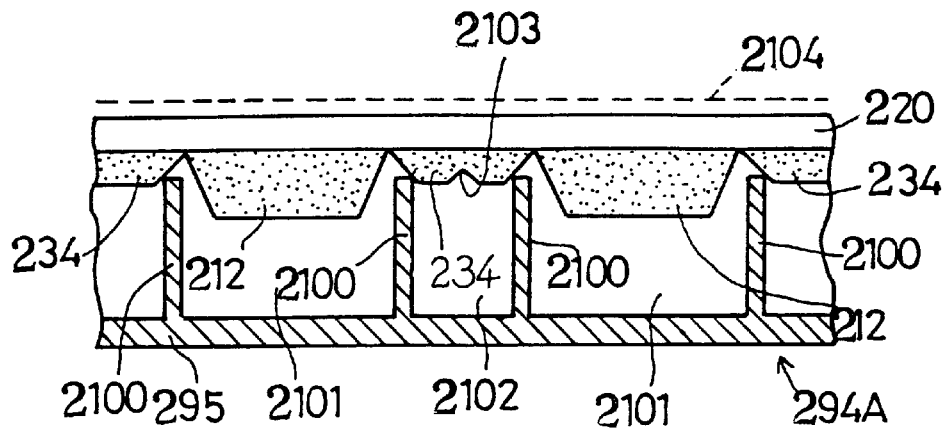
FIGS. 99A, 99B and 99C are respectively cross-sectional views showing still another variation of the separating step.
Figure 99B:
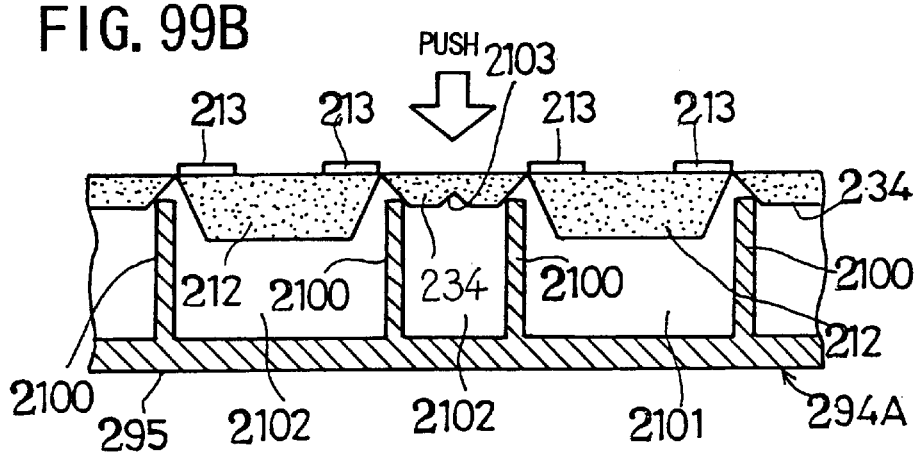
Figure 99C:
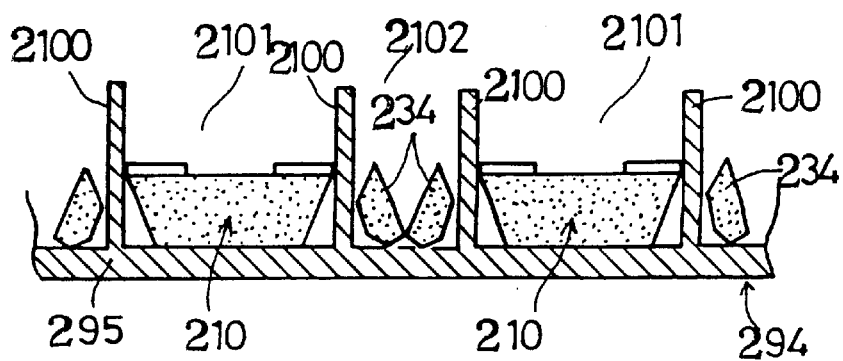

FIGS. 99A, 99B and 99C show another separating step. As has been described previously, the runner frames 234 should be removed before shipping. The separating step shown in FIGS. 99A, 99B and 99C has a particular step of removing the runner frames 234. A fixing tool 294A is used to maintain the resin packages 212 and the runner frames 234 in the stationary step. The fixing tool 294A has wall portions 2100, which stand upright on the base 295. The wall portions 2100 define a plurality of accommodating portions 2101 and 2102. As shown in FIG. 99A, the resin packages 212 face the resin package accommodating portions 2101, and the runner frames 234 face the runner frame accommodating portions 2102.

In the state in which the resin packages 212 (runner frames 234) and the lead frame 220 are supported by the fixing tool 294A, the wall projections 2100 face the portions in which the resin packages 212 and the runner frames 234 are joined together. The above portions are thinner than the other portions, and do not have a mechanical strength as strong as the other thick portions. However, the relatively thin portions have a mechanical strength which is not broken by the injection of the highly pressured etchant.

Figure 100A:
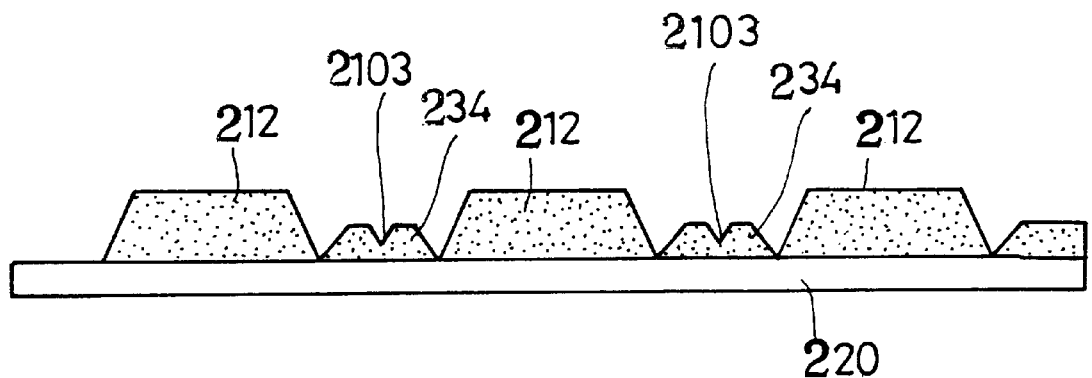
FIG. 100A is a side view showing separation grooves formed in the runner frames.
Figure 100B:
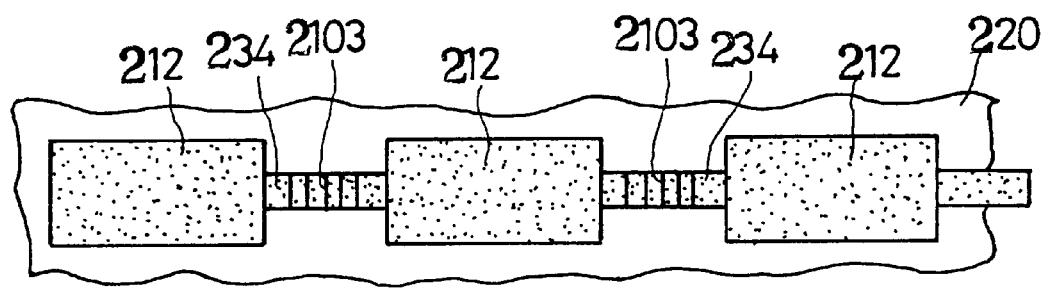
FIG. 100B is a plan view of the separation grooves shown in FIG. 100A.
Figure 101:
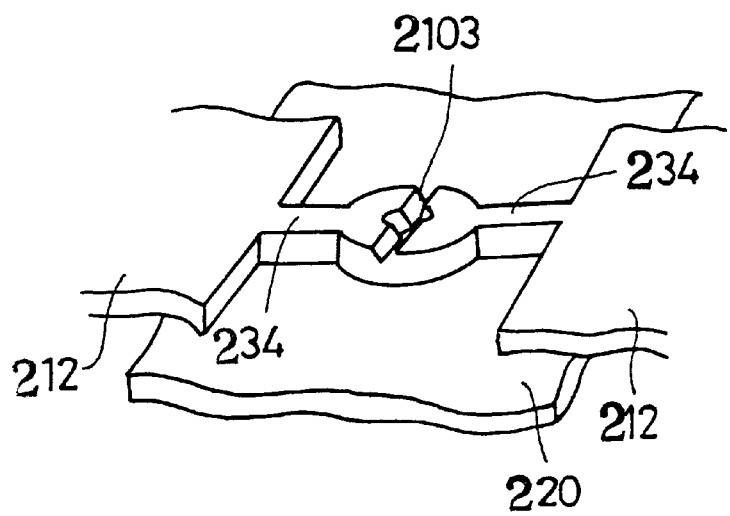
FIG. 101 is an enlarged perspective view of a separation groove formed in the runner frame.

Grooves 2103 are formed on the runner frames 234. As shown in FIGS. 100A, 100B and 101, the groove 2103 extends in the center of the runner frame 234. The portions having the grooves 2103 are mechanically weaker than the other portions, but have a mechanical strength which prevents the runner frames 234 from being broken.

In the above separating step, the fixing tool 294A is positioned as shown in FIG. 99A. Since the resin packages 212 have a height different from that of the runner frames 234, the arrangement of the resin packages 212 and the runner frames 234 form step portions. The wall portions 2100 engage the recess portions of the step portions, so that the resin packages 212 can be prevented from deviating from the original positions.

As shown in FIG. 99A, a mesh member 2104 is provided on the surface of the lead frame 220 opposite to the surface thereof on which the runner frames 234 are formed. The mesh member 2104 allows the etchant to pass therethrough. Hence, the mesh member 2104 does not affect the step of etching the lead frame 220. Further, the mesh member 2104 is urged so as to press the lead frame 220 against the fixing tool 294A. Hence, the resin packages 212, the runner frames 234 and the lead frame 220 can be certainly supported by the fixing tool 294A. Hence, it is possible to prevent occurrence of any positional error of the lead frame 220 in the etching process.

FIG. 99B shows that the lead frame 220 and the mesh member 2104 have been removed by the etching process. In FIG. 99B, the resin packages 212 and the runner frames 234 are joined together. Further, the resin packages 212 face the accommodating portions 2101, and the runner frames 234 face the accommodating portion 2102.

Then the resin packages 212 and the runner frames 234 are pressed so that the wall portions 2100 come into contact with the joint portions between the resin packages 212 and the runner frames 234. The joint portions are thinner than the other portions, and therefore are easily broken as shown in FIG. 99C without any excessive stress to the resin packages 212.

It should be noted that the resin packages 212 (semiconductor devices 210) can be accommodated in the accommodating portions 2101, and the broken runner frames 234 can be accommodated in the accommodating portions 2102. In this manner, the semiconductor devices 210 and the runner frames 234 can be automatically and separately accommodated, and thus the production process can be simplified.

Figure 102A:
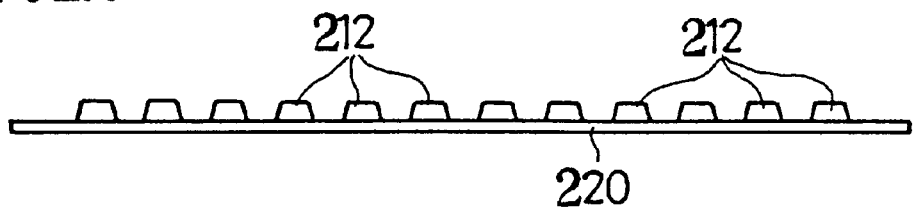
FIGS. 102A, 102B, 102C, 102D and 102E are respectively cross-sectional views showing another separating step.
Figure 102B:
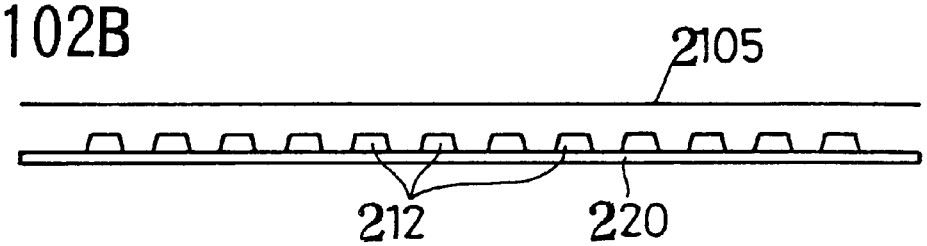

FIGS. 102A through 102E show yet another separating step. FIG. 102A shows that the resin packages 212 are supported by the lead frame 220. The runner frames 234 are not formed. As shown in FIG. 102B, a sheet member 2105 is provided so as to cover the resin packages 212 after the sealing step is carried out and before the lead frame 220 is removed. The sheet member 2105 is not supplied with any adhesive, while the aforementioned tape member 233 is supplied with an adhesive.

Figure 102C:
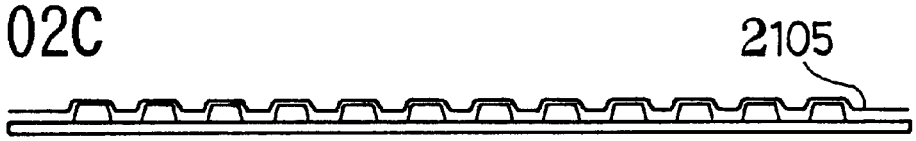

Then, as shown in FIG. 102C, the sheet member 2105 is attached to the resin packages 212 by a vacuum absorbing process (sheet member absorbing step). Hence, the sheet member 2105 is deformed so as to match the shape of the resin packages 212 and is adhered thereto. Thus, the resin packages 212 are supported by the sheet member 2105. It should be noted that an adhesive is not used to support the resin packages 212 by the sheet member 2105.

Figure 102D:
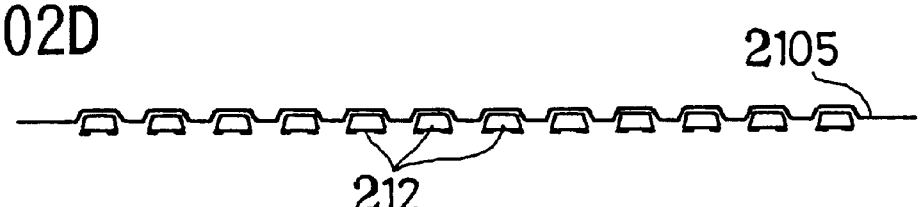

Then, the packages 212 supported by the lead frame 220 and the sheet member 2105 are placed in the etching chamber 262, and the lead frame 220 is etched. FIG. 102D shows a state observed when the etching process is completed. The resin packages 2105 are supported by the sheet member 2105.

Figure 102E:
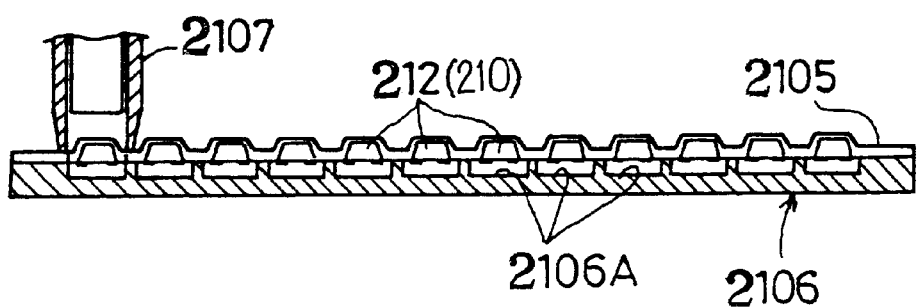

Finally, as shown in FIG. 102E, the resin packages 212 supported by the sheet member 2105 are accommodated in a package accommodating member container 2106, and an accommodating tool 2107 is driven so that the resin packages 212 are depressed one by one. Each of the resin packages 212 is separated from the sheet member 2105, and is then accommodated in the container 2106 (resin package accommodating step).

It should be noted that no adhesive is used to support the resin packages 212 by the resin sheet 2015, and thus the above package accommodating process can easily be carried out.

Figure 103A:
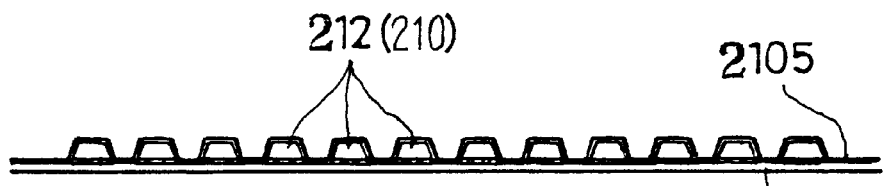
FIGS. 103A and 103B are cross-sectional views showing a packaging step.
Figure 103B:
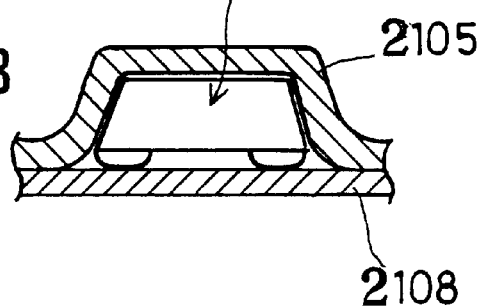

Instead of use of the container 2106, it is possible to perform a packing process as shown in FIGS. 103A and 103B. After the assembly shown in FIG. 102D is obtained, a second sheet member 2108 is provided to the packages 212 so that the packages 212 are packed by the first and second sheet members 2105 and 2108 (packing step). The assembly shown in FIGS. 103A and 103B can be handled by a packed product.

[Fifteenth Embodiment]

Figure 104:
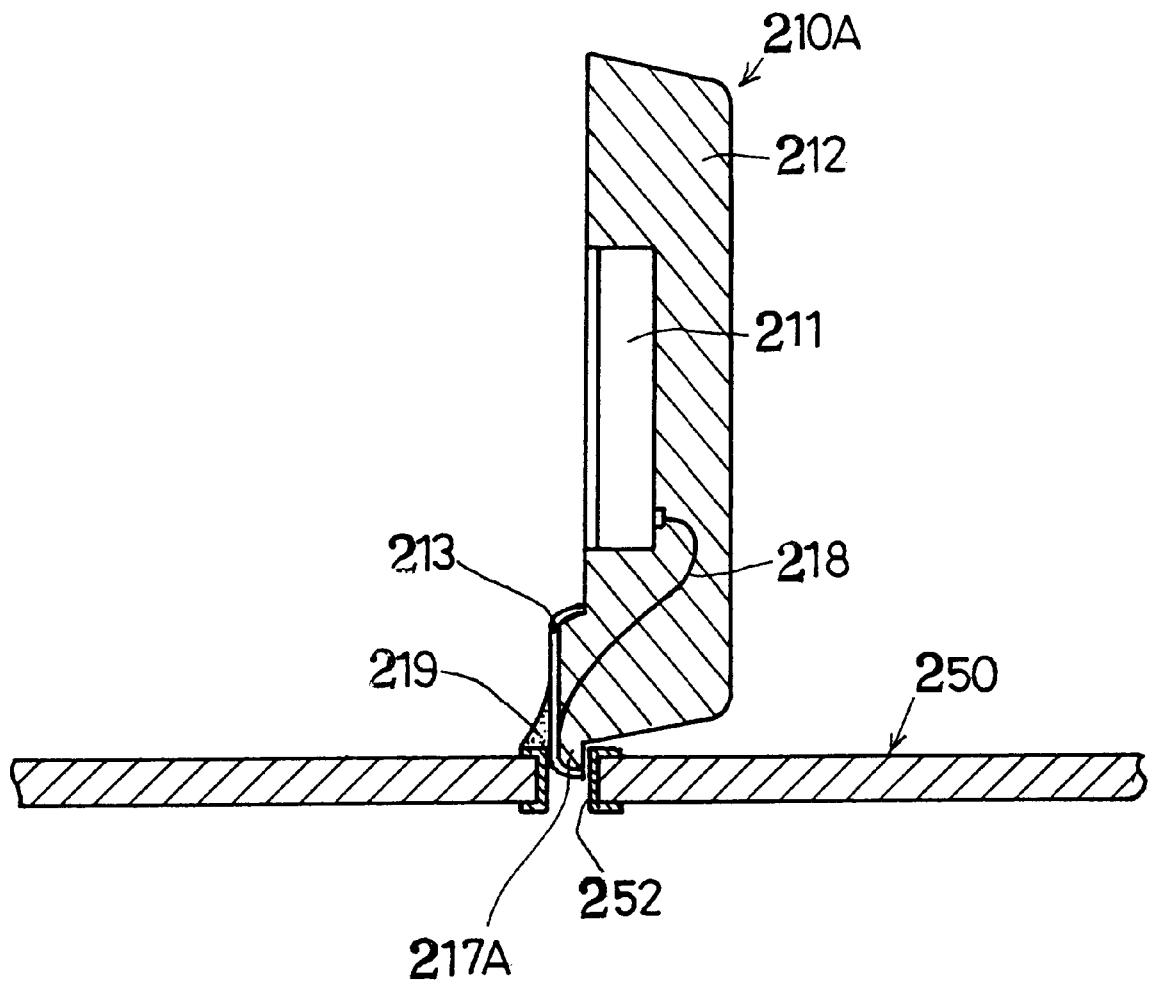
FIG. 104 is a cross-sectional view of a semiconductor device according to a fifteenth embodiment of the present invention.

A description will now be given, with reference to FIG. 104, of a semiconductor device according to a fifteenth embodiment of the present invention. In FIG. 104, parts that are the same as those of the fourteenth embodiment of the present invention are given the same reference numbers.

A semiconductor device 210A shown in FIG. 104 has a feature in which resin projections 217A are provided on one side of the resin package 212. Such an arrangement of the resin projections 217A can be easily defined by appropriately selecting the positions of the recess portions 222 in the lead frame 220.

The semiconductor device 210A can be mounted on the circuit board 250 as follows. As shown in FIG. 104, through holes 252, to which electrical conductors are provided, are formed in the circuit board 250 so that the through holes 252 correspond to the resin projections 217A. The resin projections 217A are inserted into the through holes 252 so that the semiconductor device 210A stands upright. Then, the metallic films 213 respectively formed on the resin projections 217A are soldered to the conductors formed in the through holes 252. The above mounting manner increases the mounting density, since the semiconductor device 210A is vertically mounted. Further, it is easy to check, from the outside of the semiconductor device 210A, the states of soldering in the connections between the metallic films 213 and the conductors in the through holes 252.

[Sixteenth Embodiment]

Figure 105:
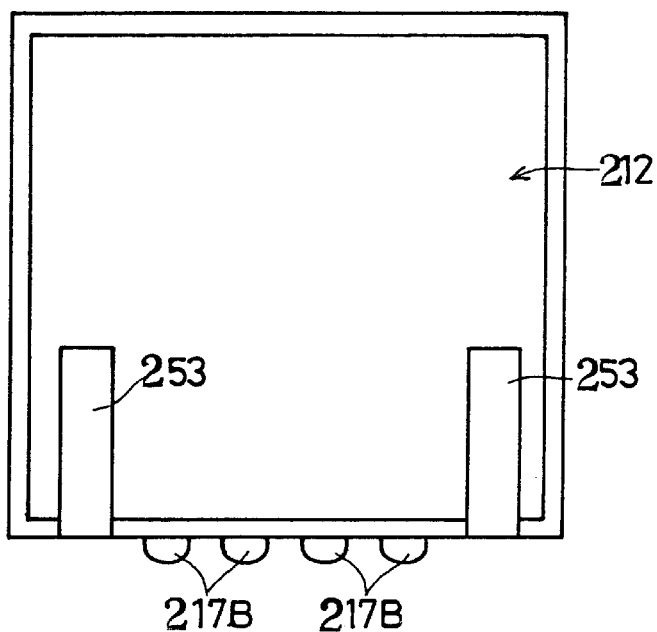
FIG. 105 is a bottom view of a semiconductor device according to a sixteenth embodiment of the present invention.
Figure 106:
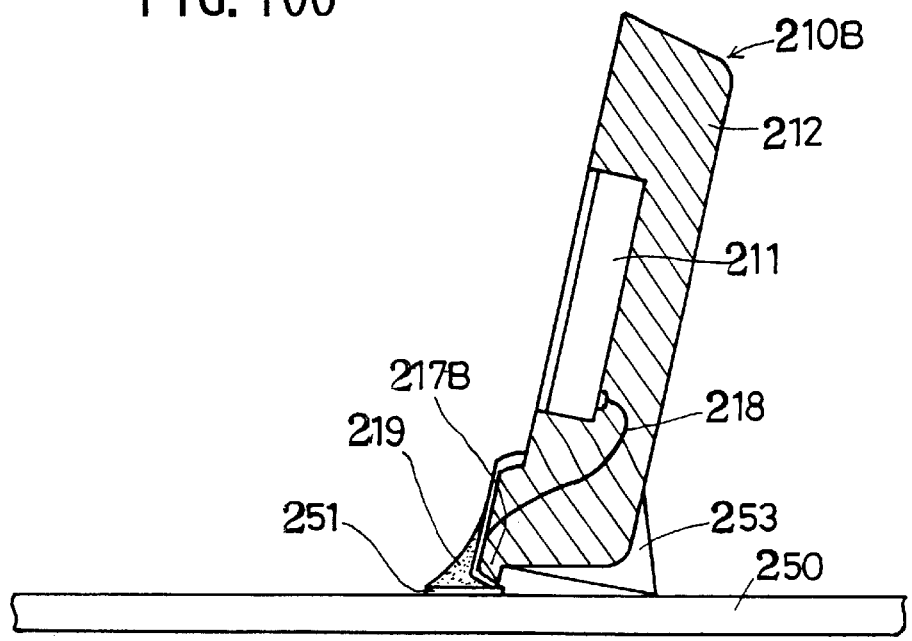
FIG. 106 is a cross-sectional view of the semiconductor device shown in FIG. 105, in which the device is mounted on a circuit board.

FIG. 105 is a plan view of a semiconductor device 210B according to a sixteenth embodiment of the present invention, and FIG. 106 shows the semiconductor device 210B mounted on the circuit board 250. In these figures, parts that are the same as those shown in the previously described figures are given the same reference numbers.

The semiconductor device 210B has a feature in which supporting members 253 are provided on one side of the resin package 212. The supporting member 253 supports the resin package 212 so that the semiconductor device 210 stands upright on the circuit board 250. The semiconductor device 210B has an alignment of resin projections 217B provided on one side of the resin package 212, as in the case of the semiconductor device 210A.

The semiconductor device 210B is mounded so that the resin projections 217B are positioned to the connection electrodes 251 formed on the circuit board 250, and are soldered thereto via the soldering portions 219. The above soldering can be carried out by a solder reflow process, so that the soldering process can be facilitated. The sixteenth embodiment of the present invention has the same advantages as those of the fifteenth embodiment thereof.

[Seventeenth Embodiment]

Figure 107:
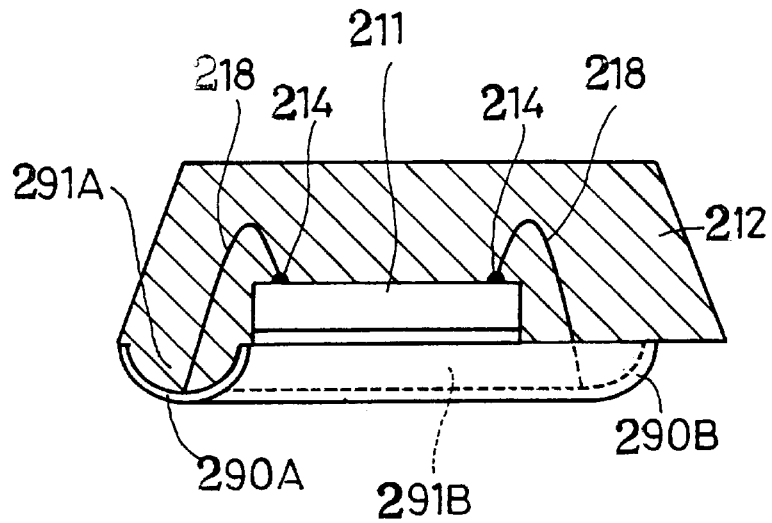
Figure 108:
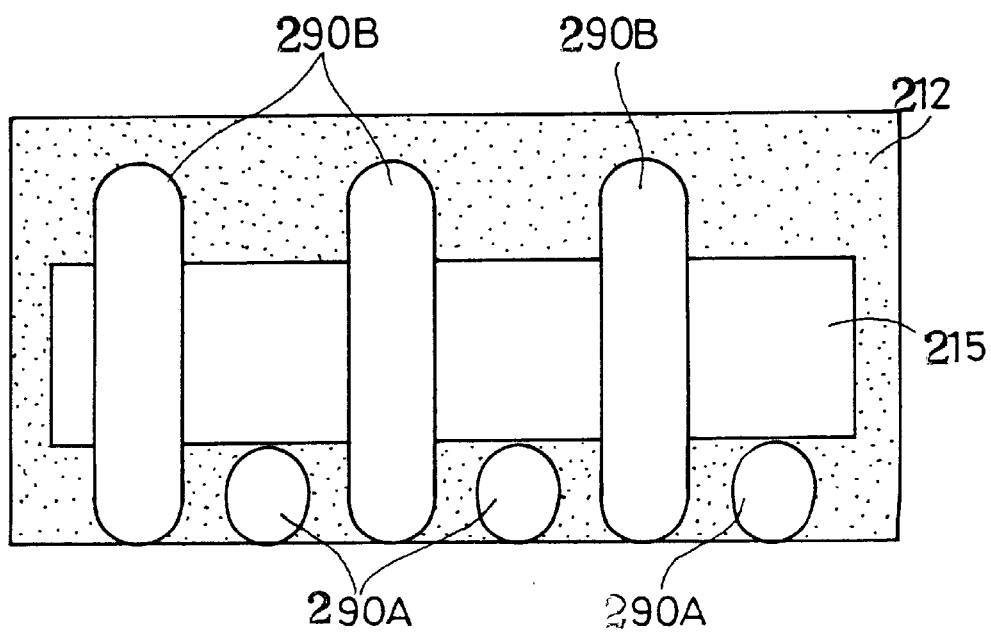
Figure 109:
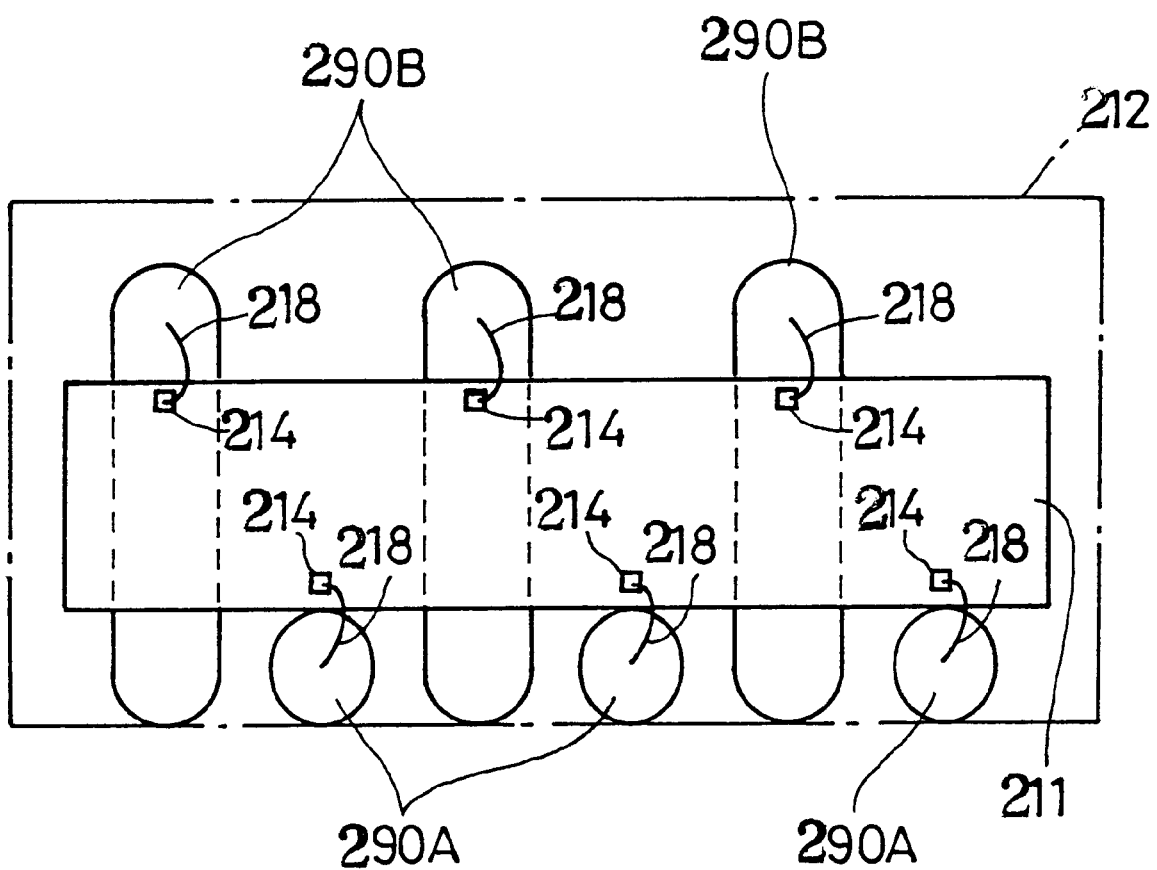

A description will now be given, with reference to FIGS. 107 through 109, of a semiconductor device 210C according to a seventeenth embodiment of the present invention. In these figures, parts that are the same as those shown in the previously described figures are given the same reference numbers.

The semiconductor device 210C has a feature in which there are provided resin projections 291A and 291B having different lengths laterally. More particularly, the first resin projections 291A have a relatively short length, and the second resin projections 291B have a relatively long length. Metallic films 290A are respectively provided to the first resin projections 291A, and metallic films 290B are respectively provided to the second resin projections 291B. The metallic films 290A are relatively short in the lateral direction, and the metallic films 290B are relatively long in the lateral direction. The second projections 291B and the second metallic films 290B extend below the chip 211.

The above arrangement of the resin projections 291A and 291B facilitates the routing of the bonding wires 218 toward the metallic films 290A and 290B. As shown in FIG. 107, the bonding wires 218 extend from the two sides of the chip 211 to the metallic films 290A and 290B. On the other hand, as shown in FIG. 104, the bonding wires 218 can be routed via only one side of the chip 211. Hence, it may be required that the electrode pads 214 formed on the chip 211 shown in FIG. 104 be aligned on one side of the chip 211. In the structure shown in FIGS. 107 through 109, the electrode pads 214 can be arranged on four sides of the chip 211. Even in this case, the routing of the bonding wires 218 to the metallic films 290A and 290B provided on one side of the resin package 212 can be easily selected.

If the device 210C has the same number of electrode pads 214 as that of electrode pads 214 of the device 210A, the electrode pads 214 of the device 210C can be arranged at a pitch greater than that of the electrode pads of the device 210A. In other words, the device 210C can a larger number of electrode pads 214 than the device 210A at an identical pitch. Further, the electrode pads 214 and the metallic films 290A and 290B can be connected by relatively short bonding wires 218. Hence, short-circuiting between the wires 218 and an increase in the impedance of the wires 218 can be prevented.

[Eighteenth Embodiment]

Figure 110:
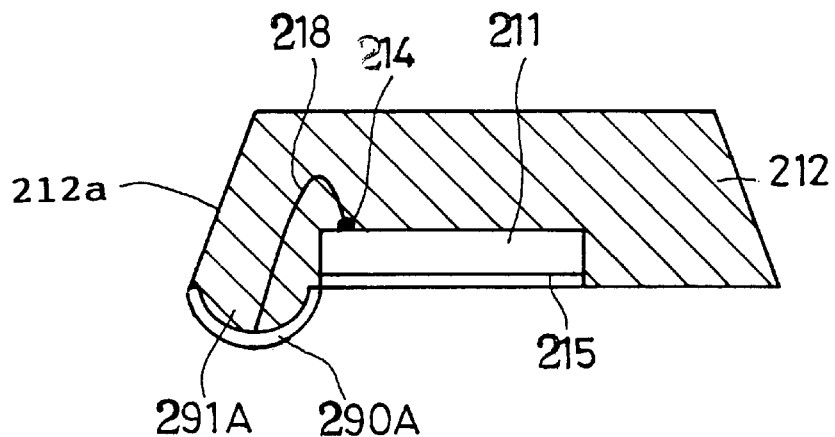
Figure 111:
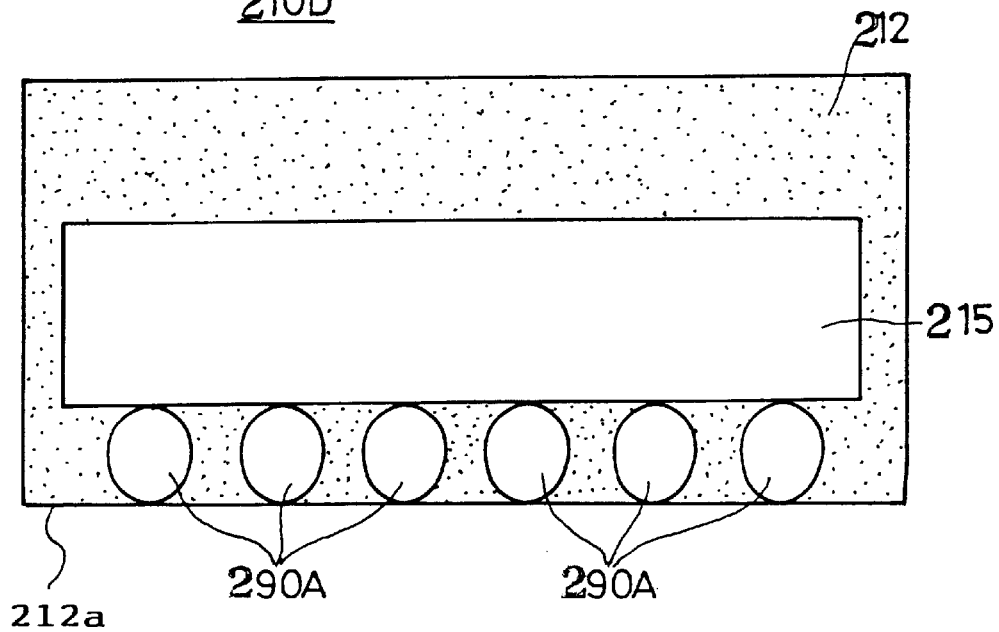

FIG. 110 is a cross-sectional view of a semiconductor device 210D according to an eighteenth embodiment of the present invention, and FIG. 111 is a bottom view of the semiconductor device 210D. In these figures, parts that are the same as those shown in the previously described figures are given the same reference numbers.

The semiconductor device 210D has a feature in which the resin projections 291A are substantially flush with the side surface 212a of the resin package 212. The resin projections 291A are aligned on one side of the resin package 212 and have an identical lateral length. Hence, the metallic films 290A are aligned on one side of the resin package 212.

Even when the resin projections 291A are substantially flush with the side surface 212a, it is possible to visually check, from the side of the resin package 212, the states of soldering between the metallic films 290A and the circuit board.

Figure 112:
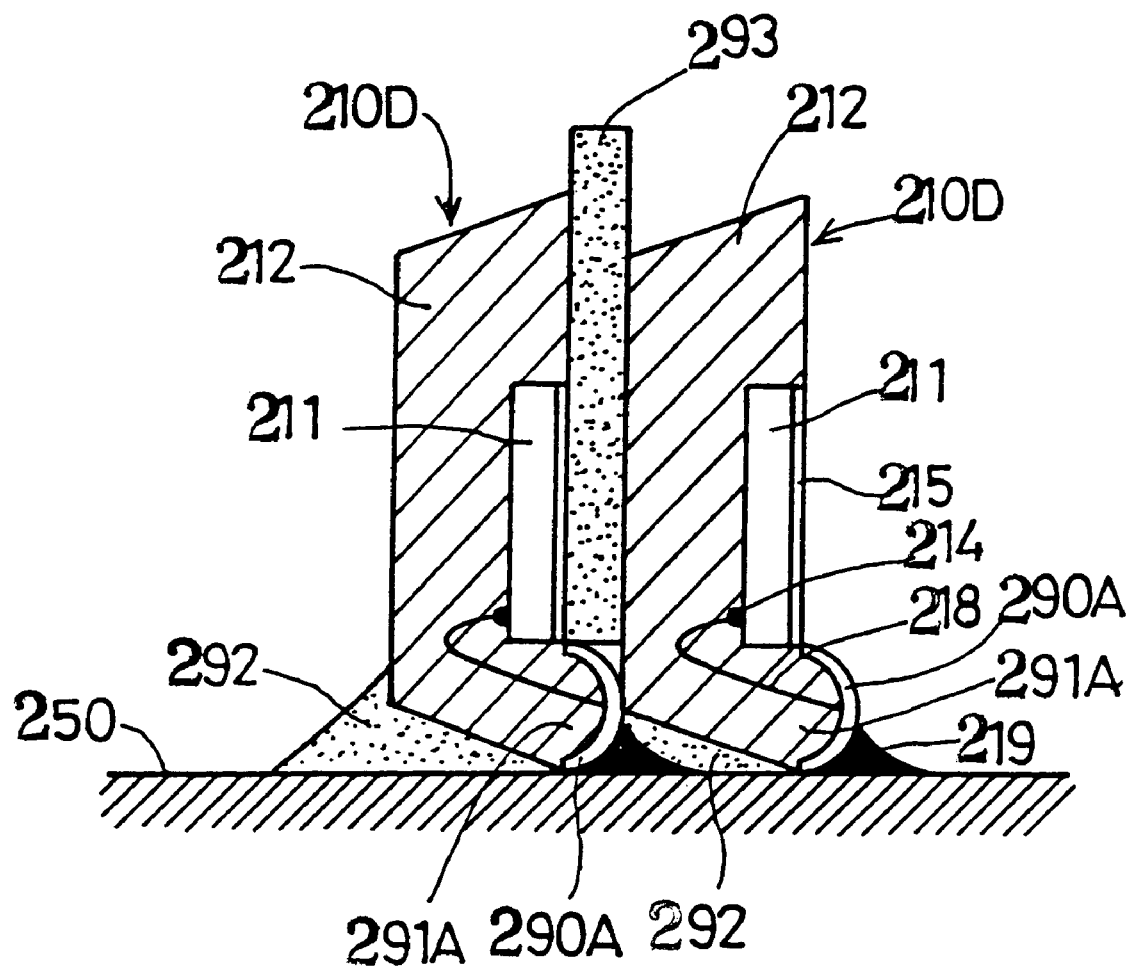

The semiconductor device 210D can be mounted as shown in FIG. 112. A plurality of semiconductor devices 210D are arranged side by side so that the devices 210D stand upright. In this state, the semiconductor devices 210D are soldered to the circuit board 250. Supporting members 292 are respectively provided to the semiconductor devices 210D in order to support the semiconductor devices 210D. The supporting members 292 can be, for example, resin (adhesive), and are different from the supporting member 253 shown in FIGS. 105 and 106. That is, the supporting members 292 are members separated from the resin packages 212, and are not integrally formed therewith. Hence, the positions of the supporting members 292 can be arbitrarily selected at an arbitrary time.

When the semiconductor devices 210D stand upright and are arranged side by side, a space is defined between them. A spacer 293 can be provided between the above space before the semiconductor devices 210D are mounted on and fixed to the circuit board 250. The spacer 293 functions to more certainly make the semiconductor devices 210D stand upright on the circuit board 250 and to improve the reliability of mounting.

Figure 113:
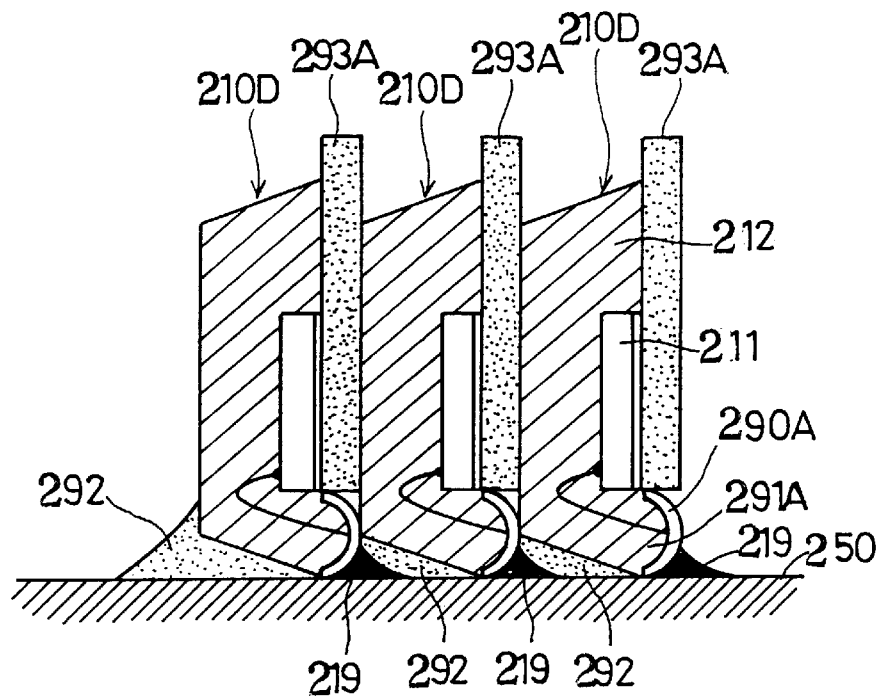

A mounting manner shown in FIG. 113 is characterized in that heat radiating members 293A are used instead of the spacer 293 shown in FIG. 112. The heat radiating members 293A radiate heat generated by the semiconductor devices 210D in addition to the function as spacers. It is preferable that the heat radiating members 293A are made of a material having a good thermal conductivity in order to realize good heat radiating performance. It is possible to efficiently and effectively radiate heat generated by the semiconductor devices 210D which are closely arranged side by side. Hence, the reliability of the operation of the semiconductor devices 210D can be improved.

Figure 114:
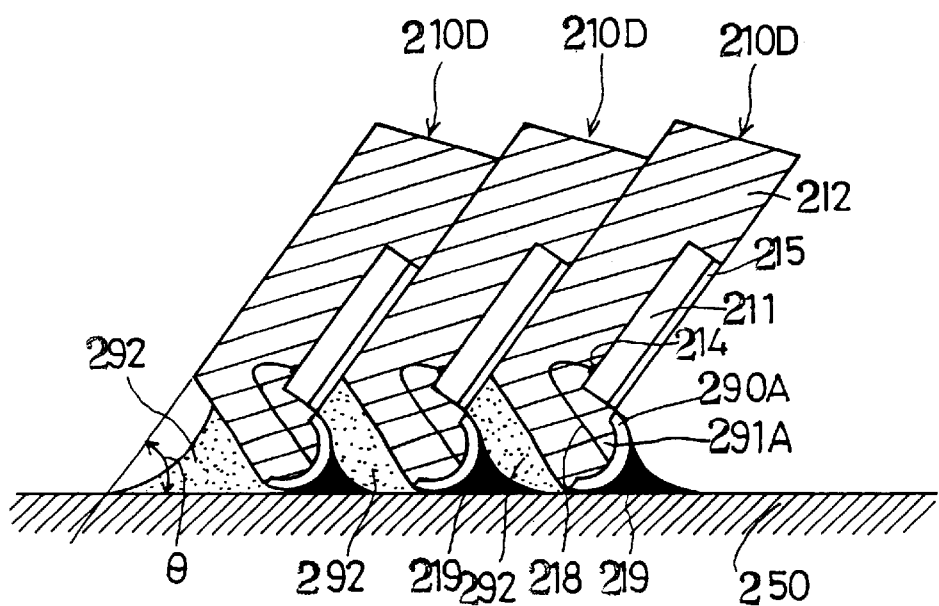

FIG. 114 shows yet another mounting manner. The semiconductor devices 210D contact each other. This is achieved by making the semiconductor devices 210D stand on the circuit board 250 in an inclined state. The semiconductor devices 210D are inclined at an angle with respect to the circuit board 250. The semiconductor devices 210D are supported by the supporting members 292. The mounting manner shown in FIG. 114 needs no spacers and a smaller number of components necessary for mounting the semiconductor devices 210D. However, the heat radiation performance of the mounting method shown in FIG. 114 may not be as good as that of the mounting method shown in FIG. 113.

Figure 115:
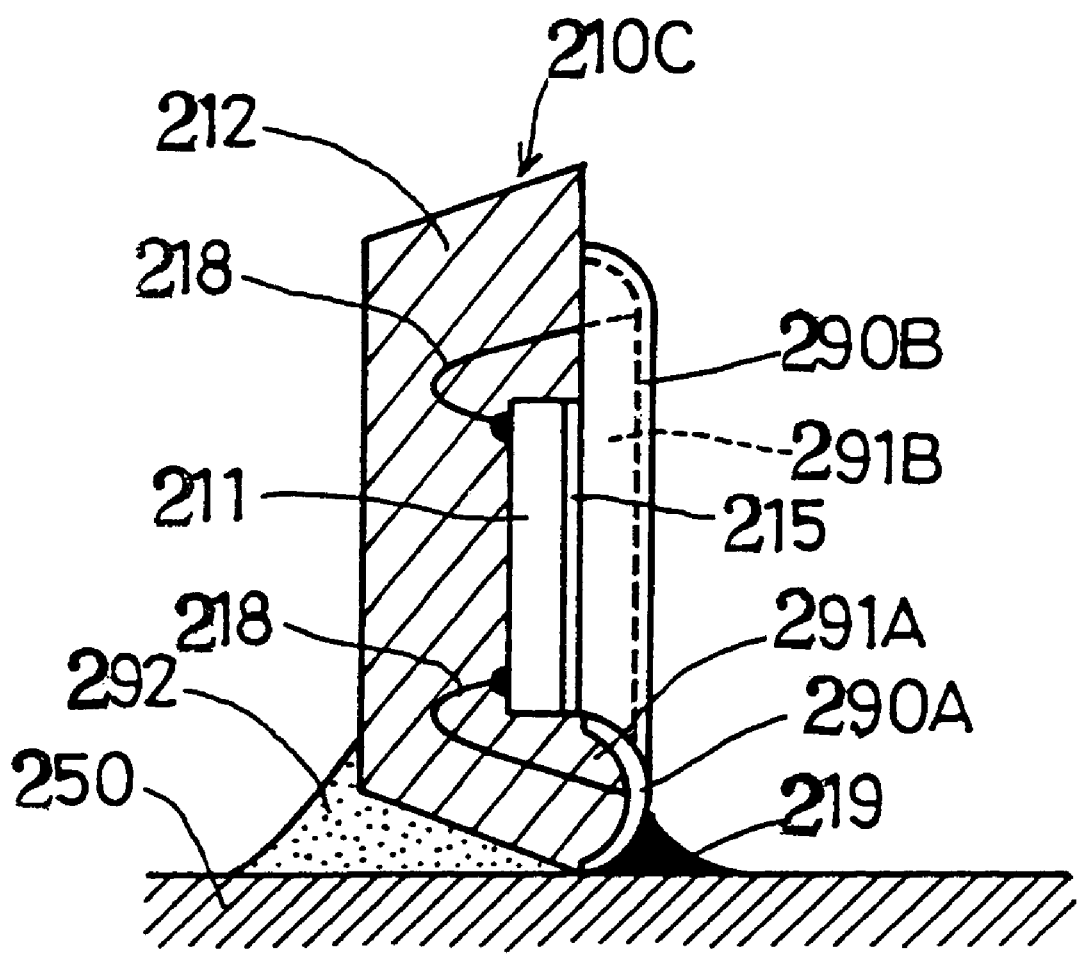

A plurality of semiconductor devices 210C can be arranged side by side so that they stand upright on the circuit board 250, as shown in FIG. 115. In this case, the second resin projections 291B function spacers and heat radiating members. Hence, there is no need to use any spacers and heat radiating members.

[Nineteenth Embodiment]

Figure 116:
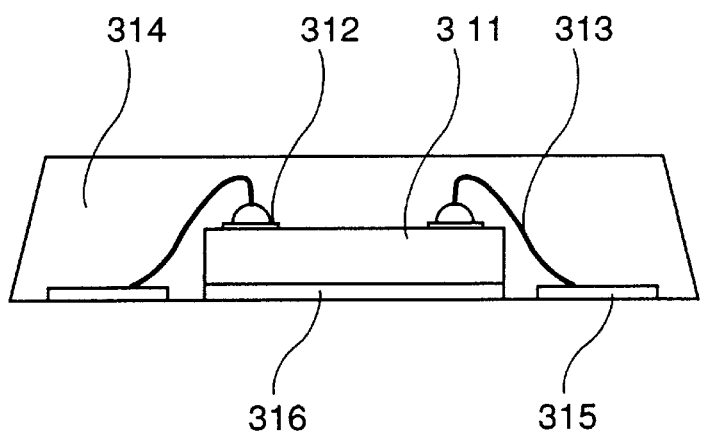
Figure 117:
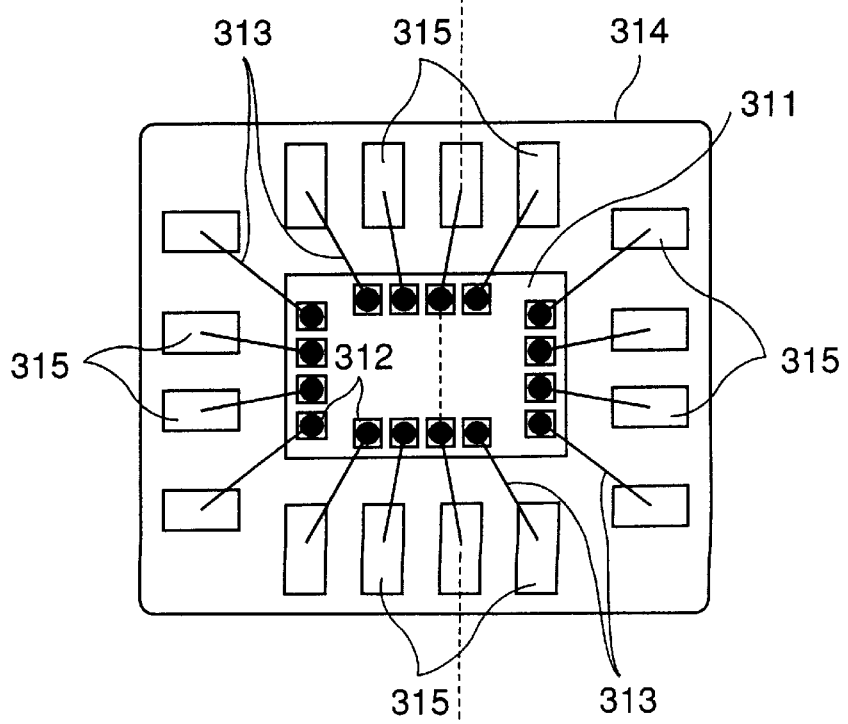

A description will now be given, with reference to FIGS. 116 and 117, of a semiconductor device according to a nineteenth embodiment of the present invention. FIG. 116 is a cross-sectional view of such a semiconductor device taken along a broken line shown in FIG. 117, which is a top view thereof in which the inner parts are seen through a resin package.

A semiconductor device 310 shown in FIG. 116 includes a chip 311, electrode pads 312, bonding wires 313, a resin package 314, and metallic films 315. The chip 311 may be a semiconductor chip, a SAW chip, a multichip module or the like. Ends of the bonding wires 313 are bonded to the electrode pads 312 on the chip 311, and the other ends thereof are bonded to the metallic films 315, which are exposed from the bottom surface of the resin package 314 formed by resin molding. The metallic films 315 substantially flush with the bottom surface of the resin package 315. Each of the metallic films 315 is, for example, 0.4 mm wide, 0.75 mm long, and 10 m high, and are arranged at a pitch equal to, for example, 0.65 mm.

The above structure does not require the inner leads and outer leads necessary for the SSOP, so that there is no need to provide a leading area in which the inner leads are arranged as well as an area occupied by the outer leads. Further, the structure shown in FIG. 3 does not require a mount base necessary for providing solder balls in the BGA type. Hence, the semiconductor device according to the first embodiment of the present invention requires a smaller mounting area and is less expensive.

The metallic films 315 are electrically connected to the chip 311 through the bonding wires 313. The metallic films 315 function as external connection terminals of the semiconductor device 310. When the semiconductor device 310 is mounted on a circuit board (not shown), the metallic films 315 are soldered to electrode portions provided on the circuit board.

The metallic films 315 can have a single-layer structure or a multilayer structure, as in the case of the aforementioned metallic films 113 and 213. It is required that the metallic films 315 satisfy the aforementioned film requirement.

Figure 118:
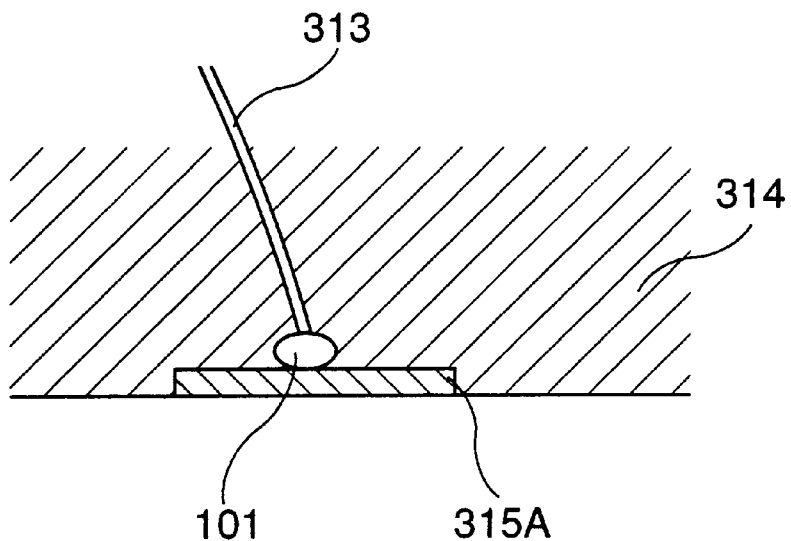

FIG. 118 is an enlarged cross-sectional view of a metallic film 315A having a single-layer structure. The metallic film 315A can be made of, for example, silver (Ag) or palladium (Pd).

FIG. 119 is an enlarged cross-sectional view of a metallic film 315B having a two-layer structure consisting of an outer layer 315B-1 and an inner layer 315B-2. For example, the outer layer 315B-1 is a palladium layer having a thickness of 0.05–2 m, and the inner layer 315B-2 is a gold layer having a thickness of 10–0.5 m. The outer layer 315B-1 may be gold, and the inner layer 315B-2 may be palladium.

FIG. 120 is an enlarged cross-sectional view of a metallic film 315C having a three-layer structure consisting of an outer layer 315C-1, an intermediate layer 315C-2, and an inner layer 315C-3. By way of example, these layers can be configured as follows. The outer layer 315C-1 is a gold layer having a thickness of 10–0.5 m, and the intermediate layer 315C-2 is a nickel layer having a thickness of 0.5–20 m. The inner layer 315C-3 is a gold layer having a thickness of 0.1–0.5 m.

The following other combinations can be employed.

| 315C-1 | 315C-2 | 315C-3 |
|---|---|---|
| Au | Ni | Au |
| Pd | Ni | Pd |
| Au | Pd | Au |
| solder | Ni | Au |
| solder | Ni | Pd |

FIG. 121 is an enlarged cross-sectional view of a metallic film 315D having a four-layer structure consisting of an outer layer 315D-1, a first intermediate layer 315D-2, a second intermediate layer 315D-2, and an inner layer 315D-4. For example, the four-layer structure is as follows. The outer layer 315D-1 is a solder layer having a thickness of 5–20 m, and the first intermediate layer 315D-2 is a nickel layer having a thickness of 1–20 m. The second intermediate layer 315D-3 is a palladium layer having a thickness of 0.05–2 m, and the inner layer 315D-4 is a gold layer having a thickness of 10–0.5 m.

By way of another example, the outer layer 315D-1 is a palladium layer having a thickness of 0.05–2 m, and the first intermediate layer 315D-2 is a nickel layer having a thickness of 1–20 m. The second intermediate layer 315D-3 is a palladium layer having a thickness of 10–0.5 m, and the inner layer 315D-4 is a gold layer having a thickness of 10–0.5 m.

The following other combinations can be employed.

| 315D-1 | 315D-2 | 315D-3 | 315D-4 |
|---|---|---|---|
| Au | Pd | Ni | Pd |
| Pd | Ni | Au | Pd |
| solder | Ni | Au | Pd |

Alternatively, it is possible to form the metallic films 315 having a five-layer structure respectively made of substances described with reference to FIG. 86 or having a six-layer structure respectively made of substances described with reference to FIG. 87.

It is possible to employ the aforementioned bonding balls 101 to which the ends of the bonding wires 313 are bonded.

The above-mentioned semiconductor device 310 can be formed by using a lead frame 320 as shown in FIG. 125. In order to simultaneously produce a plurality of semiconductor devices 310, the lead frame 320 is configured as shown in aforementioned FIG. 42A, or a lead frame unit as shown in FIG. 43 having a plurality of lead frames as shown in FIG. 42 is used.

The lead frame 320 can be configured as follows. As shown in FIG. 122, a resist coating step is carried out so that etching resist films 324 are provided to two opposite surfaces of a metallic member 321 having tool engagement holes 323 (which correspond to the holes 123 shown in FIG. 123 shown in FIG. 42A).

Next, exposing and developing steps are carried out in order to obtain a structure having resist patterns 324a shown In FIG. 123. In the exposing step, a mask having windows corresponding to the positions of the metallic films 315 is provided on one of the etching resist films 324. In the developing step, the exposed portions of the etching resist film 324 are removed. The portions of the etching resist film 324 corresponding to the power supply portions 125 shown in FIG. 42A are also removed by the exposing and developing steps.

Thereafter, a metallic film forming step is carried out so that a structure shown in FIG. 124 is formed. The above step is, for example, a plating process in which plating electrodes are provided to the power supply portions 125 shown in FIG. 42A, and the metallic member 321 is placed in a plating chamber. The structure shown in FIG. 124 is the three-layer structure 315C having the outer layer 315C-1, the intermediate layer 315C-2 and the inner layer 315C-3. In this case, the metallic member 321 is plated with gold to form the inner layer 351C-3. Next, the inner layer 351C-3 is plated with palladium to form the intermediate layer 351C-2. Then, the intermediate layer 351C-2 is plated with gold to form the outer layer 351C-1. The thickness of each of the above three layers can be regulated by controlling the plating time.

In the separating step to be carried out later, it is necessary to separate the metallic films 351C from the lead frame 320 together with the resin package 312. Hence, it is required that the metallic films 351C have a nature which enables the metallic films 351C to be smoothly separated from the metallic member 321. With the above in mind, a material which facilitates the separating process, such as an electrically conductive paste, is provided in the exposed portions of the metallic member 321 before the metallic films 351C are formed therein. Hence, the metallic films 351C are formed on the material.

It should be noted that the metallic films 351C can be formed by thin-film forming processes other than the plating process, such as an evaporating process and a sputtering process.

Then, the resist patterns 324a (the etching resist films 324) are removed by a resist removing step, so that the lead frame 320 shown in FIG. 125 can be formed.

The semiconductor device 310 can be produced by using the lead frame shown in FIG. 125.

As shown in FIG. 126, a chip mounting step is carried out in which a chip fixing resin 316 is provided in a given position on the lead frame 320, and the chip 311 is placed on the chip fixing resin 316. The chip fixing resin 316 functions as an insulation member and an adhesive. Hence, the chip 311 is mounted on the lead frame 320 due to the adhesiveness of the chip fixing resin 316.

Next, the lead frame 320 is loaded to the wire bonding apparatus, and the bonding wires 313 are provided as shown in FIG. 127. More particularly, the bonding wires 313 are bonded to the electrode pads 312 and the metallic films 315. The previously given description of the order of bonding the wires (the first and second bondings) holds true for the bonding of the bonding wires 313. For example, if the ends of the bonding wires 313 are bonded to the metallic films 315C first, and the other ends thereof are bonded to the electrode pads 312 second, the height of the bonded wires 313 shown in FIG. 128 can be lower than that of the bonding wires 313 bonded in the reverse order shown in FIG. 127.

Then, the molding step is carried out in the same manner as that described with reference to FIG. 49. By the molding step, the resin package 314 is provided to each of the chips 311, as shown in FIG. 129. The lead frame 320 observed after the molding step is as shown in aforementioned FIGS. 51A and 51B.

Thereafter, a tape arrangement step is carried out in the same manner as that already described with reference to FIGS. 52A and 52B.

Then, a separating (etching) step which corresponds to the separating step shown in aforementioned FIG. 53 is carried out, as shown in FIG. 130 in which a reference number 333 indicates a tape member which corresponds to the tape member 133 shown in aforementioned FIG. 53.

The semiconductor devices 310 observed after the lead frame 320 are supported by the tape member 333, as shown in aforementioned FIGS. 54A and 54B.

An alternative separating step shown in FIG. 131 can be carried out in the same manner as shown in aforementioned FIG. 59.

In the above-mentioned production process, the semiconductor devices 310 can be produced.

[Twentieth Embodiment]

FIGS. 132A and 132B show a semiconductor device 310B according to a twentieth embodiment of the present invention. In these figures, parts that are the same as those of the semiconductor device 310 are given the same reference numbers. The semiconductor device 310B differs from the semiconductor device 310 as follows. The metallic films 315 are formed on resin projections 318 which are portions of the resin package 314. An insulating film 317 is provided on the bottom surface of the resin package 314. Further, the metallic films 315 have lead portions 3151 extending toward the chip 311. The resin projections 318 can absorb a curvature of the resin package 314 when the semiconductor device 310B is mounted on a circuit board and can prevent occurrence of a solder bridge over adjacent metallic films. The leading portions 3151 extending toward the chip 311 enable a greater pitch at which the metallic films 315 are arranged.

This advantage is effective particularly to an area bump type in which the resin projections 318 are arranged on the entire bottom surface of the package 314. In this case, the area bumps can be arranged at a reduced pitch without bonding wires to recess portions arranged at a small pitch. The insulating film 317 defines an area to be soldered when the semiconductor device 310B is mounted on a circuit board. Further, the insulating film 317 prevents a degradation of the semiconductor device 310B due to oxidation of the leading portions 3151. Furthermore, the insulating film 317 prevents occurrence of the solder bridge.

The semiconductor device 310B can be produced by almost the same process as that of producing the semiconductor device 310. The resin projections 318 can be defined by half-etching the metallic member 321 to which the resist patterns 324a are provided (FIG. 123). By the half-etching, recess portions like the recess portions 122 shown in FIG. 41 can be formed. The metallic films 315 can be provided to the above recess portions as shown in FIG. 44, so that the metallic films 315 can be formed on the resin projections 318. The wire bonding can be carried out, as shown in FIG. 47. The insulating film 317 can be formed by remaining the patterned resist film used to define the leading portions 3151.

[Twenty-first Embodiment]

FIG. 133 shows a semiconductor device 310C according to a twenty-first embodiment of the present invention. In FIG. 133, parts that are the same as those of the semiconductor device 310B shown in FIGS. 132A and 132B are given the same reference numbers. A heat radiating member 340 is provided to the semiconductor device 310B. The heat radiating member 340 is made of a member having a good thermal conductivity. It is preferable that the insulating film 317 shown in FIG. 132A be omitted because the insulating film 317 may prevent heat radiating.

The heat radiating member 340 is adhered to the given portion of the lead frame, and then the chip 311 is fixed to the heat radiating member 340. The use of the heat radiating member 340 makes it possible to mount a chip which consumes a large amount of power.

[Twenty-second Embodiment]

FIG. 134 shows a semiconductor device 310D according to a twenty-second embodiment of the present invention. In FIG. 134, parts that are the same as those of the semiconductor devices 310B and 310C are given the same reference numbers. The semiconductor device 310D employs bumps or bonding balls 341, which are replaced by the leading portions 3151 of the metallic films 315. The bumps 341 are provided in the projections and are connected to the metallic films 315. The structure shown in FIG. 134 will be effective to a case where the resin projections 318 are not arranged at a narrow pitch. The bumps 341 can more certainly connect the bonding wires 313 to the metallic films 315. The heat radiating member 340 can be used in the semiconductor device 310D in the same manner as shown in FIG. 133.

[Twenty-third Embodiment]

FIG. 135 shows a semiconductor device 310E according to a twenty-third embodiment of the present invention. In FIG. 135, parts that are the same as those shown in the previously described figures are given the same reference numbers. The semiconductor device 310E does not use bonding wires which connect the electrode pads 312 and the metallic films 315. Instead of such bonding wires, bumps 342 are used to electrically connect the electrode pads 312 and the metallic films 315. The use of the bumps 342 makes it possible to reduce the height of the semiconductor device 310E and to provide a thinner package. The bumps 342 can be provided by flip-chip bonding, which is faster than wire bonding. Hence, it is possible to reduce the time necessary to connect the electrode pads 312 and the metallic films 315 together.

The semiconductor device 310E can be produced in almost the same manner as that of producing the semiconductor device 310 except for the following. When the chip 311 is mounted on the lead frame 320, the flip-chip bonding is carried out so that the electrode pads 312 are connected to the metallic films 315 via the bumps 342, which can be preformed to either the electrode pads 312 or the metallic films 315.

As shown in FIG. 136A showing a semiconductor device 310F, the bonding wires 313 of the semiconductor device 310B shown in FIG. 132 can be replaced by bumps 342. The flip-chip bonding is carried out for the leading portions 3151 of the metallic films 315. It is possible to increase the pitch at which the metallic films 315 provided on the resin projections 318 are arranged.

FIG. 136B shows a semiconductor device 310G, which is a variation of the structure shown in FIG. 136A. Referring to FIG. 136B, recess portions 343 are formed in the leading portions 3151 of the metallic films 315, and the bumps 342 are provided so as to engage the recess portions 343 by the flip-chip bonding. The use of the recess portions 343 facilitates the positioning of the bumps 342.

In the structures shown in FIGS. 136A and 136B, the insulating films 317 can be omitted.

FIG. 137 shows a semiconductor device 310H, in which the bumps 342 are provided in the resin projections 318. The height of the resin projections 318 is less than that of the bumps 342 in order to directly connect the electrode pads 312 to the bumps 342. The bumps 342 are engaged with the recess portions formed in the lead frame, so that the positioning of the bumps 342 can be facilitated.

FIG. 138 shows a semiconductor device 310I in which the back surface of the chip 311 is exposed from the resin package 314. It is easily possible to radiate heat generated in the chip 311 to the outside of the semiconductor device 310I. The structure shown in FIG. 138 can be applied to the semiconductor devices shown in FIGS. 135, 136A and 136B.

FIG. 139A shows a semiconductor device 310J, in which a heat radiating member 345 is attached to the back surface of the chip 311 by means of an adhesive 344. The heat radiating performance can be facilitated by the heat radiating member 345.

FIG. 139B shows a semiconductor device 310K having the heat radiating member 345, which has a plurality of fins 346. The heat radiating performance can further be facilitated.

FIG. 140 shows a semiconductor device 310L, which has an insulating member 347 which is flush with the bottom surface of the resin package 314. The insulating member 347 can be formed of a tape, an adhesive or the like. The insulating member 347 is provided taking into account a possibility that it may be difficult for the mold resin to enter the gap between the chip 311 and the lead frame 320 in the resin molding step because the above gap is very small. In this case, the sealing may be defective. The insulating member 347 provided beforehand to the element forming surface of the chip 311 prevents occurrence of defective sealing even if the gap is completely full of the mold resin. The insulating member 347 can be provided to either the chip 311 or the lead frame 320 before the flip-chip bonding is carried out.

FIG. 141A shows a semiconductor device 310M in which the bumps 342 and the metallic films 315 are electrically and mechanically joined together by anisotropically electrically conductive resins 348. The bumps 342 are provided to the electrode pads on the chip 311. As shown in FIG. 141C, the bumps 342 can be provided on the metallic films 315. Alternatively, it is possible to provide bumps 342a on the electrode pads, and bumps 342b on the metallic films 315. The resin 348 is provided to cover the bumps 342, 342a and 342b.

When a pressure is applied to the resins 342, fine conductors (conductive particles) contained in the resins 348 are made to be jointed together between the bumps 342 and the metallic films 315, so that the electrical connections can be made.

As shown in FIG. 141B, the bumps 342 are provided on the sides of the metallic frames 315 of the lead frame 320. As shown in FIG. 141C, bumps 342a are provided to the electrode pads on the chip 311, and bumps 342b are provided on the metallic films 315.

The use of the anisotropically electrically conductive resins 342 prevents a short-circuit between adjacent bumps, which may occur when the semiconductor device is mounted on a circuit board.

[Twenty-fourth Embodiment]

Before a twenty-fourth embodiment of the present invention is described, a description will be given, with respect to FIG. 142, of a semiconductor device 1210.

The semiconductor device 1210 includes a semiconductor chip 1211, a resin package 1212, and metallic film parts 1213. Resin projections 1217 integrally formed on a mounting surface 1216 of the resin package 1212, and the metallic film parts 1213 are formed on the resin projections 1217.

The semiconductor device 1210 thus configured does not need the inner leads and outer leads used in the SSOP and does not need the area four routing of the leads from the inner leads to the outer leads as well as the area for the outer leads themselves. Thus, the semiconductor device 1210 can be made compact.

Further, there is no need to use a mounting board on which solder balls as those used in the BGA are formed, and the cost reduction can be achieved. In addition, the resin projections 1217 and the metallic film part portions 1213 cooperate with each other and thus present the same functions as the solder bumps of the BGA type semiconductor devices. Hence, the mounting efficiency can be improved.

The fabrication process of the semiconductor device 1210 has been described. In short, the metallic film 1213 is formed on the recess portions formed on the lead frame. The semiconductor chip 1211 is formed on the lead frame and wires 1218 are provided. Then the resin packages 1212 are formed by the sealing step. Thereafter, only the lead frame is removed by etching by the separating step. Thereafter, the gate portions joining the resin packages 1212 together are removed by the gate breaking step.

An attention is drawn to the fabrication steps following the separating step and the gate breaking step.

First, the separating step will be considered. The etching process carried out in the separating step is a selective etching in which the metallic film 1213 remains while the other portions of the lead frame are dissolved. The etching fluid is supplied in a shower formation, and the resin package 1212 is required to be fixed at the time of etching.

In the gate breaking step, the resin packages 1212 are joined through the gate portions (which are formed together with the resin packages 1212) when the separating step is finished. Thus, the gate portions are required to be removed. The removing process is manually performed.

Hence, it takes a long time to complete the step of removing the gate portions, as compared to the other steps. This degrades the fabrication efficiency. Also, resin scrap produced in the gate breaking step is manually removed and there is thus a need to perform the step of removing resin scrap. This further degrades the fabrication efficiency.

Moreover, there is a possibility that the manual process may make the gate cutting cross sections uneven and part of the gates remain. The above causes the resin packages 1212 to have different shapes. In this case, the semiconductor devices 1210 are determined as having defective external shapes although the other parts are normal. This degrades the throughput.

The twenty-fourth embodiment of the present invention is directed to eliminating the above disadvantages.

FIGS. 143A, 143B and 144 show a method and apparatus for fabricating a semiconductor device and a semiconductor device 410 manufactured thereby. More particularly, FIG. 143A shows a plan view of the semiconductor device 410, and FIG. 143B is a cross-sectional view thereof. FIG. 144 is a bottom view of the semiconductor device 410. The semiconductor device 410 is generally made up of a semiconductor chip 411, a resin package 412 and metallic film parts 413.

A plurality of pads 414 are formed on the upper surface of the semiconductor chip 411, which is mounted on a chip fixing resin 415. The resin package 412 is formed by transfer molding of epoxy resin (may be formed by potting), as will be described later. Resin projections that are integrally formed with the resin package 412 are formed on a mounting surface 416 and are located in predetermined positions. The resin projections 417 protrude downwards from the mounting surface 416 of the resin package 412. The arrangement pitches of the resin projections 417 are equal to, for example, 0.8 mm.

The metallic film parts 413 are provided so as to cover the resin projections 417. Wires 418 are arranged between the metallic films 413 and electrode pads 414, and electrically connect them. The detail of the metallic film parts 413 will be described later for the convenience' sake.

The semiconductor device 410 thus configured does not need inner leads and outer leads used in the conventional SSOP, and does not need an area for routing from the inner leads to the outer leads as well as an area for the outer leads. Thus, the semiconductor device 410 can be made compact.

Further, there is no need to use a mounting board on which solder balls as those used in the BGA are formed, and the cost reduction can be achieved. In addition, the resin projections 417 and the metallic film part portions 413 cooperate with each other and thus present the same functions as the solder bumps of the BGA type semiconductor devices. Hence, the mounting efficiency can be improved.

Now, a description will be given, with reference to FIGS. 145 through 150B, the metallic film parts 413.

The metallic film parts 413 are provided so that they respectively cover the resin projections 417. The bonding wires 418 are provided between the metallic film parts 413 and the electrode pads 414, so that the metallic film parts 413 and the chip 411 are electrically connected together. The metallic film parts 413 function as external connection terminals of the semiconductor device 410, and are soldered to connection electrodes formed on the mounting board when the semiconductor device 410 is mounted to the mounting board.

Each of the metallic film parts 413 can be formed of a single metallic layer or a plurality of metallic layers stacked. FIG. 145 shows a metallic film part, which is formed of a single metallic layer 413A, and FIGS. 146 through 150B respectively show metallic films formed of a plurality of metallic layers 413B–413E arranged in a stacked formation.

A substance or substances of the metallic films should be selected taking into account the following. The inner portions of the metallic film parts 413 are to be bonded to the bonding wires 418, and the outer portions thereof are to be soldered to electrodes on the circuit board. Hence, it is required that the inner portion (the innermost layer) of each metallic film part 413 has a good bondability and the outer portion (the outermost layer) thereof has a good ability of soldering. The above requirement, that is, the film requirement can be satisfied by the following substances.

It is required that a substance of the metallic film part 413A shown in FIG. 145 has both a good bondability and a good ability of soldering. Such a material is, for example, silver (Ag) or palladium (Pd).

The metallic film part 413B shown in FIG. 146 is made up of an outer layer 413B-1 and an inner layer 413B-2. By way of example, the outer layer 413B-1 can be made of palladium (Pd), and the inner layer 413B-2 can be made of gold (Au) so that the film requirement can be satisfied.

The metallic film part 413C shown in FIG. 147 is made up of an outer layer 413C-1, an intermediate layer 413C-2 and an inner layer 413C-3. By way of example, the outer layer 413C-1 can be made up of gold (Au), the intermediate layer 413C-2 can be made up of nickel (Ni), and the inner layer 413C-3 can be made up of gold (Au) so that the film requirement can be satisfied.

Alternatively, the following combinations can be employed.

| 413C-1 | 413C-2 | 413C-3 |
| --- | --- | --- |
| palladium (Pd) | nickel (Ni) | palladium (Pd) |
| gold (Au) | palladium (Pd) | gold (Au) |
| solder | nickel (Ni) | gold (Au) |
| solder | nickel (Ni) | palladium (Pd) |

The above combinations satisfy the film requirement and improve the ability of joining the outer layer 413C-1 and the inner layer 413C-3 due to the intermediate layer 413C-2.

The metallic film part 413D shown in FIG. 38 is made up of an outer layer 413D-1, a first intermediate layer 413D-2, a second intermediate layer 413D-3 and an inner layer 413D-4. These layers can be formed by the following substances.

| 413D-1 | 413D-2 | 413D-3 | 413D-4 |
| --- | --- | --- | --- |
| Pd | Ni | Pd | Au |
| Au | Pd | Ni | Pd |
| Pd | Ni | Au | Pd |
| solder | Ni | Au | Pd |

FIG. 149 shows a metallic film part 413E having a five-layer structure consisting of an outer layer 413E-1, a first intermediate layer 413E-2, a second intermediate layer 413E-3, a third intermediate layer 413E-4, and an inner layer 413E-5. These layers can be made of the following combinations.

| 413E-1 | 413E-2 | 413E-3 | 413E-4 | 413E-5 |
| --- | --- | --- | --- | --- |
| Au | Pd | Ni | Pd | Au |
| solder | Ni | Au | Pd | Au |
| Pd | Ni | Au | Pd | Au |
| Pd | Ni | Cu | Ni | Pd |
| Au | Ni | Cu | Ni | Au |
| Au | Pd | Ni | Au | Pd |

FIG. 150A shows a metallic film part 413F having a six-layer structure consisting of an outer layer 413F-1, a first intermediate layer 413F-2, a second intermediate layer 413F-3, a third intermediate layer 413F-4, a fourth intermediately layer 413F-5, and an inner layer 413F-6. These layers can be made of the following combinations.

| 413F-1 | 413F-2 | 413F-3 | 413F-4 | 413F-5 | 413F-6 |
|--------|--------|--------|--------|--------|--------|
| Au | Pd | Ni | Au | Pd | Au |
| Au | Pd | Ni | Cu | Ni | Pd |
| Pd | Ni | Cu | Ni | Pd | Au |

FIG. 150B shows a metallic film part 413G having a seven-layer structure consisting of an outer layer 413G-1, a first intermediate layer 413G-2, a second intermediate layer 413G-3, a third intermediate layer 413G-4, a fourth intermediate layer 413G-5, a fifth intermediately layer 413G-6, and an inner layer 413G-7. These layers can be made of the following combinations.

| 413G-1 | 413G-2 | 413G-3 | 413G-4 | 413G-5 | 413G-6 | 413-7 |
|--------|--------|--------|--------|--------|--------|-------|
| Au | Pd | Ni | Cu | Ni | Pd | Au |

By using any of the above-mentioned metallic film parts 413, it is possible to meat the film requirement and improve the bondability of the outer, intermediate and inner layers.

A description will now be given of a method of producing the semiconductor device 410 according to the twenty-fourth embodiment of the present invention. In the following description, the metallic film part 413C having the outer layer 413C-1, the intermediate layer 413C-2 and the inner layer 413C-3 is used by way of example.

The semiconductor device 410 is fabricated using a lead frame 420 shown in FIG. 157. The lead frame 420 has an electrically conductive metallic base member 421 on which a plurality of recess portions 422 are formed. The metallic film parts 413C are respectively formed on the recess portions 422. The positions of the recess portions 420 correspond to the positions of the resin projections 417 of the semiconductor device 410. The metallic film parts 413C are shaped so as to fit with the resin projections 417.

As will be described later, the lead frame 420 is formed so that a plurality of semiconductor devices 410 can be formed at a time. Hence, a plurality of recess portions 422 and a plurality of metallic film parts 413C are formed on the metallic base member 421. In the present embodiment, the areas for the respective semiconductor devices 410 are close to each other, and a high integration density is attained. A reference number 423 indicates a positioning hole used to position the lead frame 420 in a later step.

Before describing the method for fabricating the semiconductor device 410, a description will now be given, with reference to FIGS. 151 to 157, of a process for forming the lead frame 420.

First, as shown in FIG. 151, a metallic base member 421 formed in a plate shape and made of an electrically conductive substance (for example, copper) is prepared. Next, etching resist layers 424 are coated on the upper and lower surfaces of the metallic base member 421 (etching resist coating step). The etching resist layers 424 are made of, for example, photosensitive resin, and are formed to a given film thickness by putting dry films on the upper and lower surfaces of the lead frame 420 and coating the photosensitive resin.

Then, the etching resist layers 424 are subjected to an exposure step using a mask, which is not shown. Thereafter, a developing step is carried out. Hence, the portions of the etching resist films 424 corresponding to the positions of the recess portions and the positioning holes 423 for a tool are removed therefrom. As a result, etching resist patterns 424a are formed as shown in FIG. 152 (etching resist pattern forming step).

After the etching resist pattern forming step is finished, an etching process is carried out for the metallic base member 421 on which the etching resist patterns 424a are formed (etching step). In this etching step, half etching is carried out, from the side of the upper surface of the metallic base member 421, in the positions in which the recess portions 422 should be formed. Further, two-side etching is carried out in the positions in which the positioning holes 423 should be formed. When the metallic base member 421 is formed of copper (Cu), the etchant is, for example, ferric oxide.

By the above steps, as shown in FIG. 153, the recess portions 422 are formed in the recess formation positions of the metallic base member 421, and the positioning holes 423 are formed in the positioning hole forming positions. The depth of the recess portions 422 made by the half etching can be 60% of the thickness of the metallic base member 421.

After the above etching step is completed, the step of removing the resist patterns 424a (etching resist removing step) is executed. Thus, as shown in FIG. 154, the bare metallic base member 421 is obtained in which the recess portions 422 and the positioning holes 423 are formed.

Subsequently, plating resist layers 425 are coated on the upper and lower surfaces of the metallic base member 421 in the state shown in FIG. 154 (plating resist coating step). Then, the plating resist layers 425 are subjected to an exposure process using a mask which is not shown, and are then subjected to a developing step. Thus, the portions of the upper etching resist film 425 located in the positions in which the recess portions 422 should be formed are removed. Hence, as shown in FIG. 155, plating resist patterns 425a are formed (plating resist pattern forming step).

As described above, in the plating resist pattern forming step, only the portions of the plating resist pattern 425a in which the recess portions 422 should be formed are exposed, while the other portions of the metallic base member 421 are completely covered by the plating resist patterns 425a.

After the plating resist pattern forming steps are finished, the metallic film parts 413C are formed by a metallic film forming step, as shown in FIG. 156. In the present embodiment, the metallic film parts 413C are formed by plating. The outer layer 413C-1, the intermediate layer 413C-2 and the inner layer 413C-3 are respectively formed by plating.

More particularly, if the outer layer 413C-1, the intermediate layer 413C-2 and the inner layer 413C-3 are respectively formed of Au, Pd and Au, plating of Au for the inner layer 413C-3 is carried out. Then, plating of Pd for the intermediate layer 413C-2 is carried out. Finally, plating of Au for the outer layer 413C-1 is carried out. The thicknesses of the layers 413C-1 through 413C-3 can arbitrarily be selected by controlling the time necessary for plating.

By the above step, the metallic film parts 413C are formed on the metallic base member 421. As will be described later, it is necessary to detach the metallic film parts 413C from the lead frame 420 together with the resin packages 412 when the resin packages 412 are separated from the lead frame 420. Hence, the metallic film parts 413C are required to have a detachability with respect to the metallic base member 421.

Hence, before the metallic film parts 413C are formed on the recess portions 422, it may be possible, in order to ensure the detachability, to coat a substance having the function of enhancing the detachability such as conductive paste and form the metallic film portions 413C on the coated substance. In the aforementioned metallic film forming step, the plating method is used to form the metallic film parts 413C. Alternatively, it is possible to employ other film forming techniques such as an evaporating method and a sputtering method.

In the present embodiment, the recess portions 422 are formed on the metallic base member 421 and the plating resist layers 425 are disposed separate from the etching resist layers 424 by the etching resist coating step, the etching resist patterning step, the etching step and the etching resist removing step.

That is, after the resist removing step is completed, the plating resist coating step is carried out. Hence, the plating resist layers 425 are formed on the opposing surfaces of the metallic base member 421, and only the portions of the plating resist layers 425 in which the recess portions 422 should be formed are removed in the plating resist patterning step, so that the plating resist patterns 425a are formed. In the above process, the etching resist layers 424 and the plating resist layers 425 are separate resist layers, so that the etching resist patterns 424a and the plating resist patterns 245a can have mutually different patterns.

Hence, in the subsequent metallic film forming step, it is possible to define only the portions in which the metallic film parts 413C should be formed irrespective of etching. Particularly, in the present embodiment, the plating resist coating step is carried out so that the positioning holes 423 are covered by the plating resist layers 425. It is thus possible to prevent metallic film parts 413 from being formed in the positioning holes 423 that are required to have a high precision.

The positioning holes 423 are positioned with a high precision at the time of defining them. If the metallic film parts 413 are formed after the positioning holes 423 are formed, the precision of forming the positioning holes 423 will be degraded. From this viewpoint, the positioning holds 423 are covered by the plating resist layers 425 in the plating resist coating step in order to prevent the metallic film parts 413 from being coated. Thus, the following steps can be carried out with a high precision.

After the metallic film parts 413C are formed in the recess portions 422 by the metallic film forming step, the steps of removing the plating resist patterns 425a and smoothing the surfaces of the metallic base member 421. Thus, the lead frame 420 shown in FIG. 157 is formed.

The above method is capable of fabricating the lead frame 20 by the simple steps of coating the resist layers, patterning the resist layers, etching, forming the metallic films and removing the resist layers. In the above-mentioned embodiment, the plating resist layers 425 are provided separate from the etching resist layers 424. Alternatively, if the portions subjected to the etching step are the same as those subjected to the plating step, it will be possible to omit the step of providing the plating resist layers 425 and the associated steps.

A description will now be given of a method for fabricating the semiconductor device 410 using the lead frame 420 produced as described above.

First, as shown in FIG. 158, the chip fixing resin parts 415 are coated on chip mounting positions on the lead frame 420. For the sake of simplicity, only one chip fixing resin part 415 is illustrated. The semiconductor chip 411 is mounted on the chip fixing resin part 415 (chip mounting step). The chip fixing resin part 415 has an insulating property and functions as an adhesive. The chip 411 is fixed to the lead frame 420 by adhesive force of the chip fixing resin part 415.

After the chip mounting step, the lead frame 420 is loaded to a wire bonding apparatus. As shown in FIG. 159, wires 418 are provided between the electrode pads 414 formed on the chip 411 and the metallic film parts 413C (more specifically, the inner layer 413C-3) formed on the lead frame 420, so that the chip 411 can electrically be connected to the metallic film parts 413C (connecting step). The positioning holes 423 do not have the metallic film parts 413C. Hence, using the positioning holes 423, the lead frame 420 can be positioned in the wire bonding apparatus with a high precision.

In the case of FIG. 159, the wires 418 are bonded so that ends of the wires 418 are bonded to the electrode pads 414 first, and the other ends are bonded to the metallic film parts 413C second. Alternatively, it is possible to bond one ends of the wires 418 to the metallic film parts 413C first and bond the other ends to the electrode pads 414 second.

By bonding ends of the wires 418 to the metallic film parts 413C first, it is possible to reduce the top positions of the wires 418 curved in a loop fashion and thus reduce the height of the semiconductor devices 410.

Generally, the arrangement pitch of the electrode pads 414 is less than that of the metallic film parts 413C, and the bonding areas for the first bonding are wider than those for the second bonding. Hence, it is possible to arrange the wires 418 at an increased density by bonding the wires 418 to the metallic film parts 413C first and bonding them to the electrode pads 414 second.

Another wire bonding method may be employed in which stud bumps 445 are formed on the metallic film parts 413C beforehand, and the wires 418 are bonded to the stud bumps 445 in the second bonding. The above alternative bonding method will be described with reference to FIGS. 161A–161E and 162A–162I.

Figure 161A:
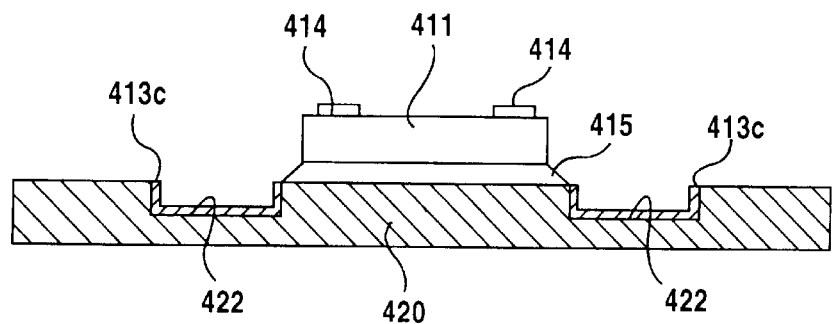
Figure 161B:
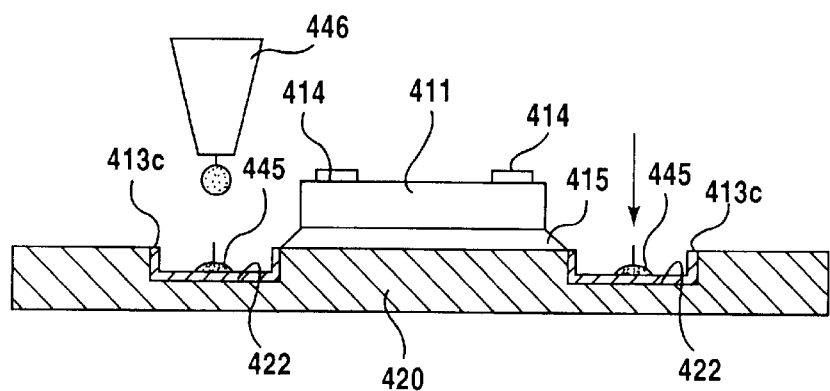

FIG. 161A shows a state observed when the chip mounting step is completed. In this state, the stud bumps 445 are formed, by using a capillary 446, on the metallic film parts 413C formed in the recess parts 422 of the lead frame 420. FIG. 161B shows a state in which the stud bumps 445 are formed on the metallic film parts 413C. The method of forming the stud bumps 445 will be described later with reference to FIGS. 162A–162I.

Figure 161C:
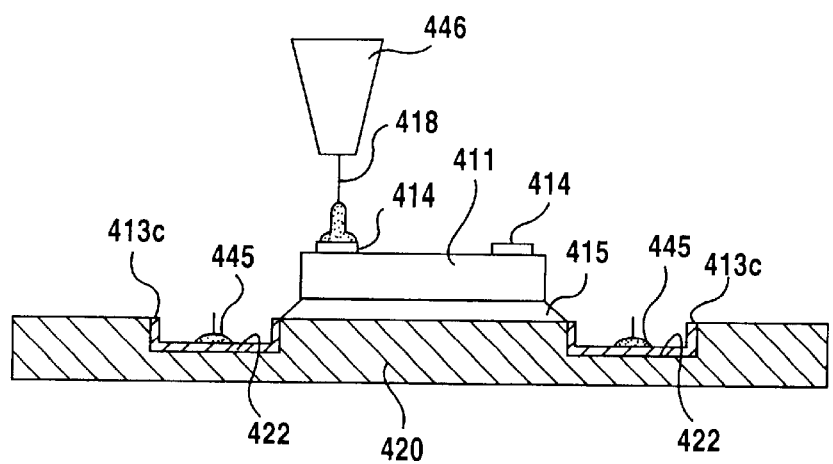

After the stud bumps 445 are formed, the capillary 446 is moved to one of the electrode pads 414 formed on the semiconductor chip 411. As shown in FIG. 161C, the wire 418 is bonded to the electrode pad 414 (first bonding). Then, the capillary 446 is moved to a position above one of the stud bumps 445, and correspondingly the wire 418 is extended to the position above the stud bump 445.

Figure 161D:
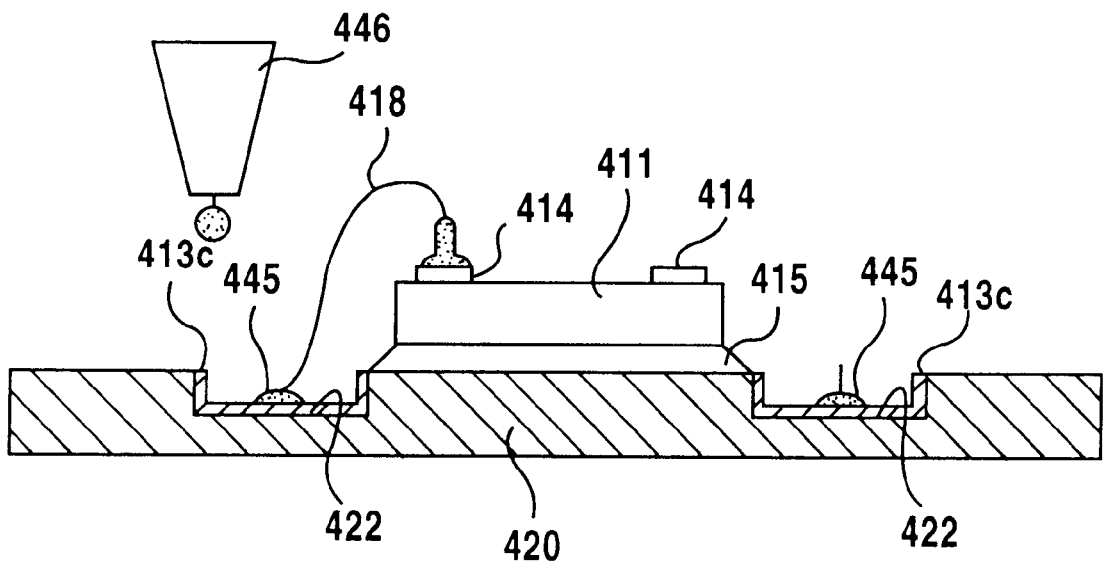
Figure 161E:
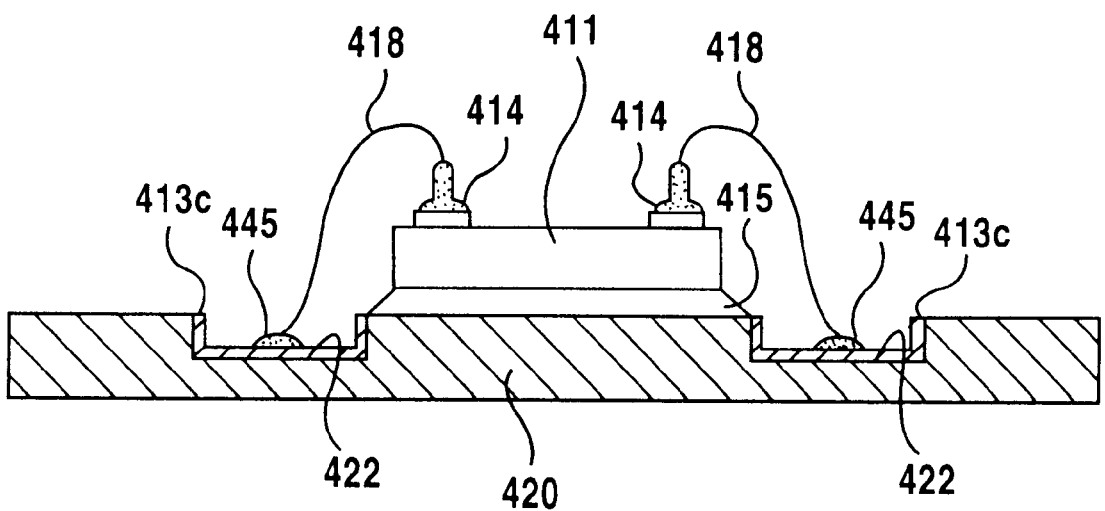

Next, as shown in FIG. 161D, the capillary 446 is pressed against the stud bump 445, and thus the wire 418 and the stud bump 445 are bonded (second bonding). Subsequently, the same process is carried out for the other electrode pad 414. Thus, as shown in FIG. 161E, the wires 418 are arranged between the electrode pads 414 and the metallic film parts 413C.

The above-mentioned wire bonding method employs the stud bumps 445, which make it possible to more definitely bond the wires 418 to the metallic film parts 413C than the bonding in which the wires 418 are directly bonded to the metallic film parts 413C.

That is, the second bonding is performed in the state in which balls are not formed to the wires 418. This differs from the first bonding. Also, in the second bonding, the wires 418 are pressed against the capillary 446 and are welded. Thus, the joined parts have a mechanical strength lower than that of the joined parts obtained in the first bonding.

By providing the stud bumps 445 made of the same material as that of the wires 418 to the metallic film parts 413C, it is possible to definitely connect the wires 418 to the metallic film parts 413C.

Subsequently, a description will now be given, with reference to FIGS. 162A–162I, of a method of forming the stud bumps 445. The following description is directed to a case where the wires 418 are made of gold (Au). For the sake of simplicity, one metallic film part 413 and the vicinity thereof are depicted, and an illustration of the other parts is omitted.

The method of forming the stud bump 445 commences with a process shown in FIG. 162A. The capillary 445 is moved to a position above the metallic film part 413C, and a spark rod (not shown) provided in the wire bonding apparatus is discharged. Thus, a ball 447 (having a diameter of 90 m) is formed to a tip end.

Next, as shown in FIG. 162B, the capillary 445 is moved down and presses the ball 447 against the metallic film part 413C. In this state, the ball 447 is bonded to the metallic film part 413C by ultrasonic welding. The ball 447 is crushed by the capillary 445. Hence, the shape of the ball 447 has a diameter of 10–120 m and a height of 30–40 m when the bonding is completed.

After the bonding step, as shown in FIG. 162C, the capillary 446 is lifted upwards by approximately 300 m from the ball 447. Then, as shown in FIG. 162D, the capillary 446 is moved horizontally by approximately 40–50 m. Hence, the capillary 446 is located in a position that slightly deviates from the center of the ball 447 in the horizontal direction.

Then, as shown in FIG. 162E, the capillary 446 is moved down while the above-mentioned position that slightly deviates from the center of the ball 447 is maintained. Then, the ball 447 is crushed. Thereafter, the wire 428 is maintained in the clamped state (in which the feeding of the wire 418 is inhibited), as shown in FIG. 162F, the capillary 446 is moved up. Hence, the wire 418 is cut, and the stud bump 445 is defined.

According t the above method of forming the stud bump 445, the capillary 445 crushes the ball 447 in the step of FIG. 162E, so that the stud bump 445 and the metallic film part 413C can certainly be joined together. For the same reason as described above, the area of the stud bump 445 can be increased.

Figures 162G, 162H:
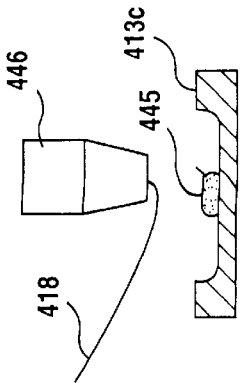

Hence, as shown in FIGS. 162G–162I, the second bonding of the wire 418 can definitely be performed because the wide bonding area of the stud bump 445 is available. Also, the bondability is excellent because the wire 418 and the stud bump 445 are made of an identical material (gold, for example). This increases the bonding force exerted between the wire 418 and the stud bump 445.

As has been described with reference to FIG. 162F, the capillary 446 is moved up and the wire 418 is cut after the ball 447 is crushed. The position to which the capillary 446 is moved up is the position to which the capillary 446 is horizontally moved (the above position deviates from the center of the ball 447). Hence, a projection 448 formed in the wire cutting position does not affect the second bonding in which the wire 418 is bonded to the stud bump 445.

In the above-mentioned connecting step, the wire 418 is made of gold. Alternatively, the wire 418 may be a coated gold wire having a gold wire coated by an insulating material. There is no possibility that the wires 418 contact each other and short-circuit. This is advantageous to a situation that the wires 418 are required to be arranged at a high density.

After the connecting step, a sealing step is carried out in which the semiconductor chips 411 arranged on the lead frame 420 are sealed by the resin packages 412.

In the embodiment of interest, the resin packages 412 are formed by transfer molding. However, the resin packages 412 may be formed by another resin forming method such as potting. In the potting, it is desirable that a frame serving as dam slits 478A and 478B (see FIG. 164) which block a flow of potting resin be formed on the lead frame 420 and resin be potted within the frame.

The transfer molding is capable of forming the resin packages 412 at low cost and with high reliability. The potting leads to simplifying the fabrication facility and reducing the cost.

FIG. 163 shows a state observed immediately after the lead frame 420 after the connecting step is loaded to a mold and resin is molded. Reference numbers 429, 430 and 431 respectively indicate resin, a curl, and a runner. A plurality of resin packages 412 are formed on the lead frame 420. In the state immediately after the molding, the resin packages 412 are joined through resin portions guided in the gates 432 (hereinafter the resin portions guided in the gates 432 and hardened are referred to as gate portions 432).

FIG. 165 shows a mold used in the resin sealing step, and FIG. 164 is an enlarged view of portions indicated by arrows shown in FIG. 165. First of all, the overall structure of the mold will be explained with reference to FIG. 164.

The mold is generally made up of an upper mold 434 and a lower mold 436. The upper mold 434 includes an upper mold pin plate 348 and an upper mold chaise block 442. The upper mold pin plate 438 can move up and down in the figure with respect to the upper mold chaise block 442.

A plurality of ejector pins 443 are provided to the upper mold pin plate 438, and extend downwards so that the ejector pins 443 can movably be inserted into pin holes 468 formed in the upper mold chaise block 442. The upper mold chaise block 442 has a recess portion, which faces the lower mold 436. An upper mold cavity insert 444 fits into the recess portion. Package cavities 456 and anchor cavities 458 are formed in the upper mold cavity insert 444.

The lower mold 436 is made up of a lower mold pin plate 440 and a lower mold chaise block 448. The lower mold pin plate 440 can move up and down in the figure with respect to the lower mold chaise block 448.

A plurality of ejector pins 452 are provided to the lower mold pin plate 440, which extend upwards so that the ejector pins 452 can movably be inserted into pin holes 468 a formed in the lower mold chaise block 448. The lower mold chaise block 448 has a recess portion, which faces the upper mold 434. A lower mold cavity insert 450 fit into the recess portion. The upper surface of the lower mold cavity insert 450 is flat, which is different from the upper mold cavity insert 444.

A plunger 454 is movably inserted into the central portions of the lower mold pin plate 440 and the lower mold chaise block 448. Resin 464 (tablet) used to form the resin packages 412 and the gate portions 432 is provided within the lower mold chaise block 448 and located at the tip end of the plunger 454. Heaters (not shown) are respectively disposed in the upper mold 434 and the lower mold 436, and function to melt the resin 464 in the mold.

The upper mold 434 and the lower mold 436 shown in FIG. 165 can be moved between a state in which the upper mold 434 and the lower mold 436 are separate from each other (separate state) and a clamped state in which the upper mold 434 and the lower mold 436 are clamped (clamped state).

A description will be given of a concrete example of the upper mold 434 (the upper mold cavity insert 444) and the lower mold 436 (the lower mold cavity insert 450) by referring to FIG. 164. For the convenience' sake, FIG. 164 shows that the upper mold 434 and the lower mold 436 are separate from each other after the resin sealing step is completed. Hence, the resin packages 412 and the gate portions 432 are formed on the lead frame 420.

First, the upper mold cavity insert 444 will be described. The mold is used to form the resin package 412 of the semiconductor device 410. The resin package 412 is formed on only one side of the lead frame 420. A package cavity 456 used to form the resin packages 412 is formed in only the upper mold cavity insert 444, while the upper surface of the lower mold cavity insert 450 is flat.

In the upper mold cavity insert 444 shown in FIG. 164, two (or plural) package cavities 456 are formed. In the present embodiment, the anchor cavities 458 are provided between the package cavities 456. The anchor cavities 458 also function as gate cavities used to feed the resin 464 to the package cavities 456. In the anchor cavities 458, the gate portions 432 connecting the resin packages together are formed.

FIG. 164A shows the surface of the upper mold cavity insert 444 on which he package cavities 456 are formed. The package cavities 456 and the anchor cavities 458 are alternately arranged in line. Hence, the package cavities 456 and the anchor cavities 458 are alternately supplied with the resin 429 supplied from the runner 431. The resin 429 may be supplied via runners 482A.

The anchor cavities 458 are used as gates via which the resin 429 is supplied, so that the resin 429 is enabled to efficiently flow at a constant rate. Thus, the cavities are definitely full of the resin 429. This avoids occurrence of voids in the resin packages 412 and the reliability of the semiconductor devices can be improved.

The gate width W1 of the anchor cavities 458 is made approximately equal to the gate width W2 of the package cavities 456. Hence, the resin 429 can smoothly be supplied without increase in the size of the molds.

When an attention is paid to the resin packages 412 and the gate portions 432 formed using the upper mold cavity insert 444, the adjacent resin packages 412 are integrally joined together through the gate portions 432. Hence, the gate portions 432 reinforce the resin packages 412.

The bonding force exerted on the lead frame 420 and the resin packages 412 is increased by the arrangement in which the gate portions 432 integrally formed with the resin packages 412 are joined to the lead frame 420. That is, in the resin-molded state, the contact area between the lead frame 420 and the resin packages 412 as well as the gate portions 432 is increased, which thus increases the bonding force.

Hence, when the resin packages 412 are separated from the upper mold cavity insert 444, the resin packages 412 and the lead frame 420 can be prevented from being detached from each other even if a force that functions to break away the resin packages 412 and the lead frame 420 (hereinafter such a force is referred to as breaking-away force) is exerted on interfaces between the resin packages 412 and the lead frame 420 due to adhesive force of the resin 464. Hence, it is possible to prevent the metallic film parts 413 formed on the lead frame 420 from breaking away from resin projections 417 and thus improve the reliability of the semiconductor devices 410.

As shown in FIGS. 164 and 164A, it is preferable to form anchor openings 476 in the lead frame 420. The anchor openings 476 are formed so as to face the anchor cavities 458 in the state in which the lead frame 420 is loaded to the upper and lower molds 434 and 436. As shown in FIG. 164B, the resin supplied to the molds enters the anchor openings 476. Hence, the gate portions 432 defined by the anchor cavities 458 have projections entering into the anchor openings 476 and encroach upon the lead frame 420. The bonding force between the gate portions 432 and the lead frame 420 can be increased. Thus, the bonding force between the resin packages 412 and the lead frame 420 can also be increased, so that the resin packages 412 can be prevented from being broken away from the lead frame 420.

A description will be given while paying attention to the depths of the package cavities 456 and the anchor cavities 458. In the present embodiment, the gate width W of the anchor cavities 458 is approximately equal to the package width W2 of the package cavities 456. In contrast, the depth of the anchor cavities 458 are made different from that of the package cavities 456.

Hence, the height H1 of the resin packages 412 formed by the package cavities 456 is different from the height H2 of the gate portions 432 formed by the anchor cavities 458. More particularly, in the present embodiment, the height H1 of the resin packages 412 is greater than the height H2 of the gate portions 432 (H1>H2). Hence, the resin packages 412 have a shape different from that of the gate portions 432.

As has been described previously, the gate portions 432 are provided in order to reinforce the resin packages 412 and present the gate function. Thus, the gate portions 432 are finally removed from the resin packages 412. If the resin packages 412 and the gate packages 432 have the same shape as each other, it will be difficult to discriminate the resin packages 412 and the gate packages 432 from each other. Hence, the work of removing the gate portions 432 will be troublesome.

In contrast, according to the present embodiment, the anchor cavities 458 and the package cavities 456 have mutually different shapes in order to form the resin packages 412 and the gate portions 432 having different shapes. Hence, it is easy to discriminate the gate portions 432 over the resin packages 412 and remove the gate portions 432 from the resin packages 412. That is, the work of removing the gate portions 432 can be done efficiently.

A description will now be given by paying attention to the lower mold cavity insert 450. As has been described previously, the resin packages 412 are formed on only one side of the lead frame 420, and thus the upper surface of the lower mold cavity insert 450 is approximately flat. Anchor holes 462 are formed in order to maintain the state in which the lead frame 420 engages the lower mold cavity insert 450 when the upper mold 434 and the lower mold 436 are detached from each other.

The anchor holes 462 accommodate the ejector pins 452 used to detach the lead frame 420, the resin packages 412 and the gate portions 432 from the lower mold cavity insert 450. The ejector pins 452 are connected to the lower mold pin plate 440, and urges the curl 460 joined to the gate portions 432 upwards when moving up. Hence, the lead frame 420, the resin packages 412 and the gate portions 432 are detached from the lower mold cavity insert 450.

In the present embodiment, the ejector pins 452 are arranged in the anchor holes 462. Hence, the anchor hole 462 can be used commonly to the holes for the ejector pins 452, and the structure of the mold can be simplified.

The anchor holes 462 have a slope angle (under cut) in the vicinity of the upper end thereof. When the ejector pins 452 are located at the upper limit position, the ejector pins 452 cannot enter the slope angle portions of the anchor holes 462. In this state, spaces are formed in the slope angle portions. When the resin 464 is supplied, the anchor holes 462 are filled with the resin 464, so that anchor projections 480 are formed.

The anchor projections 480 cause the curl 460 to encroach upon the lower mold cavity insert 450. At the time of the separating step, the resin packages 412 and the gate portions 432 can remain in the lower mold cavity insert 450. For example, the slope angle of the anchor projections 480 is approximately 2 degrees, and the height H3 thereof is approximately 1 mm. Hence, it is possible to prevent the anchor projections 480 from falling out and prevent the interface portions between the curl 460 and the anchor projections 480 from being bent.

As described above, the resin packages 412 and the gate portions 432 are provisionally fixed to the lower mold cavity insert 450. Thus, the resin packages 412 and the gate portions 432 can be prevented from being carried together with the upper mold cavity insert 444 at the time of the separating step. It is also possible to prevent the breaking-away force from being exerted on the interfaces between the resin packages 412 and the lead frame 420.

As have been briefly described, the dam slits 478A and 478B are formed on the lower mold cavity insert 450 and are located in positions that correspond to the positions of the gate portions 432. The dam slits are allowed to have an arbitrary cross-sectional shape. For example, the dam slits 478A have a triangular cross section and the dam slits 478B have a rectangular cross section.

It is preferable that the dam slits are located close to the anchor openings 476. As has been described previously, the resin enters into the anchor openings 476 in order to increase the bonding force between the gate portions 432 and the lead frame 420. In this case, no problem will occur if the lead frame 420 tightly contacts the upper surface of the lower mold cavity insert 450. If a warp occurs in the lead frame 420, gaps will be formed between the lead frame 420 and the lower mold cavity insert 450. When the resin enters in the anchor openings at the time of forming the gate portions 432, the resin will enter into the gaps and form resin flushes on the back surface of the lead frame 420.

As will be described later, the lead frame 420 is removed by etching. The above resin flushes may not be removed completely. The remaining portions of the resin flushes remain in the resin packages 412. This degrades the throughput in the fabrication.

The dam slits 478A and 478B function to prevent the occurrence of such resin flushes. The resin entering into the gaps between the lead frame 420 and the lower mold cavity insert 450 flows out to the dam slits 478A and 478B and is stored. Hence, it is possible to prevent the resin from moving up to the positions in which the resin packages 412 are formed and prevent the throughput from being degraded.

After the resin packages 412 and the gate portions 432 are formed on the lead frame 420 by the above sealing step, the step of separating the resin packages 412 and the gate portions 432 from the lead frame 420.

In the present embodiment, the lead frame 420 is dissolved by etching.

Another etching method can be used. For example, the etchant is injected to the lead frame 420 in a shower fashion. Alternatively, the lead frame 420 is put in the etchant together with the resin packages 412 and the gate portions 432. Although any etching method can be used, the following description is directed to the etching method in which the etchant is injected to the lead frame 420 in a shower fashion.

FIGS. 166A and 166B show an etching apparatus 450 used in the present separating step. More particularly, FIG. 166A is a schematic plan view of the etching apparatus 450, and FIG. 166B shows a side view of the etching apparatus. The etching apparatus 450 is generally made up of a carrier feed part 451, a lead frame stacker 453, an attaching part 455, a frame rotating mechanism 457, an etching part 459 and a carrier withdrawing part 467.

The carrier feed part 451 accommodates a plurality of carriers 460, and supplies the carriers 460 to the attaching part 455. The lead frame stacker 453 accommodates, in a stacked formation, lead frames 420 (see FIG. 169) on which the resin packages 412 and the gate portions 432 have been provided.

The attaching part 455 is supplied with the lead frames 420 from the lead frame stacker 453 and is supplied with the carrier 460, and loads the lead frames 420 to the carrier 460. The present embodiment is characterized in that, at the time of etching the lead frames 420, the transportation and etching process is performed in the state in which the lead frames 420 are carried by the carrier 460.

FIGS. 167 and 168 show the carrier 460 on which the lead frames 420 are attached. As shown in these figures, the carrier 460 includes a metallic frame 461 and an adhesive tape 463. The metallic frame 461 has a rectangular shape, and is formed of titanium or a metal coated with resin. The frame 461 can be formed of resin.

The substance of the metallic frame 461 is required so that the quality thereof is not changed by the etchant. Hence, it is possible to prevent the metallic frame 461 from being etched and use it repeatedly.

The adhesive tape 463 has a resin base film not affected by the etchant like the metallic frame 461. An adhesive substance is coated on the resin base film. In the present embodiment, the adhesive tape 463 is formed of a substance that loses the adhesive performance when it is wetted.

The adhesive tape 463 is fixed to the metallic frame 461 so that only two opposing sides 463a and 463b are fixed thereto and the remaining two sides are separated from the metallic frame 461. Thus gaps 460a are formed inside the carrier 460.

Subsequently, a description will be given, with respect to FIG. 170, of the step of attaching the lead frames 420 to the carrier 460. First, the lead frames 420 are supplied to the attaching part 455 from the lead frame stacker 453, and is then loaded to a positioning stage 470 disposed in the attaching part 455.

The positioning stage 470 has recess portions 470a, which are positioned so as to correspond to the given loading positions of the lead frames 420. Hence, by simply loading the lead frame 420 to the recess portions 470a of the positioning stage 470, the lead frames 420 are positioned in place in the attaching part 455.

After the lead frames 420 are loaded to the positioning stage 470, the carrier 460 is supplied thereto from the carrier feed part 451, and is loaded to recess portions 470b formed in the positioning state 470. Thus, the lead frames 420 and the carrier 460 are positioned by the positioning stage 470. In the present embodiment, the lead frames 420 are located at a lower level than the resin packages 412 and the gate portions 432. The adhesive tape 463 attached to the carrier 460 is located at a higher level than the resin packages 412 and the gate portions 432.

After the lead frames 420 and the carrier 460 are loaded to the positioning stage 470, an attaching tool 469 is moved down and presses the adhesive tape 463 against the lead frames 420. The attaching tool 469 has pressing portions 469a projecting downwards. The positions of the pressing portions 469a correspond to the resin packages 412. As has been described previously, the height H2 of the gate portions 432 is less than the height H1 of the resin packages 412 (see FIG. 164).

In the attaching process by the attaching tool 469, the adhesive tape 463 adheres to only the upper portions of the resin packages 412, while the adhesive tape 463 is spaced apart from the gate portions 432. As shown in FIG. 167, in practice, a large number of lead frames 420 are arrayed on the adhesive tape 463. Thus, the separating step can be carried out for a large number of lead frames 420 simultaneously.

Turning to FIGS. 166A and 166B again, a further description will be given of the etching apparatus. After the lead frames 420 are loaded to the carrier 460, which is rotated by the frame rotating mechanism 457 so that it is turned upside down. Thus, the adhesive tape 463 faces down, while the lead frames 420 face up.

Then, the carrier 460 is placed on the transportation belt 466 and is transported to the etching part 459. The etching part 459 is equipped, in the upper part thereof, with a nozzle 465 which injects the etchant. When the carrier 460 placed on the transportation belt 466 is being moved, the etchant is injected toward the lead frames 420. Hence, the lead frames 420 are dissolved and removed by the etchant.

The metallic film parts 413 formed on the lead frames 420 are made of substances that are immune to the etchant. Thus, the lead frames 420 are removed while the metallic film parts 413 are attached to the resin projections 417 formed to the resin packages 412.

As described previously, the gaps 460a are formed inside the carrier 460. The etchant injected toward the carrier 460 (the lead frames 420) in the etching part 459 are ejected to the lower portion of the carrier 460 via the gaps 460a. Hence, it is possible to the etchant from retaining within the carrier 460 and attain even etching.

After the lead frames 420 are etched, the resin packages 412 and the gate portions 432 are left on the carrier 460. Then, the carrier 460 is transported to the carrier withdraw part 467 and is accommodated therein.

As described above, in the separating step of the present embodiment, the resin packages 412 integral with the lead frames 420 are attached to the adhesive tape 463 arranged on the carrier 460, which is transported in the etching step. Hence, the resin package 412 (the lead frames 4209 can be transported without a complex transporting mechanism. This leads to simplifying the transportation mechanism within the etching apparatus 450.

It is also possible to definitely attach the resin packages 412 (the lead frames 420) to the adhesive tape 463 so that some resin packages can be prevented from dropping. Even if such a dropping occurs, the resin packages dropped can be identified with ease. Additionally, even if the lead frames 420 are insufficiently etched, it is merely required to send the carrier 460 to the etching part 459 again.

Further, as has been described with reference to FIG. 170, the resin packages 412 (the lead frames 420) are positioned with respect to the metallic frame 461 with high precision. Hence, it is easily possible to perform the step of separating the resin packages 412 from the adhesive tape 463 and the step of removing the gate portions 432 after the etching step.

A description will now be given, with reference to FIGS. 171 and 172, of another structure of the attaching part 455.

FIG. 171 shows an attaching part 455A. The aforementioned attaching part 455 shown in FIG. 170 uses the positioning stage 470 on which the lead frames 420 are positioned so that the resin packages 412 face up. The adhesive tape 463 is attached to the resin packages 412.

In contrast, the adhesive part 455A has an arrangement in which the lead frames 420 are attached to the carrier 460 so that the carrier 460 is placed on a flat base stage (not shown) so that the adhesive tape 463 faces up, while the resin packages 412 face down.

The resin packages 412 face down and project from the gate portions 432. Hence by merely pressing the lead frames 420 again the adhesive tape 463, it is possible to adhere only the resin packages 412 to the adhesive tape 463. Hence, the attaching tool 469 is not needed when the attaching part 455A is used.

FIG. 172 shows yet another attaching part 455B. The attaching part 455 uses the attaching tool 469 having the pressing portions 469a corresponding to the positions of the resin packages 412 in order to attach the resin packages to the adhesive tape 463.

In contrast, the attaching part 455B is characterized in that it is equipped with a spot air generating apparatus 471 and nozzles 472 for blowing high-pressure air generated by the spot air generating apparatus 471 are arranged in the positions corresponding to those of the resin packages 412. The spot air is blown to the portions on the adhesive tape 463 that correspond to the resin packages 412, and presses the above portions. Thus, the adhesive tape 463 is attached to the resin packages 412 only.

By the attaching part 455B, the tool 469 does not directly press the adhesive tape 463, but the spot air presses it. Thus, it is possible to prevent the adhesive tape 463 from being cracked. The lifetime of the carrier 460 can be elongated.

After the resin packages 412 and the gate portions 432 are separated from the lead frames 420 by the separating step, the gate break step is performed. FIGS. 173A and 173B show the resin packages 412 and the gate portions 432 immediately after the lead frames 420 are removed. As shown in these figures, the gate portions 432 are integrally joined to the resin packages 412.

In order to obtain the separate semiconductor devices 410, it is necessary to separate the gate portions 432 from the resin packages 412. As shown in FIG. 173B, the gate portions 432 are cut from the resin packages 412 at positions indicated by symbols C, that is, the interface portions between the resin packages 412 and the gate portions 432.

The resin packages 412 to which the gate portions 432 are joined are transported to the gate break apparatus, in which the gate portions 432 are separated from the resin packages 412 at the positions C shown in FIG. 173B. By the above gate breaking step, the separate semiconductor devices 410 can be obtained.

FIGS. 174 through 180 show gate break apparatuses 480A through 480E.

The gate break process attaches a protection tape 473 to the resin packages 412 attached to the adhesive tape 463. The protection tape 473 is formed of the same material as the base member of the adhesive tape 463.

The adhesive tape 463 is attached to the surfaces of the resin packages 412, and thus the protection tape 473 is attached to the other surfaces thereof on which the metallic film parts 413 are provided. Hence, the resin packages 412 are protected by the protection tape 473. If external force is applied to the resin packages 412, the metallic film parts 413 having a comparatively weak strength can certainly be protected.

The protection tape 473 cooperates with the adhesive tape 463 so that the resin packages 412 and the gate portions 432 are sandwiched between these tapes. When the resin packages 412 are separated from the gate portions 432, the resin packages 412 and the gate portions do not drop in random fashion.

The gate break apparatus 480A will first be described with reference to FIGS. 174 through 176. The gate break apparatus 480A uses rubber rollers 474A–474C (bending tools), which function to separate the resin packages 412 from the gate portions 432. The tapes 463 and 473 to which the gate portions 432 and the resin packages 412 travel from the left side in the figures to the right side thereof (directions indicated by arrow). The rubber rollers 474A through 474C are provided in the halfway of the transportation path and perform the separating process.

The rubber roller 474A (hereinafter referred to as an upper rubber roller 474A) has a comparatively large size, while the rubber rollers 474B and 474C (hereinafter referred to as lower rubber rollers 474B and 474C) have sizes smaller than that of the rubber roller 474A. The upper rubber roller 474A is disposed above the transportation path of the tapes 463 and 473, and the lower rubber rollers 474B and 474C are disposed below the transportation path. The lower rubber rollers 474B and 474C are located so as to sandwich the upper rubber roller 474A along the transportation path.

The upper rubber roller 474A presses the tapes 463 and 473 downward and the lower rubber rollers 474B and 474C presses them upward. Hence, the rubber rollers 474A–474C defines an approximately V-shaped transportation path of the tapes 463 and 473 (see FIGS. 174 and 175).

The upper rubber roller 474A pushes the resin packages 412 or the gate portions 432 downward, while the lower rubber rollers 474B and 474C push the resin packages 412 or the gate portions 432. Thus, as indicated by the arrows shown in FIG. 173B, bending force concentrates on the interface portions between the resin packages 412 and the gate portions 432. The above interface portions are comparatively thin and have a weak mechanical strength. Thus, the interface portions are divided so that the resin packages 412 and the gate portions 432 can be separated.

It is to be noted that even the simple arrangement using only three rubber rollers 474A–474C can definitely separate the resin packages 412 and the gate portions 432 from each other.

Further, the rubber rollers 474A–474C are arranged so that the gate portions 432 are bent toward the surfaces of the resin packages 412. In addition, slits 432*a* are formed on the surface and are located at the interface portions between the resin packages 412 and the gate portions 432. Thus, the interface portions are comparatively thin. With the above arrangement, it is possible to prevent the resin packages 412 from being cracked or damaged and thus improve the yield.

The rubber rollers 474A–474C are rotated in the directions indicated by the arrows by means of a driving mechanism (not shown), and transport the resin packages 412 along with the tapes 463 and 473. Thus, the rubber rollers 474A–474C also function as a transportation mechanism. Hence, there is no need to provide a particular transportation mechanism.

A description will be given, with reference to FIG. 177, of the gate break apparatus 480B. The gate break apparatus 480B employ projections 478A and 478B (press tools) arranged in a comb-shaped fashion. The projections 478A and 478B is used to separate the gate portions and the resin packages 412 from each other by utilizing the difference between the heights of the resin packages 412 and the gate portions 432. The gate portions 432 and the resin packages 412 are separated in the state they are sandwiched between the tapes 463 and 473.

As described before, the height H1 of the resin packages 412 is greater than the height H2 of the gate portions 432 (see FIG. 173B). Therefore, when the tape assembly is loaded to a fixing block 482 so that the surface of the lead frame 420 including the metallic film parts 413 faces upward, gaps can be defined between the gate portions 432*a* and the fixing block 482 (more particularly between the gate portions 432 and the adhesive tape 463).

The projection 478A is shaped so that it faces the whole surface of the gate portion 432. The projection 478B is shaped so that it faces the interface between the gate portion 432 and the resin package 412. In practice, a large number of projections 478A and 478B are arranged. The projections 478A and 478B are pressed toward the fixing block 482. Hence, shearing forces are produced at the interface portions indicated by the arrows C shown in FIG. 173B, and the gate portions 432 are punched out, whereby the resin packages 412 and the gate portions 432 are separated from each other.

In the present embodiment, the interface portions between the gate portions 432 and the resin packages 412 are pressed b the projections 478A and 478B (pressing tools) in order to separate the gate portions 432 and the resin packages 412 from each other. In practice a plurality of projections 478A and 478B are arranged so as to correspond to the interface positions and the gate portions 432. Hence, a plurality of cutting portions are simultaneously cut with a high efficiency.

A description will now be given of the gate break apparatuses 480C and 480D shown in FIGS. 178, 179A and 179B.

The gate break apparatus 480C shown in FIG. 480C has a laser generating apparatus 484, which generates a laser beam applied to the interface portions between the resin packages 412 and the gate portions 432 for cutting. The gate break apparatus 480D shown in FIGS. 179A and 179B has a rotary cutter 486, which cuts the interface portions between the resin packages 412 and the gate portions 432.

The gate break apparatuses 480C and 480D can access the cutting portions with high precision, and can precisely define the sizes of the resultant resin packages 412 (semiconductor devices 410). Further, if the semiconductor devices 410 are down-sized and become as small as almost the chip size, it is required that the sizes of the resin packages 412 and the gate portions 432 be reduced. Even in such a case, the resin packages 412 and the gate portions 432 can definitely be separated. Particularly, when the gate break apparatus 480C equipped with the laser generating apparatus 484 is used, resin scrap does not occur in the cutting positions.

The gate break apparatus 480E shown in FIG. 180 will be described. The gate break apparatus 480E uses high-pressure water 487*a* generated by a high-pressure water generating apparatus 487 and separates the resin packages 412 and the gate portions 432 due to the difference between the thickness of the resin packages 412 and the thickness of the gate portions 432.

The high-pressure water generating apparatus 487 includes a high-pressure pump, which injects water supplied thereto at a high pressure. Injection nozzles 488A and 488B are connected to the high-pressure generating apparatus 487, and highly-pressurized water (high-pressure water 487*a*) is injected via the injection nozzles 488.

In the present embodiment, the injection nozzle 488A is arranged so as to face the whole surface of the target gate portion 432, and the injection nozzle 488B is arranged so as to face the target interface portion between the gate portion 432 and the resin package 412. In this state, the high-pressure water 487*a* generated by the high-pressure water generating apparatus 487 is injected via the injection nozzles 488A and 488B, shearing force is generated at the interface portion indicated by the arrow C shown in FIG. 176B. Thus, the gate portion 432 is punched out and is separated from the resin packages 412.

As compared to the gate break apparatuses 480A–480D, the gate break apparatus 480E applies a small load to the protection tape 473 at the time of the gate breaking. Hence, it is possible to prevent occurrence of a damage in the protection tape 473 and enables the repetitive use thereof. Further, even if resin scrap occurs at the time of the gate breaking, it can be removed by the high-pressure water 487a.

The gate break apparatuses 480A–480E can automatically separate the gate portions 432 and the resin packages 412 with high efficiency. In addition, it is possible to suppress or prevent resin scrap from occurring and thus improve the fabrication efficiency.

After the resin packages 412 are separated from the gate portions 432, it is required to perform a process for separating the resin packages 412 (semiconductor devices 410) and the gate portions 432 into respective groups.

The above grouping process utilizes the fact that the resin packages 412 have a thickness different from that of the gate portions 432. More particularly, a grouping hole is provided which is smaller than the semiconductor devices 410 and is greater than the gate portions 432. However, there is a possibility that some gate portions 432 may not pass through the grouping hole if the gate portions 432 are stacked. This possibility does not accomplish the definite grouping.

With the above in mind, as shown in FIG. 181, after the gate break step is finished, the adhesive tape 463 is placed in water or hot water in a chamber 489. More particularly, the protection tape 473 is broken away after the gate break step. Hence, the gate portions 432 that are attached to the protection tape 473 among the gate portions are removed.

There are also gate portions 432 that are attached to the adhesive tape 463. Such gate portions 432 remain after the protection tape 473 is broken away.

The adhesive tape 463 to which some gate portions 432 are attached is placed in the chamber 489. As has been described previously, the adhesive force of the adhesive tape 463 is lost when it is wetted. In addition, the adhesive force of the adhesive tape 463 to the gate portions 432 is weak, while the semiconductor packages 412 are tightly attached to the adhesive tape 463 because they are pressed during the pressing step (see FIGS. 170 through 172).

As described above, only the gate portions 432 can be broken away from the adhesive tape 463 by simply placing it in the chamber 489. Hence, the resin packages 412 and the gate portions 432 can easily be separated from each other.

After the step of breaking away the gate portions 432 from the adhesive tape 463, the second step of breaking away the semiconductor packages 412 from the adhesive tape 463 is performed. By this step, the separate semiconductor devices 410 become finally available.

FIGS. 182 through 185 show break-away apparatuses 4102A–4102D used in the second break away step.

FIG. 182 shows the break-away apparatus 4102A, which breaks away the gate portions 432 from the adhesive tape 463 by using a break-away tool 491.

The break-away tool 491 is made up of a upper tool 492, a lower tool 493 and an accommodation part 495. A slit 494 is provided between the upper tool 492 and the lower tool 493. The break-away tool 491 is disposed in the halfway of the transportation path of the adhesive tape 463 to which the resin packages 412 are attached. Further, the break-away tool 491 passes through the slit 494. When the break-away took 491 passes through the slit 494, the adhesive tape 463 is bent into a V shape.

The slit 494 has a width less than the height H1 of the resin packages 412. Hence, the adhesive tape 463 can pass through the slit 494, but the resin packages 412 cannot pass therethrough. The transportation path of the adhesive tape 463 is greatly bent in the position of the slit 494.

Thus, the resin packages 412 are broken away from the adhesive tape 463 by the break-away tool 491 while the adhesive tape 463 is traveling. In this manner, the individual semiconductor devices 410 can be fabricated. The resin packages 412 that are broken away from the adhesive tape 463 drop and enter the accommodation portion 495.

The break-away apparatus 4102A is capable of breaking away the resin packages 412 from the adhesive tape 463 by merely causing the adhesive tape 463 with the resin packages attached to pass through the break-away tool 491. Hence, the break-away process can automatically be performed efficiently.

A description will be given of the break-away apparatus 4102B shown in FIG. 183, which is configured so that the gate portions 432 are broken away from the adhesive tape 463 by means of a push-up tool 496.

The push-up tool 496 has push-up needles 497, which push up the resin packages 412, and are arranged below the transportation path of the adhesive tape 463. The push-up tool 496 can move up and down with respect to the adhesive tape 463. When the adhesive tape 463 travels, the resin packages 412 are located above the adhesive tape 463.

When the resin packages 412 are moved to the positions above the push-up tool 496, the push-up tool 496 is moved up. Then, the push-up needles 497 penetrate through the adhesive tape 463 and push up the resin packages 412. Hence, the resin packages 412 are broken away from the adhesive tape 463, and the semiconductor devices 410 become available.

As described above, the break-away apparatus 4102B equipped with the push-up tool 496 can separate the resin packages 412 from the adhesive tape 463 by merely moving up the push-up tool 496. Hence, Hence, the break-away process can automatically be performed efficiently.

The break-away apparatus 4102C shown in FIG. 184 will be described. The break-away apparatus 4102C is equipped with a high-pressure water generating apparatus 498 in order to break away the gate portions 432 from the adhesive tape 463.

The high-pressure water generating apparatus 498 includes a high-pressure pump, which injects water supplied at a high pressure. An injection nozzle 499 is connected to the high-pressure water generating apparatus 498, and highly-pressurized water is injected via the injection nozzle 499. The injection nozzle 499 is arranged so that the high-pressure water is injected to the interface between the adhesive tape 463 and the target resin package 412.

Hence, the high-pressure water 498a generated by the high-pressure water generating apparatus 498 and injected via the nozzle 499 is injected to the interface between the adhesive tape 463 and the target resin package 412. Hence, the resin package 412 is broken away from the adhesive tape due to the pressure of the injected water.

The high-pressure water 498a makes it possible to prevent the adhesive tape 463 from being damaged and to enable repetitive use of the adhesive tape 463. Additionally, the high-pressure water 498a functions to remove dust attached to the resin packages 412 and clean the resin packages 412. It is desirable that the adhesive material of the adhesive tape 463 be a material having adhesive force that is lost when it is wetted.

The break-away apparatus 41-2D shown in FIG. 185 will be described. This apparatus breaks away the gate portions 432 from the adhesive tape 463 by means of a wire 4100.

The wire 4100 is provided in the halfway of the transportation path of the adhesive tape 463 to which the resin packages 412 are attached, and is located at the interface between the adhesive tape 463 and the resin package 412. Further, a push-up tool 4101 is provided at the side of the adhesive tape 463 opposite to the side thereof at which the wire 4100 is provided. The adhesive tape 463 travels between the wire 4100 and the push-up tool 4101. Further, the adhesive tape 463 is bent into a V shape by the push-up tool 4101.

The wire 100 enters into the interface between the adhesive tape 463 that is traveling and the target resin package 412, and breaks the resin package 412 from the adhesive tape 463. Hence, by merely causing the adhesive tape 463 to pass through the wire 100, the resin packages 412 can easily and efficiently be broken away from the adhesive tape 463.

The resin packages can be ejected by the following package separation ejector mechanism used instead of the aforementioned ejecting mechanisms.

FIG. 186 shows such an alternative ejector mechanism, which includes a film 484. This film 484 is flexible and is formed of a substance having a poor contactability with the resin forming the resin packages 412 and the gate portions 432 and the upper mold cavity insert 444.

When the resin molding is performed with the film 484, the film 484 is disposed to the upper mold cavity insert 444 and is additionally sucked thereto. The upper mold cavity insert 444 is equipped with vacuum holes (not shown). When the pressure in the vacuum holes is reduced, the film 484 is sucked to the upper mold cavity insert 444. Since the film 484 has a flexibility, it is deformed in accordance with the shapes of the package cavities 456 and the anchor cavities 458.

Since the film 484 has a poor contactability with the upper mold cavity insert 444 and the resin 429, the upper mold cavity insert 444 can easily be detached from the resin packages 412 and the gate portions 432 at the time of the separating step.

When the film 484 is used, the ejector pins 452 are no longer needed. Hence, it is not required that resin packages 412 and the gate portions 432 have a certain ejection strength. This enables down sizing of the semiconductor packages 412. In addition, the upper mold pin plate 348 and the device for driving it is no longer needed. Thus, the fabrication facility can be simplified.

[Twenty-fifth Embodiment]

A description will now be given of a twenty-fifth embodiment of the present invention.

FIG. 187 schematically shows a structure of the apparatus for fabricating the semiconductor devices according to a twenty-fifth embodiment of the present invention. The whole block structure shown in FIG. 187 is also applied to the aforementioned embodiments of the present invention.

A fabrication apparatus 510A shown in FIG. 187 executes the gate break step of separating the resin packages from the lead frame, and an outer appearance checking step of checking the outer appearance of the resin packages.

A fabrication apparatus 510B shown in FIG. 188 performs an electrical operation test of the semiconductor devices after the outer appearance test executed by the fabrication apparatus 510A shown in FIG. 187.

Now, a description will be given of the overall structures of the fabrication apparatuses 510A and 510B.

As shown in FIG. 187, the fabrication apparatus 510A is made up of a feed part 512, a gate break part 514, a gate part eject box 516, an orientation part 518, an outer appearance check part 520, a faulty device eject body 522 and a receiving part 524.

The feed part 512 is supplied with resin packages 542 separated from the lead frame by the etching apparatus used in the separating step (preprocess), and are stored therein. The resin packages 542 immediately after the molding process are connected via the gate portions 552, as shown in FIGS. 173A and 173B. The gate portions 452 are separated from the resin packages 542, as has been described previously.

As shown in FIGS. 190A–190D, the semiconductor device 540 has the resin package 542 in which a semiconductor chip is provided. Bumps 544 are provided to the resin package 542. The bumps 542 function as external connection terminals, and include resin projections and metallic film parts that cover the resin projections. The metallic film parts have magnetism, and include a magnetic metal having electrical conductivity. Hence, the bumps 544 are absorbed due to the magnetic force.

The bumps 544 are arrayed on the bottom surface of the resin package 542, and do not laterally extend from the resin package 542.

The resin package 542 has an asymmetrical shape. More particularly, as shown in FIG. 190A, The length L1 of first and second opposing sides 546 and 548 of the resin package 542 is greater than the length L2 of third and fourth opposing sides 550 thereof (L1>L2).

As shown in FIG. 190D, the first side 546 has a shape different from that of the second side 548. More particularly, the slant angle θ1 of the first side 546 is greater than the slant angle θ2 of the second side 548 (θ1>θ2).

As shown In FIG. 190C, a bump 544A (hereinafter referred to as first bump 544A) has a shape different from that of the other bumps 544. The bump 544A is arranged in one of the four corners, and has an approximately square shape. The bumps 544 have a rectangular shape.

The resin package 542 of the semiconductor device 540 is asymmetrical in any of a first direction connecting in the front and back surfaces, a second direction connecting the first and second sides 546 and 548, and a third direction connecting the third and fourth sides 550. This asymmetrical shape of the resin package 542 makes it possible to visually recognize the orientation of the resin package 542.

Turning to FIG. 187 again, a step of discriminating the resin packages 542 from the gate portions 552 is performed after the resin packages 542 are separated from the gate portions 552 in the gate break part 514. The unwanted gate portions 552 are ejected to the gate part eject box 516. The resin packages 542 (semiconductor devices 540) are sent to the orientation part 518.

The orientation part 518 utilizes the asymmetrical shape of the resin packages 542 and orients the resin packages 542 in a predetermined direction. This is directed to facilitating the outer appearance check executed in the outer appearance check part 520.

The semiconductor devices 540 oriented in the particular direction are transported to the outer appearance check part 520 for the outer appearance check. In this check, a camera is used to make an image of the surface of the semiconductor device 540 on which the bumps 544 are formed. The image thus obtained is compared with an image obtained in the normal state beforehand, and it is determined whether the target semiconductor device 540 is faulty. If it is determined that the target semiconductor device 540 is faulty, it is ejected to the faulty device eject box 522. If not, the normal semiconductor device 540 is transported to the receiving part 524.

The semiconductor devices 540 stored in the receiving part 524 are transported to the fabrication apparatus 510B shown in FIG. 188 by means of a tool in the receiving part 524. The semiconductor devices 540 are serially taken from the tool and are then supplied to the fabrication apparatus 510B. In the fabrication apparatus 510B, the semiconductor devices 540 are transported due to the weights thereof. The above self-weight based transportation does not need a handling apparatus, which is needed in a transparent transportation. Hence, the fabrication apparatus 510B has a comparatively simple structure.

As shown in FIG. 188, the fabrication apparatus is made up of an orientation part 526, a separation part 528, a measurement part 530 and an outer appearance check part 532.

The orientation part 526 orients the semiconductor devices 540 in the above-mentioned second and third directions, but does not perform the orientation operation in the first direction. This is because the semiconductor devices 540 have already been oriented in the first direction when they are supplied to the fabrication apparatus 510B.

The separation part 528 receives the semiconductor devices 540 that are irregularly transported from the orientation part 526, and sends the semiconductor devices 540 to the measurement part 530 at a constant timing. More particularly, the semiconductor devices 540 transported from the orientation part 526 are temporarily stopped, and are sent out at constant intervals.

The reason why the separation part 528 is provided is as follows. The time it takes the semiconductor devices 540 oriented in the correct orientation to pass through the orientation part 526 is different from the time it takes the semiconductor devices 540 oriented in the incorrect orientations to pass through the orientation part 526. If the semiconductor devices 540 are transported in the incorrect orientations, the orientation part 526 turns the semiconductor devices 540 to the correct orientation. The semiconductor devices 540 correctly oriented do not need such a process. It can be seen from the above that the semiconductor devices 540 are transported from the orientation part 526 at irregular intervals.

The measurement part 530 moves the semiconductor devices 540 toward a measurement printed-circuit board 5122 (see FIG. 199), and tests them with the devices 540 loaded thereto. In order to efficiently test the semiconductor devices 540, it is desirable to perform the measurement operation on the semiconductor devices 540 at constant intervals. The separation part 528 is provided in order to achieve the above constant-interval measurement.

In the measurement operation, it is determined whether the semiconductor chips of the semiconductor devices 540 operate normally and whether the chips are normally connected to the bumps 544.

The outer appearance check part 532 following the measurement part 530 checks, using the camera, whether there are any bumps 544 that are damaged or flaked off. The semiconductor devices 540 that are determined as being normal are packed and shipped.

FIG. 189 shows the fabrication apparatus 510A shown in FIG. 187 more specifically. The feed part 512 accommodates the resin packages 542 which are joined through the gate portions 552. The resin packages 542 are supplied to the gate break part 514, which is equipped with the gate break apparatus as shown in any of FIGS. 174, 177, 178, 179A and 179B.

According to the present embodiment, an attention is paid to the bumps 544 that have the metallic film parts including a magnetic metal, and a magnet 515 is provided in the gate break part 514. The magnetic metal is absorbed to the magnet 515, while the gate portions 552 are not absorbed.

The magnet 515 is, for example, a solenoid, which is attached to the gate break part 515 so that it can move toward the orientation part 518. The semiconductor device 540 absorbed to the magnet 515 is transported up to the transportation path 535 connected to the orientation part 518. Then, a supply of electricity to the magnet 515 is turned off. Thus, the semiconductor device 540 is supplied to the orientation part 518 via the transportation path 535. In contrast, the gate portions 552 that are not absorbed to the magnet 515 are ejected to the gate part eject box 516.

With the above arrangement, it is possible to certainly separate the semiconductor devices 540 from the gate portions 552 in automatic fashion. Thus, the efficiency in fabricating the semiconductor devices 540 can be improved.

A description will now be given of the orientation part 518.

The orientation part 518 is made up of a ball feeder 536, a plating scrap removing part 538, an orientation discrimination part 554 and a return passage 556. The ball feeder 536 is known as an apparatus for orienting and transporting the chip components, and is equipped with a vibration applying device built therein. The semiconductor devices 540 supplied to a receiving part 536a of the transportation passage 535 from a feed inlet 543 thereof are vibrated in order to serially feed the semiconductor devices 540 to a transportation passage 588. While the semiconductor devices 540 are transported through the transportation passage 588, the semiconductor devices 540 are oriented.

The plating scrap removing part 538 is provided at the downstream side of the gate break part 514 in the direction of transporting the semiconductor devices 540. In the present invention, the plating scrap removing part 538 is provided in the halfway of the transportation passage 588. The plating scrap removing part 538 is made up of a flow device and a magnet. The blow device blows up magnetic metal scraps produced in the gate break part 514. The magnet absorbs magnetic metal scraps blown by the blow device.

The blow device blows compressed air toward the receiving part 536a. The compressed air blows up the semiconductor devices 540 and the magnetic metal scraps existing in the receiving part 536a.

The magnet is disposed in an appropriate position in which the magnetic metal scraps blown up can be captured. More example, the magnet is provided in the vicinity of a blowout hole of the blow device from which the compressed air is blown.

With the above structure, it is possible to easily and definitely remove the magnetic metal scraps and to prevent smooth transportation of the semiconductor devices 540 from being blocked due to the presence of the magnetic metal scraps. This leads to increase in the throughput.

The orientation discrimination part 554 orients the semiconductor devices 540 transported over the transportation passage 588 in a given direction. In the present embodiment, the above orientation discrimination process is implemented by means of a slop surface 590 and a stopper 594, which are provided in the transportation passage 588. A further description will be given of the structure of the orientation discrimination part 554 by referring to FIGS. 191A, 191B, 192A and 192B.

Three directions of the semiconductor devices 540 are discriminated. Referring to FIG. 190A, the first direction connects the front and back surfaces of the semiconductor device 540. The second direction connects the first and second sides 546 and 548. The third direction connects the third and fourth sides 550.

FIGS. 191A and 191B show the structure for discriminating the first direction over the second and third directions. FIGS. 192A and 192B show the structure for discriminating the second direction over the first and third directions. The third direction is discriminated by the outer appearance check device 566, as will be described later.

Referring to FIGS. 191A and 191B, the slope 590 provided in the transportation passage 588 functions to discriminate the first direction over the second and third directions. A flange portion 592 is formed in the lower portion of the slope 590. The edge of the resin package 542 on the bottom side of the semiconductor device 540 contacts the flange portion 592. In this state, the semiconductor device is transported along the transportation passage 588. The first direction of the semiconductor device 540 is correctly oriented in the state in which the bumps 544 are in contact with the slope 590, as shown in FIG. 191A.

If the resin package 542 is transported along the transportation passage 588 in the upside-down state, the top surface of the semiconductor device 540 contacts the slope 590. Further, one of the four sides 546, 548 and 550 of the resin package 542 contacts the flange portion 592. As has been described previously, the sides 546, 548 and 550 have the slopes or curved surfaces.

The angle of the slope 590 and the length of the flange portion 592 are selected so that, if the semiconductor device 540 is transported along the transportation passage 588 in the incorrect orientation (upside-down state), the flange portion 590 cannot engage the resin package 542. Hence, as shown in FIG. 191B, the flange portion 592 cannot engage any of the sides 546, 548 and 550 of the semiconductor device 540. Thus, the semiconductor device 540 drops from the slope 590. Hence, only the semiconductor devices 540 in which the first direction thereof is correctly oriented can be transported toward the next step.

Referring to FIGS. 192A and 192B, the stopper 594 provided in the slope 590 of the transportation passage 588 functions to discriminate the second direction over the first and third directions. As has been described with reference to FIG. 190A, the length L1 of the sides 546 and 548 of the semiconductor device 540 is greater than the length L2 of the sides 550 (L1>L2). The difference between the lengths L1 and L2 makes it possible to determine whether the second direction of the semiconductor device 540 is correctly oriented. In the present embodiment, the second direction of the semiconductor device 540 is correctly oriented when the length L2 extends in the direction (indicated by arrow D) along the slope 590.

The stopper 594 is arranged so that it does not contact the resin package 542 when the second direction of the semiconductor device 540 is correctly oriented and is transported along the transportation passage 588. At that time, as shown in FIG. 192A, the stopper 594 permits the semiconductor device 540 to pass below the stopper 594.

In contrast, when the resin package 542 is incorrectly oriented, as shown in FIG. 192B, the resin package 542 contacts the stopper 594, and the semiconductor device 540 drops from the slope 590. Hence, only the semiconductor devices 540 in which the second direction thereof is correctly oriented are transported along the transportation passage 588 toward the next step. With the above structure, it is possible to easily and definitely remove the semiconductor devices 540 transported in the incorrectly oriented state.

The return passage 556 is provided in the orientation discrimination part 554. The return passage 556 returns, to the halfway of the transportation passage 588, the semiconductor devices 540 dropped from the transportation passage 588 by the cooperation of the slope 590 and the stopper 594 if the semiconductor devices 540 are incorrectly oriented.

It will now be assumed that the semiconductor device 540 dropped from the transportation passage 588 is returned to the start point (indicated by arrow E in FIG. 189) and is restarted therefrom. In this case, if only a small number of semiconductor devices 540 is stored in the receiving part 536a, the transportation efficiency will be degraded.

In contrast, the return passage 556 functions to return the semiconductor devices 540 dropped from the transportation passage 588 to the halfway of the transportation passage 588. Hence, even if the number of semiconductor devices 540 stored in the receiving part 536a becomes small, the semiconductor devices 540 dropped from the transportation passage 588 are returned to the halfway of the transportation passage 588. Hence, the efficiency in the orientation process can be improved.

It is possible to provide a correction mechanism which performs a correction operation when the semiconductor devices 540 dropped to the return route 556 are returned to the transportation passage 588. The correction operation may utilize the differences in the angles of the tapered portions, the differences between the lengths L1 and L2 and/or the presence/non-presence of the terminals.

An orientation changing part 555 is provided at the downstream side of the orientation discrimination part 554 in the direction in which the semiconductor devices 540 are transported.

As has been described with reference to FIGS. 191A and 191B, the orientation discrimination part 554 determines that the semiconductor devices 540 are correctly oriented when the bumps 544 contact the slope 590. If this state is maintained after the discrimination process, the metallic film parts of the bumps 544 may be damaged or broken away.

The orientation changing part 555 changes the orientation of the semiconductor devices 540 so that the metallic film parts face outward after the discrimination process of the orientation discrimination part 554. Hence, it is possible to prevent the metallic film parts of the bumps 544 from sliding on the slope 590 of the transportation passage 588 and from being damaged or broken away.

The semiconductor devices 540 correctly oriented in the above-mentioned steps pass through a linear feeder and are supplied to the outer appearance check part 520. The outer appearance check part 520 is generally made up of a separation part 560, transfer robots 562 and 570, an outer appearance check device 566, and an orientation correction part 568 shown in FIG. 189.

The semiconductor devices 540 correctly oriented are transported up to the final end of the linear feeder 558, and are separated one by one and positioned by the separation part 560. Then, the transfer robot 562 places the semiconductor devices 540 on a rotary table 564 one by one. The rotary table 564 is equipped with a vacuum absorption mechanism. The semiconductor device 540 is fixed to the rotary table 564 by the vacuum absorption mechanism.

Then, the rotary table on which the semiconductor device 540 is fixed is turned by 90°, so that the semiconductor device 540 faces the outer appearance check device 566, which is equipped with a camera. Then the semiconductor device 540 is tested in various viewpoints by referring to images taken by the camera. For example, it is checked whether the semiconductor device 540 has the specified size and whether there is lack of terminals.

If the semiconductor device 540 is transported in the upside-down state, an inverting mechanism provided in the outer appearance check device 566 turns the semiconductor device 540 upside down. Further, at the same time as the various tests, it is determined in which direction the first bump 544A is oriented by utilizing the fact that the shape of the bump 544A differs from that of the other bumps 544 (see FIG. 190C).

After the various tests and the step of determining in which direction the bump 544A is oriented, the rotary table 564 is further turned by 90°. Hence, the semiconductor device 540 faces the orientation correction part 568, in which, if the bump 544A is oriented in the reverse direction, the semiconductor device 540 is turned by 180°.

The rotary table 564 is further turned by 90°. If the semiconductor device 540 is determined as being normal, the vacuum absorption operation is stopped, and the semiconductor device 540 is transferred to a positioning part 572 by the transfer robot 570. After the semiconductor device 540 is positioned, it is transported to the receiving part 524 and is received in a tool (not shown) provided therein. When a given number of semiconductor devices 540 is received in the tool, this tool is stocked and another tool is automatically set.

If the semiconductor device 540 is determined as being faulty, the rotary table 564 is further rotated while the semiconductor device 540 is vacuum-chucked. When the semiconductor device 540 is transported up to the vicinity of the faulty device eject box 522, air is blown from a nozzle (not shown) and thus the semiconductor device 540 is ejected to the faulty device eject box 522.

The receiving part 524 has a unit type so that a container, a tray, a tape or another tool can be used as the tool for receiving the semiconductor devices 540 stored in the receiving part 524. If a tool of a type different from that of the tool being used is employed, the corresponding unit can be used instead of the used currently used.

In the separation part 560 and the positioning part 572, the semiconductor devices 540 are clamped by craws in order to position the semiconductor devices 540. At that time, the semiconductor devices 540 may be damaged. In order to avoid the above problem, a spring may be provided to the clamp mechanism in order to prevent an overload from being applied to the semiconductor devices 540. A pressure sensor may be used to stop the clamp operation if a pressure exceeding a threshold level is applied to the semiconductor device 540.

In the present embodiment, the semiconductor devices 540 are oriented in the first and second directions within the ball feeder 536. Alternatively, it is possible to orient the semiconductor devices 540 in the outer appearance device 566 and the orientation correction part 568 rather than the ball feeder 558.

After the processes executed by the fabrication device 510A are completed, the semiconductor devices 540 are processed by the fabrication device 510B shown in FIG. 188.

The semiconductor devices 540 stored in the tools in the receiving part 524 are transported to the fabrication apparatus 510B as they are. Then, the semiconductor devices 540 are picked up one by one by a loader (not shown) and are then supplied to the fabrication apparatus 510B.

In the fabrication apparatus 510B, the semiconductor devices 540 are transported due to the weight thereof. The self-weight based transportation is suitable for the fabrication apparatus 510B because the individual semiconductor devices 540 are separately handled one by one and the horizontal transportation based on the absorbing and chucking processes is not suitable for such handling.

As has been described previously, the fabrication apparatus 510B includes the orientation part 526, the separation part 528, the measurement part 530 and the outer appearance part 532. While the semiconductor devices 540 pass through the above parts, an operation test and an outer appearance test are executed.

The semiconductor device 410B is transported to the orientation part 526 by dropping due to the weight thereof. FIG. 193 shows a structure of the orientation part 526, which orients the semiconductor device 540 in the second direction.

The semiconductor device 540 picked up from the tool is supplied to the orientation part 526 so that the second side 548 is located on the right side as indicated by an arrow D or the second side 548 is located on the left side as indicated by an arrow E. If the semiconductor devices 540 can be oriented in the above two directions, the measurement part 530 and the outer appearance check part 532 may not perform the respective operations correctly.

Thus, the orientation part 526 is provided to orient the semiconductor derives 540 in the given direction before the semiconductor devices 540 are supplied to the measurement part 532 and the outer appearance check part 532. When the semiconductor devices 540 are picked up one by one from the tool, the loader can correctly orient the first direction of the picked-up semiconductor device 540. Hence, the orientation part 526 can orient only the second direction of the semiconductor devices 540. In the present embodiment, the semiconductor device 540 is correctly oriented when the side 548 of the semiconductor device 540 is located on the right side as indicated by the arrow D.

As shown in FIG. 193, the orientation part 526 is generally made up of a pre-inversion rail 596, an inversion rail 598, a stopper pin 5100 and a post-inversion rail 5102.

The pre-inversion rail 596 includes a non-taper passage 596a over which the semiconductor device 540 is transported. The semiconductor device 540 is fed to the pre-inversion rail 596 from the loader. The non-tapered passage 596a formed in the pre-inversion rail 596 allows the semiconductor device 540 to pass therethrough irrespective of the orientation thereof.

The inversion rail 598 has a circular shape viewed from the front side. A tapered passage 598a is formed in the central portion of the inversion rail 598 so that it extends in the radial direction. A tapered portion 598b is formed in the tapered passage 598a, and is shaped so as to correspond to the second side 548 of the semiconductor device 540. If the semiconductor device 540 enters into the tapered passage 598a in the direction in which the second side 548 corresponds to the taped portion 598b (the direction indicated by the arrow D), the tapered portion 598b allows the semiconductor device 540 to pass therethrough. In contrast, if the semiconductor device 540 enters into the tapered passage 598a in the direction in which the second side 548 does not correspond to the tapered portion 598b (the direction indicated by the arrow E), the tapered portion 598b rejects the passage of the semiconductor device 540. The inversion rail 598 can be rotated by a driving apparatus (not shown).

The stopper pin 5100 is located in the center of the rotation of the inversion rail 598, and is provided in the tapered passage 598a. The stopper pin 5100 can be displaced in the direction vertical to the drawing sheet by a driving apparatus (not shown). Hence, in the state the stopper pin 5100 is displaced downward with respect to the drawing sheet, the stopper pin 5100 is located in the tapered passage 598a, which thus prevent the semiconductor device 540 from passing through the tapered passage 598a. In contrast, when the stopper pin 5100 is displaced upward with respect to the drawing sheet, the stopper pin 5100 is located out of the tapered passage 598. Hence, the semiconductor device 540 is permitted to pass through the tapered passage 598a.

The post-inversion rail 5102 includes a non-tapered passage 5102a over which the semiconductor device 540 passing through the inversion rail 598 is transported toward the separation part 528. The non-tapered passage 5102a formed in the post-inversion rail 5102 permits the semiconductor device 540 to pass therethrough irrespective of the orientation thereof.

A description will now be given of an operation of the orientation part 526 by referring to FIGS. 193, 194A–194F.

Initially, the state of the orientation part 526 is as shown in FIG. 193. With respect to the initial state shown in FIG. 193, the orientation part 526 performs the following orientation operation.

A case will be described where the semiconductor device 540 is correctly oriented with respect to the orientation part 526 (as indicated by the arrow D) and is transported. In this case, the second side 548 corresponds to the tapered portion 598b as described before, and thus the semiconductor device 540 passing through the inversion rail 596 enters into the inversion rail 598. Also, in the present state, the stopper pin 5100 is maintained in the downward-displaced state. Hence, the semiconductor device 540 is permitted to pass through the tapered passage 598, and enters into the post-inversion rail 5102.

Figure 194A:
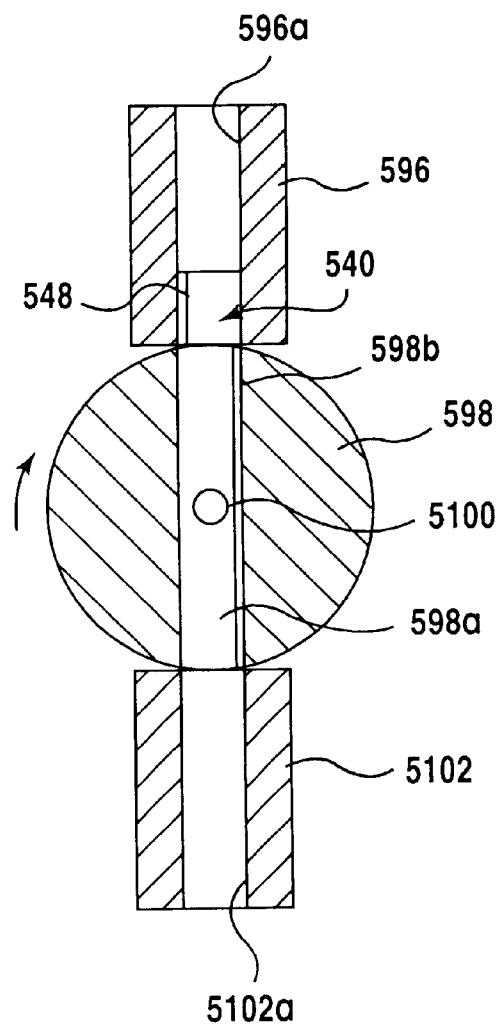
Figure 194B:
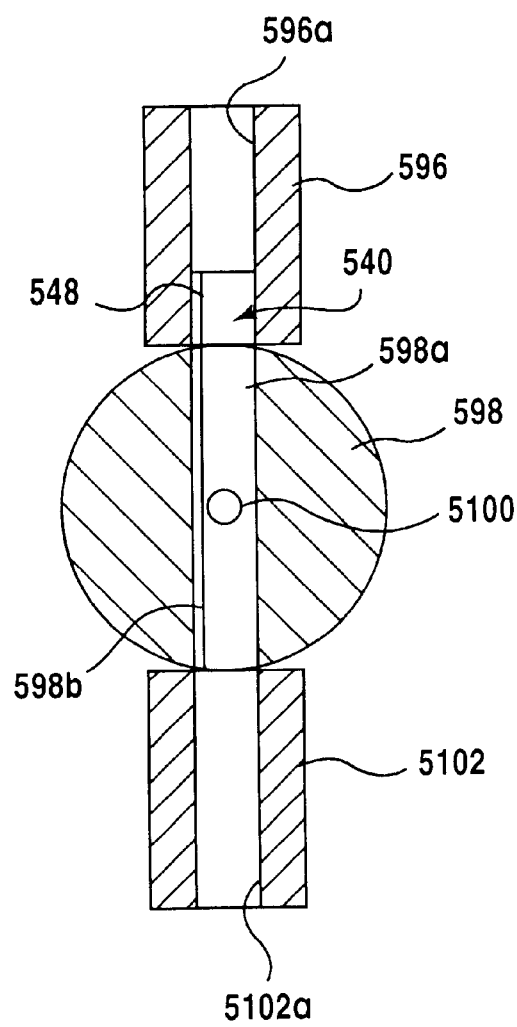

A case will be described where the semiconductor device 540 is incorrectly oriented with respect to the orientation part 526 (as indicated by the arrow E) and is transported. In this case, the second side 548 does not correspond to the tapered portion 598b. Hence, as shown in FIG. 194A, the semiconductor device 540 passing through the pre-inversion rail 596 butts against the inversion rail 598 and cannot enter into the tapered passage 598a.

A sensor (not show) that senses the semiconductor device 540 is provided to the pre-inversion rail 596, and detects the situation in which the entry of the semiconductor device 540 into the tapered passage 598a is blocked.

When the sensor detects the above situation, the driving apparatus is activated and turns the inversion rail 598 by 180° in the clockwise direction. Further, the stopper pin 5100 is displaced downward with respect to the drawing sheet, and is maintained in the state shown in FIG. 194B.

Thus, the second side 548 corresponds to the tapered portion 598b of the tapered passage 598a, and is permitted to enter into the tapered passage 598a. Since the stopper pin 5100 is located in the tapered passage 598a, as shown in FIG. 194C, the semiconductor device 540 butts against the stopper pin 5100.

Figure 194C:
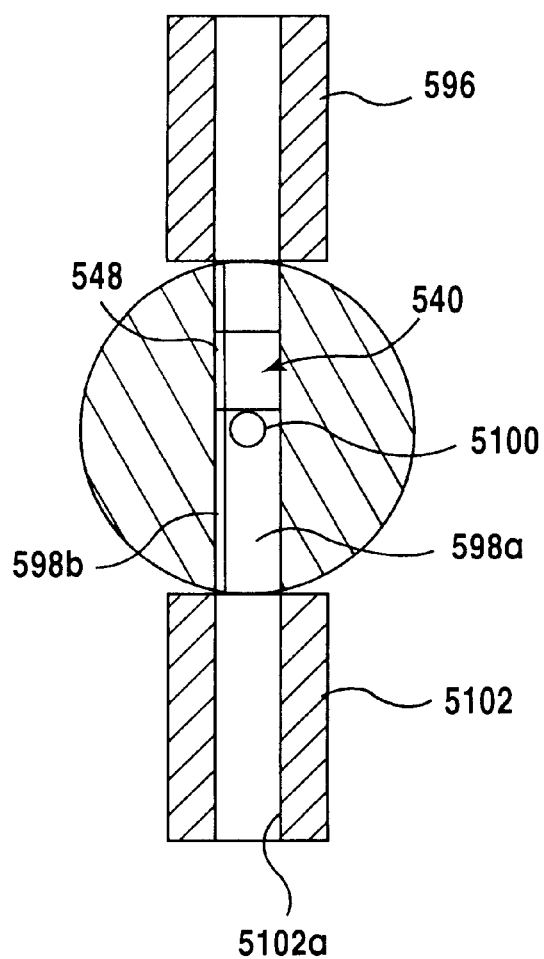
Figure 194D:
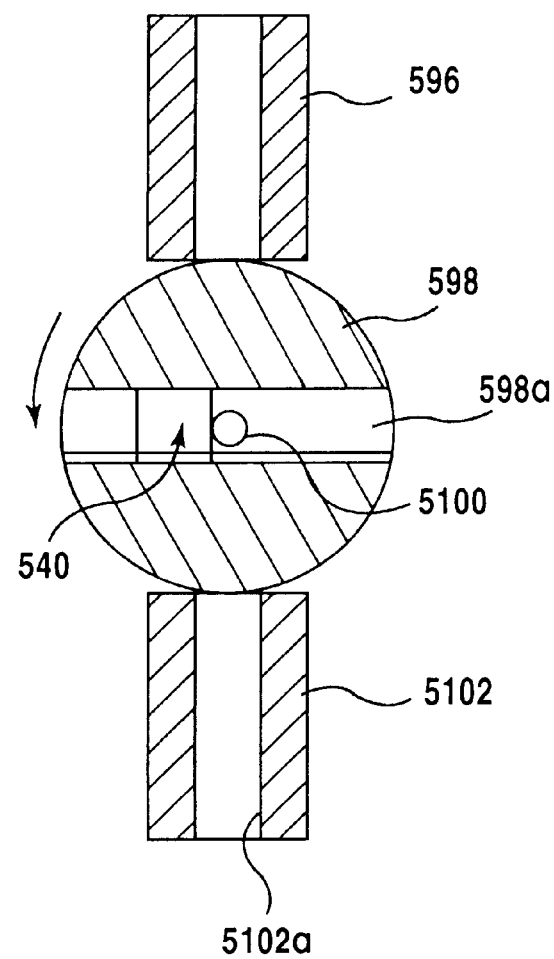

In the above state, the driving apparatus is activated again, and as shown in FIG. 194C, the inversion rail 598 is rotated by 180° in the counterclockwise direction in the state in which the semiconductor device 540 retains in the tapered passage 598a. The stopper pin 5100 is displaced upward with respect to the drawing sheet, and becomes away from the tapered passage 598a.

Figure 194E:
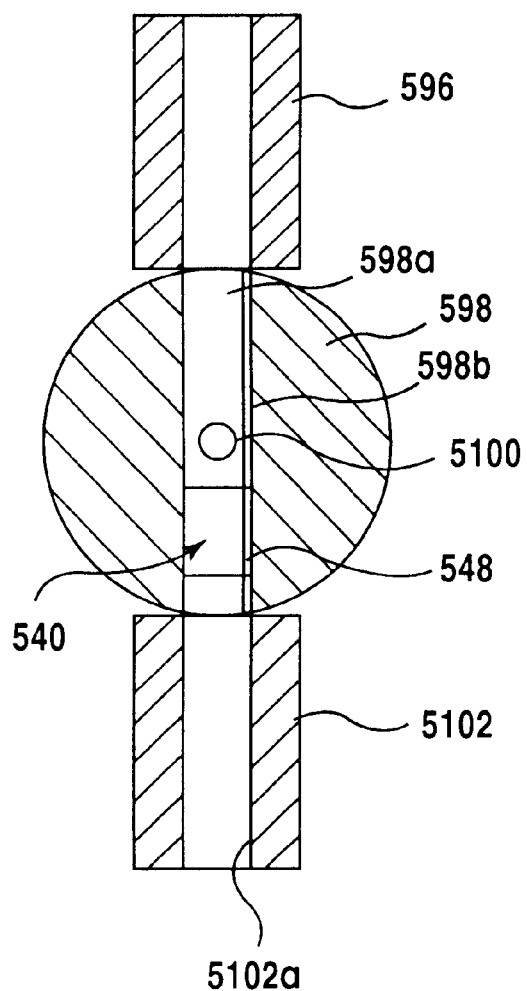

FIG. 194E shows a state in which the inversion rail 598 is rotated by 180° in the counterclockwise direction. The state shown in FIG. 194E is the same as the initial state. In this state, the semiconductor device 540 is in the inverted state in the second direction. The inversion rail 598 is rotated so that the second side 548 is located on the right side.

Figure 194F:
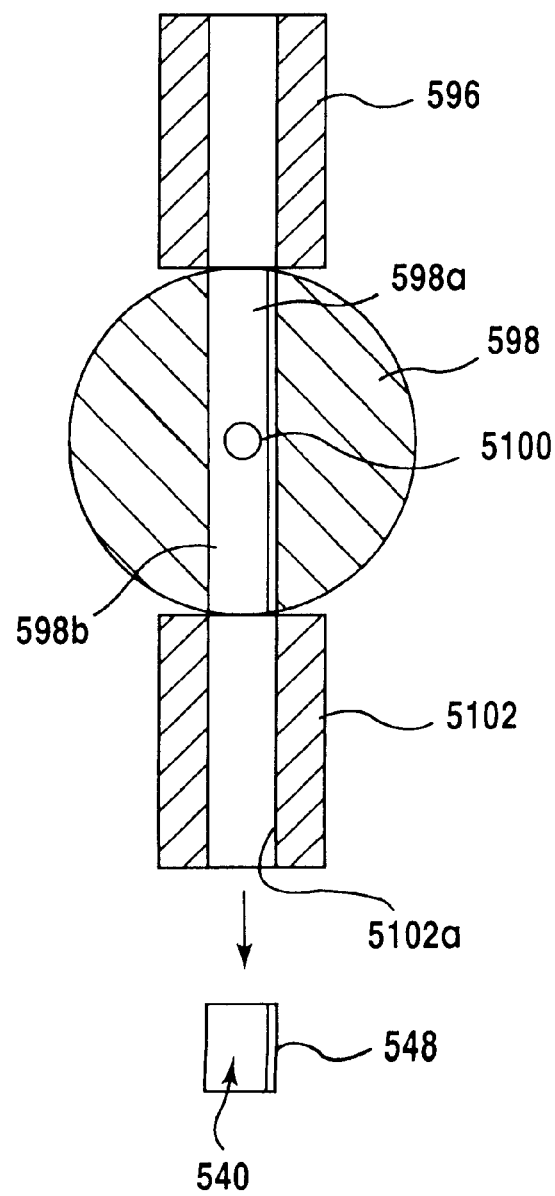

As shown in FIG. 194F, the semiconductor device 540 correctly oriented passes through the post-inversion rail 5102 and is transported toward the separation part 528. The orientation part 526 orients the semiconductor devices 540 in the correct direction without exception.

A description will be given, with reference to FIGS. 195 and 196, of a first embodiment of the separation part 528.

The separation part 528 performs sends the semiconductor devices 540 transported from the orientation part 526 toward the measurement part 530 one by one at a constant timing.

FIG. 195 shows a structure of the separation part 528. As shown in this figure, the separation part 528 is generally made up of a transportation rail 5104, a first upper-side presser 5106A, a first lower-side presser 5106B, a second upper-side presser 5108A, a second lower-side presser 5108B, and a stopper 5112.

The transportation rail 5104 is connected to the post-inversion rail 5102 of the orientation part 526, and has a transportation passage 5104a to which the semiconductor devices 540 fed from the orientation part 526 and oriented correctly are fed. It can be seen from the above-mentioned description that the orientation part 526 sends the semiconductor devices supplied thereto in the correctly oriented state to the separation part 528 at a timing different from the timing at which the orientation part 526 sends the semiconductor devices supplied thereto in the incorrectly oriented state to the separation part 528. In order to cancel the timing difference, the semiconductor devices 540 from the orientation part 526 are temporarily stored in the transportation rail 5104.

The first upper-side presser 5106A and the second lower-side presser 5106B are arranged so as to face each other. Similarly, the second upper-side presser 5108A and the second lower-side presser 5108B are arranged so as to face each other. The first upper-side presser 5106A and the first lower-side presser 5106B are located at the downstream side of the second upper-side presser 5108A and the second lower-side presser 5108B in the direction in which the semiconductor devices 540 are transported.

The space between the first upper-side presser 5106A and the first lower-side presser 5106B (hereinafter referred to as first hold position) defines a passage for the semiconductor devices 540. The first upper-side presser 5106A and the first lower-side presser 5106B can move in the directions (directions Y1 and Y2 shown in FIGS. 195 and 196) at right angles to the transportation direction of the semiconductor devices 540.

Hence, the first upper-side presser 5106A and the first lower-side presser 5106B move closer to each other in the state in which the semiconductor device 540 reaches the first hold position, and hold the semiconductor device 540. Hence, the movement of the semiconductor device 540 is limited.

The space between the second upper-side presser 5108A and the second lower-side presser 5108B (hereinafter referred to as second hold position) defines a passage for the semiconductor devices 540. The second upper-side presser 5108A and the second lower-side presser 5108B can move in the directions (directions Y1 and Y2 shown in FIGS. 195 and 196) at right angles to the transportation direction of the semiconductor devices 540.

Hence, the second upper-side presser 5108A and the second lower-side presser 5108B move closer to each other in the state in which the semiconductor device 540 reaches the second hold position, and hold the semiconductor device 540. Hence, the movement of the semiconductor device 540 is limited.

Further, the first upper-side presser 5106A and the first lower-side presser 5106B can move in directions X1 and X2 shown in FIGS. 195 and 196.

The separation rail 5110 is located on the downstream side of the first pressers 5106A and 5106B in the direction in which the semiconductor devices 540 are transported. The separation rail 5110 includes a passage through the semiconductor devices 540 are transported. The stopper 5112 enters into the above passage.

The stopper 5112 can move at right angles to the transportation direction by a driving apparatus. When the stopper 5112 moves in the direction Y2, the passage in the separation rail 5110 is closed and the semiconductor devices 540 are blocked. In contrast, when the stopper 5112 moves in the direction Y1, the passage in the separation rail 5110 is opened and allows the semiconductor devices 540 to pass therethrough.

A description will be given of an operation of the separation part 528.

In the initial state of the separation part 528, the first upper-side presser 5106A and the first lower-side presser 5106B are spaced apart from each other, and the second upper-side presser 5108A and the lower-side presser 5108B are spaces apart from each other. Further, the stopper 5112 is located in the direction Y2 so that the passage of the semiconductor devices 540 is closed. Hence, the semiconductor devices 540 passing through the first and second hold positions butt against the stopper 5112 in the separation rail 5110 and the movement thereof is limited.

In that state, the first upper-side presser 5106A and the second lower-side presser 5106B are moved close to each other. Similarly, the second upper-side presser 5108A and the second lower-side presser 5108B are moved close to each other. Hence, the semiconductor device 540 that is the first one in the moving direction is held by the pressers 5106A and 5106B in the first hold position, and is stopped here. The semiconductor device 540 that is the second one in the moving direction is held by the pressers 5108A and 5108B in the second hold position, and is stopped here. FIG. 195 shows the above state.

Then, the first upper-side presser 5106A and the first lower-side presser 5106B are moved, together with the separation rail 5110, toward the second upper-side presser 5108A and the second lower-side presser 5108B in the direction X1. Hence, the semiconductor device 540 that is the first one in the moving direction is pulled away from the second semiconductor device 540. As described above, the second semiconductor device 540 is held by the pressers 5108A and 5108B, and is prevented from being dropped from the separation part 528.

Then, the pressers 5106A and 5106B are pulled away from each other, and the stopper 5112 is moved in the direction Y1. Hence, as shown in FIG. 196, the semiconductor device 540 is set to the movable state, and is transported toward the measurement part 530 from the separation rail 5110.

The separation part 528 performs the above operation at the predetermined timing. Hence, the semiconductor devices 540 can be transported toward the measurement part 530 one by one at the predetermined timing. Hence, it is possible to prevent the semiconductor devices 540 from being erroneously loaded to the measurement part 530, which can perform the measurement process definitely.

A description will be given, with reference to FIGS. 197 and 198, of a second embodiment 528A of the separation part 528. In FIGS. 197 and 198, parts that are the same as those shown in FIGS. 195 and 196 are given the same reference numbers as previously.

In the above-mentioned first embodiment of the separation part 528, the movement of the semiconductor devices 540 is limited by means of the first pressers 5106A and 5106B and the second pressers 5108A and 5108B. The separation part 528A according to the second embodiment employs a transportation rail 5114 with an electromagnet.

The transportation rail 5114 with the electromagnet has a transportation passage 5114a in a central portion thereof, and the electromagnet is provided in the circumferential portion of the transportation passage. The semiconductor devices 540 from the orientation part 526 are transported through the transportation passage 5114a.

A separation rail 5116 with an electromagnet is provided at the downstream side of the transportation rail 5114 in the direction in which the semiconductor devices 540 are transported. A transportation passage is formed in the central portion of the separation rail 5116, in which a stopper 5112 for opening and closing the transportation passage is arranged.

The separation rail 5116 can be moved with respect to the transportation rail 5114 in the direction X1. The electromagnets of the transportation rail 5114 and the separation rail 5116 can be turned on and off. The bumps 544 of the semiconductor devices 540 include a magnetic metal. When the electromagnets are turned on, the semiconductor devices 540 are attached to the transportation rail 5114 and the separation rail 5116 and are stopped. When the electromagnets are turned off, the semiconductor devices 540 are permitted to pass through the transportation rail 5114 and the separation rail 5116.

A description will be given of an operation of the separation part 528A.

In the initial state of the separation part 528A, the transportation rail 5114 and the separation rail 5116 contact each other. Also, the electromagnets of the transportation rail 5114 and the separation rail 5116 are maintained in the off state. Further, the stopper 5112 is moved in the direction Y2 and blocks the passage of the semiconductor devices 540. Hence, the semiconductor devices 540 from the orientation part 526 are permitted to enter into the transportation rail 5114 and the separation rail 5116, and are then stopped by the stopper 5112 provided in the separation rail 5116.

In that state, the electromagnets respectively provided in the transportation rail 5114 and the separation rail 5116 are turned on. Hence, the semiconductor device 540 that is the first one in the moving direction is attached to the separation rail 5116 and is stopped here. The semiconductor devices following the first semiconductor device 540 are attached to the transportation rail 5114 and are stopped there. FIG. 197 shows the above state.

Then, the separation rail 5116 is moved in the direction X1. Hence, the semiconductor device 540 that is the first one in the moving direction is pulled away from the semiconductor devices 540 on and after the second. The semiconductor devices 540 on and after the second are attached to the separation rail 5116 and are stopped, so that the devices 540 can be prevented from being dropped from the separation part 528A.

After the first semiconductor device 540 is separated from the semiconductor devices on and after the second, the electromagnet of the separation rail 5116 is turned off, and the stopper 5112 is moved in the direction Y1. Hence, as shown in FIG. 198, the semiconductor devices 540 are permitted to move, and are transported toward the measurement part 530.

The separation part 528A performs the above operation at a predetermined timing, and the semiconductor devices 540 are transported one by one toward the measurement part 530. Hence, it is possible to prevent the semiconductor devices 540 from being erroneously loaded to the measurement part 530 and to perform the measurement process definitely. The structure of the separation part 528A is simpler than the separation part 528 described with reference to FIGS. 195 and 196.

A description will now be given of the measurement part 530 and the outer appearance check part 532.

FIG. 199 shows the measurement part 530 and the outer appearance check part 532. The measurement part 530 loads the semiconductor device 540 to a measurement printed-circuit board 5112, and tests for the semiconductor device 540 in order to determine whether the semiconductor chip built therein operates normally and whether the chips are correctly connected to the bumps 544. The outer appearance check part 532 uses a camera 5138 and checks whether the bumps 544 have any problem such as a crack or flake off.

A description will now be given, with reference to FIGS. 199–201, of a first embodiment of the measurement part 530.

The measurement part 530 is generally made up of a first movement apparatus 5120 and a measurement printed-circuit board 5122. The first apparatus 5120 is generally made up of a standby rail 5124, a stopper 5126, rail covers 5128A and 5128B, a moving rail 5130 and a positioning block 5132.

The standby rail 5124 and the stopper 5126 (cooperating therewith) function to temporarily position the semiconductor device 540 dropping in the self-weight formation in a standby position prior to the measurement position. The standby rail 5124 is connected to the separation part 528, from which the semiconductor devices 540 are supplied at given intervals.

A groove-shaped transportation passage 5124a is formed in the standby rail 5134. The semiconductor devices 540 fed from the separation part 528 is given to the transportation passage 5124a. The stopper 5126 is provided so as to enter into and go away from the transportation passage 5124a. In the state in which the stopper 5126 enters into the transportation passage 5124a, the semiconductor device 540 engages with the stopper 5126, and the movement thereof is restricted.

At the time other than the measurement time, the rail covers 5128A and 5128B are closed so that the semiconductor device 540 can be prevented from dropping from the standby rail 5124. Even in the state in which the rail covers 5128A and 518B are closed, the stopper 5126 can enter into and go away from the transportation passage 5124a. The rail covers 5128A and 5128B are opened and closed at predetermined timings.

The moving rail 5130 and the positioning block 5132 are arranged below the standby rail 5124. A positioning passage 5130a connected to the standby rail 5134 is formed in the moving rail 5130, and can be moved in the directions X1 and X2 in the state in which the semiconductor device 540 is loaded to the positioning passage 5130a.

A description will now be given, with reference to FIG. 201, of a movement mechanism for moving the movement mechanism in the directions X1 and X2. The moving rail 5130 is fixed to a carriage 5144. The carriage 5144 is provided to a guide shaft 5150 and a screw shaft 5152 disposed between a first base member 5146 and a second base member 5148. The first and second base members 5146 and 5148 are fixed to a chassis of the fabrication apparatus 510B.

The guide shaft 5150 movably supports the carriage 5144. The screw shaft 5152 engages a female screw part formed in the carriage 5144. The screw shaft 5152 is connected to a rotary shaft of a motor 5142 fixed to the first base member via a belt 5154. When the motor 5142 is rotated, the rotation is transferred to the screw shaft 5152 via the belt 5154, and the screw shaft 5152 is thus rotated.

Since the carriage 5144 engages the screw shaft 5152, the rotation of the screw shaft 5152 moves the carriage 5144 in the direction X1 or X2. Hence, by controlling the revolution and the rotating direction of the motor 5142, the moving rail fixed to the carriage 5144 is moved to the direction X1 or X2.

A vacuum absorption mechanism is provided to the moving rail 5130, and functions to fix the semiconductor device 540 to the moving rail 5130 when the semiconductor device 540 is loaded to the positioning passage 5130a of the moving rail 5130.

Hence, even if the moving rail 5130 is moved during the measuring operation, the semiconductor device 540 can be prevented from dropping from the moving rail 5130. The positioning block 5132 can be moved in the directions X1 and X2.

A contact 5134 is formed in the measurement printed-circuit board 5122 and is located in a position corresponding to the moving rail 5130. The contact 5134 is connected to a tester, which performs a given operation test of the semiconductor device 540. When the semiconductor device 540 is moved in the direction X1 by moving the moving rail 5130, the semiconductor device 540 is loaded to the contact 5134 formed in the measurement printed-circuit board 5122. Then, the tester can perform the given operation test of the semiconductor device 540.

A description will now be given of an operation of the measurement part 530.

FIG. 200 shows an initial state observed before the semiconductor device 540 is supplied from the separation part 528. In the initial state, the stopper 5126 enters into the transportation passage 5124a of the standby rail 5124, and the rail covers 5128A and 5128B close the transportation passage 5124a. Further, the moving rail 5130 and the positioning block 5132 are located in the turned-out state in the direction X2. When the moving rail 5130 is in the turned-out state, the transportation passage 5124a and the positioning passage 5130 are joined together.

In the above initial state, the semiconductor device 540 supplied from the separation part 528 in the self-weight dropping manner engages the stopper 5126 and is positioned in the given standby position in the transportation passage 5124a. After it is confirmed that the moving rail 5130 totally returns to the initial state, the stopper 5126 is turned out from the transportation passage 5124a.

Thus, the semiconductor device 540 drops in the self-weight fashion again and is loaded to the positioning passage 5130a of the moving rail 5130. At that time, the positioning block 5132 enters into the lower part of the positioning passage 5130a. During the above process, the rail covers 5128A and 5128B close the transportation passage 5124a and the positioning passage 5130a. Hence, the semiconductor device 540 cannot be prevented from dropping.

As described above, the semiconductor device 540 dropping is placed in the predetermined standby position and is then loaded to the positioning passage 5130a of the moving rail 5130. Hence, it is possible to precisely load the semiconductor device to the positioning passage 5130a. Hence, in the subsequent step, the semiconductor device 540 can be loaded to the contact 5134 of the measurement printed-circuit board 5122 with high precision, and the reliability of the test can be improved.

After the semiconductor device 540 is loaded to the moving rail 5130, the aforementioned vacuum absorption mechanism is activated, and the semiconductor device 540 is absorbed to the moving rail 5130. Hence, the semiconductor device 540 is fixed to the moving rail 5130.

Then, the rail covers 5128A and 5128B are opened to an extent in which the moving rail 5130 can be moved without being affected by the rail covers 5128A and 5128B. Further, a motor 5142 shown in FIG. 201 is driven. Hence, the moving rail 5130 is started to move in the direction X1, and the semiconductor device 540 is started to move toward the contact 5134.

Then, the moving rail 5130 is moved up to the limit in the direction X1. In this state, the semiconductor device 40 is loaded to the contact 5134. During the above movement, the semiconductor device 540 is moved in the state in which it is fixed to the moving rail 5130. Hence, it is possible to prevent the semiconductor device 540 from being displaced on the moving rail 540 and load the semiconductor device 540 to the contact 5134 with high precision.

When the semiconductor device 540 is loaded to the contact 5134, the tester is electrically connected to the chip provided in the semiconductor device 540 via the contact 5134 via the contact 5134 and the bumps 544. Hence, the tester performs the given operation test of the semiconductor chip.

In the present embodiment, the first movement apparatus 5120, which moves the semiconductor device 540 to make a connection with the measurement printed-circuit board 5122. Hence, it is possible to definitely load, to the measurement printed-circuit board 5122, the semiconductor device 540 having the bumps 544 which do not extend over the package 542 in the horizontal directions. Hence, the tester can test for the semiconductor device 540 with high precision. The semiconductor device 540 can automatically be loaded to the measurement printed-circuit board 5122 and the efficiency in the measurement can be improved.

A description will now be given, with reference to FIG. 202, of a second embodiment 530A of the measurement part 530A. In FIG. 202, parts that are the same as those shown in FIGS. 199–201 are given the same reference numbers, and a description thereof will be omitted here.

In the measurement part 530 of the first embodiment employs the vacuum absorption mechanism in order to fix the semiconductor device 540 to the moving rail 5130. In the measurement part 530A, a first movement apparatus 5120A employs an electromagnet in order to fix the semiconductor device 540 to the moving rail 5130.

More particularly, the present embodiment utilizes the arrangement in which the bumps 544 include a magnetic metal. An electromagnet 5158 (magnetic absorption mechanism) is provided to a moving rail 5130A. The electromagnet 5158 can be turned on and off.

The electromagnet 5158 is turned on in order to move the semiconductor device 540 toward the measurement printed-circuit board 5122. Hence, the semiconductor device 540 is fixed to the moving rail 5130A due to the magnetic force generated by the electromagnet 5158. Hence, it is possible to prevent the semiconductor device 540 from being displaced when the moving rail 5130 is moved. With the above arrangement, it is also possible to precisely load the semiconductor device 540 to the contact 5134 of the measurement printed-circuit board 5122 and perform highly reliable test.

In order to precisely load the semiconductor device 540 to the contact 5134 of the measurement printed-circuit board 5122, the first movement apparatus 5120 (5120A) and the measurement printed-circuit board 5122 are positioned precisely. FIGS. 203 and 204 show examples of the step of precisely positioning the first movement apparatus 5120 (5120A) and the measurement printed-circuit board 5122.

Referring to FIG. 203, a first positioning step is illustrated. A positioning board 5160 is used instead of the measurement printed-circuit board 5122. A positioning hole 5162 is formed in a predetermined position in the positioning board 5160, and defines the positioning. Positioning pins 5164 are provided to the positioning board 5160 and are used to position the positioning board 5160 with respect to the chassis of the fabrication apparatus 510B.

At the time of the positioning, the positioning block 5132 located below the lower part of the moving rail 5103 is caused to extend toward the positioning board 5160. While the above state is maintained, the moving rail 5130 is moved, together with the positioning block 5132, close to the positioning board 5160. Then the first movement apparatus 5120 is adjusted so that the positioning block 5132 is inserted into and engaged with the positioning hole 5162.

After the positioning block 5132 is positioned so as to be inserted into the positioning hole 5162, the first movement apparatus 5120 is positioned and fixed in the above state. The positioning hole 5162 formed in the positioning board 5160 corresponds to the contact 5134 of the measurement printed-circuit board 5122. Hence, the positioning block 5132 is inserted into the positioning hole 5162, the positioning passage 5130*a* of the moving rail 5130 (that is, the position in which the semiconductor device 540 is loaded) is positioned to the contact 5134 of the measurement printed-circuit board 5122.

Hence, if the positioning board 5160 is replaced by the measurement printed-circuit board 5122 in the above state, the moving rail 5130 is positioned with respect to the contact 5134 of the measurement printed-circuit board 5122.

The second positioning method will be described with reference to FIG. 204. A transparent board such as a glass board is used as a positioning board 5160A. Hence, the semiconductor device 540 loaded to the moving rail 5130 can be viewed through the transparent positioning board 5160A. A positioning mark 5166 having the same size and shape as those of the bumps 544 is formed by a marking-off line scored in the given position on the positioning board 5160A. The position of the positioning mark 5166 corresponds to the position of the contact 5134 of the measurement printed-circuit board 5122.

The positioning process is carried out as follows. The semiconductor device 540 is loaded to the moving rail 5130, which is then moved close to the positioning board 5160A. Then, the first movement apparatus 5120 is adjusted so that the positions of the bumps 544 correspond to the position of the positioning mark 5166.

After that, the first movement apparatus 5120 is fixed and positioned. The positioning mark 5166 formed on the positioning board 5160A corresponds to the position of the contact 5134 of the measurement printed-circuit board 1522. Hence, the bumps 544 and the positioning mark 5166 are positioned, and thus the positioning passage 5130*a* of the moving rail 5130 (that is, the position in which the semiconductor device 540 is loaded) is positioned to the contact 5134 of the measurement printed-circuit board 5122.

When the positioning board 5160A is replaced by the measurement printed-circuit board 5122 in the above-mentioned positioned state, the movement rail 5130 is positioned with respect to the contact 5134 of the measurement printed-circuit board 5122. According to the methods shown in FIGS. 203 and 204, the first movement apparatus 5120 is easily positioned by using the positioning boards 160 and 166.

Turning to FIG. 199, the outer appearance check part 532 is generally made up of a second movement apparatus 5136 and a camera 5138. The second movement apparatus 5136 is supplied with the semiconductor device 540 dropping in the self-weight fashion from the measurement part 530.

The second movement apparatus 5130 has the same structure and function as those of the first movement apparatus 5120 provided in the measurement part 530. Hence, a description of the second movement apparatus 5130 will be omitted.

The camera 5138 takes images of the bumps 544 of the semiconductor device 540 coming from the moving rail 5130, and determines whether there are any faulty parts therein. The semiconductor devices 540 that pass the test are packed and shipped. The semiconductor devices 540 that are determined as being faulty by the measurement part 530 or the outer appearance check part 532 are taken away from the packing line and are subjected to a maintenance process or discarding process.

The present invention is not limited to the specifically disclosed embodiments, and variations and modifications may be made without departing from the scope of the present invention.

What is claimed is:

1. A method for fabricating semiconductor devices including resin packages sealing semiconductor elements and external connection terminals respectively resin projections formed on the resin packages and metallic film parts provided to the resin projections, said method comprising the steps of:
    (a) mounting the semiconductor elements to a lead frame having recess portions located in positions corresponding to positions of the resin projections, metallic film parts being provided in the recess portions;
    (b) electrically connecting the semiconductor elements to the metallic film parts;
    (c) forming the resin packages that seal the semiconductor elements and gate portions integrally formed with the resin packages;
    (d) etching the lead frame so that the resin packages are separated from the lead frame together with the metallic film parts; and
    (e) removing the gate portions from the resin packages, the resin packages being attached to an adhesive tape provided to a frame and being used as a carrier in the step (d).

2. The method as claimed in claim 1, wherein only the resin packages are attached to the adhesive tape, and the gate portions are spaced apart from the adhesive tape.

3. The method as claimed in claim 1, wherein two sides of the adhesive tape are fixed to the frame and two remaining sides of the adhesive tape are spaced apart from the frame.

4. The method as claimed in claim 1, wherein the frame is titanium, resin or a metal coated with resin.

5. The method as claimed in claim 1, wherein the adhesive tape comprises a substance which loses adhesive force when the substance is wetted.

6. The method as claimed in claim 2, wherein the step (d) comprises the steps of:
    (d-1) positioning the adhesive tape above the resin packages; and
    (d-2) pressing portions of the adhesive tape corresponding to the resin packages toward the resin packages by means of a pressing mechanism, so that the adhesive tape can adhere to the resin packages only.

7. The method as claimed in claim 6, wherein the step (d-2) comprises the step of pressing the portions of the adhesive tape by a spot of air generated by the pressing mechanism.

8. The method as claimed in claim 2, wherein the step (d) comprises the steps of:
    (d-1) positioning the adhesive tape below the resin packages; and
    (d-2) pressing surfaces of the resin packages toward the adhesive tape by means of a pressing mechanism, so that the adhesive tape can adhere to the resin packages only.

9. A method for fabricating semiconductor devices including resin packages sealing semiconductor elements and external connection terminals respectively having resin projections formed on the resin packages and metallic film parts provided to the resin projections, said method comprising the steps of:
    (a) mounting the semiconductor elements to a lead frame having recess portions located in positions corresponding to positions of the resin projections, metallic film parts being provided in the recess portions;
    (b) electrically connecting the semiconductor elements with the metallic film parts;
    (c) forming the resin packages that seal the semiconductor elements and gate portions being integrally formed with the resin packages;
    (d) etching the lead frame so that the resin packages are separated from the lead frame together with the metallic film parts; and
    (e) removing the gate portions from the resin packages by cutting interface portions between the gate portions and the resin packages by a cutting apparatus.

* * * * *